US009614136B2

(12) United States Patent
Koike et al.

(10) Patent No.: US 9,614,136 B2
(45) Date of Patent: Apr. 4, 2017

(54) OPTICAL SUBSTRATE, SEMICONDUCTOR LIGHT-EMITTING ELEMENT AND METHOD OF MANUFACTURING SEMICONDUCTOR LIGHT-EMITTING ELEMENT

(71) Applicant: ASAHI KASEI KABUSHIKI KAISHA, Tokyo (JP)

(72) Inventors: Jun Koike, Tokyo (JP); Yoshimichi Mitamura, Tokyo (JP); Fujito Yamaguchi, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/389,968

(22) PCT Filed: Mar. 29, 2013

(86) PCT No.: PCT/JP2013/059635
§ 371 (c)(1),
(2) Date: Oct. 1, 2014

(87) PCT Pub. No.: WO2013/150984
PCT Pub. Date: Oct. 10, 2013

(65) Prior Publication Data

US 2015/0048380 A1 Feb. 19, 2015

(30) Foreign Application Priority Data

Apr. 2, 2012 (JP) ................................ 2012-084208
Apr. 27, 2012 (JP) ................................ 2012-103489
(Continued)

(51) Int. Cl.
*H01L 33/58* (2010.01)
*H01L 33/22* (2010.01)
(Continued)

(52) U.S. Cl.
CPC .............. *H01L 33/58* (2013.01); *H01L 22/12* (2013.01); *H01L 33/22* (2013.01);
(Continued)

(58) Field of Classification Search
CPC ................................ H01L 33/22; H01L 33/58
See application file for complete search history.

(56) References Cited

U.S. PATENT DOCUMENTS 6,844,569 B1 * 1/2005 Lee ....................... C30B 29/605 257/103
6,870,191 B2 3/2005 Niki et al.
(Continued)

FOREIGN PATENT DOCUMENTS

DE WO 2015189088 A1 * 12/2015 ............ H01L 33/22
EP 1 858 090 A2 11/2007
(Continued)

OTHER PUBLICATIONS

Extended European Search Report, issued Sep. 21, 2015, for European Application No. 15174863.9.
(Continued)

*Primary Examiner* — Earl Taylor
(74) *Attorney, Agent, or Firm* — Birch, Stewart, Kolasch & Birch, LLP

(57) ABSTRACT

In an optical substrate (1), a concave-convex structure (12) including a plurality of independent convex portions (131 to 134) and concave portions (14) provided between the convex portions (131 to 134) is provided in a surface. The average interval Pave between the adjacent convex portions (131 to 134) in the concave-convex structure (12) satisfies 50 nm≤Pave≤1500 nm, and the convex portion (133) having a convex portion height hn satisfying 0.6 h≥hn≥0 h for the average convex portion height Have is present with a probability Z satisfying 1/10000≤Z≤1/5. When the optical
(Continued)

substrate (1) is used in a semiconductor light-emitting element, dislocations in a semiconductor layer are dispersed to reduce the dislocation density, and thus internal quantum efficiency IQE is improved, and a waveguide mode is removed by light scattering and thus the light the extraction efficiency LEE is increased, with the result that the efficiency of light emission of the semiconductor light-emitting element is enhanced.

11 Claims, 44 Drawing Sheets

(30) Foreign Application Priority Data

| | | |
|---|---|---|
| Apr. 27, 2012 | (JP) | 2012-103490 |
| Oct. 12, 2012 | (JP) | 2012-227295 |
| Dec. 6, 2012 | (JP) | 2012-267377 |
| Dec. 6, 2012 | (JP) | 2012-267488 |
| Dec. 21, 2012 | (JP) | 2012-280241 |

(51) Int. Cl.

| | |
|---|---|
| ***H01L 21/66*** | (2006.01) |
| *H01L 33/32* | (2010.01) |
| *H01L 21/02* | (2006.01) |
| *H01L 33/00* | (2010.01) |
| *H01L 33/20* | (2010.01) |

(52) U.S. Cl.

CPC ...... *H01L 21/0243* (2013.01); *H01L 21/0254* (2013.01); *H01L 21/02658* (2013.01); *H01L 33/007* (2013.01); *H01L 33/20* (2013.01); *H01L 33/32* (2013.01)

(56) References Cited

U.S. PATENT DOCUMENTS

| | | | | |
|---|---|---|---|---|
| 7,436,001 | B2 | 10/2008 | Lee et al. | |
| 7,449,215 | B2 * | 11/2008 | Akiyoshi | H01L 51/5275 427/162 |
| 7,601,621 | B2 | 10/2009 | Choi et al. | |
| 7,612,381 | B2 | 11/2009 | Kamiyama et al. | |
| 7,893,451 | B2 * | 2/2011 | Cho | H01L 33/20 257/98 |
| 7,939,840 | B2 * | 5/2011 | Cho | H01L 33/20 257/13 |
| 8,003,993 | B2 * | 8/2011 | Cho | H01L 33/20 257/13 |
| 8,008,103 | B2 * | 8/2011 | Cho | H01L 33/20 438/42 |
| 8,013,354 | B2 | 9/2011 | Lee et al. | |
| 8,022,412 | B2 | 9/2011 | Wuu et al. | |
| 8,283,690 | B2 * | 10/2012 | Cho | H01L 33/20 257/98 |
| 8,384,111 | B2 | 2/2013 | Tadatomo et al. | |
| 8,461,611 | B2 | 6/2013 | Ono et al. | |
| 8,648,376 | B2 * | 2/2014 | Cho | H01L 33/20 257/98 |
| 9,246,054 | B2 * | 1/2016 | Cho | H01L 33/20 |
| 2004/0056267 | A1 | 3/2004 | Asatsuma et al. | |
| 2007/0246700 | A1 | 10/2007 | Park | |
| 2008/0230793 | A1 | 9/2008 | Yoon et al. | |
| 2009/0078954 | A1 * | 3/2009 | Shim | H01L 33/22 257/98 |
| 2009/0159871 | A1 * | 6/2009 | Lee | H01L 33/22 257/13 |
| 2009/0298213 | A1 | 12/2009 | Lee et al. | |
| 2010/0072501 | A1 | 3/2010 | Wakai et al. | |
| 2010/0224894 | A1 | 9/2010 | Kim et al. | |
| 2015/0048380 | A1 * | 2/2015 | Koike | H01L 33/22 257/76 |
| 2015/0076468 | A1 * | 3/2015 | Yamaguchi | G02B 1/118 257/40 |

FOREIGN PATENT DOCUMENTS

| | | | | | |
|---|---|---|---|---|---|
| EP | 2 226 855 | A1 | | 9/2010 | |
| JP | 2003-318441 | A | | 11/2003 | |
| JP | 2003-347238 | A | | 12/2003 | |
| JP | 2005-259970 | A | | 9/2005 | |
| JP | 2005-354020 | A | | 12/2005 | |
| JP | 2005354020 | A | * | 12/2005 | |
| JP | 2007-36240 | A | | 2/2007 | |
| JP | 2007-88277 | A | | 4/2007 | |
| JP | 2007088277 | A | * | 4/2007 | |
| JP | WO 2007108532 | A1 | * | 9/2007 | H01L 33/14 |
| JP | 2007-294972 | A | | 11/2007 | |
| JP | 2007-311784 | A | | 11/2007 | |
| JP | 2008-47860 | A | | 2/2008 | |
| JP | 2009-130027 | A | | 6/2009 | |
| JP | 2009130027 | A | * | 6/2009 | |
| JP | WO 2009084670 | A1 | * | 7/2009 | H01L 33/20 |
| JP | 2009-242130 | A | | 10/2009 | |
| JP | 2010-74008 | A | | 4/2010 | |
| JP | 2010-147056 | A | | 7/2010 | |
| JP | 2010-171427 | A | | 8/2010 | |
| JP | 2010-225787 | A | | 10/2010 | |
| JP | WO 2011027679 | A1 | * | 3/2011 | H01L 33/22 |
| JP | 2012-33521 | A | | 2/2012 | |
| JP | 2012-124257 | A | | 6/2012 | |
| JP | WO 2013125823 | A1 | * | 8/2013 | H01L 33/20 |
| JP | WO 2013150984 | A1 | * | 10/2013 | H01L 33/22 |
| JP | WO 2014199851 | A1 | * | 12/2014 | H01L 33/22 |
| JP | WO 2015016150 | A1 | * | 2/2015 | H01L 33/22 |
| JP | WO 2015053363 | A1 | * | 4/2015 | H01L 33/22 |
| JP | EP 2835836 | A4 | * | 8/2015 | H01L 33/22 |
| JP | EP 2942819 | A1 | * | 11/2015 | H01L 33/22 |
| JP | EP 2942820 | A1 | * | 11/2015 | H01L 33/22 |
| JP | EP 2942821 | A1 | * | 11/2015 | H01L 33/22 |
| JP | EP 2942822 | A1 | * | 11/2015 | H01L 33/22 |
| KR | EP 1858090 | A2 | * | 11/2007 | H01L 33/22 |
| KR | EP 1858090 | A3 | * | 9/2009 | H01L 33/22 |

OTHER PUBLICATIONS

Extended European Search Report, issued Sep. 21, 2015, for European Application No. 15174886.0.

Extended European Search Report, issued Sep. 23, 2015, for European Application No. 15174860.5.

Extended European Search Report, issued Sep. 29, 2015, for European Application No. 15174876.1.

Choi et al., "OSNR Monitoring Technique for DPSK/DQPSK Signals Based on Self-Heterodyne Detection," IEEE Photonics Technology Letters, Jul. 1, 2008, vol. 20, No. 13.

Gao et al., "Enhancement of the light output power of InGaN/GaN light-emitting diodes grown on pyramidal patterned sapphire substrates in the micro- and nanoscale," Journal of Applied Physics, 2008, vol. 103, 014314.

International Search Report issued in PCT/JP2013/059635, mailed on Jul. 30, 2013.

International Preliminary Report on Patentability and Written Opinion of the International Searching Authority (Forms PCT/IB/338, PCT/IB/373 and PCT/ISA/237), dated Oct. 16, 2014, for International Application No. PCT/JP2013/059635.

* cited by examiner

OPTICAL SUBSTRATE, SEMICONDUCTOR LIGHT-EMITTING ELEMENT AND METHOD OF MANUFACTURING SEMICONDUCTOR LIGHT-EMITTING ELEMENT

TECHNICAL FIELD

The present invention relates to an optical substrate, a semiconductor light-emitting element and a method of manufacturing a semiconductor light-emitting element. More particularly, the present invention relates to an optical substrate in which a concave-convex structure is formed in its surface, a semiconductor light-emitting element using it, a method of manufacturing it and a method of preferably managing them.

BACKGROUND ART

In recent years, in order to enhance efficiency in semiconductor light-emitting elements such as an OLED, a fluorescent member and an LED, the improvement of the efficiency of extracting light from the semiconductor light-emitting element has been examined. The semiconductor light-emitting element described above has a structure in which a high refractive index region including a light-emitting portion therewithin is sandwiched between low refractive index regions. Hence, light emitted by the light-emitting portion of the semiconductor light-emitting element is brought into a waveguide mode in which the emitted light is wave-guided within the high refractive index region, is trapped within the high refractive index region, is absorbed in a waveguide process, is transformed into heat and is attenuated. As described above, in the semiconductor light-emitting element, it is impossible to extract the emitted light from the semiconductor light-emitting element, with the result that the light extraction efficiency is significantly and disadvantageously reduced.

In the case of an LED element, as will be described later, a light extraction efficiency LEE and an internal quantum efficiency IQE or a light extraction efficiency LEE and an electron injection efficiency EIE are simultaneously improved, and thus it is possible to manufacture a high efficiency LED element.

A GaN semiconductor element such as a blue LED is manufactured by depositing an n-type semiconductor layer, a light-emitting layer and a p-type semiconductor layer on a single crystal substrate by epitaxial growth. As the single crystal substrate, a sapphire single crystal substrate or a SiC single crystal substrate is generally used. However, since a lattice mismatch is present between a sapphire crystal and a GaN semiconductor crystal, dislocations are generated within the GaN semiconductor crystal (see, for example, non-patent document 1). The dislocation density thereof reaches $1\times10^9$ pieces/cm$^2$. The dislocations cause the internal quantum efficiency of the LED, that is, the light emission efficiency of the semiconductor to be decreased, with the result that an external quantum efficiency is lowered.

The refractive index of a GaN semiconductor layer is higher than that of a sapphire substrate. Hence, light generated within the semiconductor light-emitting layer is prevented from being emitted from an interface between the sapphire substrate and the GaN semiconductor layer at an angle equal to or more than a critical angle. In other words, the light forms a waveguide mode, and is, in a waveguide process, transformed into heat and is attenuated. Hence, the light extraction efficiency is lowered, with the result that the external quantum efficiency is lowered. Moreover, when a SiC substrate having a significantly high refractive index as a single crystal substrate is used, since light is prevented from being emitted from an interface between the SiC substrate and an air layer at an angle equal to or more than a critical angle, as in the case where the sapphire substrate is used, the light forms a waveguide mode, and thus the light extraction efficiency LEE is lowered.

In other words, since a dislocation defect within the semiconductor crystal causes the internal quantum efficiency to be lowered, and the formation of the waveguide mode causes the light extraction efficiency to be lowered, the external quantum efficiency of the LED is significantly lowered.

Hence, a technology is proposed in which a concave-convex structure is provided in a single crystal substrate to change a light waveguide direction in a semiconductor crystal layer and thus a light extraction efficiency is increased (see, for example, patent document 1).

A technology is also proposed in which the size of a concave-convex structure provided in a single crystal substrate is on the order of nanometers, and thus the pattern of the concave-convex structure is brought into random arrangement (see, for example, patent document 2). It is reported that when the size of a pattern provided on a signal crystal substrate is on the order of nanometers, as compared with a pattern on the order of micrometers, the light emission efficiency of an LED is enhanced (see, for example, patent document 2).

Furthermore, a GaN semiconductor light-emitting element is proposed in which in order to enhance an electron injection efficiency EIE, a concave-convex structure is provided on the upper surface of a p-type semiconductor layer to reduce a contact resistance with a transparent conductive film (see patent document 3).

PRIOR ART DOCUMENT

Patent Document

Patent document 1: Japanese Unexamined Patent Application Publication No. 2003-318441

Patent document 2: Japanese Unexamined Patent Application Publication No. 2007-294972

Patent document 3: Japanese Unexamined Patent Application Publication No. 2005-259970

Non-Patent Literature

Non-patent document 1: IEEE photo. Tech. Lett., 20, 13 (2008)

Non-patent document 2: J. Appl. Phys., 103, 014314 (2008)

SUMMARY OF THE INVENTION

Technical Problem

Incidentally, as factors for determining an EQE (External Quantum Efficiency) indicating the light emission efficiency of an LED, there are an EIE (Electron Injection Efficiency), an IQE (Internal Quantum Efficiency) and a LEE (Light Extraction Efficiency). Among them, the internal quantum efficiency IQE depends on a dislocation density caused by a crystal mismatch in a GaN semiconductor crystal. The light extraction efficiency LEE is improved by disturbing a waveguide mode within a GaN semiconductor crystal layer through light scattering caused by a concave-convex structure provided in a single crystal substrate. Furthermore, the electron injection efficiency EIE is improved by reducing an interface resistance between a p-type semiconductor layer and a transparent conductive film formed with an oxide such as ITO, ZnO, $In_2O_3$ or $SnO_2$. In particular, since the transparent conductive film of ITO is an n-type conductor, a Schottky barrier is easily formed in an interface with the p-type semiconductor layer, and thus its ohmic characteristic is lowered, with the result that its contact resistance is easily increased. Hence, a concave-convex structure is formed in the interface with the p-type semiconductor layer to increase the contact area, and thus the ohmic contact is enhanced, with the result that the light extraction efficiency LEE is improved. In other words, as the effects of the concave-convex structure provided in the single crystal substrate, the following three effects are present: (1) improvement of the internal quantum efficiency IQE by the reduction of the dislocations within the semiconductor crystal; (2) improvement of the light extraction efficiency LEE by removing the waveguide mode; and (3) enhancement of the electron injection efficiency EIE by the enhancement of the ohmic contact.

However, in the technology disclosed in patent document 1, although the light extraction efficiency LEE is improved by the effect of (2), the effect (1) of the reduction of the dislocations within the semiconductor crystal is low. The reason why the concave and convex portions are provided in the surface of the single crystal substrate to reduce the dislocation defect is that the growth mode of chemical vapor deposition (CVD) in the semiconductor crystal layer is disturbed by the concave and convex portions, and dislocations generated as the semiconductor crystal layer is grown collide with each other and thereby disappear. Hence, although when a number of concave and convex portions corresponding to the dislocation density are present, this is effective for the reduction of the dislocations, if a smaller number of concave and convex portions than the dislocation density are present, the effect of the dislocations is limited. For example, when a dislocation density of $1\times10^9$ pieces/$cm^2$ is converted into 10 pieces/$\mu m^2$ on the order of nanometers, and a dislocation density of $1\times10^8$ pieces/$cm^2$ is converted into 1 piece/$\mu m^2$. When about 2 concave and convex portions are provided in 5 μm×5 μm (□5 μm), the density of the concave and convex portions is $0.08\times10^8$ pieces/$cm^2$ whereas when about 2 concave and convex portions are provided in 500 nm×500 nm (□500 nm), the density of the concave and convex portions is $8\times10^8$ pieces/$cm^2$. As described above, when the size of the concave and convex portions is of interval on the order of nanometers, since the dislocation density is significantly reduced, it is effective for improvement of the internal quantum efficiency IQE.

However, when the density of the concave and convex portions is lowered, the effect of light scattering is reduced, and thus the effect (2) of the removal of the waveguide mode is reduced. The emission wavelength of an LED is within a visible light range, and in particular, the emission wavelength of a GaN LED used in a white LED is 450 nm to 500 nm. In order to obtain the sufficient light scattering effect, the size of the concave and convex portions is preferably about twice to 20 times as large as the wavelength, and the order of nanometers causes the effect to be lowered.

In the technology disclosed in patent document 3, since the interval and the depth in the concave-convex structure need to be on the order of nanometers, the improvement of the light extraction efficiency LEE by the concave-convex structure formed is not sufficient. This is because the thickness of the p-type semiconductor layer needs to be about a few hundreds of nanometers due to the magnitude of its absorption coefficient, and is inevitably on the same order as the size of the concave-convex structure. On the other hand, since the emission wavelength of an LED is within the visible light range (450 nm to 750 nm), the concave-convex structure whose size is about the same as that of the wavelength disadvantageously causes the light extraction efficiency LEE to be lowered.

As described above, in the conventional technology, among the three effects for the light emission efficiency of an LED, (1) improvement of the internal quantum efficiency IQE by the dispersion of the dislocations within the semiconductor crystal and the reduction of the dislocation density; (2) improvement of the light extraction efficiency LEE by removing the waveguide mode through light scattering; and (3) enhancement of the electron injection efficiency EIE by the enhancement of the ohmic contact, as the effect (role) of the concave-convex structure in the semiconductor light-emitting element, (1) and (2) are in the relationship of tradeoff, and (2) and (3) are in the relationship of tradeoff, with the result that it is not always possible to realize the optimum structure. In other words, disadvantageously, in the conventional technology, as the internal quantum efficiency IQE is more enhanced, the effect of the improvement of the light extraction efficiency LEE is lowered. Additionally, as the electron injection efficiency EIE is more enhanced, the effect of the improvement of the light extraction efficiency LEE is lowered.

The present invention is made in view of the foregoing points, and an object of the present invention is to provide an optical substrate, a semiconductor light-emitting element and a method of manufacturing it that can simultaneously achieve either the enhancement of the light extraction efficiency LEE and the improvement of the internal quantum efficiency IQE in an LED element or the enhancement of the light extraction efficiency LEE and the enhancement of the electron injection efficiency EIE, which are regarded as tradeoff.

Means for Solving the Problem

According to the present invention, there is provided an optical substrate that includes a substrate and a concave-convex structure which is formed in a part or a whole of a surface of the substrate, where at least one region of the concave-convex structure includes a plurality of convex portions arranged apart from each other, and the plurality of convex portions include a plurality of first convex portions having a first height and a plurality of second convex portions having a second height lower than the first height, an average interval $P_{ave}$ between the first convex portions adjacent satisfies formula (1) below and the second convex portion has a convex portion height hn that satisfies a relationship of formula (2) below with an average convex portion height $H_{ave}$ of the concave-convex structure, and is present with a probability Z that satisfies formula (3) below in the concave-convex structure:

$$50\ \text{nm} \leq P_{ave} \leq 1500\ \text{nm} \qquad \text{Formula (1)}$$

$$0.6H_{ave} \geq hn \geq 0 \qquad \text{Formula (2)}$$

$$1/10000 \leq Z \leq 1/5. \qquad \text{Formula (3)}$$

According to the present invention, there is provided an optical substrate that includes a substrate and a concave-convex structure which is formed in a part or a whole of a surface on one main surface of the substrate, where at least one region of the concave-convex structure includes a plurality of concave portions arranged apart from each other, and the plurality of concave portions include a plurality of first concave portions having a first depth and a plurality of second concave portions having a second depth smaller than the first depth, an average interval $P_{ave}$ between the first concave portions adjacent satisfies formula (5) below and the second concave portion has a concave portion depth do that satisfies a relationship of formula (6) below with an average concave portion depth $D_{ave}$ of the concave-convex structure, and is present with a probability Z that satisfies formula (7) below in the concave-convex structure:

$$50\text{ nm} \leq P_{ave} \leq 1500\text{ nm} \quad \text{Formula (5)}$$

$$0.6D_{ave} \geq dn \geq 0 \quad \text{Formula (6)}$$

$$1/10000 \leq Z \leq 1/5. \quad \text{Formula (7)}$$

According to these configurations, since the average interval $P_{ave}$ in the concave-convex structure is shorter than a conventional micro-structure, it is possible to (1) improve the internal quantum efficiency IQE by the dispersion of dislocations within the semiconductor crystal layer and the reduction of the dislocation density. Since it is also possible to (3) increase the specific surface area of the concave-convex structure, it is possible to improve the decrease in the ohmic characteristic caused by a Schottky barrier formed in an interface between the transparent conductive material such as ITO and the p-type semiconductor layer, to enhance the ohmic contact and to enhance the electron injection efficiency EIE.

Furthermore, since the heights or the depths of a plurality of first convex portions or concave portions of the concave-convex structure are not even, and the second convex portions or the second concave portions having a significantly different height or depth are preset in some places with a predetermined probability, in the positions of the second convex portions or the second concave portions, the number of modes disturbing the waveguide mode is increased, and thus it is possible to (2) provide optical scattering (light diffraction or light scattering) and to simultaneously improve the light extraction efficiency LEE. In other words, since it is possible to simultaneously enhance either the internal quantum efficiency IQE and the light extraction efficiency LEE or the electron injection efficiency EIE and the light extraction efficiency LEE, it is possible to enhance the external quantum efficiency EQE of the LED.

In particular, the average interval $P_{ave}$ is equal to or less than 1500 nm, and thus it is possible to increase the density of the concave-convex structure. Thus, it is possible to (1) disperse dislocations produced within the semiconductor crystal layer of the LED element and to lower the dislocation density locally and macroscopically. Consequently, it is possible to enhance the internal quantum efficiency IQE. Even when the height of the concave-convex structure is limited to several hundred nanometers, since it is possible to increase the specific surface area, it is possible to (3) improve the decrease in the ohmic characteristic caused by a Schottky barrier formed in the interface between the transparent conductive material such as ITO and the p-type semiconductor layer and to enhance the ohmic contact, with the result that it is possible to enhance the electron injection efficiency EIE.

On the other hand, the average interval $P_{ave}$ is equal to or more than 50 nm, and the second convex portions or the second concave portions having a significantly different height or depth are included with a predetermined probability, and thus the number of modes disturbing the waveguide mode is increased, and optical scattering (light diffraction or light scattering) can be provided to the light emitted from the LED element, with the result that it is possible to enhance the light extraction efficiency LEE.

It is also possible to further apply an optical phenomenon (light diffraction or light scattering) corresponding to the second convex portion or the second concave portion. In other words, since the number of modes for the waveguide mode of the optical scattering (light diffraction or light scattering) can be increased, the degree of the disturbance of the waveguide mode is increased, with the result that the light extraction efficiency LEE is significantly enhanced. On the other hand, when the wavelength of the emitted light within the LED element is sufficiently higher than the concave-convex structure, the concave-convex structure as seen from the emitted light is averaged by effective medium approximation. Hence, it is impossible to expect the significant improvement of the light extraction efficiency LEE. However, the second convex portion or the second concave portion is provided, and thus it is possible to make the averaged refractive index have disturbance. Thus, it is possible to produce an optical phenomenon (light diffraction or light scattering) corresponding to the disturbance of the average refractive index, and thus the waveguide mode is disturbed, with the result that it is possible to enhance the light extraction efficiency LEE.

In other words, since the average interval $P_{ave}$ in the concave-convex structure satisfies the above range, and thus the density of the concave-convex structure is increased, the internal quantum efficiency IQE is enhanced. Moreover, since the specific surface area of the concave-convex structure is increased, the electron injection efficiency EIE is enhanced. On the other hand, since the minute concave-convex structure is achieved, and thus the optical scattering effect is reduced, the effect of disturbing the waveguide mode is reduced. However, the second convex portion or the second concave portion is included with a predetermined probability, and thus it is possible to apply a new optical phenomenon (light diffraction or light scattering) corresponding to the second convex portion or the second concave portion, with the result that in a state where the enhancement of the internal quantum efficiency IQE is maintained or a state where the enhancement of the electron injection efficiency EIE is maintained, it is possible to enhance the light extraction efficiency LEE. Furthermore, it is also possible to reduce the leak current of the semiconductor light-emitting element.

According to the present invention, there is provided an optical substrate that includes a substrate and a concave-convex structure which is formed in a part or a whole of a surface of the substrate, where at least one part of the concave-convex structure includes a plurality of convex portions arranged apart from each other, at least one of the plurality of convex portions is a unique convex portion that includes one or more convex members or concave members in a surface and an average interval $P_{ave}$ in the concave-convex structure is equal to or more than 1.5 μm but equal to or less than 10 μm.

In this configuration, first, since the average interval $P_{ave}$ in the concave-convex structure is equal to or more than 1.5 μm but equal to or less than 10 μm, the size of the convex portion of the concave-convex structure as seen from the emitted light of the semiconductor light-emitting element is increased. In other words, since light scattering or light ray traceability is significantly realized, the light extraction efficiency LEE is enhanced. Then, since the concave-convex structure is formed with a plurality of convex portions, the semiconductor crystal layer can be grown from the bottom portion of the concave portion in the concave-convex structure, and thus it is possible to stabilize the growth of the semiconductor crystal layer. Here, the unique convex portion is included in a plurality of convex portion groups in the concave-convex structure. As described above, since the unique convex portion is included in a plurality of convex portion groups, the convex member or the concave member in the surface of the unique convex portion disturbs the growth mode, and thus dislocations in the semiconductor crystal layer are reduced and the internal quantum efficiency IQE is enhanced. Consequently, it is possible to simultaneously enhance the light extraction efficiency LEE and the internal quantum efficiency IQE.

According to the present invention, there is provided an optical substrate that includes a substrate main body and a concave-convex structure which is formed in a part or a whole of a surface of the substrate main body, where the concave-convex structure includes: a first concave-convex structure (L) that is provided on a main surface of the substrate main body and that is formed with a plurality of convex portions and concave portions having a first average interval (PL); and a second concave-convex structure (S) that is provided on a surface of at least one of the convex portion and the concave portion forming the first concave-convex structure (L) and that is formed with a plurality of convex portions and concave portions having a second average interval (PS), and a ratio (PL/PS) between the first average interval (PL) and the second average interval (PS) is more than 1 but equal to or less than 2000.

According to the present invention, there is provided an optical substrate that includes a substrate main body and a concave-convex structure which is formed in a part or a whole of a surface of the substrate main body, where the concave-convex structure includes: a first concave-convex structure (S) that is provided on a main surface of the substrate main body and that is formed with a plurality of convex portions and concave portions having a first average interval (PS); and a second concave-convex structure (L) that includes a plurality of convex portions which are provided apart from each other on a surface of the first concave-convex structure (S) such that the first concave-convex structure (S) is partially exposed and which have a second average interval (PL), and a ratio (PL/PS) between the first average interval (PS) and the second average interval (PL) is more than 1 but equal to or less than 2000.

In this configuration, within one concave-convex structure surface, the concave-convex structure for improving the internal quantum efficiency IQE and the concave-convex structure for improving the light extraction efficiency LEE can be combined in a predetermined arrangement relationship. Hence, it is possible to simultaneously realize both functions. In other words, the high-density concave-convex structure and the concave-convex structure having wide variations in volume are provided in a predetermined arrangement relationship, and thus it is possible to improve the internal quantum efficiency IQE with the high-density concave-convex structure and to simultaneously improve the light extraction efficiency LEE with the concave-convex structure having wide variations in volume.

According to the present invention, there is provided a semiconductor light-emitting element including at least one or more of the optical substrates described above.

According to the present invention, there is provided a semiconductor light-emitting element, where on the concave-convex structure surface of the optical substrate described above, at least a first semiconductor layer, a light-emitting semiconductor layer and a second semiconductor layer are deposited in this order.

According to the present invention, there is provided a method of manufacturing a semiconductor light-emitting element, the method including: a step of preparing the optical substrate described above; a step of optically inspect the prepared optical substrate; and a step of manufacturing a semiconductor light-emitting element by using the optically inspected optical substrate.

In this configuration, since it is possible to previously evaluate the minute concave-convex structure that facilitates the improvement of the internal quantum efficiency IQE, it is possible to previously predict the performance rank of the semiconductor light-emitting element to be manufactured. Furthermore, since it is possible to previously insect and manage the concave-convex structure of the optical substrate, it is possible to enhance the yield in the manufacturing of the LED element.

Advantageous Effect of the Invention

According to the present invention, it is possible to provide an optical substrate and a semiconductor light-emitting element and a method of manufacturing them that can simultaneously achieve either the enhancement of the light extraction efficiency LEE and the improvement of the internal quantum efficiency IQE in an LED element or the enhancement of the light extraction efficiency LEE and the enhancement of the electron injection efficiency EIE, which are regarded as tradeoff.

BEST MODE FOR CARRYING OUT THE INVENTION

The present inventors et al. have focused on the fact that in an optical substrate having a concave-convex structure, the improvement of an internal quantum efficiency IQE by dispersing dislocations within a semiconductor crystal and reducing a dislocation density through the change of the size of the interval in the concave-convex structure and the improvement of a light extraction efficiency LEE by removing a waveguide mode through light scattering are in the relationship of tradeoff. The present inventors et al. also have focused on the fact that with consideration given to the attenuation of emitted light by absorption, in order to lower an ohmic resistance to enhance an ohmic contact, it is necessary to provide a minute concave-convex structure whose interval is small but in the concave-convex structure whose interval is small, the light extraction efficiency LEE is lowered. Then, the present inventors et al. have found that the interval between convex portions or concave portions in the concave-convex structure is within a predetermined range, and the concave-convex structure is provided such that concave portions whose concave portion height is lower than the average convex portion height or concave portions whose concave portion depth is lower than the average concave portion depth are present with a predetermined probability, with the result that it is possible to realize the improvement of the internal quantum efficiency IQE by dispersing dislocations within the semiconductor crystal and reducing the dislocation density and the improvement of the light extraction efficiency LEE by removing the waveguide mode through optical light scattering or the improvement of the electron injection efficiency EIE by the enhancement of the ohmic contact and the improvement of the light extraction efficiency LEE by removing the waveguide mode through light scattering. Then, they have completed the present invention.

Embodiment of the present invention will be described in detail below with reference to accompanying drawings.

An optical substrate according to the present invention will be described in detail with reference to the drawings. The optical substrate of the present invention is a substrate that is adjacent to a light-emitting semiconductor layer, that is, a substrate that is adjacent to any of an n-type semiconductor layer, a light-emitting semiconductor layer and a p-type semiconductor layer in a semiconductor light-emitting element formed with at least one or more n-type semiconductor layers, at least one or more p-type semiconductor layers and one or more light-emitting layers.

Figure 1:
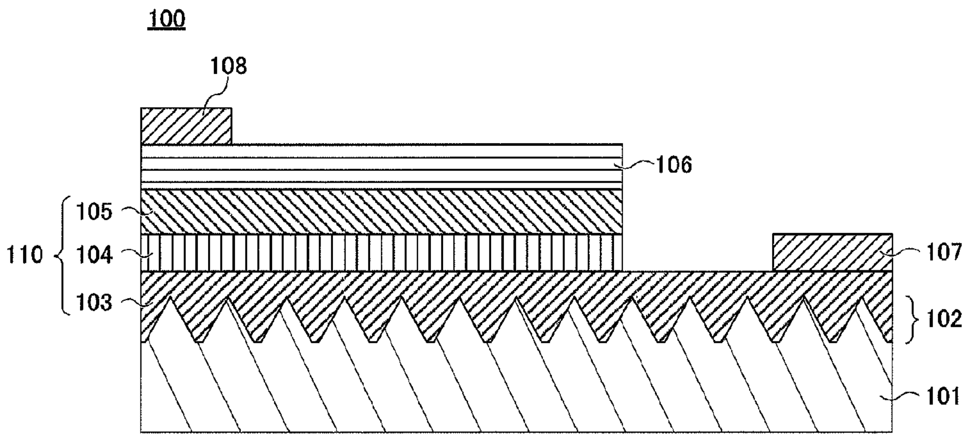
FIG. 1 A cross-sectional schematic view of a semiconductor light-emitting element that applies an optical substrate according to the present embodiment.

For example, FIG. 1 is a cross-sectional schematic view of a semiconductor light-emitting element that applies the optical substrate according to the present embodiment.

As shown in FIG. 1, in the semiconductor light-emitting element 100, on a concave-convex structure 102 provided on a main surface of the optical substrate 101, an n-type semiconductor layer 103, a light-emitting semiconductor layer 104 and a p-type semiconductor layer 105 are sequentially deposited. On the p-type semiconductor layer 105, a transparent conductive film 106 is formed. A cathode electrode 107 is formed on the surface of the n-type semiconductor layer 103, and an anode electrode 108 is formed on the surface of the transparent conductive film 106. The n-type semiconductor layer 103, the light-emitting semiconductor layer 104 and the p-type semiconductor layer 105 sequentially deposited on the optical substrate 101 are referred to as a deposited semiconductor layer 110.

Although in FIG. 1, on the concave-convex structure 102 provided on the one main surface of the optical substrate 101, the semiconductor layers 103, 104 and 105 are sequentially deposited, on the other main surface opposite the surface on which the concave-convex structure 102 of the optical substrate 101 is provided, the semiconductor layers may be sequentially deposited.

Figure 2:
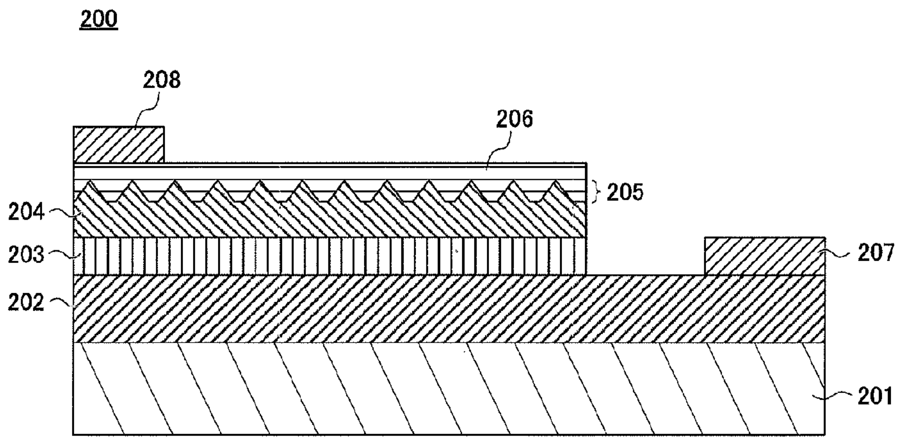
FIG. 2 A cross-sectional schematic view of another example of the semiconductor light-emitting element that applies the optical substrate according to the present embodiment.

FIG. 2 is a cross-sectional schematic view of another example of the semiconductor light-emitting element that applies the optical substrate according to the present embodiment. As shown in FIG. 2, in a semiconductor light-emitting element 200, on a substrate 201, an n-type semiconductor layer 202, a light-emitting semiconductor layer 203 and a p-type semiconductor layer 204 are sequentially deposited. On the p-type semiconductor layer 204, a transparent conductive film 206 is provided that is the optical substrate of the present embodiment having a concave-convex structure 205 on a main surface in contact with the p-type semiconductor layer 204. A cathode electrode 207 is formed on the surface of the n-type semiconductor layer 202, and an anode electrode 208 is formed on the surface of the transparent conductive film 206.

Although in FIG. 2, the main surface on which the concave-convex structure 205 of the transparent conductive film 206 is provided is adjacent to the p-type semiconductor layer 204, the concave-convex structure 205 of the transparent conductive film 206 may be provided on a main surface opposite the p-type semiconductor layer 204.

Figure 3:
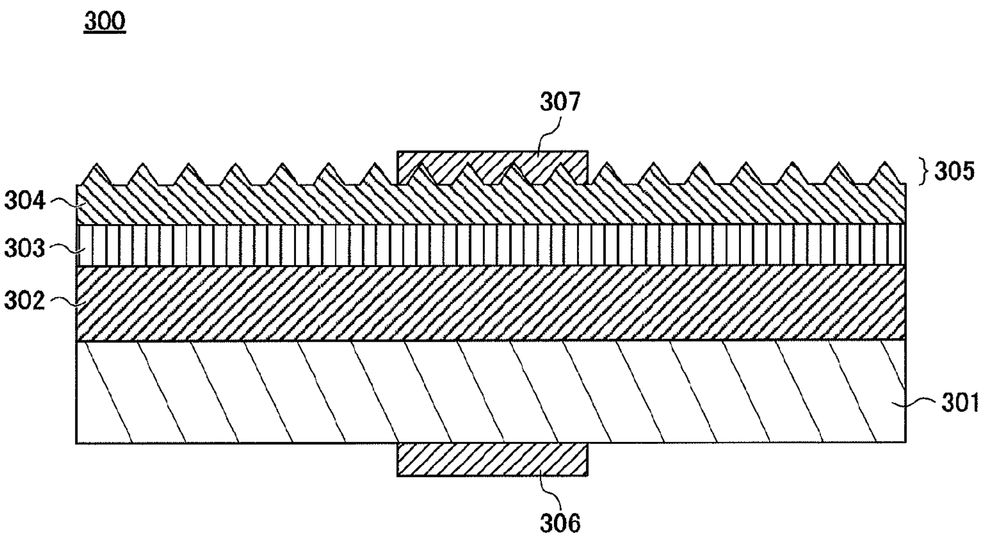
FIG. 3 A cross-sectional schematic view of another example of the semiconductor light-emitting element that applies the optical substrate according to the present embodiment.

FIG. 3 is a cross-sectional schematic view of another example of the semiconductor light-emitting element that applies the optical substrate according to the present embodiment. As shown in FIG. 3, in a semiconductor light-emitting element 300, on a substrate 301, an n-type semiconductor layer 302, a light-emitting semiconductor layer 303 and a p-type semiconductor layer 304 that is the optical substrate of the present invention in which a concave-convex structure 305 is provided on a main surface opposite the light-emitting semiconductor layer 303 are sequentially deposited. A cathode electrode 306 is formed on a main surface on the opposite side to the main surface in contact with the n-type semiconductor layer 302 of the substrate 301, and an anode electrode 307 is formed on the surface of the p-type semiconductor layer 304.

Although the semiconductor light-emitting elements 100, 200 and 300 shown in FIGS. 1 to 3 are the examples of a case where the optical substrate of the present embodiment is applied to the semiconductor light-emitting element of a double heterostructure, the deposited structure of the deposited semiconductor layer is not limited to these examples. Between the optical substrates 101, 201 and 301 and the n-type semiconductor layer 302, an unillustrated buffer layer may be provided.

Figure 4A:
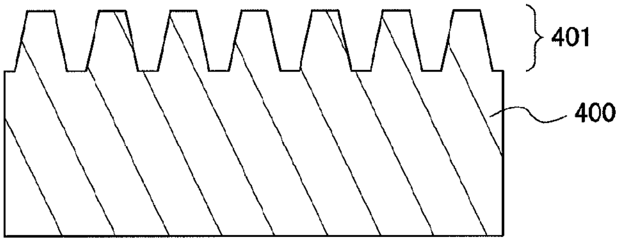
FIG. 4 A cross-sectional schematic view of the optical substrate according to the present embodiment.
Figure 4B:
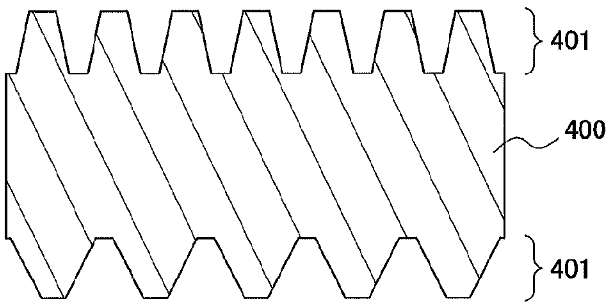

The configuration of the optical substrate according to the present embodiment will then be described with reference to the drawings. FIG. 4 is a cross-sectional schematic view of the optical substrate according to the present embodiment; FIG. 4A shows a case where one surface of an optical substrate 400 has a concave-convex structure 401, and FIG. 4B shows a case where both surfaces of the optical substrate 400 have the concave-convex structure 401. As shown in FIG. 4B, the concave-convex structure 401 may be provided on both surfaces of the optical substrate 400. Here, the concave-convex structure 401 that satisfies the scope of the present invention is preferably formed on at least one surface of the optical substrate 400.

The reason why the optical substrate according to the present embodiment is used either to enhance the internal quantum efficiency IQE or to simultaneously enhance the electron injection efficiency EIE and the light extraction efficiency LEE is as follows.

The internal quantum efficiency IQE is reduced by dislocations generated by a mismatch (lattice mismatch) between the lattice constant of the optical substrate and the lattice constant of the semiconductor crystal layer. Here, when on the surface of the optical substrate, a concave-convex structure having about the same density as a dislocation density or higher is provided, it is possible to disturb the crystal growth mode of the semiconductor crystal layer, and it is possible to disperse the dislocations within the semiconductor crystal layer according to the concave-convex structure. In other words, it is possible to reduce the dislocation density both microscopically and macroscopically. Hence, it is possible to enhance the internal quantum efficiency IQE.

The electron injection efficiency EIE is lowered by an increase in contact resistance resulting from a Schottky barrier. The optical substrate is provided on the outermost surface of a semiconductor light-emitting element having a deposited semiconductor layer configured by depositing at least two or more semiconductor layers and a light-emitting layer, and thus the contact area of a transparent conductive film or an electrode pad formed on the surface is increased according to the specific surface area of the concave-convex structure, with the result that it is possible to reduce the contact resistance. Hence, the ohmic contact is enhanced, and thus it is possible to enhance the electron injection efficiency EIE.

However, in order either to enhance the internal quantum efficiency IQE or to enhance the electron injection efficiency EIE, it is necessary to provide a minute concave-convex structure on the order of nanometers. As in order either to enhance the internal quantum efficiency IQE or to enhance the electron injection efficiency EIE, the density and the specific surface area of the concave-convex structure are enhanced, the size of the concave-convex structure when seen from the wavelength of emitted light is decreased, with the result that the optical scattering effect is reduced. In other words, since the effect of disturbing the waveguide mode is reduced, the degree to which the light extraction efficiency LEE is enhanced is decreased.

Here, the present inventors et al. have found that by adding partial disturbance to a basic concave-convex structure, it is possible to add a new optical phenomenon (light diffraction or light scattering) corresponding to the disturbance to the function (the enhancement of the internal quantum efficiency IQE or the enhancement of the electron injection efficiency EIE by the minute concave-convex structure) realized by the original concave-convex structure. Specifically, since it is possible both to enhance, with a high-density concave-convex structure, the internal quantum efficiency IQE or the electron injection efficiency EIE (the original function) and to apply the new optical phenomenon (light diffraction or light scattering) corresponding to the disturbance of the concave-convex structure (a second convex portion or a second concave portion), in a state where the enhancement of the internal quantum efficiency IQE or the electron injection efficiency EIE is maintained, it is possible to enhance the light extraction efficiency LEE. The present principle will be described in detail below including actual examinations.

When the wavelength of light is about equal to or less than the size of the concave-convex structure, as the optical phenomenon, light diffraction occurs. On the other hand, when the wavelength of light is sufficiently large, an effective medium approximation effect is produced.

In the former case, on a microscopic scale such as each concave-convex structure, light diffraction occurs whereas in the case of a highly regular arrangement, the number of modes of light diffraction is limited. In other words, the number of diffraction points that disturb the waveguide mode is limited. On the other hand, when disturbance is included, it is thought that the number of modes of light diffraction corresponding to the disturbance is increased. Specifically, when observation is performed on a macroscopic scale such as a few tens of micrometers, since the average light of emitted light caused by a plurality of light diffraction modes is observed, the concave-convex structure including the disturbance produces optical scattering (light diffraction or light scattering). In such optical scattering (light diffraction or light scattering), the effect of disturbing the waveguide mode is great. More specifically, since the emitted light in which the waveguide mode is disturbed significantly lowers the probability that the waveguide mode is formed again, it is possible to significantly enhance the light extraction efficiency LEE. On the other hand, in the latter case, it is thought that the averaged refractive-index distribution forms a distribution corresponding to the disturbance of the concave-convex structure. Hence, since the light acts as if a medium having an effective medium approximation refractive index with an outer shape corresponding to the distribution were present, it is possible to newly realize an optical phenomenon (light diffraction or light scattering) corresponding to the distribution, with the result that it is possible to enhance the light extraction efficiency LEE.

For example, in a concave-convex structure that is formed with a plurality of convex portions and concave portions arranged in the form of a hexagonal lattice whose average interval $P_{ave}$ is 460 nm, as seen from light having a wavelength of 550 nm, light diffraction corresponding to the average interval $P_{ave}$ occurs. Hence, as a result of a visual observation, glare (diffraction color) corresponding to the diffracted light was observed (hereinafter also referred to as the "original optical phenomenon"). Then, a second convex portion (or a second concave portion) was added to the concave-convex structure. In this case, it was confirmed that in addition to the original optical phenomenon (light diffraction phenomenon) corresponding to the average interval $P_{ave}$, a scattering component corresponding to the second convex portion (or the second concave portion) was further included. Here, as a result of an optical measurement using light of a wavelength (for example, 550 nm) that was about equal to the average interval $P_{ave}$ and that produced light diffraction, it was confirmed that as compared with the case where a concave-convex structure having free from the second convex portion (or the second concave portion) was a target, the degree of scattering in the case where the concave-convex structure having the second convex portion (or the second concave portion) was a target was more increased. This is thought that when seen from light having a wavelength of 550 nm, the convex portion in the concave-convex structure functions as a diffraction point whereas when the regularity of the arrangement of the convex portions in the concave-convex structure is high, the number of diffraction modes is limited by the arrangement. On the other hand, it is thought that when the second convex portion (or the second concave portion) is included in the concave-convex structure, the number of diffraction modes is increased and dispersion is included. For example, a haze for a sapphire substrate in which a plurality of convex portions having an average interval $P_{ave}$ of 300 nm were arranged in the form of a regular hexagonal lattice was half as great as a haze for a sapphire substrate in which a plurality of convex portions having an average interval $P_{ave}$ of 300 nm were arranged in the form of a regular hexagonal lattice and which included the second convex portion dispersed at a rate of 1% and having a height of 0 nm. When a visual observation was performed, a lilac diffraction color corresponding to the average interval $P_{ave}$ was confirmed whereas when the second convex portion was included, turbidity was added to the lilac diffraction color. It is found from what has been described above that the concave-convex structure including the second convex portion (or the second concave portion) is used, it is possible to realize optical scattering. In other words, even when a minute concave-convex structure is used, it is possible to disturb the waveguide mode by scattering, with the result that it is possible to enhance the light extraction efficiency LEE.

For example, a concave-convex structure that is formed with a plurality of convex portions and concave portions arranged in the form of a hexagonal lattice whose average interval $P_{ave}$ is 200 nm, as seen from light having a wavelength of 550 nm, is averaged by an effective medium approximation effect. When the concave-convex structure was provided on a transparent substrate, and a visual observation was performed, the transparent substrate in which very little light is reflected was observed. This is generally called an anti-reflective film or a moth-eye structure. This is because a concave-convex structure which is sufficiently smaller than the wavelength of light is averaged by an effective medium approximation action, as seen from the light. Here, it was confirmed that when the concave-convex structure includes the second convex portion (or the second concave portion), in addition to the original optical phenomenon (anti-reflective effect) corresponding to the average interval $P_{ave}$, a scattering component corresponding to the second convex portion (or the second concave portion) was further included. In other words, as a result of an optical measurement using light of a wavelength (for example, 550 nm) sufficiently larger than the average interval $P_{ave}$, it was confirmed that the scattering component was significantly decreased. This is thought that when a concave-convex structure free from the second convex portion (or the second concave portion) is used, the effective medium approximation action is exerted, and thus the measurement becomes equivalent to an optical measurement for a thin film having an even effective medium approximation refractive index Nema within the surface. On the other hand, when the concave-convex structure including the second convex portion (or the second concave portion) was a target to be measured, it was confirmed that the scattering component was increased. This is thought that since a distribution is added to the effective medium approximation refractive index Nema, light used for the optical measurement acts as if a medium which has the effective medium approximation refractive index Nema with an outer shape corresponding to the second convex portion (or the second concave portion) were measured. For example, a haze for convex portions arranged in the form of a regular hexagonal lattice having an average interval $P_{ave}$ of 200 nm was 0.65 times as great as a haze for a concave-convex structure having an average interval $P_{ave}$ of 200 nm and including the second convex portion. As a result of a visual observation, the concave-convex structure free from the second convex portion was significantly transparent whereas when the concave-convex structure includes the second convex portion, turbidity was confirmed. It is found from what has been described above that the concave-convex structure including the second convex portion (or the second concave portion) is used, it is possible to realize optical scattering. In other words, even when a concave-convex structure is smaller than the wavelength of light, it is possible to disturb the waveguide mode by scattering, with the result that it is possible to enhance the light extraction efficiency LEE.

As described above, it is found that the second convex portion (or the second concave portion) is added to the concave-convex structure, and thus it is possible to newly add scattering corresponding to the second convex portion (or the second concave portion). In other words, since even in a high-density concave-convex structure which cannot sufficiently disturb the waveguide mode originally, the second convex portion (or the second concave portion) is included, and thus it is possible to realize scattering corresponding to the second convex portion (or the second concave portion), in a state where the internal quantum efficiency IQE or the electron injection efficiency EIE is maintained, it is possible to enhance the light extraction efficiency LEE.

As described above, it is suggested that the second convex portion is added to the concave-convex structure, and thus the internal quantum efficiency IQE can be improved by the minute concave-convex structure, and that the light extraction efficiency LEE can be improved by optical scattering (light diffraction or light scattering) newly produced by the second convex portion. A phenomenon that was observed when a semiconductor crystal layer was formed into a film on the optical substrate including the second convex portion will then be described.

Although described in detail later, it has been discovered that the existence probability Z of the second convex portion is equal to or less than a predetermined value, and thus the leak current of the semiconductor light-emitting element is more improved. In other words, the subject of the present invention is the improvement of the IQE described above, the improvement of the LEE and the reduction of the leak current.

Figure 5:
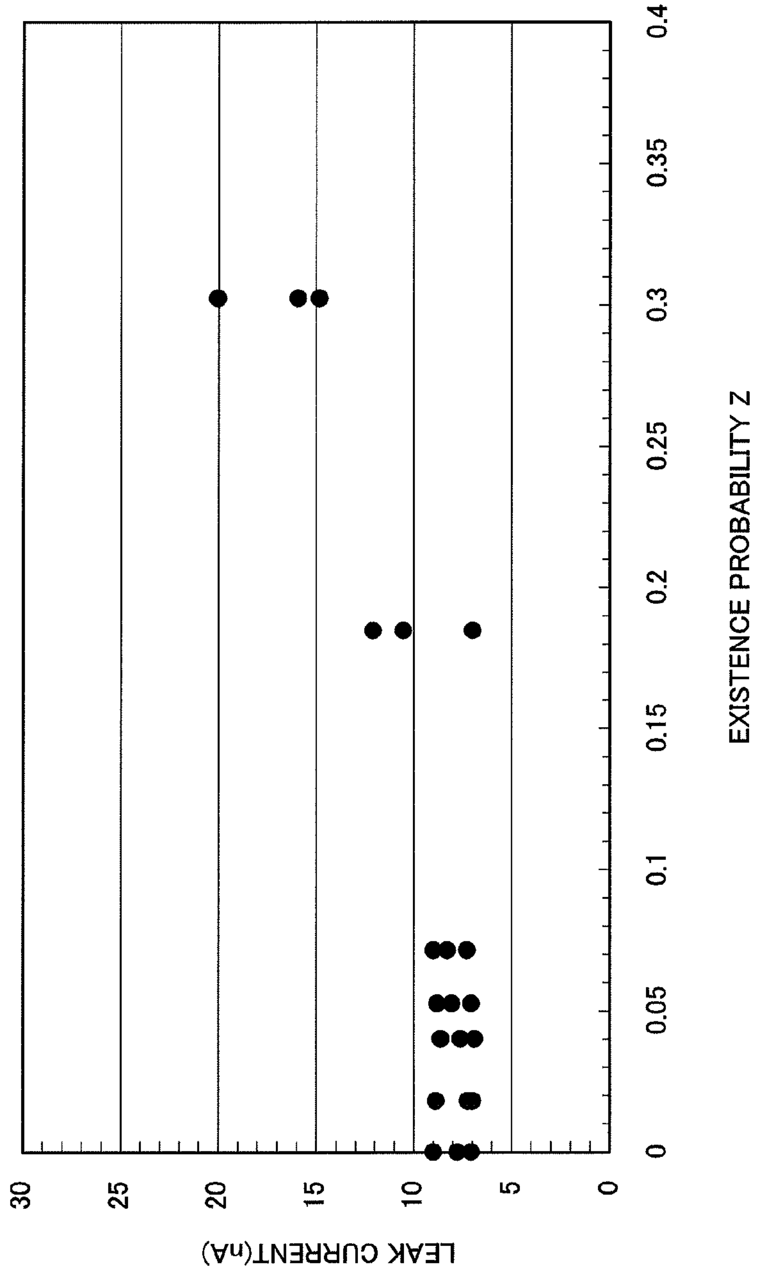
FIG. 5 A graph showing a relationship between the existence probability Z of a second convex portion and a leak current in the semiconductor light-emitting element that applies the optical substrate according to the present embodiment.

FIG. 5 is a graph showing a relationship between the existence probability Z of the second convex portion and the leak current in the semiconductor light-emitting element applying the optical substrate according to the present embodiment. The existence probability Z of the second convex portion was used as a parameter, and on the sapphire substrate (optical substrate), a buffer layer, a uGaN layer, an nGaN layer, an MQW layer and a pGaN layer were formed into a film by a MOCVD method. Then, ITO was formed into a film, mesa etching was performed and finally, a metal pad pattern consisting of Cr/Ti/Au was formed. In this state, the leak current was measured. FIG. 5 is a diagram showing the effect of the existence probability Z of the second convex portion on the leak current, where the horizontal axis represents the existence probability Z and the vertical axis represents the leak current value. FIG. 5 shows that when the existence probability Z is low, the leak current is more improved, and a satisfactory diode characteristic is indicated. It is also found that as the existence probability Z is increased from a starting point that is the area where the existence probability Z is about 1/5, the leak current is rapidly increased. For example, the leak current when the existence probability Z is 1/3.3 was 1.7 to 2.9 times as great as that when the existence probability Z is 1/55. In other words, it was confirmed that the diode characteristic was significantly degraded. Here, when the existence probability Z was used as a parameter, and the growth of the semiconductor crystal layer was checked, it was confirmed that as the existence probability Z was higher, the specific growth of the semiconductor crystal layer occurs from the vicinity of the second convex portion. Here, the specific growth means that the growth rate is higher than that therearound.

Figure 6A:
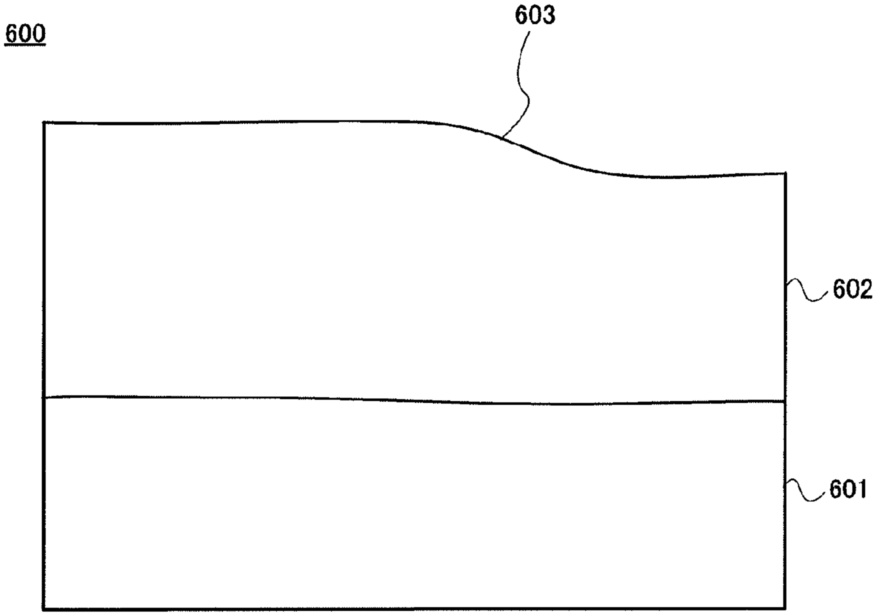
FIG. 6 A diagram that is produced based on an electron micrograph obtained by shooting the optical substrate in which a semiconductor crystal layer is specifically grown on its surface so that the effect of the optical substrate according to the present invention is described.
Figure 6B:
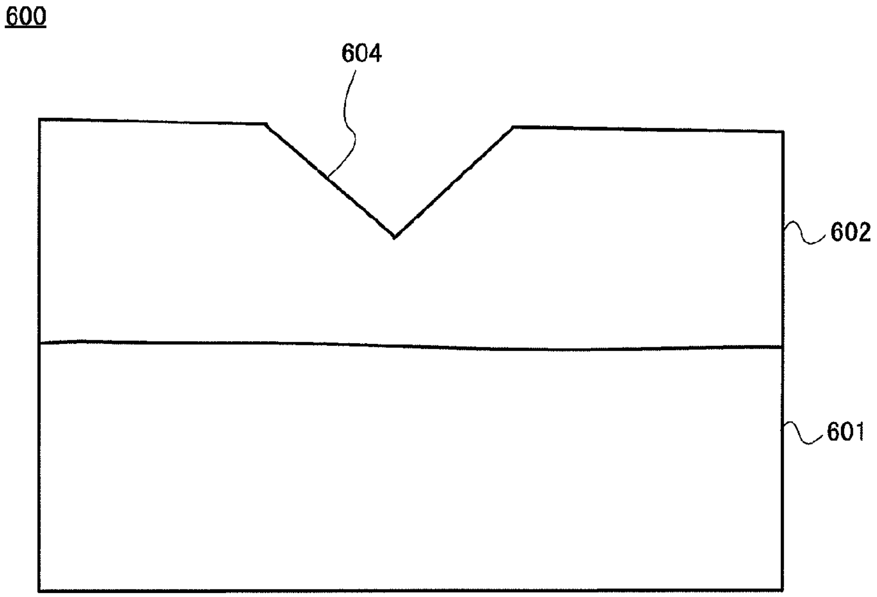

FIG. 6 is a diagram that is produced based on an electron micrograph obtained by shooting the optical substrate in which the semiconductor crystal layer is specifically grown on its surface so that the effect of the optical substrate according to the present invention is described. The optical substrate 600 shown in FIGS. 6A and 6B has the concave-convex structure in which the existence probability Z is 1/3.3. This corresponds to a case where the existence probability Z is 0.3 in the graph shown in FIG. 5. FIG. 6A shows that convex unevenness 603 is generated in the farthest surface of a semiconductor crystal layer 602 from a sapphire substrate 601. The unevenness 603 is caused by the semiconductor crystal layer that is rapidly grown by the formation of an aggregation of the second convex portions due to a high existence probability Z. On the other hand, FIG. 6B shows that concave unevenness 604 is generated in the farthest surface of the semiconductor crystal layer 602 from the sapphire substrate 601. This is caused by the collision of the semiconductor crystal layers specifically grown in the second convex portion due to the fact that the aggregations of the second convex portions produced by a high existence probability Z are adjacent. When the specific growth of the semiconductor crystal layers described above occurs, the diode characteristic of the semiconductor light-emitting element is lowered, and the leak current is increased. It is found from what has been described above that by making the existence probability Z equal to or less than a predetermined value, it is possible to reduce the displacement of a p-n junction interface in the semiconductor crystal layer, that is, the displacement of a band gap in a band diagram, with the result that it is possible to more satisfactorily reduce the leak current.

Figure 7A:
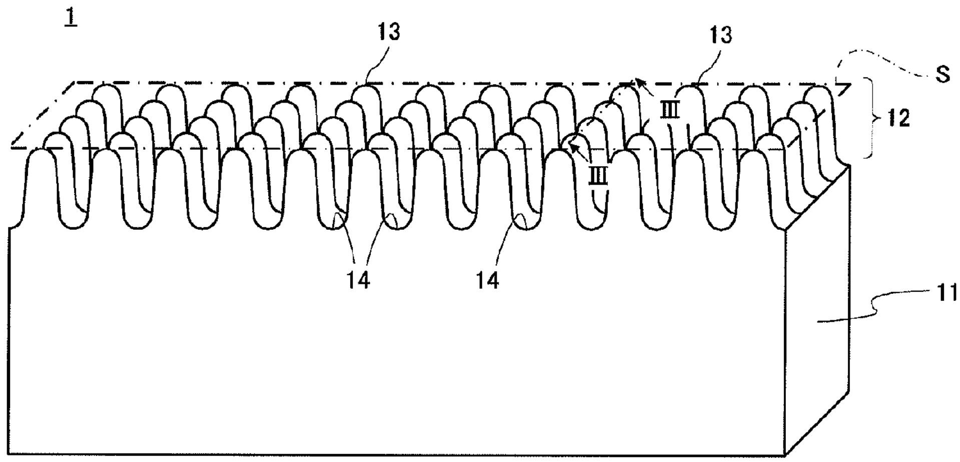
FIG. 7 A schematic perspective view showing an optical substrate (I) according to a first embodiment.

The configuration of an optical substrate (I) 1 according to a first embodiment of the present invention will be described with reference to FIG. 7. FIG. 7A is a schematic perspective view showing the optical substrate (I) 1 according to the first embodiment. As shown in FIG. 7A, the optical substrate (I) 1 is formed substantially in the shape of a flat plate. The optical substrate (I) 1 includes a substrate main body 11 and a concave-convex structure 12 provided on one surface of the substrate main body 11. The concave-convex structure 12 is formed with a plurality of convex portions 13 that are independent of each other and continuous concave portions 14 provided between the convex portions 13. The convex portions 13 are arranged a predetermined interval apart from each other. The concave-convex structure 12 is arranged in the thickness direction of the substrate main body 11.

Figure 8A:
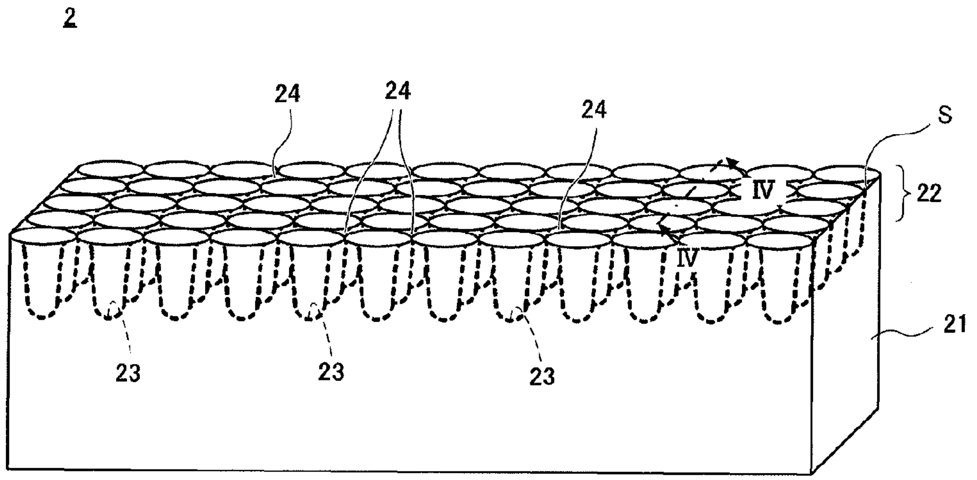
FIG. 8 A schematic perspective view showing an optical substrate (II) according to a second embodiment.

The configuration of an optical substrate (II) 2 according to a second embodiment of the present invention will be described. FIG. 8A is a schematic perspective view showing the optical substrate (II) 2 according to the second embodiment. As shown in FIG. 8A, the optical substrate (II) 2 includes a substrate main body 21 and a concave-convex structure 22 provided on the surface of the substrate main body 21. The concave-convex structure 22 is formed with a plurality of concave portions 23 that are independent of each other and continuous convex portions 24 provided between the concave portions 23. The concave-convex structure 22 is arranged in the thickness direction of the substrate main body 21, and includes a plurality of concave portions 23 that are recessed. The concave portions 23 are independent of each other, and are arranged a predetermined interval from each other.

In the optical substrates (I) 1 and (II) 2 described above, the surface of the substrate main bodies 11 and 21 may be processed to provide the concave-convex structures 12 and 22 or the concave-convex structures 12 and 22 may be added separately on the surface of the substrate main bodies 11 and 21.

For example, when a sapphire substrate is processed, both the substrate main bodies 11 and 21 and the concave-convex structures 12 and 22 are formed of sapphire. For example, when in a layered product formed with a sapphire substrate, an n-type semiconductor layer, a light-emitting layer, a p-type semiconductor layer and a transparent conductive film, the transparent conductive film is processed, the concave-convex structures 12 and 22 are formed with the transparent conductive film. These are the states illustrated in FIGS. 7A and 8A.

For example, in a layered product formed with a sapphire substrate, an n-type semiconductor layer, a light-emitting layer, a p-type semiconductor layer and a transparent conductive film, the concave-convex structures 12 and 22 can be added separately on the transparent conductive film. This is the state illustrated in FIGS. 7B and 8B. In this case, the materials of the transparent conductive film and the concave-convex structure may be the same as or different from each other.

Figure 8B:
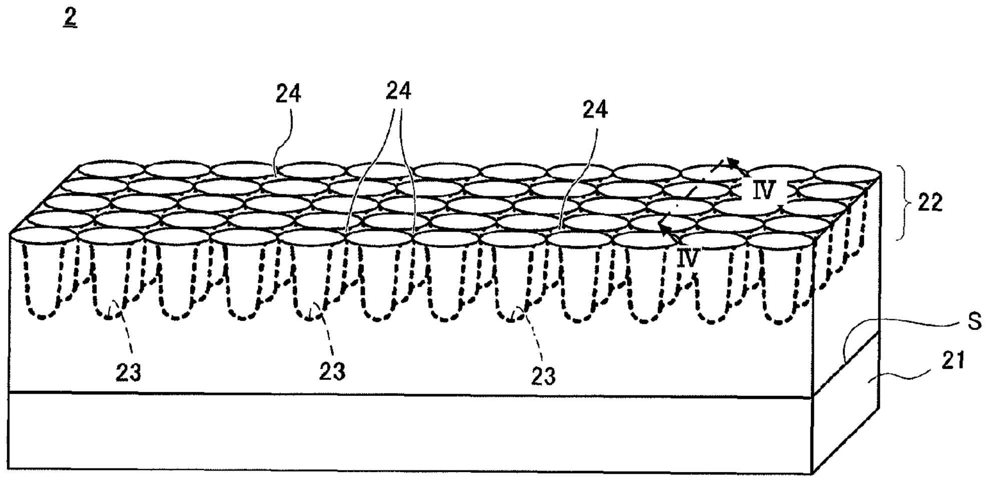
Figure 9:
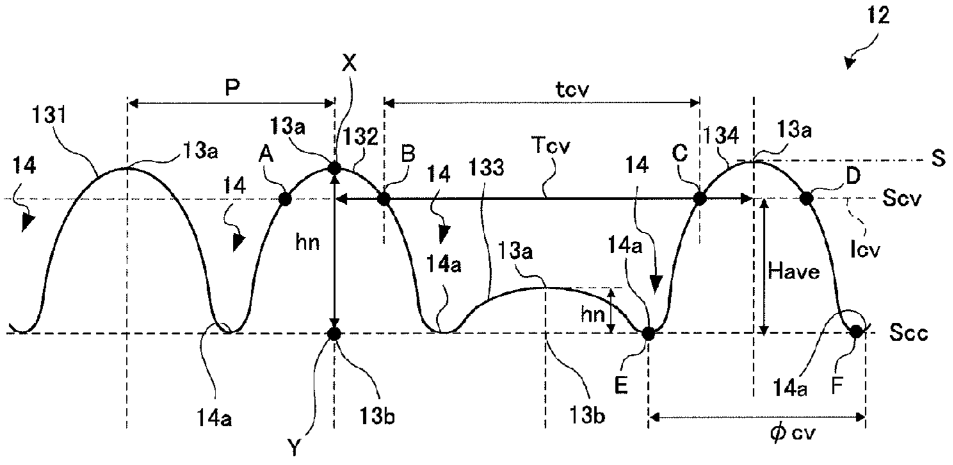
FIG. 9 A vertical cross-sectional view taken along a long and short dashed line III-III in FIGS. 7A and 7B.
Figure 10:
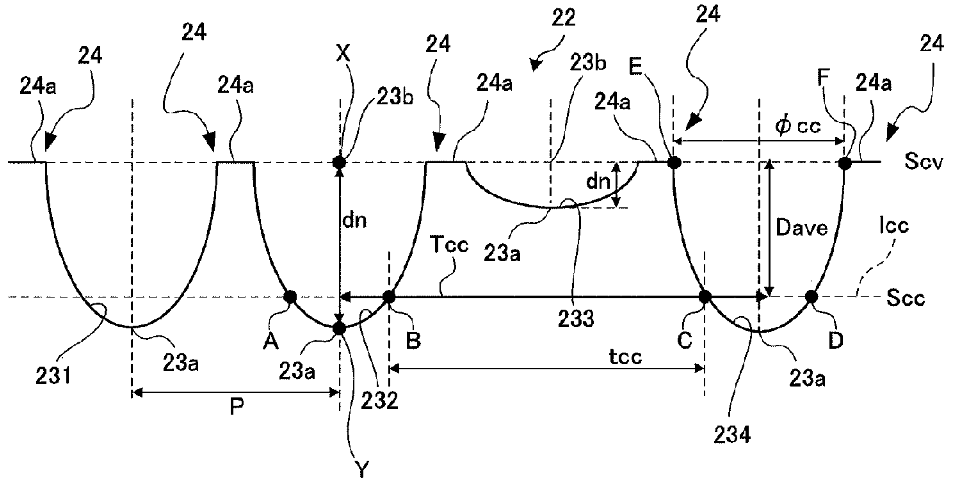
FIG. 10 A vertical cross-sectional view taken along a long and short dashed line IV-IV in FIGS. 8A and 8B.

The configuration of the concave-convex structures 12 and 22 in the optical substrates (I) 1 and (II) 2 according to the first and second embodiments of the present invention will then be described with reference to FIGS. 9 and 10. FIG. 9 is a vertical cross-sectional view taken along a long and short dashed line III-III in FIGS. 7A and 7B, and schematically shows the configuration of the concave-convex structure 12. FIG. 10 is a vertical cross-sectional view taken along a long and short dashed line IV-IV in FIGS. 8A and 8B, and schematically shows the configuration of the concave-convex structure 22.

Optical Substrate (I) 1

The optical substrate (I) 1 according to the first embodiment will first be described. As shown in FIG. 9, in the cross section, a plurality of convex portions 131, 132, 133 and 134 are aligned an interval apart from each other. The areas between the convex portions 131 to 134 are continuously connected by the concave portions 14.

Various symbols and the definition of terms shown in FIG. 9 will be described below.

Scv

A symbol Scv shown in FIG. 9 indicates a convex portion average position. The convex portions are arranged in the thickness direction of the substrate main body 11. The convex portion average position Scv means an in-plane average position of convex portion vertexes 13*a* of the convex portions 131 to 134 in the concave-convex structure 12, and the plane is a plane parallel to the direction of the surface of the substrate main body 11.

The convex portion average position Scv is determined according to the following definition. First, on the surface (hereinafter referred to as a concave-convex structure surface) on which the concave-convex structure 12 of the optical substrate (I) 1 is formed, a 50 μm×50 μm square region parallel to the main surface of the substrate main body 11 is taken. Then, the 50 μm×50 μm square region is divided into twenty five 10 μm×10 μm square regions. Then, 5 regions are arbitrarily selected from the twenty five 10 μm×10 μm square regions. Here, the selected 10 μm×10 μm square regions are referred to as a region A, a region B, a region C, a region D and a region E. Thereafter, the region A is observed at high magnification, and is magnified until at least 100 convex portions 13 are clearly observed. Then, 10 convex portions 13 are arbitrarily selected from the observed convex portions 13, and the height of each of the convex portions 13 is determined. The highest height among the 10 convex portions 13 measured from the region A is assumed to be ha. On the region B, the region C, the region D and the region E, the same operation as on the region A is also performed, and hb, hc, hd and he are determined. The convex portion average position Scv shown in FIG. 9 is above a concave portion average position Scc, which will be described below, that is, is a position that is moved from the concave portion average position Scc by a distance corresponding to (ha+hb+hc+hd+he)/5 in the direction of the vertex 13*a* of the convex portion 13. The vertex 13*a* of each of the convex portions 13 can be determined by a measurement utilizing Tilt in an observation using a scanning electron microscope for the cross section of the optical substrate (I) 1, in an observation using an atomic force microscope for the concave-convex structure surface of the optical substrate (I) 1 or in an observation of a scanning electron microscope for the surface of the optical substrate (I) 1.

As shown in FIG. 9, the heights of a plurality of convex portions 131 to 134 are substantially the same but are not uniform, and the second convex portion 133 whose height is low is mixed. In FIG. 9, the convex portion average position Scv of the convex portions 131 to 134 is lower than the vertexes 13*a* of the convex portions 13 in the first convex portions 131, 132 and 134. This shows, from the above definition, a case where a distribution is present in the heights of the first convex portions 131, 132 and 134. On the other hand, although not shown, when a distribution is present in the heights of the first convex portions 131, 132 and 134, the convex portion average position Scv may be located slightly above the vertexes 13*a* of the first convex portions 131, 132 and 134. Moreover, although not shown, when the heights of the first convex portions 131, 132 and 134 are substantially uniform or uniform, the convex portion average position Scv is substantially equal to or completely equal to the vertexes 13*a* of the first convex portions 131, 132 and 134.

Scc

A symbol Scc shown in FIG. 9 indicates the concave portion average position. The concave portion average position Scc means an in-plane average position of concave portion vertexes 14*a* of the concave portions 14 in the concave-convex structure 12, and the plane is a plane parallel to the direction of the surface of the optical substrate (I) 1. The concave portions 14 are continuous to each other, and the convex portions 131 to 134 are separated from each other by the concave portions 14. The concave portion average position Scc is preferably determined from the average of 10 concave portion vertexes 14*a*. The vertex 14*a* of each of the concave portions 14 can be determined by an observation using a scanning electron microscope for the cross section of the optical substrate (I) 1 or by an observation using an atomic force microscope for the concave-convex structure surface of the optical substrate (I) 1. The average in the present specification means an arithmetic average. The observation described above is defined as being performed within a range which will be described below. The convex portion average position Scv is a position that is moved from the observed and measured concave portion average position Scc by a distance corresponding to (ha+hb+hc+hd+he)/5 toward the vertex 13*a* of the convex portion 13.

Icv

A symbol Icy shown in FIG. 9 indicates a line segment on the flat plane formed by the convex portion average position Scv. Hence, the line segment Icy is a plane parallel to the direction of the surface of the substrate main body 11.

$H_{ave}$

A symbol $H_{ave}$ shown in FIG. 9 indicates an average convex portion height. The average convex portion height $H_{ave}$ is a distance between the convex portion average position Scv and the concave portion average position Scc. Hence, the average convex portion height $H_{ave}$ is (ha+hb+hc+hd+he)/5 calculated when the convex portion average position Scv is determined.

hn

A symbol hn shown in FIG. 9 indicates a convex portion height of each of the convex portions 131 to 134. The convex portion height hn means a distance between the center 13*b* of the bottom portion of each of the convex portions 131 to 134 in the concave portion average position Scc and the vertex 13*a* of the convex portion 13. In other words, the convex portion height hn corresponds to the height of the vertex 13*a* of each of the convex portions 131 to 134 with respect to the concave portion average position Scc. For example, when the thickness direction of the optical substrate (I) 1 is not parallel to a line segment connecting the center 13*b* of the bottom portion of the convex portion 13 and the vertex 13*a* of the convex portion 13, the height hn of each of the convex portions 13 is defined as follows. As shown in the convex portion 132, first, the point of intersection between a line segment parallel to the thickness direction of the optical substrate (I) 1 and the outline of the convex portion 132 is assumed to be X. Then, the point of intersection between the line segment passing through the point of intersection X and the concave portion average position Scc is assumed to be Y. When the line segment is moved parallel to the direction of the surface within the concave portion average position Scc, the distance between the point of intersection X and the point of intersection Y is changed. The maximum value of the distance between the point of intersection X and the point of intersection Y is hn.

ϕcv

A symbol ϕcv shown in FIG. 9 indicates the width of the bottom portion of the first convex portions 131, 132 and 134 in the concave portion average position Scc. Here, the width ϕcv of the bottom portion is defined as follows. As shown in the convex portion 134, first, an arbitrary point E on the outline of the bottom portion of the convex portion 134 is set. Then, an arbitrary point F different from the point E on the outline is set. In a case where the point E is fixed and the point F is moved onto the outline, the distance when the distance between the point E and the point F is maximized is assumed to be the width ϕcv of the bottom portion. The value obtained by arbitrarily selecting 10 convex portions 13, determining the width ϕcv of the bottom portion for each of the convex portions 13 and arithmetically averaging them is the average ϕcv−ave of the width of the bottom portion. The observation described above is defined as being performed within a range which will be described below.

tcv

A symbol tcv shown in FIG. 9 indicates the shortest distance between the outlines of the first convex portion 132 and the first convex portion 134 adjacent to each other through the second convex portion 133 on the line segment Icy. In other words, the symbol tcv means a distance on the line segment Icy between the first concave portions 132 and 134 through the second convex portion 133. In FIG. 9, (1) first, the line segment Icy within the flat plane formed with the convex portion average position Scv passes through a plurality of first concave portions 131, 132 and 134. Here, the points of intersection between the first convex portion 132 and the line segment Icy are indicated by A and B in FIG. 9. (2) Then, the points of intersection between the first convex portion 134 adjacent through the second convex portion 133 to the first convex portion 132 on the line segment Icy and the line segment Icy are indicated by C and D in FIG. 9. (3) When the line segment Icy is seen from one direction, the points of intersection A, B, C and D are sequentially aligned, and among them, the distance between the points of intersection B and C is defined as tcv. Attention is focused on 5 arbitrary second convex portions 133, tcv is measured for 5 arbitrary points for each of the second convex portions 133 and the arithmetic mean of them, that is, the arithmetic mean of 25 points is defined as tcv−ave. Here, tcv−ave is a scale for indicating the size of an aggregation of the second convex portions, and in particular, tcv−ave is a distance that is easily measured when the cross section of the optical substrate is observed with a scanning electron microscope. The observation described above is defined as being performed within a range which will be described below. When the convex portion average position Scv is located slightly above the vertexes 13*a* of the first convex portions 131, 132 and 134, the distance tcv and its arithmetic mean tcv−ave are defined as a distance Tcv or its arithmetic mean Tcv−ave.

Tcv

A symbol Tcv shown in FIG. 9 indicates the shortest distance between the convex vertex 13*a* of the first convex portion 132 and the vertex 13*a* of the first convex portion 134 adjacent to each other on the line segment Icy through the second convex portion 133. In other words, the symbol Tcv means the interval between the first convex portions 132 and 134 adjacent to each other on the line segment Icy through the second convex portion 133. When the convex portion average position Scv is located slightly above the vertexes 13*a* of the first convex portions 131, 132 and 134, the symbol Tcv is the shortest distance between the point of intersection (J) between the line segment passing through the vertex 13*a* of the first convex portion 132 and parallel to the thickness direction of the optical substrate (I) 1 and the line segment Icy and the point of intersection (K) between the line segment passing through the vertex 13*a* of the first convex portion 134 adjacent through the second convex portion 133 to the first convex portion 132 and parallel to the thickness direction of the optical substrate (I) 1 and the line segment Icy. In other words, the symbol Tcv means the interval between the vertexes 13*a* of the first convex portions 132 and 134 adjacent to each other through the second convex portion 133 within a plane parallel to the direction of the surface of the substrate main body 11. Attention is focused on 5 arbitrary second convex portions 133, Tcv is measured for 5 arbitrary points for each of the second convex portions 133 and the arithmetic mean of them, that is, the arithmetic mean of 25 points is defined as Tcv−ave. Here, Tcv−ave is a scale for indicating the size of an aggregation of the second convex portions, and in particular, Tcv−ave is a distance that is easily measured when the surface of the optical substrate (I) 1 is observed with a scanning electron microscope or an atomic force microscope. The observation described above is defined as being performed within a range which will be described below.

P

A symbol P shown in FIG. 9 indicates the shortest interval between the two first convex portions 131 and 132 adjacent to each other, among a plurality of first convex portions 131, 132 and 134, without the second convex portion 133 along the pass. The average interval $P_{ave}$ will be described in detail later.

Distinction Between the First Convex Portion and the Second Convex Portion

The distinction between the first convex portions 131, 132 and 134 and the second convex portion 133 whose height is lower than them will be described. In the concave-convex structure 12 according to the present embodiment, as shown in FIG. 9, the convex portion heights hn of a plurality of convex portions 131 to 134 are not uniform, and as in the second convex portion 133 shown in FIG. 9, its convex portion height hn is lower than that of the convex portions 131, 132 and 134 having substantially the same convex portion height; in other words, the convex portion (hereinafter referred to a minimal convex portion) whose convex portion height hn is lower than the average convex portion height $H_{ave}$ is present with a predetermined probability. Here, the minimal convex portion is defined as the second convex portion, and the convex portion which does not correspond to the minimal convex portion is defined as the first convex portion. The convex portion whose convex portion height hn satisfies formula (2) below for the average convex portion height $H_{ave}$ corresponding to the distance between the convex portion average position Scv and the concave portion average position Scc in the concave-convex structure 12 is defined as the minimal convex portion. Whether or not formula (2) below is satisfied can be determined by an observation using a scanning electron microscope for the cross section of the optical substrate or an observation using an atomic force microscope for the concave-convex structure 12 of the optical substrate (I) 1. The observation described above is defined as being performed within a range which will be described below.

$$0.6H_{ave} \geq hn \geq 0 \quad \text{Formula (2)}$$

From the definition, the second convex portion is the convex portion whose height hn is lower than the average convex portion height $H_{ave}$. In other words, in the second convex portions, the convex portion heights may be constant or a plurality of second convex portion heights may be distributed. Likewise, the first convex portion heights may be constant or a plurality of first convex portion heights may be distributed.

Optical Substrate (II)

The optical substrate (II) 2 shown in FIG. 8 and according to the second embodiment will then be described with reference to FIG. 10. As shown in FIG. 10, in the cross section of the optical substrate (II) 2, a plurality of concave portions 231 to 234 are aligned independently of each other. The convex portions 24 are present between the concave portions 231 to 234, and the concave portions 231 to 234 are separated from each other.

The definitions of various symbols and terms shown in FIG. 10 will be described below.

Scv

A symbol Scv shown in FIG. 10 indicates a convex portion average position of the convex portions 24. The convex portion average position Scv means an in-plane average position of the vertexes 24*a* of the convex portions 24 in the concave-convex structure 22, and the plane is a plane parallel to the direction of the surface of the substrate main body 21. The convex portion average position Scv is preferably determined from the average of 10 vertexes 24*a*. The convex portion average position Scv is defined as in the first embodiment. The observation described above is defined as being performed within a range which will be described below.

Scc

A symbol Scc shown in FIG. 10 indicates the concave portion average position of a plurality of concave portions 231 to 234. The concave portion average position Scc means an in-plane average position of the vertexes 23*a* of the concave portions 231 to 234 in the concave-convex structure 22, and the plane is a plane parallel to the direction of the surface of the substrate main body 21. The concave portion average position Scc is determined according to the following definition. First, on the surface on which the concave-convex structure 22 of the optical substrate (II) 2 is formed, a 50 μm×50 μm square region parallel to the main surface of the substrate main body 21 is taken. Then, the 50 μm×50 μm square region is divided into twenty five 10 μm×10 μm square regions without being overlapped. Then, 5 regions are arbitrarily selected from the twenty five 10 μm×10 μm regions. Here, the selected 10 μm×10 μm square regions are referred to as a region A, a region B, a region C, a region D and a region E. Thereafter, the region A is observed at high magnification, and is magnified until at least 100 concave portions 23 are clearly observed. Then, 10 concave portions are arbitrarily selected from the observed concave portions 23, and the depth of each of the concave portions 23 is determined. The maximum depth among the 10 concave portions 23 measured from the region A is assumed to be da. On the region B, the region C, the region D and the region E, the same operation as on the region A is also performed, and db, dc, dd and de are determined. The concave portion average position Scc is below the convex portion average position Scv, which has already been described, that is, is a position that is moved from the convex portion average position Scv by a distance corresponding to (da+db+dc+dd+de)/5 toward the bottom portion of the concave portions 23.

As shown in FIG. 10, the depths of a plurality of concave portions 231 to 234 are substantially the same but are not uniform, and the second concave portion 233 whose depth is low is mixed. Thus, the concave portion average position Scc of the concave portions 231 to 234 is lower than the vertexes 23*a* of the first concave portions 231, 232 and 234. This shows, from the above definition, a case where a distribution is present in the heights of the first concave portions. On the other hand, although not shown, when a distribution is present in the heights of the first concave portions, the concave portion average position Scc may be located slightly below the vertexes 23*a* of the first concave portions 231, 232 and 234. Moreover, although not shown, when the depths of the first concave portions are substantially uniform or uniform, the concave portion average position Scc is substantially equal to or completely equal to the vertexes 23*a* of the first concave portions 231, 232 and 234.

Icc

A symbol Icc shown in FIG. 10 indicates a line segment on the flat plane formed by the concave portion average position Scc. Hence, the line segment Icc is a plane parallel to the direction of the surface of the substrate main body 21.

$D_{ave}$

A symbol $D_{ave}$ shown in FIG. 10 indicates an average concave portion depth of the concave portions 231 to 234. The average concave portion depth $D_{ave}$ is a distance between the convex portion average position Scv and the concave portion average position Scc. Hence, the average concave portion depth $D_{ave}$ is (da+db+dc+dd+de)/5 calculated when the concave portion average position Scc is determined.

dn

A symbol dn shown in FIG. 10 indicates a concave portion depth of a plurality of concave portions 231 to 234. The concave portion depth dn means a distance between the center 23*b* of the opening portion of each of the concave portions 231 to 234 in the convex portion average position Scv and the vertex 23*a* of the concave portions 231 to 234. In other words, the concave portion depth dn is the depth of each of the concave portions 231 to 234 with respect to the convex portion average position Scv. When the thickness direction of the optical substrate (II) 2 is not parallel to a line segment connecting the center 23*b* of the opening portion of the concave portions 231 to 234 and the vertex 23*a*, the depth dn of each of the concave portions 231 to 234 is defined as follows. As shown in the concave portion 232, first, the point of intersection between a line segment parallel to the thickness direction of the optical substrate (II) 2 and the outline of the concave portion 232 is assumed to be Y. Then, the point of intersection between the line segment passing through the point of intersection Y and the convex portion average position Scv is assumed to be X. When the line segment is moved parallel to the direction of the surface within the convex portion average position Scv, the distance between the point of intersection X and the point of intersection Y is changed. The maximum value of the distance between the point of intersection X and the point of intersection Y is dn.

ϕcc

A symbol ϕcc shown in FIG. 10 indicates the width of the opening portion of the first concave portions 231, 232 and 234 in the convex portion average position Scv. Here, the width ϕcc of the opening portion is defined as follows. As shown in the concave portion 234, first, an arbitrary point E on the outline of the opening portion of the concave portion 234 is set. Then, an arbitrary point F different from the point E on the outline is set. In a case where the point E is fixed and the point F is moved onto the outline, the distance when the distance between the point E and the point F is maximized is assumed to be the width ϕcc of the opening portion. The value obtained by arbitrarily selecting 10 concave portions 23, determining the width ϕcc of the opening portion for each of the concave portions 23 and arithmetically averaging them is the average ϕcc−ave of the width of the opening portion. The observation described above is defined as being performed within a range which will be described below.

tcc

A symbol tcc shown in FIG. 10 indicates the shortest distance between the outlines of the first concave portions 232 and 234 adjacent to each other on the line segment Icc. In other words, the symbol tcc means a distance on the line segment Icc between the first concave portions adjacent to each other through the second concave portion 233. In FIG. 10, (1) first, the line segment Icc within the flat plane formed with the concave portion average position Scc passes through a plurality of first concave portions 231, 232 and 234. Here, the points of intersection between the first concave portion 232 and the line segment Icc are indicated by A and B in FIG. 10. (2) Then, the points of intersection between the first concave portion 234 adjacent through the second concave portion 233 to the first concave portion 232 on the line segment Icc and the line segment Icc are indicated by C and D in FIG. 10. (3) When the line segment Icc is seen from one direction, the points of intersection A, B, C and D are sequentially aligned, and among them, the distance between the points of intersection B and C is defined as tcc. Attention is focused on 5 arbitrary second concave portions 233, tcc is measured for 5 arbitrary points for each of the second concave portions 233 and the arithmetic mean of them, that is, the arithmetic mean of 25 points is defined as tcc−ave. Here, tcc−ave is a scale for indicating the size of an aggregation of the second concave portions, and in particular, tcc−ave is a distance that is easily measured when the cross section of the optical substrate (II) 2 is observed with a scanning electron microscope. The observation described above is defined as being performed within a range which will be described below. When the concave portion average position Scc is located slightly below the vertexes 23*a* of the first concave portions 231, 232 and 234, the distance tcc and its arithmetic mean tcc−ave are defined as a distance Tcc or its arithmetic mean Tcc−ave.

Tcc

A symbol Tcc shown in FIG. 10 indicates the shortest distance between the center portion of the opening portion of the first concave portion 232 and the center portion of the opening portion of the first concave portion 234 adjacent to each other on the line segment Icc through the second concave portion 233. In other words, the symbol Tcc means the interval between the first concave portions 232 and 234 adjacent to each other on the line segment Icc through the second concave portion 233. When the concave portion average position Scc is located slightly below the vertexes 23*a* of the first concave portions 231, 232 and 234, the symbol Tcc is the shortest distance between the point of intersection (L) between the line segment passing through the center portion of the opening portion of the first concave portion 232 and parallel to the thickness direction of the optical substrate (II) 2 and the line segment Icc and the point of intersection (M) between the line segment passing through the center portion of the opening portion of the first concave portion 234 adjacent through the second concave portion 233 to the first concave portion 232 and parallel to the thickness direction of the optical substrate (II) 2 and the line segment Icc. In other words, the symbol Tcc means the interval between the center portions of the opening portions of the first concave portions 232 and 234 adjacent to each other through the second concave portion 233 within a plane parallel to the direction of the surface of the substrate main body 21. Attention is focused on 5 arbitrary second concave portions 233, Tcc is measured for 5 arbitrary points for each of the second concave portions 233 and the arithmetic mean of them, that is, the arithmetic mean of 25 points is defined as Tcc−ave. Here, Tcc−ave is a scale for indicating the size of an aggregation of the second concave portions 233, and in particular, Tcc−ave is a distance that is easily measured when the surface of the optical substrate is observed with a scanning electron microscope or an atomic force microscope. The observation described above is defined as being performed within a range which will be described below.

P

A symbol P shown in FIG. 10 indicates the interval between the two first concave portions adjacent to each other, among a plurality of first concave portions 231, 232 and 234. The average interval $P_{ave}$ will be described in detail later.

Distinction Between the First Concave Portion and the Second Concave Portion

The distinction between the first concave portion and the second concave portion whose depth is lower than that of the first concave portion will be described. In the concave-convex structure 22 according to the second embodiment, as shown in FIG. 10, the concave portion depths dn of a plurality of concave portions 231 to 234 are not uniform, and as in the second concave portion 233 shown in FIG. 10, its concave portion depth dn is lower than that of a plurality of concave portions 231, 232 and 234 having substantially the same depth; in other words, the concave portion (hereinafter referred to a minimal concave portion) whose concave portion depth dn is lower than the average concave portion depth $D_{ave}$ is present with a predetermined probability. Here, the minimal concave portion is defined as the second concave portion, and the concave portion which does not correspond to the minimal concave portion is defined as the first concave portion. The concave portion whose concave portion depth dn satisfies formula (6) below for the concave portion average depth $D_{ave}$ corresponding to the distance between the convex portion average position Scv and the concave portion average position Scc in the concave-convex structure 22 is defined as the minimal concave portion. Whether or not formula (6) below is satisfied can be determined by an observation using a scanning electron microscope for the cross section of the optical substrate (II) 2 or an observation using an atomic force microscope for the concave-convex structure 22 of the optical substrate. The observation described above is defined as being performed within a range which will be described below.

$$0.6D_{ave} \geq dn \geq 0 \quad \text{Formula (6)}$$

From the definition, the second concave portion 233 is the concave portion 23 whose depth do is lower than the average concave portion depth $D_{ave}$. In other words, in the second concave portions 233, the concave portion depths may be constant or a plurality of second concave portion depths may be distributed. Likewise, the depths of the first concave portions 231, 232 and 234 may be constant or a plurality of first concave portion depths may be distributed.

Average Interval $P_{ave}$

The average interval $P_{ave}$ between the first convex portions 131, 132 and 134 in the optical substrate (I) 1 and the first concave portions 231, 232 and 234 in the optical substrate (II) 2 discussed above will then be described. Although in the following description, for convenience, the convex portions 13 in the optical substrate (I) 1 will be illustrated, the interval between the concave portions 23 in the optical substrate (II) 2 is the same.

As has already been described, in the optical substrates (I) 1 and (II) 2, a plurality of first convex portions 131, 132 and 134 (concave portions 231, 232 and 234) and the second convex portion 133 (concave portion 233) whose height is lower (depth is lower) than that of the first convex portions 131, 132 and 134 (concave portions 231, 232 and 234) are mixed. The second convex portion (concave portion) is the minimal convex portion (concave portion), which has already been described. The average interval $P_{ave}$ in the concave-convex structures (I) 12 and (II) 22 is defined for the first convex portions 13 (concave portions 23).

Figure 11:
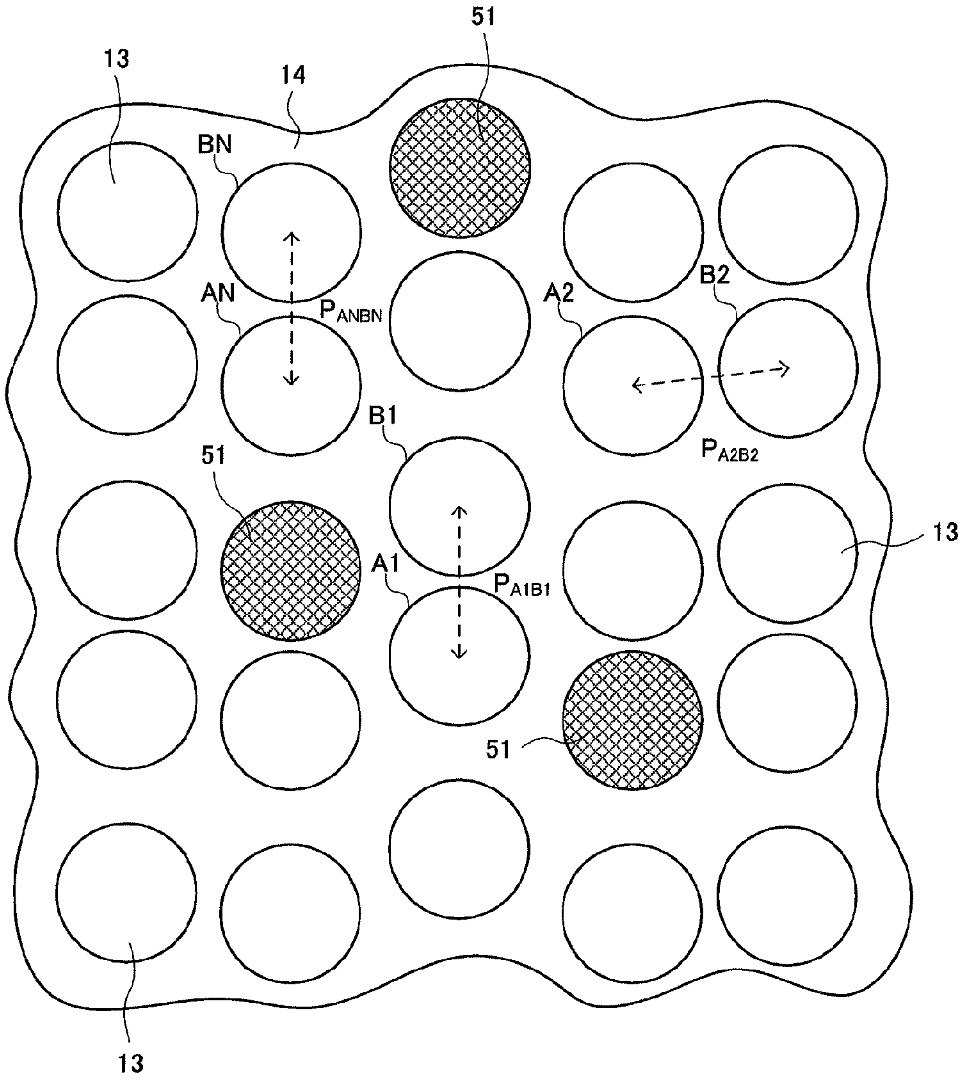
FIG. 11 A schematic diagram when the optical substrate according to the present embodiment is observed from a concave-convex structure surface side.

As shown in FIG. 11, when the concave-convex structure 12 is a structure in which a plurality of convex portions 13 are unevenly arranged and in which second convex portions 51 are mixed, a distance $P_{A1B1}$ between the center of a certain first convex portion A1 and the center of a certain first convex portion B1 closest to the first convex portion A1 is defined as an interval P. However, when as shown in FIG. 11, a plurality of convex portions 13 are unevenly arranged, and the interval differs depending on the selected first convex portion, a plurality of arbitrary first convex portions A1, A2, . . . AN are selected, intervals $P_{A1B1}$, $P_{A2B2}$, . . . $P_{ANBN}$ between the selected first convex portions A1, A2, . . . AN and first convex portions B1, B2, . . . BN closest thereto are measured, and the arithmetic mean of them is assumed to be the average interval $P_{ave}$ in the concave-convex structure 12. In other words, the interval P is defined such that $(P_{A1B1}+P_{A2B2}+\ldots+P_{ANBN})/N=P$. Although in FIG. 11, a plurality of convex portions 13 are unevenly arranged, an arrangement in the form of a triangular lattice, a square lattice or a hexagonal lattice or an arrangement where their lattice number is regularly varied may be adopted.

Figure 12:
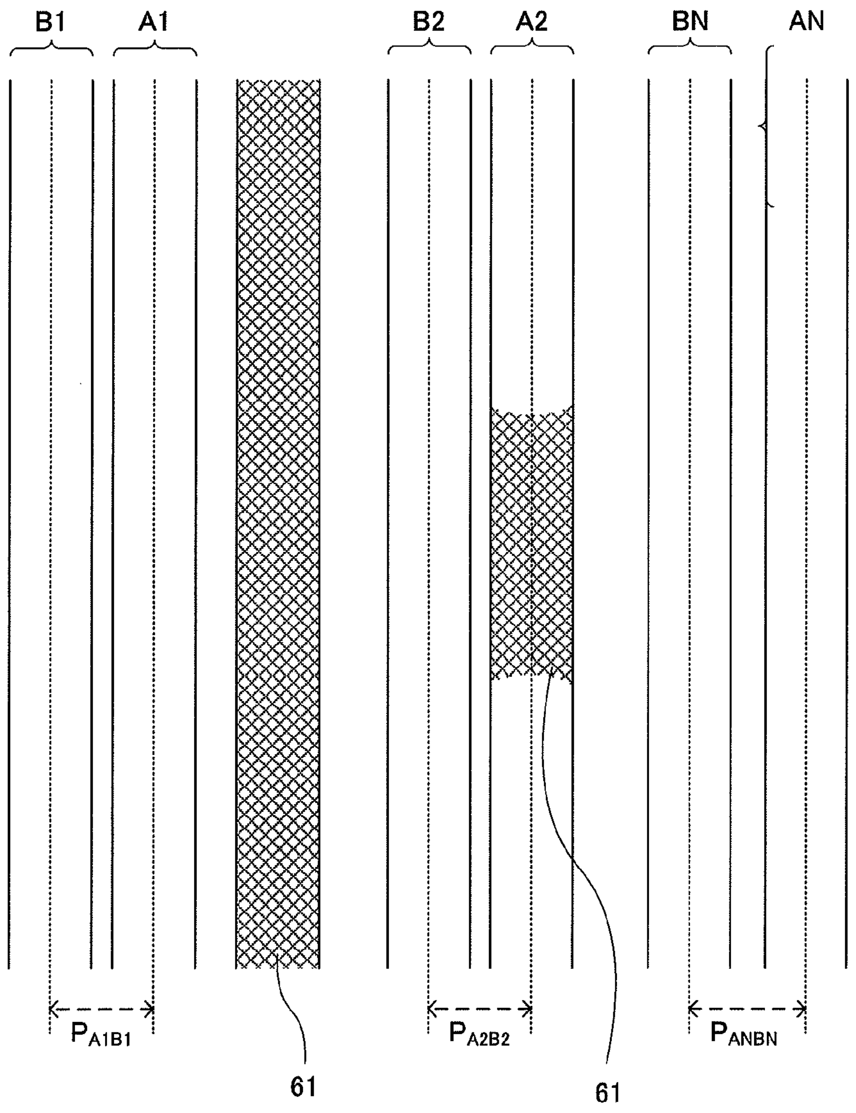
FIG. 12 A schematic diagram when the optical substrate according to the present embodiment is observed from the concave-convex structure surface side.

As shown in FIG. 12, when the concave-convex structure 12 is a line and space structure, the length of the convex portion in a second convex portion 61 (the length of the second convex portion in the longitudinal direction) is equal to or less than that of the first convex portion. Here, even when a second convex line is partially included in a certain first convex line, the interval P is defined as the shortest distance $P_{A1B1}$ between the center line of a certain first convex line A1 and the center line of a first convex line B1 closest to this first convex line A1. However, as shown in FIG. 12, when the interval differs depending on the selected convex line, a plurality of arbitrary first convex lines A1, A2, . . . AN are selected, the intervals between the selected first convex lines A1, A2, . . . AN and first convex lines B1, B2, . . . BN adjacent thereto are measured and the arithmetic mean of them is assumed to be the average interval $P_{ave}$ in the concave-convex structure 12. In other words, the interval P is defined such that $(P_{A1B1}+P_{A2B2}+\ldots+P_{ANBN})/N=P$.

The number N of first convex portions that are selected as samples when the above arithmetic mean is determined is preferably 10.

Existence Probability Z

The existence probability Z of the second convex portions or the second concave portions will then be described. Here, when the existence probability of the second convex portion or the second concave portion is determined by actual observation, the terms described above are used. In other words, in a measurement range for calculating the existence probability Z of the second convex portions or the second concave portions, which will be described below, the terms described above are defined.

1. The concave-convex structure is observed with a scanning electron microscope or an atomic force microscope, the first convex portions (or the first concave portions, the same is true for the following description) and the second convex portions (or the second concave portions, the same is true for the following description) are isolated. The distinction between the first convex portions and the second convex portions has already been described. Here, when the concave-convex structure surface side in the optical substrate can be directly observed, the concave-convex structure is observed with a scanning electron microscope or an atomic force microscope, and thus the second convex portions are distinguished. On the other hand, when the semiconductor crystal layer is provided on the concave-convex structure in the optical substrate, and thus the semiconductor crystal layer cannot be removed, the cross section of the optical substrate is observed with a scanning electron microscope, and the second convex portions are distinguished.

2. From a plurality of first convex portions, 10 first convex portions are arbitrarily selected, and the interval P is measured. The arithmetic mean of the measured 10 intervals P is the average interval $P_{ave}$. The interval P is the shortest interval between two first convex portions adjacent to each other, among the first convex portions, without the second convex portion along the pass.

3. From the observation of a square region of 10 times the calculated average interval $P_{ave}$, that is, a region corresponding to 10 $P_{ave}\times10$ $P_{ave}$, 5 second convex portions are arbitrarily selected. Here, it is assumed that in the region corresponding to 10 $P_{ave}\times10$ $P_{ave}$, a region where the average interval $P_{ave}$ is measured is included without fail. Only the second convex portion in which its entire outline is present within 10 $P_{ave}\times10$ $P_{ave}$ is selected. In a case where the average interval $P_{ave}$ is long, when in the observation of the 10 $P_{ave}\times10$ $P_{ave}$ range, the convex portions are unclear and thus a problem occurs in the selection of the second convex portion or the measurement of Tcv (or tcv), for example, four 5 $P_{ave}\times5$ $P_{ave}$ regions are observed and connected, and thus it is possible to observe the 10 $P_{ave}\times10$ $P_{ave}$ region. For each of the selected second convex portions, Tcv (or tcv) is measured arbitrarily at 5 points. In other words, since for each of the selected second convex portions, Tcv (or tcv) is measured arbitrarily at 5 points, 25 pieces of measurement data on Tcv (or tcv) are collected. The arithmetic mean of the 25 pieces on Tcv (or tcv) is Tcv−ave (or tcv−ave). When within the region corresponding to 10 $P_{ave}\times10$ $P_{ave}$, only N (<5) second convex portions are present, the N second convex portions are selected, then Tcv (or tcv) is measured arbitrarily at 5 points. In other words, since for each of the selected second convex portions, Tcv (or tcv) is measured arbitrarily at 5 points, 5× N pieces of measurement data on Tcv (or tcv) are collected. The arithmetic mean of the obtained Tcv (or tcv) is Tcv−ave (or tcv−ave). Incidentally, tcv is the shortest distance between the outlines of the first convex portions adjacent to each other on a line segment lcv through the second convex portion, and is particularly useful when the cross section of the optical substrate is observed with a scanning electron microscope or when the surface is observed with an atomic force microscope. On the other hand, Tcv is the shortest distance within a plane parallel to the direction of the surface of the substrate main body 11 between the vertexes 13*a* of the first convex portions 132 and 134 adjacent to each other through the second convex portion 133, and is adopted when the surface of the optical substrate is observed.

4. When the surface of the optical substrate is observed, the number (N1) of first convex portions and the number (N2) of second convex portions present in a square region of 10 times the calculated Tcv−ave (or tcv−ave), that is, a region corresponding to 10 Tcv−ave×10 Tcv−ave (or 10 tcv−ave×10 tcv−ave) are counted, and thus the existence probability Z of the second convex portions is calculated. Here, within the region of 10 Tcv−ave×10 Tcv−ave, a region used for calculating Tcv−ave is included without fail. The first convex portions and the second convex portions whose outlines are completely within 10 Tcv−ave×10 Tcv−ave are counted within 10 Tcv−ave×10 Tcv−ave. The existence probability Z is given as N2/(N1+N2). In the present specification, (N2/N2)/[(N1+N2)/N2]=1/[1+(N1/N2)], the numerator of the existence probability Z is represented by 1 in a unified manner. In a case where Tcv−ave is large, when in the observation of the 10 Tcv−ave×10 Tcv−ave range, the convex portions are unclear and thus a problem occurs in counting of the first convex portions and the second convex portions, for example, four 5 Tcv−ave×5 Tcv−ave regions are observed and connected, and thus it is possible to observe the 10 Tcv−ave×10 Tcv−ave region.

Figure 13:
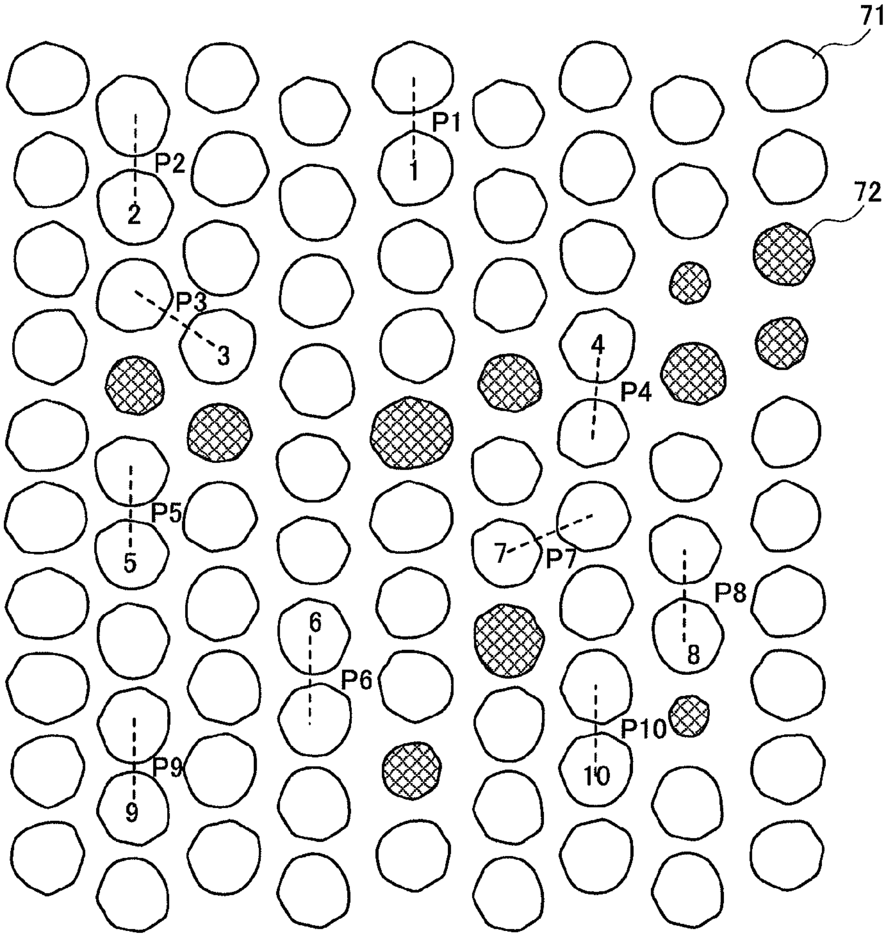
FIG. 13 A schematic diagram when the optical substrate according to the present embodiment is observed from the concave-convex structure surface side.
Figure 14:
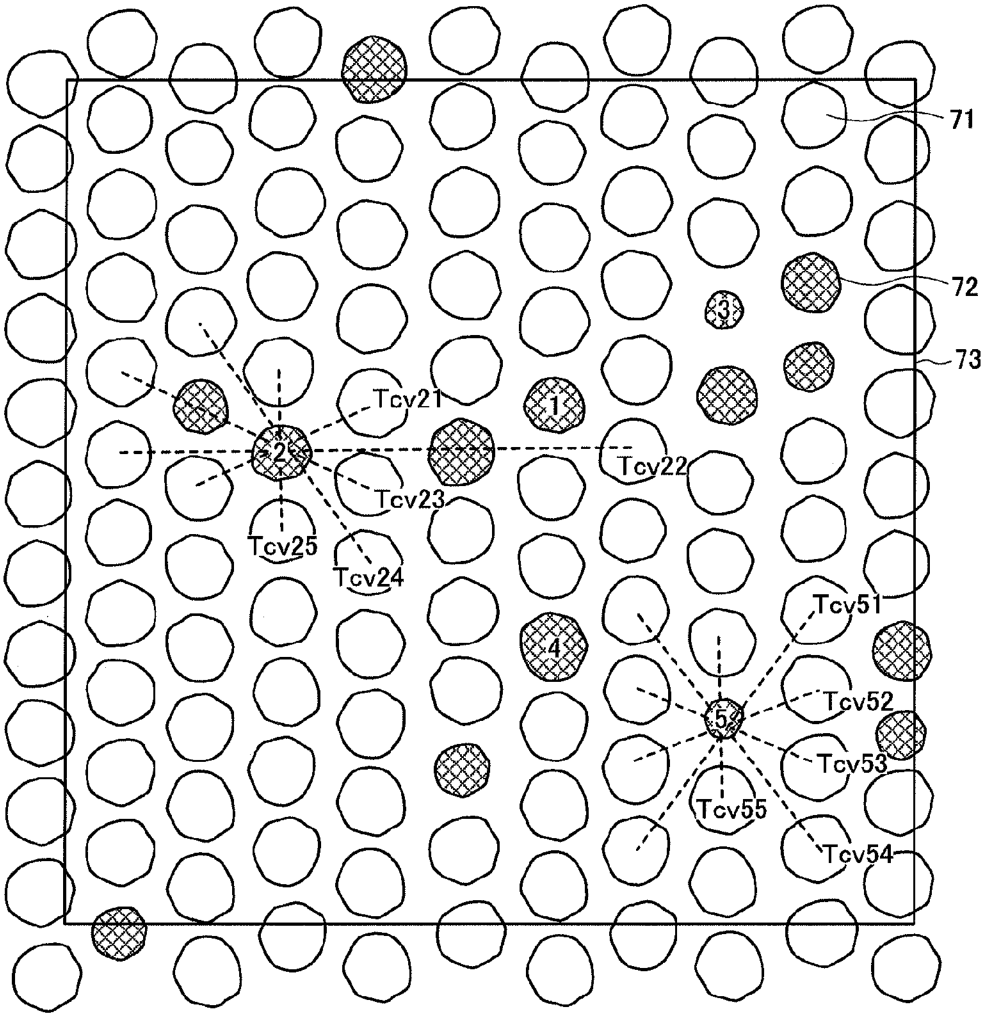
FIG. 14 A schematic diagram when the optical substrate according to the present embodiment is observed from the concave-convex structure surface side.
Figure 15:
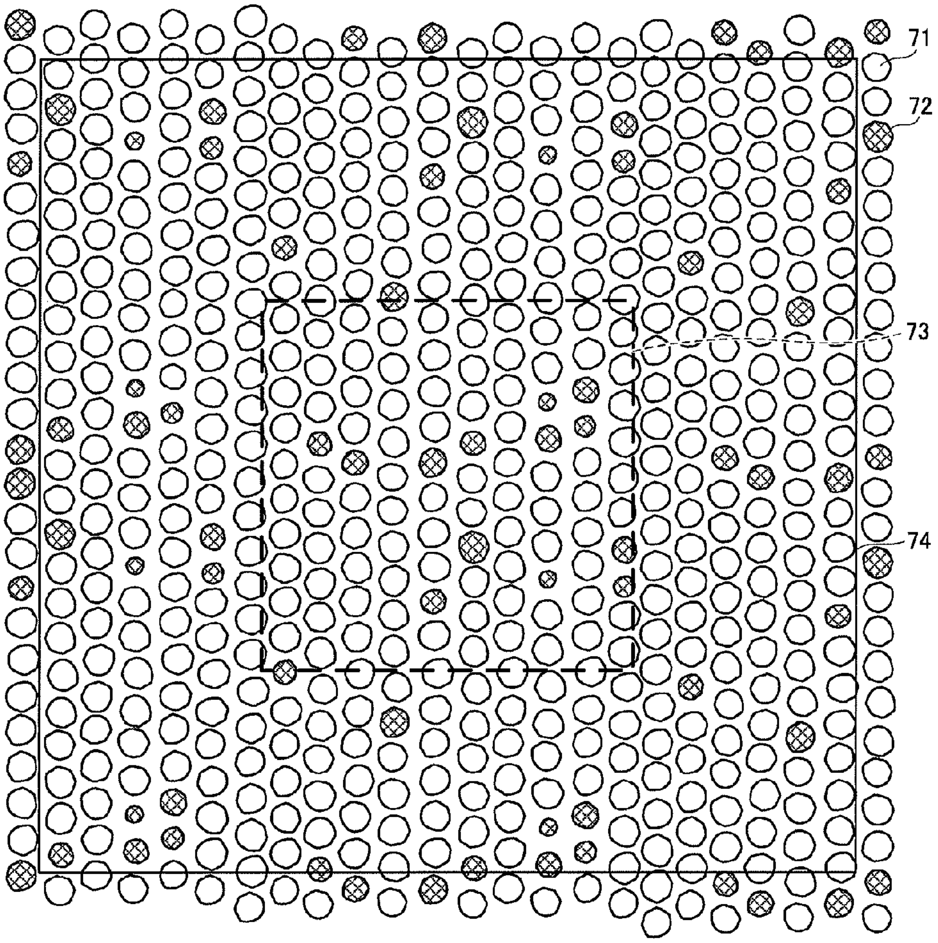
FIG. 15 A schematic diagram showing a region used for counting the number of convex portions while performing an observation from a minute concave-convex surface side of the optical substrate according to the present embodiment.

The method of calculating the existence probability Z of the second convex portions discussed above will be described with reference to the drawings. Although a case where the concave-convex structure of the optical substrate is formed with a plurality of convex portions will be described below, the same is true for a case where the concave-convex structure is formed with a plurality of concave portions. FIGS. 13 to 15 are schematic diagrams when the optical substrate according to the present embodiment is observed from the concave-convex structure surface side. FIGS. 13 to 15 are simulated views of an image obtained by performing an observation with a scanning electron microscope or an atomic force microscope.

1. First, as shown in FIG. 13, first convex portions 71 and second convex portions 72 are distinguished. Since in the observation using a scanning electron microscope, information on the height direction (three-dimensional direction) cannot be obtained, tilt is conducted at the time of the observation, and thus it is possible to distinguish the first convex portions 71 and the second convex portions 72. On the other hand, since in the observation using an atomic force microscope, information on the height direction (three-dimensional direction) is detected with a probe, it is possible to distinguish, with the obtained image, the first convex portions 71 and the second convex portions 72. Although in FIG. 13, the second convex portions 72 are irregularly arranged, the arrangement of the second convex portions 72 is not limited to this arrangement, and the second convex portions 72 can also be regularly arranged.

2. Then, from a plurality of first convex portions 71, 10 first convex portions (in FIG. 13, the first convex portions 71 numbered from 1 to 10) are arbitrarily selected. For each of the selected first convex portions 71 (1 to 10), the interval P is measured (in FIG. 13, P1 to P10). The arithmetic mean of the measured 10 intervals P, that is, (P1+P2+ . . . +P10)/10 is the average interval $P_{ave}$.

3. As shown in FIG. 14, from an observation on a square region 73 of 10 times the calculated average interval $P_{ave}$, that is, the region 73 corresponding to 10 $P_{ave}$×10 $P_{ave}$, 5 second convex portions 72 are arbitrarily selected. Here, it is assumed that within the region 73 corresponding to 10 $P_{ave}$×10 $P_{ave}$, a region where the average interval $P_{ave}$ is measured is included without fail. Only the second convex portion in which its entire outline is present within the region 73 corresponding to 10 $P_{ave}$×10 $P_{ave}$ is selected. In other words, as shown in FIG. 14, from the second convex portions in which all regions used for selecting the average interval $P_{ave}$ are observed within 10 $P_{ave}$×10 $P_{ave}$ and in which the outlines are completely present within the range of 10 $P_{ave}$×10 $P_{ave}$, 5 second convex portions 72 (in FIG. 14, the second convex portions 72 numbered from 1 to 5) are arbitrarily selected. Then, for each of the selected second convex portions 72 (1 to 5), Tcv (or tcv) is measured arbitrarily at 5 points. For example, with data obtained from an observation using an atomic force microscope, it is possible to measure Tcv (or tcv). By exerting tilt on an observation using a scanning electron microscope to distinguish the first convex portions 71 and the second convex portions 72, it is possible to measure Tcv. Here, for convenience, it is assumed that Tcv is measured. In other words, for each of the selected second convex portions 72 (1 to 5), Tcv is measured arbitrarily at 5 points. In FIG. 14, Tcv measured for the second convex portion 72 with number 2 and the second convex portion 72 with number 5 is illustrated as a typical example. As shown in FIG. 14, five pieces of Tcv for the first convex portions 71 adjacent to the selected second convex portion 72 are individually measured. For example, for the second convex portion 72 with number 2, Tcv 21 to Tcv 25 are measured, and for the second convex portion 72 with number 5, Tcv 51 to Tcv 55 are measured. Likewise, for each of the second convex portions 72 with numbers 1, 3 and 4, five pieces of Tcv are measured. Hence, 25 pieces of measurement data on Tcv are collected. The arithmetic mean of 25 pieces of Tcv obtained is Tcv−ave.

4. As shown in FIG. 15, the number (N1) of first convex portions and the number (N2) of second convex portions present within the square region of 10 times the calculated Tcv−ave, that is, a region 74 corresponding to 10 Tcv−ave×10 Tcv−ave are counted. Here, as illustrated in FIG. 15, within the region 74 corresponding to 10 Tcv−ave×10 Tcv−ave, the region 73 used for calculating Tcv−ave is included without fail. It is assumed that the outlines of the first convex portions 71 and the second convex portions 72 counted within the region 74 corresponding to 10 Tcv−ave×10 Tcv−ave are completely present within the region 74 corresponding to 10 Tcv−ave×10 Tcv−ave. In FIG. 15, the number N1 of first convex portions 71 is 433, and the number N2 of second convex portions 72 is 52. Hence, the existence probability Z of the second convex portions 72 is given as N2/(N1+N2)=52/(52+433)=1/9.3.

Figure 16:
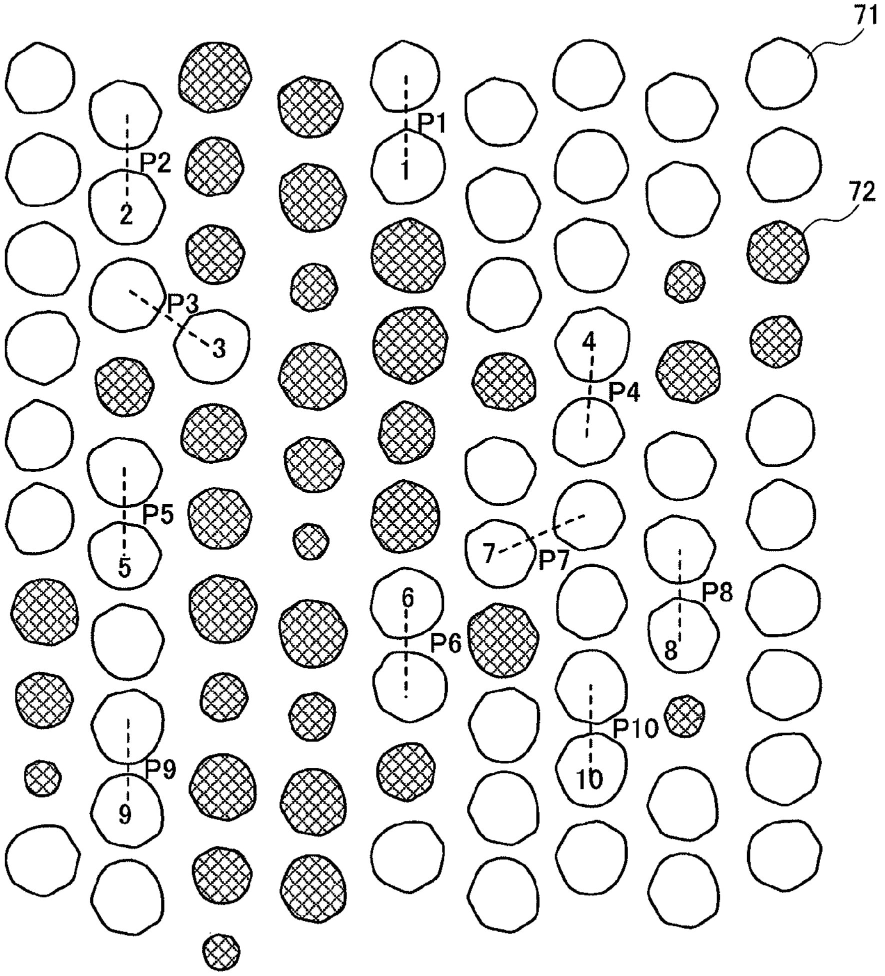
FIG. 16 A schematic diagram when the optical substrate according to the present embodiment is observed from the concave-convex structure surface side.
Figure 17:
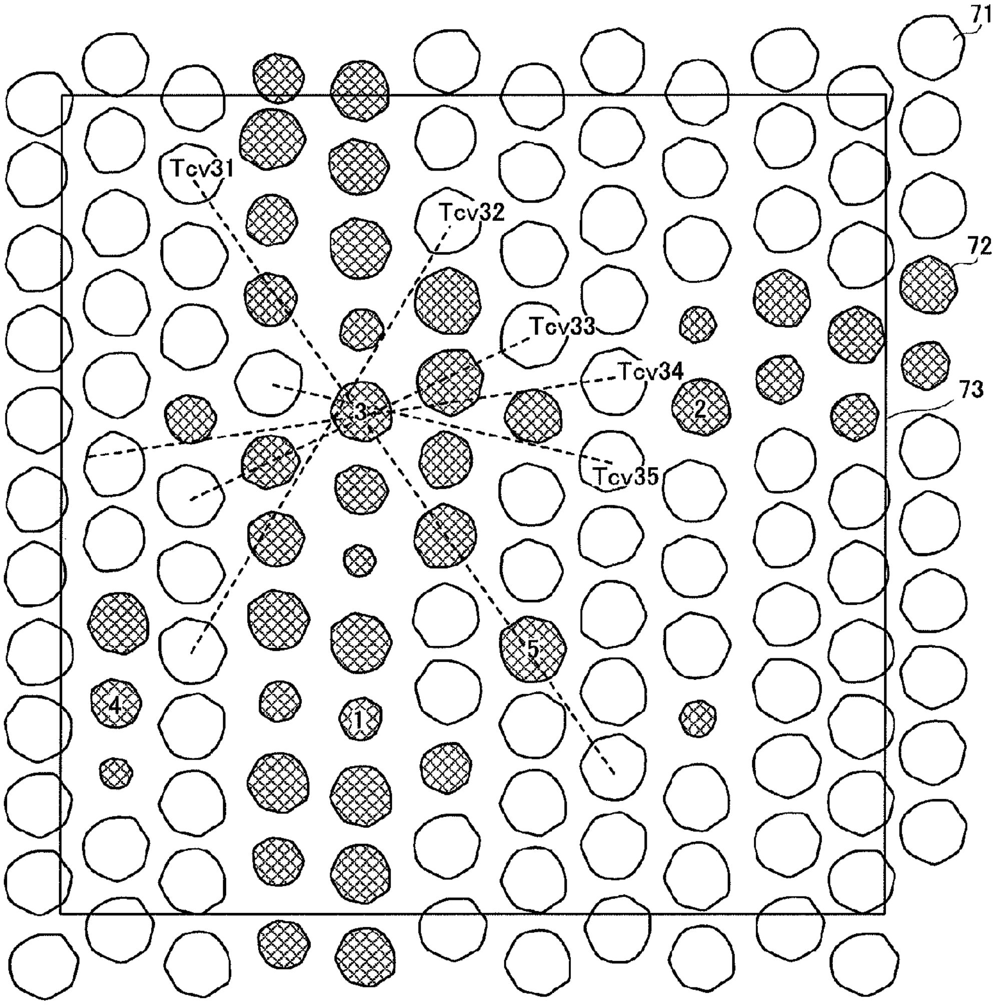
FIG. 17 A schematic diagram when the optical substrate according to the present embodiment is observed from the concave-convex structure surface side.

FIGS. 16 and 17 are schematic diagrams when the optical substrate according to the present embodiment is observed from the concave-convex structure surface side. FIGS. 16 and 17 are simulated views of an image obtained by performing an observation with a scanning electron microscope or an atomic force microscope, and as compared with the concave-convex structure illustrated in FIGS. 13 to 15, a larger number of second convex portions are present and collected. Even in this case, the existence probability Z is determined according to the definition described above.

1. First, as shown in FIG. 16, the first convex portions 71 and the second convex portions 72 are distinguished. Since in the observation using a scanning electron microscope, information on the height direction (three-dimensional direction) cannot be obtained, tilt is conducted at the time of the observation, and thus it is possible to distinguish the first convex portions 71 and the second convex portions 72. On the other hand, since in the observation using an atomic force microscope, information on the height direction (three-dimensional direction) is detected with a probe, it is possible to distinguish, with the obtained image, the first convex portions 71 and the second convex portions 72. Although in FIG. 16, the second convex portions 72 are irregularly arranged, the arrangement of the second convex portions 72 is not limited to this arrangement, and the second convex portions 72 can also be regularly arranged.

2. Then, from a plurality of first convex portions 71, 10 first convex portions (in FIG. 16, the first convex portions 71 numbered from 1 to 10) are arbitrarily selected. For each of the selected first convex portions 71, the interval P is measured (in FIG. 16, P1 to P10). The arithmetic mean of the measured 10 intervals P, that is, (P1+P2+ . . . +P10)/10 is the average interval $P_{ave}$.

3. As shown in FIG. 17, from an observation on the square region 73 of 10 times the calculated average interval $P_{ave}$, that is, the region 73 corresponding to 10 $P_{ave}$×10 $P_{ave}$, 5 second convex portions 72 are arbitrarily selected. Here, it is assumed that within the region 73 corresponding to 10 $P_{ave}$×10 $P_{ave}$, a region where the average interval $P_{ave}$ is measured is included without fail. Only the second convex portion 72 in which its entire outline is present within 10 $P_{ave}$×10 $P_{ave}$ is selected. In other words, as shown in FIG. 17, from the second convex portions 72 in which all regions used for selecting the average interval $P_{ave}$ are observed within 10 $P_{ave}$×10 $P_{ave}$ and in which the outlines are completely present within the range of 10 $P_{ave}$×10 $P_{ave}$, 5 second convex portions 72 (in FIG. 17, the second convex portions 72 numbered from 1 to 5) are arbitrarily selected. Then, for each of the selected second convex portions, Tcv or tcv is measured arbitrarily at 5 points. For example, with data obtained from an observation using an atomic force microscope, it is possible to measure Tcv or tcv. By exerting tilt on an observation using a scanning electron microscope to distinguish the first convex portions 71 and the second convex portions 72, it is possible to measure Tcv. Here, for convenience, it is assumed that Tcv is measured. In other words, for each of the selected second convex portions 72, Tcv is measured arbitrarily at 5 points. In FIG. 17, Tcv measured for the second convex portion 72 with number 3 is illustrated as a typical example. As shown in FIG. 17, five pieces of Tcv for the first convex portions 71 adjacent to the selected second convex portion 72 are individually measured. For example, for the second convex portion 72 with number 3, Tcv 31 to Tcv 35 are measured. Likewise, for each of the second convex portions 72 with numbers 1, 2, 4 and 5, five pieces of Tcv are measured. Hence, 25 pieces of measurement data on Tcv are collected. The arithmetic mean of 25 pieces of Tcv obtained is Tcv−ave.

Figure 18:
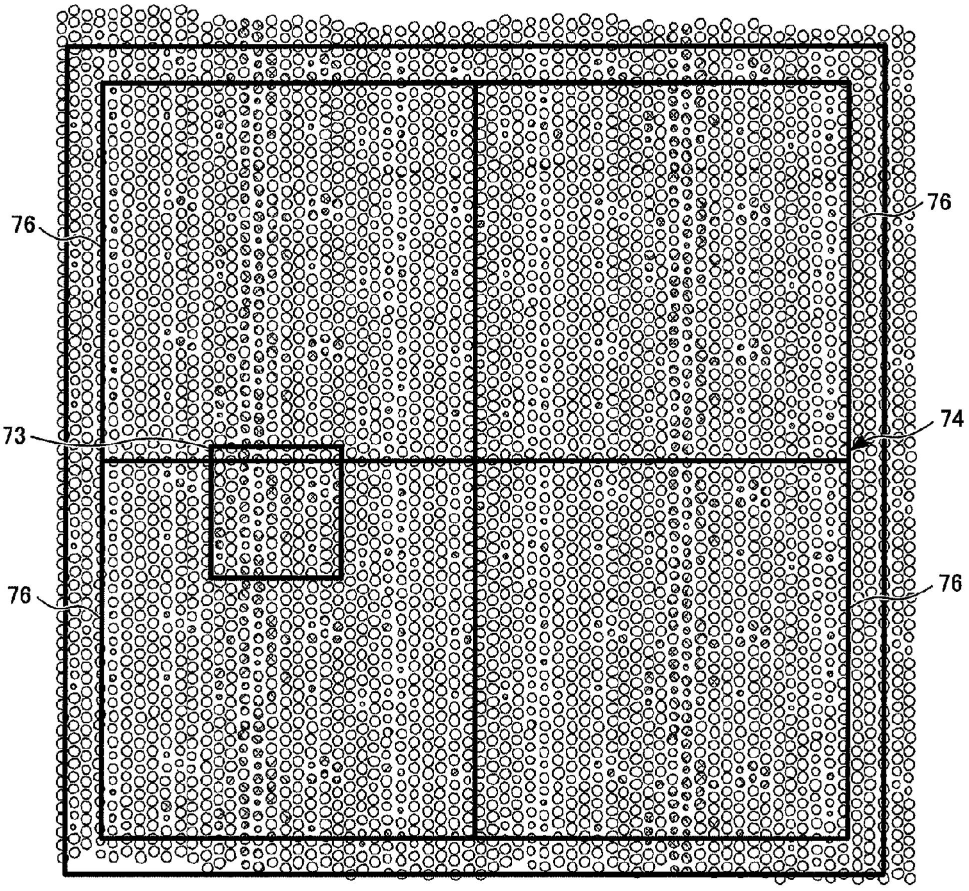
FIG. 18 A schematic diagram showing a region used for counting the number of convex portions while performing an observation from the minute concave-convex surface side of the optical substrate according to the present embodiment.

4. FIG. 18 is a schematic diagram showing a region used for counting the number of convex portions while performing an observation from a minute concave-convex surface side of the optical substrate according to the present embodiment. As shown in FIG. 18, the number (N1) of first convex portions and the number (N2) of second convex portions present within the square region 74 of 10 times the calculated Tcv−ave, that is, the region 74 corresponding to 10 Tcv−ave×10 Tcv−ave are counted. Here, as illustrated in FIG. 18, within the region 74 corresponding to 10 Tcv−ave×10 Tcv−ave, the region 73 used for calculating Tcv−ave is included without fail. It is assumed that the outlines of the first convex portions 71 and the second convex portions 72 counted within the region 74 corresponding to 10 Tcv−ave×10 Tcv−ave are completely present within the region 74 corresponding to 10 Tcv−ave×10 Tcv−ave. In FIG. 18, the number N1 of first convex portions is 2944, and the number N2 of second convex portions is 498. Hence, the existence probability Z of the second convex portions is given as N2/(N1+N2)=498/(498+2944)=1/6.9. In particular, as in FIG. 18, in a case where Tcv−ave is large, when in the observation of the 10 Tcv−ave×10 Tcv−ave range, the convex portions are unclear and thus a problem occurs in counting of the first convex portions and the second convex portions, for example, as shown in FIG. 18, four 5 Tcv−ave×5 Tcv−ave regions 76 are observed and connected, and thus it is possible to observe the 10 Tcv−ave×10 Tcv−ave region 74.

Optical Substrate (I) According to the First Embodiment

The feature of the concave-convex structure 12 in the optical substrate (I) 1 shown in FIG. 7A and according to the first embodiment of the present invention will be described below using the symbols and the definition of the terms described above. First, in the concave-convex structure 12, the average interval $P_{ave}$ satisfies formula (1) below.

$$50\ \text{nm} \le P_{ave} \le 1500\ \text{nm} \quad \text{Formula (1)}$$

When the average interval $P_{ave}$ is equal to or more than 50 nm, optical scattering (light diffraction or light scattering) is enhanced, and the light extraction efficiency LEE is enhanced whereas when the average interval $P_{ave}$ is equal to or less than 1500 nm, the internal quantum efficiency IQE or the electron inject on efficiency EIE in the semiconductor light-emitting element is enhanced. Even when the existence probability Z of the second concave portions is high, since it is possible to keep large the size of an aggregation of the second convex portions or to keep long the interval between the aggregations of the second convex portions by the average interval $P_{ave}$ not exceeding 1500 nm, it is possible to reduce the specific growth of the semiconductor crystal layer, with the result that it is possible to satisfactorily maintain the leak current.

When the average interval $P_{ave}$ is equal to or more than 50 nm, the distance (Tcv or tcv) between the first convex portions adjacent to each other through the second convex portions is optically increased. When the average interval $P_{ave}$ is sufficiently shorter than a wavelength of 50 nm, since the concave-convex structure 12 is averaged in terms of light, the concave-convex structure 12 functions as a thin film having an average refractive index (averaged refractive index). Specifically, since in terms of light emitted by the semiconductor light-emitting element, in a region where the average interval $P_{ave}$ is so short as to be about 50 nm, the concave-convex structure 12 behaves as a thin film (flat film) having the average refractive index, optical scattering (light diffraction or light scattering) is very lowered, with the result that the effect of disturbing the waveguide mode is lowered. In other words, it is lowered enough to enhance the light extraction efficiency LEE. However, in the optical substrate (I) 1 according to the first embodiment, the first convex portions 131, 132 and 134 and the second convex portion 133 are mixed (see FIG. 9). In this case, it is thought that the average refractive index forms disturbance corresponding to the second convex portion 133 dispersed in the first convex portions 131, 132 and 134. In other words, the light emitted by the semiconductor light-emitting element behaves as if a substance corresponding to the distribution of the averaged refractive index were present. When the average interval $P_{ave}$ is equal to or more than 50 nm, the adjacent distance (Tcv or tcv) described above is appropriately long in terms of the wavelength of the light emitted by the semiconductor light-emitting element. Specifically, since the distribution of the averaged refractive index described above is a distribution of an appropriate scale (distribution larger than the average interval $P_{ave}$) in terms of the wavelength of the light emitted by the semiconductor light-emitting element, the emitted light shows optical scattering (light diffraction or light scattering) corresponding to the distribution of the averaged refractive index, and the number of modes for disturbing the waveguide mode is increased, with the result that it is possible to enhance the light extraction efficiency LEE. In terms of further achieving this effect to enhance the light extraction efficiency LEE, the average interval $P_{ave}$ is preferably equal to or more than 100 nm, is more preferably equal to or more than 200 nm and is most preferably equal to or more than 250 nm.

When the average interval $P_{ave}$ is equal to or less than 1500 nm, the density and the specific surface area of the concave convex structure 12 are enhanced. Accordingly, it is possible to disperse dislocations within the semiconductor crystal layer, and thus it is possible to reduce local and macroscopic dislocation densities, with the result that it is possible to increase the internal quantum efficiency IQE. In terms of further achieving the effect described above, the average interval $P_{ave}$ is preferably equal to or less than 1000 nm, is more preferably equal to or less than 900 nm and is most preferably equal to or less than 800 nm. In particular, preferably, when the average interval $P_{ave}$ is equal to or less than 550 nm, it is possible to lower the size of the aggregation of the second convex portions, and the average interval $P_{ave}$ is most preferably equal to or less than 400 nm. Since a large specific surface area causes the contact area to be increased, the contact resistance is reduced, with the result that it is possible to enhance the electron injection efficiency EIE. In terms of further achieving the effect described above, the average interval $P_{ave}$ is preferably equal to or less than 1000 nm, is more preferably equal to or less than 800 nm and is most preferably equal to or less than 550 nm.

In other words, the above range is satisfied, and thus the dislocations in the semiconductor crystal layer are dispersed, the dislocation density is reduced and the internal quantum efficiency IQE is enhanced, and simultaneously optical scattering (light diffraction or light scattering) causes the waveguide mode to be disturbed and it is possible to enhance the light extraction efficiency LEE, with the result that it is possible to enhance the external quantum efficiency EQE in the semiconductor light-emitting element. The above range is satisfied, and thus as the ohmic contact is enhanced, the electron injection efficiency EIE is enhanced, and simultaneously optical scattering (light diffraction or light scattering) causes the waveguide mode to be disturbed and it is possible to enhance the light extraction efficiency LEE, with the result that it is possible to enhance the external quantum efficiency EQE in the semiconductor light-emitting element.

In the concave-convex structure 12 according to the first embodiment, as shown in FIG. 9, the convex portion heights hn of a plurality of convex portions 131 to 134 are not uniform, and as with the second convex portion (minimal convex portion) 133 shown in FIG. 9, the minimal convex portion 133 whose convex portion height hn is lower than the first convex portions 131, 132 and 134 having substantially the same convex portion height, that is, whose convex portion height hn is lower than the average convex portion height $H_{ave}$ is present with a predetermined existence probability Z. In other words, in the concave-convex structure 12 according to the first embodiment, the convex portion height hn of the minimal convex portion 133 satisfies formula (2) below for the average convex portion height $H_{ave}$ corresponding to the distance of the convex portion average position Scv and the concave portion average position Scc in the concave-convex structure 12, and the existence probability Z of the minimal convex portions 133 satisfies formula (3) below.

$$0.6H_{ave} \geq hn \geq 0 \quad \text{Formula (2)}$$

$$1/10000 \leq Z \leq 1/5 \quad \text{Formula (3)}$$

The presence of the minimal convex portion 133 whose convex portion height hn satisfies formula (2) makes it possible to provide optical scattering (light diffraction or light scattering) with the enhancement of the internal quantum efficiency IQE or the electron injection efficiency EIE ensured. As has already been described, in order to enhance the internal quantum efficiency IQE, it is necessary to disperse the dislocations within the semiconductor crystal layer and reduce the dislocation density. This requires a low average interval $P_{ave}$. On the other hand, in order to enhance the electron injection efficiency EIE with the reduction of loss caused by light absorption of the semiconductor light-emitting element, it is necessary to increase the specific surface area with a minute concave-convex structure to enhance the ohmic contact. However, a concave-convex structure having a low average interval $P_{ave}$ is approximated as a thin film having the averaged refractive index for the light emitted by the semiconductor light-emitting element. Hence, a critical angle corresponding to a difference between the average refractive index and the refractive index of the semiconductor crystal layer is determined, and the waveguide mode is formed. However, the presence of the minimal convex portion 133 causes the averaged refractive index to have a distribution. In this case, the light emitted by the semiconductor light-emitting element can behave as if the substance corresponding to the distribution of the average refractive index were present there. In other words, even a low average interval $P_{ave}$ can behave as if a structure larger than the low average interval $P_{ave}$ were present there. In a concave-convex structure with the size substantially equal to or more than the wavelength of the light emitted by the semiconductor light-emitting element and on the order of nanometers, the waveguide mode is disturbed by light diffraction. However, it is thought that the minimal convex portion 133 is included, and thus it is possible to increase the number of modes of light diffraction and make the mode include dispersion. Hence, since the waveguide mode is locally disturbed by light diffraction, and is macroscopically taken out by light scattering, it is possible to enhance the light extraction efficiency LEE. Therefore, the minimal convex portion 133 is present, and thus it is possible to disperse the dislocations within the semiconductor crystal layer, reduce the dislocation density and enhance the internal quantum efficiency IQE, and simultaneously, it is possible to disturb the waveguide mode by optical scattering and enhance the light extraction efficiency LEE. Moreover, the minimal convex portion 133 is present, and thus it is possible to increase the specific surface area, reduce the ohmic resistance and enhance the electron injection efficiency EIE, and simultaneously, it is possible to disturb the waveguide mode by optical scattering and enhance the light extraction efficiency LEE.

In terms of further achieving optical scattering (light diffraction or light scattering) by the principle described above, the convex portion height hn of the minimal convex portion 133 preferably satisfies 0.4 $H_{ave} \geq$hn, more preferably satisfies 0.3 $H_{ave} \geq$hn and most preferably satisfies 0.1 $H_{ave} \geq$hn. The most preferable state is a state where hn is 0. When the height hn of the minimal convex portion 133 is 0, it is difficult to distinguish the minimal convex portion 133 and the first convex portions 131, 132 and 134. In this case, the average interval $P_{ave}$ of the first convex portions 131, 132 and 134 is used, a square range of 3 $P_{ave}$×3 $P_{ave}$ is made and the minimal convex portions 133 corresponding to a difference value observed when this range is moved and the number of first convex portions 131, 132 and 134 is reduced are incorporated. First, the number of first convex portions 131, 132 and 134 when the entire 3 $P_{ave}$×3 $P_{ave}$ is embedded by the first convex portions 131, 132 and 134 is counted. Here, the number is assumed to be Nmax. Then, as the range of 3 $P_{ave}$×3 $P_{ave}$ is moved, the number of first convex portions 131, 132 and 134 is counted. Here, it is assumed that Ndec pieces of first convex portions 131, 132 and 134 are counted. It is also assumed that in the same range, N2 pieces of minimal convex portions 133 satisfying hn>0 are counted. Here, if Ndec+N2<Nmax, this means that the second convex portions which have not been able to be counted are present. In other words, Nmax−(Ndec+N2) is the second convex portions satisfying hn=0.

In particular, it is thought that the existence probability Z of the minimal convex portions 133 satisfying formula (2) satisfies formula (3), and thus in the averaged refractive index, the disturbance (the number of scattering points) present within the thin film or the number of modes of light diffraction and dispersion are increased, with the result that it is possible to enhance the light extraction efficiency LEE based on the dispersion adding. In terms of the optical scattering (light diffraction or light scattering) addition, the existence probability Z preferably satisfies 1/3000≤Z≤1/10, more preferably satisfies 1/1000≤Z≤1/10 and most preferably satisfies 1/500≤Z≤1/10. In particular, preferably, the existence probability Z of the minimal convex portions 133 is equal to or less than 1/100, the number of modes which disturb the waveguide mode is increased and thus the effect of disturbing the waveguide mode is more enhanced. Most preferably, the existence probability Z is equal to or less than 1/60. When the existence probability Z is equal to or more than 1/5.5, since the effect of reducing the specific growth of the semiconductor crystal layer is enhanced, it is possible to more satisfactorily maintain the leak current. From this point of view, the existence probability Z is more preferably equal to or more than 1/10.

In the optical substrate (I) 1 according to the first embodiment, the distance tcv−ave described above more preferably satisfies 1.0 $P_{ave}$<tcv−ave≤9.5≤$P_{ave}$ for the average interval $P_{ave}$ of the first convex portions.

As shown in FIG. 9, since the distance tcv−ave indicates the shortest distance between the outlines of the first convex portion 132 and the convex portion 134 adjacent to each other on the line segment Icy through the minimal convex portion 133, it is shown that the size of the minimal convex portion 133 present therebetween is prevented from exceeding the maximum value 9.5 $P_{ave}$.

The distance tcv−ave satisfies the above range, and thus it is possible to simultaneously improve the internal quantum efficiency IQE and the electron injection efficiency EIE while the improvement of the light extraction efficiency LEE based on the optical scattering (light diffraction or light scattering) addition is maintained. When the distance tcv−ave is more than 1.0 $P_{ave}$, the difference in volume between the first convex portions 131, 132 and 134 and the minimal convex portion 133 is increased. Hence, the disturbance of the averaged refractive index or the dispersion of the optical diffraction mode become remarkable, and the light emitted by the semiconductor light-emitting element shows optical scattering corresponding to the disturbance, with the result that it is possible to enhance the light extraction efficiency LEE. On the other hand, when the distance tcv−ave is equal to or less than 9.5 $P_{ave}$, it is possible to lower the local density of dislocations produced within the semiconductor crystal layer, it is possible to enhance the internal quantum efficiency IQE. Moreover, when the distance tcv−ave is equal to or less than 9.5 $P_{ave}$, it is possible to effectively increase the specific surface area, and thus the ohmic resistance is reduced to make the ohmic contact satisfactory, the electron injection efficiency EIE is enhanced. In terms of further achieving this effect, the distance tcv−ave preferably satisfies 1.0 $P_{ave}$≤tcv−ave≤7.5 $P_{ave}$. Furthermore, the distance tcv−ave is a scale for indicating the size of an aggregation of the minimal convex portions 133. Here, when the minimal convex portions 133 are aggregated, and its size exceeds a predetermined value, a p-n junction interface based on the specific growth of the semiconductor crystal layer may be displaced. In this case, the leak current characteristic is lowered. Moreover, from this point of view, the distance tcv−ave preferably satisfies 1.0 $P_{ave}$<tcv−ave≤4.5 $P_{ave}$, more preferably satisfies 1.0 $P_{ave}$<tcv−ave≤3.0 $P_{ave}$ and most preferably satisfies 1.0 $P_{ave}$<tcv−ave≤1.5 $P_{ave}$.

Preferably, in the optical substrate (I) 1 according to the first embodiment, the convex portion height hn of the minimal convex portion 133 satisfies 0.4 $H_{ave}$≥hn≥0, the existence probability Z satisfies 1/3000≤Z≤1/10 and the distance tcv−ave satisfies 1.0 $P_{ave}$<tcv−ave≤4.5 $P_{ave}$. In this case, the difference in volume between the first convex portion and the minimal convex portion 133 is increased, and the local disturbance of the averaged refractive index and optical scattering (light diffraction or light scattering) in the minimal convex portion 133 are increased, with the result that it is possible to provide enhanced scattering on the order of nanometers. Simultaneously, since the existence probability Z satisfies the above range, it is possible to increase the number of scattering points or the number of modes of light diffraction present in the thin film of the averaged refractive index, and the degree of scattering is comprehensively enhanced, with the result that the light extraction efficiency LEE is increased. Furthermore, since the distance tcv−ave satisfies the above range, it is possible to disperse dislocations within the semiconductor crystal layer and reduce the local dislocation density, with the result that it is possible to achieve the effect of improving the internal quantum efficiency IQE by the nanostructure addition. Moreover, since the distance tcv−ave satisfies the above range, even in the concave-convex structure on the order of nanometers, the specific surface area is effectively increased, and thus the ohmic contact is made satisfactory, with the result that the electron injection efficiency EIE is enhanced. In other words, it is possible to simultaneously enhance the internal quantum efficiency IQE, the electron injection efficiency EIE and the light extraction efficiency LEE, with the result that it is possible to enhance the external quantum efficiency EQE of the LED.

Furthermore, in this case, in terms of the optical scattering (light diffraction or light scattering) addition on the order of nanometers, the height hn of the minimal convex portion 133 preferably satisfies 0.1 $H_{ave}$≥hn≥0. Even in this case, since the existence probability and the range of the distance tcv−ave are satisfied, by the scattering enhanced on the order of nanometers, it is possible to enhance the light extraction efficiency LEE through the comprehensive optical scattering (light diffraction or light scattering) and to realize high internal quantum efficiency IQE or electron injection efficiency EIE.

In the optical substrate (I) 1 according to the first embodiment, the distance Tcv−ave described above preferably satisfies formula (4) below for the average interval $P_{ave}$ between the first convex portions 131, 132 and 134.

$$1.0P_{ave}<Tcv\text{-}ave\leq 11P_{ave} \quad \text{Formula (4)}$$

Here, as shown in FIG. 9, since the distance Tcv−ave indicates the shortest distance between the vertexes of the first convex portion 132 and the convex portion 134 adjacent to each other on the line segment Icy through the minimal convex portion 133, it is shown that the size of the minimal convex portion 133 present therebetween is prevented from exceeding the maximum value 11$P_{ave}$.

The distance Tcv−ave is a value that does not depend on the gradient of the side surface portions of a plurality of convex portions. Here, the distance Tcv−ave is a value that is higher than the distance tcv−ave. With consideration given to an aspect the details of which will be described below, the distance Tcv−ave is about 1.15 times as long as the distance tcv−ave of a plurality of convex portions. Hence, as has already been described, the effect produced by the fact that the distance tcv−ave is equal to or less than 9.5 $P_{ave}$ is likewise realized in a range in which the distance Tcv−ave is equal to or less than 11 $P_{ave}$.

The distance Tcv−ave satisfies formula (4), and thus it is possible to simultaneously improve the internal quantum efficiency IQE and the electron injection efficiency EIE while the improvement of the light extraction efficiency LEE based on the optical scattering (light diffraction or light scattering) addition is maintained. When the distance Tcv−ave is more than 1.0 $P_{ave}$, the difference in volume between the first convex portion and the minimal convex portion 133 is increased. Hence, the disturbance of the averaged refractive index or the dispersion of the optical diffraction mode become remarkable, and the light emitted by the semiconductor light-emitting element shows scattering corresponding to the disturbance, with the result that it is possible to enhance the light extraction efficiency LEE. On the other hand, when the distance Tcv−ave is equal to or less than 11 $P_{ave}$, since it is possible to lower the local density of dislocations produced within the semiconductor crystal layer, it is possible to enhance the internal quantum efficiency IQE. Moreover, when the distance Tcv−ave is equal to or less than 11 $P_{ave}$, since it is possible to limit the size of an aggregation of the minimal convex portions 133, it is possible to reduce the specific growth of the semiconductor crystal layer. Hence, since it is possible to reduce the displacement of a p-n junction interface, more specifically, a band in a band diagram, it is possible to satisfactorily maintain the leak current, with the result that it is possible to enhance the diode characteristic. Moreover, when the distance Tcv−ave is equal to or less than 11 $P_{ave}$, since it is possible to effectively increase the specific surface area, and thus the ohmic resistance is reduced to make the ohmic contact satisfactory, the electron injection efficiency EIE is enhanced. In terms of further achieving this effect, the distance Tcv−ave preferably satisfies 1.0 $P_{ave}$≤Tcv−ave≤9.5 $P_{ave}$. Furthermore, the distance Tcv−ave is a scale for indicating the size of an aggregation of the minimal convex portions 133. Here, when the minimal convex portions 133 are aggregated, an aggregation in which the convex portion height is lower is formed. In this case, the optical scattering is reduced. This is because, for example, when the optical scattering is light diffraction, as the convex portion height is increased, the light diffraction intensity is increased. Moreover, from this point of view, the distance Tcv−ave preferably satisfies 1.0 $P_{ave}$<Tcv−ave≤7.5 $P_{ave}$, more preferably satisfies 1.0 $P_{ave}$<Tcv−ave≤5.5 $P_{ave}$ and most preferably satisfies 1.0 $P_{ave}$<Tcv−ave≤3.5 $P_{ave}$.

Preferably, in the optical substrate (I) 1 according to the first embodiment, the convex portion height hn of the minimal convex portion 133 satisfies formula (9) below, the existence probability Z satisfies formula (10) below and the distance Tcv−ave satisfies formula (11). In this case, the convex portion height hn of the minimal convex portion 133 satisfies formula (9), and thus the difference in volume between the first convex portions 131, 132 and 134 and the minimal convex portion 133 is increased, and the local disturbance of the averaged refractive index and optical scattering (light diffraction or light scattering) in the minimal convex portion 133 are increased, with the result that it is possible to provide enhanced scattering on the order of nanometers. Simultaneously, since the existence probability Z satisfies formula (10), it is possible to increase the number of scattering points or the number of modes of light diffraction present in the thin film of the averaged refractive index, and the degree of scattering is comprehensively enhanced, with the result that the light extraction efficiency LEE is increased. Furthermore, since the distance Tcv−ave satisfies formula (11), it is possible to disperse dislocations within the semiconductor crystal layer and reduce the local dislocation density, with the result that it is possible to achieve the effect of improving the internal quantum efficiency IQE by the nanostructure addition. Moreover, since the distance Tcv−ave satisfies formula (11), even in the concave-convex structure on the order of nanometers, the specific surface area is effectively increased, and thus the ohmic contact is made satisfactory, with the result that the electron injection efficiency EIE is enhanced. In other words, formulas (9) to (11) are simultaneously satisfied, and thus it is possible to simultaneously enhance the internal quantum efficiency IQE, the electron injection efficiency EIE and the light extraction efficiency LEE, with the result that it is possible to enhance the external quantum efficiency EQE of the LED. Moreover, when formulas (9) to (11) are simultaneously satisfied, since it is possible to enhance the size of an aggregation of the minimal convex portions 133 and the dispersion of the aggregated minimal convex portions 133, it is possible to reduce the junction of the specifically growth semiconductor crystal layers, with the result that it is possible to reduce a defect in the shape of a crevasse produced in the semiconductor crystal layer. In this way, the degree of the p-n junction is enhanced, and thus it is possible to more reduce the leak current.

$$0.4H_{ave} \geq hn \geq 0 \quad \text{Formula (9)}$$

$$1/3000 \leq Z \leq 1/7.5 \quad \text{Formula (10)}$$

$$1.0P_{ave} \leq Tcv\text{−}ave \leq 7.5P_{ave} \quad \text{Formula (11)}$$

Furthermore, in this case, the convex portion height hn of the minimal convex portion 133 preferably satisfies formula (12) below in terms of the optical scattering (light diffraction or light scattering) addition on the order of nanometers. Even in this case, since the existence probability Z shown in formula (10) and the range of the distance Tcv−ave shown in formula (11) are satisfied, by the scattering enhanced on the order of nanometers, it is possible to enhance the light extraction efficiency LEE through the comprehensive optical scattering (light diffraction or light scattering) and to realize high internal quantum efficiency IQE or electron injection efficiency EIE.

$$0.2H_{ave} \geq hn \geq 0 \quad \text{Formula (12)}$$

Furthermore, an aspect ratio $H_{ave}$/ϕcv−ave is a ratio between the average value ϕcv−ave of the widths of the bottom portions of the first convex portions 131, 132 and 134 in the concave-convex structure 12 and the average value $H_{ave}$ of the convex portion heights. The aspect ratio $H_{ave}$/ϕcv−ave preferably falls within a range equal to or more than 0.1 but equal to or less than 3.0 in the following terms: the difference in volume between the first convex portions and the minimal convex portion 133 is increased, the disturbance of the averaged refractive index or optical scattering (light diffraction or light scattering) is made remarkable, scattering is provided with the internal quantum efficiency IQE or the electron injection efficiency EIE ensured and the external quantum efficiency EQE is enhanced. In particular, in terms of further achieving this effect, the aspect ratio $H_{ave}$/ϕcv−ave preferably falls within a range equal to or more than 0.5 but equal to or less than 2.5, more preferably falls within a range equal to or more than 0.5 but equal to or less than 1.5 and most preferably falls within a range equal to or more than 0.5 but equal to or less than 1.2.

Since the internal quantum efficiency IQE and the light extraction efficiency LEE are simultaneously improved by the above principle, the shape of the convex portion 13 in the concave-convex structure 12 is not limited, and thus the following shapes can be adopted: a cone, a cone-shaped member where the side surface portion of a cone is stepwise inclined, a cone-shaped member where the side surface portion of a cone is convex upward, a cone-shaped member where the bottom surface of a cone is distorted, a cone-shaped member where the outer shape of the bottom surface of a cone has three or more inflection points, a cylinder, a polygon, a pyramid and the like. In particular, preferably, in terms of more enhancing the internal quantum efficiency IQE, the vertexes 13a of the convex portions 13 are continuously and smoothly connected, that is, are corner portions where the radius of curvature of the vertexes of the convex portions 13 exceeds zero.

The side surface of the convex portion may be smooth or other concave and convex portions may be further provided on the side surface of the convex portion.

In terms of enhancing the internal quantum efficiency IQE, the bottom portion of the concave portion 14 in the concave-convex structure 12 preferably has a flat surface. In this case, since it is possible to satisfactorily maintain the growth initial state of the semiconductor crystal layer, it is possible to more achieve the effect of dispersing dislocations due to the concave-convex structure. In particular, since in the convex portions closest to each other, the shortest distance between the outer edge portions of the bottom portions of the convex portions is equal to or more than 30 nm, and thus the growth initial state of the semiconductor crystal layer, especially, nucleation can be satisfactorily maintained, the effect of improving the internal quantum efficiency IQE is enhanced. The distance is more preferably equal to or more than 60 nm, and thus the nucleation and the nuclear growth can be satisfactorily. and is most preferably equal to or more than 80 nm.

When the flat surface (hereinafter referred to as a "flat surface B") of the bottom surface of the concave portion 14 in the concave-convex structure (I) 12 is substantially parallel to a surface (hereinafter referred to as a "parallel stable growth surface") approximately parallel to the stable growth surface of the first semiconductor layer provided on the concave-convex structure (I) 12, since the disturbance of the growth mode of the first semiconductor layer in the vicinity of the concave portion 14 in the concave-convex structure (I) 12 is increased, and thus it is possible to effectively reduce dislocations within the first semiconductor layer, with the result that the internal quantum efficiency IQE is enhanced. The stable growth surface refers to a surface whose growth rate is the lowest in the material to be grown. In general, it is known that the stable growth surface appears as a facet surface in the middle of growth. For example, in a gallium nitride compound semiconductor, a flat surface parallel to an A axis, such as an M plane, is the stable growth surface. The stable growth surface of GaN semiconductor layer is the M plane (1-100), (01-10) and (-1010) of a hexagonal crystal, and is one of the flat surfaces parallel to the A axis. Depending on the growth conditions, another flat surface including the A axis that is a flat surface other than the M plane of the GaN semiconductor layer may be the stable growth surface.

The minimal convex portions 133 may be arranged non-cyclically or cyclically. When they are arranged non-cyclically, non-cyclical disturbance occurs in the averaged refractive index, and thus the waveguide mode is disturbed as light scattering. The degree of mutual enhancement of light diffraction that occurs in the minimal convex portion 133 is reduced, and thus optical scattering (light diffraction or light scattering) is enhanced. On the other hand, when they are arranged cyclically (for example, in the form of a tetragonal lattice or a hexagonal lattice), since the averaged refractive index is cyclically disturbed, the waveguide mode is disturbed as light diffraction corresponding to the cyclical characteristic. In either case, as described above, the height hn of the minimal convex portion 133, the distance Tcv−ave (or the distance tcv−ave) and the existence probability Z are satisfied, and thus it is possible to enhance the light extraction efficiency LEE. Although depending on the application, for example, when it is desired to control the angle at which the light is emitted by the semiconductor light-emitting element, the minimal convex portions 133 are preferably arranged cyclically whereas in order to effectively disturb the waveguide mode by optical scattering (light diffraction or light scattering) to enhance the light extraction efficiency LEE, the minimal convex portions 133 are preferably arranged non-cyclically.

Optical Substrate (II) According to the Second Embodiment

The feature of the concave-convex structure (II) 22 in the optical substrate (II) 2 shown in FIG. 8 and according to the second embodiment will then be described. First, due to the same effect as in the optical substrate (I) 1 according to the first embodiment, the average interval $P_{ave}$ between the concave portions 23 satisfies formula (5) below.

$$50\ \text{nm} \leq P_{ave} \leq 1500\ \text{nm} \qquad \text{Formula (5)}$$

Due to the same reason as in the optical substrate (I) 1 according to the first embodiment, in order to more enhance the internal quantum efficiency IQE and satisfactorily maintain the leak current, the average interval $P_{ave}$ is preferably equal to or less than 1000 nm, is preferably equal to or less than 800 nm, is more preferably equal to or less than 550 nm and is most preferably equal to or less than 400 nm. Moreover, due to the same reason as in the optical substrate (I) 1, in order to enhance the electron injection efficiency EIE, the average interval $P_{ave}$ is preferably equal to or less than 1000 nm, is more preferably equal to or less than 800 nm and is most preferably equal to or less than 550 nm. Likewise, in order to enhance the light extraction efficiency LEE, the average interval P is preferably equal to or more than 100 nm, is more preferably equal to or more than 200 nm and is most preferably equal to or more than 250 nm.

In the concave-convex structure (II) 22 according to the second embodiment, as shown in FIG. 10, the concave portion depth dn of a plurality of concave portions 231 to 234 is not uniform, and as in the second concave portions (minimal concave portions) 233 shown in FIG. 10, the concave portion depth dn is lower than that of the first concave portions 231, 232 and 234 having substantially the same depth. In other words, the minimal concave portions 233 having the concave portion depth dn lower than the average concave portion depth $D_{ave}$ are present with a predetermined probability Z. Specifically, in the concave-convex structure (II) 22 according to the second embodiment, the concave portion depth dn of the minimal concave portion 233 satisfies formula (6) below for the average concave portion depth $D_{ave}$ corresponding to the convex portion average position Scv and the concave portion average position Scc in the concave-convex structure (II) 22, and the existence probability Z with which the minimal concave portions 233 are present satisfies formula (7) below.

$$0.6D_{ave} \geq dn \geq 0 \qquad \text{Formula (6)}$$

$$1/10000 \leq Z \leq 1/5 \qquad \text{Formula (7)}$$

By the presence of the minimal concave portions 233 whose concave portion depth dn satisfies formula (6), due to the same reason as in the optical substrate (I) 1 according to the first embodiment, with the internal quantum efficiency IQE or the electron injection efficiency EIE ensured, it is possible to provide optical scattering (light diffraction or light scattering). Here, in terms of more achieving optical scattering (light diffraction or light scattering), the concave portion depth dn preferably satisfies $0.4\ D_{ave} \geq dn \geq 0$, more preferably satisfies $0.3 \geq D_{ave} \geq dn \geq 0$ and most preferably satisfies $0.1D_{ave} \geq dn \geq 0$.

In particular, the existence probability Z of the minimal concave portions 233 satisfying formula (6) satisfies formula (7), and thus, due to the same reason as in the optical substrate (I) 1 according to the first embodiment, it is possible to realize the light extraction efficiency LEE based on the optical scattering addition. Here, in terms of the optical scattering (light diffraction or light scattering) addition, the existence probability Z preferably satisfies 1/3000≤Z≤1/10, more preferably satisfies 1/1000≤Z≤1/10 and most preferably satisfies 1/500≤Z≤1/10. In particular, preferably, the existence probability Z of the minimal concave portions 233 is equal to or less than 1/100, and thus the number of modes disturbing the waveguide mode is increased and the effect of disturbing the waveguide mode is enhanced. The existence probability Z is most preferably equal to or less than 1/60. When the existence probability Z is equal to or more than 1/5.5, since the effect of reducing the specific growth of the semiconductor crystal layer is enhanced, it is possible to satisfactorily maintain the leak current. From this point of view, the probability Z is more preferably equal to or more than 1/10.

In the optical substrate (II) 2 according to the second embodiment, due to the same reason as in the optical substrate (I) 1 according to the first embodiment, the distance tcc−ave described above satisfies 1.0 $P_{ave}$<tcc−ave≤9.5 $P_{ave}$ for the average interval $P_{ave}$ between the first concave portions 23.

As shown in FIG. 10, since the distance tcc−ave indicates the shortest distance between the outlines of the first concave portion 232 and the concave portion 234 adjacent to each other on the line segment Icc, it is shown that the number of minimal concave portions 233 present therebetween is prevented from exceeding the maximum value $9.5P_{ave}$.

The distance tcc satisfies 1.0 $P_{ave}$ $P_{ave}$<tcc−ave≤9.5 $P_{ave}$, and thus, due to the same reason as in the optical substrate (I) 1 according to the first embodiment, it is possible to simultaneously improve the internal quantum efficiency IQE and the electron injection efficiency EIE while the improvement of the light extraction efficiency LEE based on the optical scattering (light diffraction or light scattering) addition is maintained. In terms of further achieving this effect, the distance tcc−ave preferably satisfies 1.0 $P_{ave}$≤tcc−ave≤7.5 $P_{ave}$. Furthermore, the distance tcc−ave is a scale for indicating the size of an aggregation of the minimal concave portions 233. Here, when the minimal concave portions 233 are aggregated, and its size exceeds a predetermined value, a p-n junction interface based on the specific growth of the semiconductor crystal layer may be displaced. In this case, the leak current characteristic is lowered. Moreover, from this point of view, the distance tcc−ave preferably satisfies 1.0 $P_{ave}$<tcc−ave≤4.5 $P_{ave}$, more preferably satisfies 1.0 $P_{ave}$<tcc−ave≤3.0 $P_{ave}$ and most preferably satisfies 1.0 $P_{ave}$<tcc−ave≤1.5 $P_{ave}$.

Preferably, in the optical substrate (II) 2 according to the second embodiment, the concave portion depth dn of the minimal concave portion 233 satisfies 0.4 $D_{ave}$≥dn≥0, the existence probability Z satisfies 1/3000≤Z≤1/10 and the distance tcc−ave satisfies 1.0 $P_{ave}$≤tcc−ave≤4.5 $P_{ave}$. In this case, the difference in volume between the first concave portions 231, 232 and 234 and the minimal concave portion 233 is increased so that the concave portion depth of the minimal concave portion 233 satisfies a predetermined range, and accordingly, the disturbance of the averaged refractive index or optical scattering (light diffraction or light scattering) in the minimal concave portion 233 is made remarkable. Hence, it is possible to provide enhanced scattering on the order of nanometers. Simultaneously, since the existence probability Z satisfies the above range, it is possible to increase the number of scattering points or the number of modes of light diffraction present in the thin film of the averaged refractive index, and the degree of scattering is comprehensively enhanced, with the result that the light extraction efficiency LEE is increased. Furthermore, since the distance tcc−ave satisfies a predetermined range, it is possible to disperse dislocations within the semiconductor crystal layer and reduce the local dislocation density, with the result that it is possible to achieve the effect of improving the internal quantum efficiency IQE by the nanostructure addition. In other words, it is possible to simultaneously enhance the internal quantum efficiency IQE, the electron injection efficiency EIE and the light extraction efficiency LEE, with the result that it is possible to enhance the external quantum efficiency EQE of the LED.

Furthermore, in this case, in terms of the optical scattering (light diffraction or light scattering) addition on the order of nanometers, the concave portion depth dn of the minimal concave portion 233 preferably satisfies 0.1 $D_{ave}$≥dn≥0. Even in this case, since the existence probability Z and the range of the distance tcc are satisfied, by the scattering enhanced on the order of nanometers, it is possible to enhance the light extraction efficiency LEE through the comprehensive optical scattering (light diffraction or light scattering) and to realize high internal quantum efficiency IQE or electron injection efficiency EIE.

In the optical substrate (II) 2 according to the second embodiment, the distance Tcc−ave described above preferably satisfies formula (8) below for the average interval $P_{ave}$ between the first concave portions.

$$1.0P_{ave}<Tcc\text{−}ave\leq 11P_{ave} \quad \text{Formula (8)}$$

Here, as shown in FIG. 10, since the distance Tcc−ave indicates the shortest distance between the vertex portions of the first concave portion 232 and the concave portion 234 adjacent to each other on the line segment Icc through the second concave portions 233, it is shown that the size of the minimal concave portion 233 present therebetween is prevented from exceeding the maximum value $11P_{ave}$. The distance Tcc−ave is a value that does not depend on the gradient of the side surface portions of a plurality of concave portions. Here, the distance Tcc−ave is a value that is higher than the distance tcc−ave. With consideration given to an aspect the details of which will be described below, the distance Tcc−ave is about 1.15 times as long as the distance tcc−ave of a plurality of concave portions. Hence, as has already been described, the effect produced by the fact that the distance tcc−ave is equal to or less than 9.5 $P_{ave}$ is likewise realized in a range in which the distance Tcc−ave is equal to or less than 11 $P_{ave}$.

The distance Tcc−ave satisfies formula (8), and thus it is possible to simultaneously improve the internal quantum efficiency IQE and the electron injection efficiency EIE while the improvement of the light extraction efficiency LEE based on the optical scattering (light diffraction or light scattering) addition is maintained. When the distance Tcc−ave is more than 1.0 $P_{ave}$, the difference in volume between the first concave portions 231, 232 and 234 and the minimal concave portion 233 is increased. Hence, the disturbance of the averaged refractive index or the dispersion of the optical diffraction mode become remarkable, and the light emitted by the semiconductor light-emitting element shows scattering corresponding to the disturbance, with the result that it is possible to enhance the light extraction efficiency LEE. On the other hand, when the distance Tcc−ave is equal to or less than 11 $P_{ave}$, since it is possible to lower the local density of dislocations produced within the semiconductor crystal layer, it is possible to enhance the internal quantum efficiency IQE. Moreover, when the distance Tcc−ave is equal to or less than 11 $P_{ave}$, since it is possible to limit the size of an aggregation of the minimal concave portions 233, it is possible to reduce the specific growth of the semiconductor crystal layer. Hence, since it is possible to reduce the displacement of a p-n junction interface, more specifically, a band in a band diagram, it is possible to satisfactorily maintain the leak current, with the result that it is possible to enhance the diode characteristic. Moreover, when the distance Tcc−ave is equal to or less than 11 $P_{ave}$, since it is possible to effectively increase the specific surface area, and thus the ohmic resistance is reduced to make the ohmic contact satisfactory, the electron injection efficiency EIE is enhanced. In terms of further achieving this effect, the distance Tcc−ave preferably satisfies 1.0 $P_{ave}$≤Tcc−ave≤9.5 $P_{ave}$. Furthermore, the distance Tcc−ave is a scale for indicating the size of an aggregation of the minimal concave portions 233. Here, when the minimal concave portions 233 are aggregated, an aggregation in which the concave portion depth is lower is formed. In this case, the optical scattering is reduced. This is because, for example, when the optical scattering is light diffraction, as the concave portion depth is increased, the light diffraction intensity is increased. Moreover, from this point of view, the distance Tcc−ave preferably satisfies 1.0 $P_{ave}$<Tcc−ave≤7.5 $P_{ave}$, more preferably satisfies 1.0 $P_{ave}$<Tcc−ave≤5.5 $P_{ave}$ and most preferably satisfies 1.0 $P_{ave}$<Tcc−ave≤3.5 $P_{ave}$.

Preferably, in the optical substrate (II) 2 according to the second embodiment, the concave portion depth dn of the minimal concave portion 233 satisfies formula (13) below, the existence probability Z satisfies formula (14) below and the distance Tcc−ave satisfies formula (15). In this case, the concave portion depth dn of the minimal concave portion 233 satisfies formula (13), and thus the difference in volume between the first concave portions 231, 232 and 234 and the minimal concave portion 233 is increased, and the local disturbance of the averaged refractive index and optical scattering (light diffraction or light scattering) in the minimal concave portion 233 are increased, with the result that it is possible to provide enhanced scattering on the order of nanometers. Simultaneously, since the existence probability Z satisfies formula (14), it is possible to increase the number of scattering points or the number of modes of light diffraction present in the thin film of the averaged refractive index, and the degree of scattering is comprehensively enhanced, with the result that the light extraction efficiency LEE is increased. Furthermore, since the distance Tcc−ave satisfies formula (15), it is possible to disperse dislocations within the semiconductor crystal layer and reduce the local dislocation density, with the result that it is possible to achieve the effect of improving the internal quantum efficiency IQE by the nanostructure addition. Moreover, since the distance Tcc−ave satisfies formula (15), even in the concave-convex structure on the order of nanometers, the specific surface area is effectively increased, and thus the ohmic contact is made satisfactory, with the result that the electron injection efficiency EIE is enhanced. In other words, formulas (13) to (15) are simultaneously satisfied, and thus it is possible to simultaneously enhance the internal quantum efficiency IQE, the electron injection efficiency EIE and the light extraction efficiency LEE, with the result that it is possible to enhance the external quantum efficiency EQE of the LED. Moreover, when formulas (13) to (15) are simultaneously satisfied, since it is possible to enhance the size of an aggregation of the minimal concave portions 233 and the dispersion of the aggregated minimal concave portions 233, it is possible to reduce the junction of the specifically growth semiconductor crystal layers, with the result that it is possible to reduce a defect in the shape of a crevasse produced in the semiconductor crystal layer. In this way, the degree of the p-n junction is enhanced, and thus it is possible to more reduce the leak current.

$$0.4H_{ave} \geq dn \geq 0 \quad \text{Formula (13)}$$

$$1/3000 \leq Z \leq 1/7.5 \quad \text{Formula (14)}$$

$$1.0P_{ave} < Tcc\text{−}ave \leq 7.5 \leq P_{ave} \quad \text{Formula (15)}$$

Furthermore, in this case, the concave portion depth do of the minimal concave portion 233 preferably satisfies formula (16) below in terms of the optical scattering (light diffraction or light scattering) addition on the order of nanometers. Even in this case, since the existence probability Z shown in formula (14) and the range of the distance Tcc−ave shown in formula (15) are satisfied, by the scattering enhanced on the order of nanometers, it is possible to enhance the light extraction efficiency LEE through the comprehensive optical scattering (light diffraction or light scattering) and to realize high internal quantum efficiency IQE or electron injection efficiency EIE.

$$0.2D_{ave} \geq dn \geq 0 \quad \text{Formula (16)}$$

Furthermore, the aspect ratio $D_{ave}$/ϕcc−ave of the first concave portions 231, 232 and 234 is a ratio between the average width ϕcc−ave of the opening portions of the first concave portions 231, 232 and 234 in the concave-convex structure (II) 22 and the concave portion average depth $D_{ave}$ The aspect ratio $D_{ave}$/ϕcc−ave preferably falls within a range equal to or more than 0.1 but equal to or less than 3.0 due to the same reason as in the optical substrate (I) 1 according to the first embodiment. In particular, in terms of further achieving this effect, the aspect ratio $D_{ave}$/ϕcc−ave preferably falls within a range equal to or more than 0.5 but equal to or less than 2.5, more preferably falls within a range equal to or more than 0.5 but equal to or less than 1.5 and most preferably falls within a range equal to or more than 0.5 but equal to or less than 1.2.

Since the internal quantum efficiency IQE and the light extraction efficiency LEE are simultaneously improved by the above principle, the shape of the concave portion 23 in the concave-convex structure (II) 22 is not limited, and thus the following shapes can be adopted: a cone, a cone-shaped member where the side surface portion of a cone is stepwise inclined, a cone-shaped member where the side surface portion of a cone is convex upward, a cone-shaped member where the bottom surface of a cone is distorted, a cone-shaped member where the outer shape of the bottom surface of a cone has three or more inflection points, a cylinder, a polygon, a pyramid and the like. In particular, in terms of more enhancing the internal quantum efficiency IQE, it is preferable to adopt either of the concave-convex structure (II) 22 in which the vertex portion of the convex portion 24 has a flat surface and the radius of curvature of the vertex of the concave portion 23 exceeds zero and the concave-convex structure (II) 22 in which the vertexes 24*a* of the convex portions 24 are continuously and smoothly connected and in which the bottom portion of the concave portion 23 has a flat surface.

The side surface of the concave portion may be smooth or other concave and convex portions may be further provided on the side surface of the concave portion. The bottom portion of the concave portion 23 preferably has a flat surface. In particular, when the area of the flat surface in the bottom portion of the concave portion 23 is converted into the area of a circle, the diameter of its circle is equal to or more than 30 nm, and thus it is possible to satisfactorily maintain the initial growth of the semiconductor crystal layer, with the result that it is possible to enhance the effect of improving the internal quantum efficiency IQE. In the same terms, the diameter is more preferably equal to or more than 60 nm, and is most preferably equal to or more than 80 nm.

When the flat surface having the bottom portion of the concave portion 23 in the concave-convex structure (II) 22 or the flat surface having the vertex portion of the convex portion 24 (hereinafter referred to as a "flat surface B") is parallel to a surface (hereinafter referred to as a "parallel stable growth surface") approximately parallel to the stable growth surface of the first semiconductor layer provided on the concave-convex structure (II) 22, since the disturbance of the growth mode of the first semiconductor layer in the vicinity of the concave portion 23 in the concave-convex structure (II) 22 is increased, and thus it is possible to effectively reduce dislocations within the first semiconductor layer, the internal quantum efficiency IQE is enhanced. The stable growth surface refers to a surface whose growth rate is the lowest in the material to be grown. In general, it is known that the stable growth surface appears as a facet surface in the middle of growth. For example, in a gallium nitride compound semiconductor, a flat surface parallel to an A axis, such as an M plane, is the stable growth surface. The stable growth surface of GaN semiconductor layer is the M plane (1-100), (01-10) and (-1010) of a hexagonal crystal, and is one of the flat surfaces parallel to the A axis. Depending on the growth conditions, another flat surface including the A axis that is a flat surface other than the M plane of the GaN semiconductor layer may be the stable growth surface.

The minimal concave portions 233 may be arranged non-cyclically or cyclically due to the same reason as in the optical substrate (I) 1.

In the optical substrate (I) 1 according to the first embodiment and the optical substrate (II) 2 according to the second embodiment described above, in a part or the whole of the surfaces of the optical substrates (I) 1 and (II) 2, the concave-convex structure (I) 12 and (II) 22 described above are arranged. A part or the whole mentioned here is as follows.

The optical substrates (I) 1 and (II) 2 according to the embodiments described above have the concave-convex structures described above and according to the present embodiments in a part or the whole of the surfaces of the optical substrates. In other words, the whole surfaces of the optical substrates may be covered with the concave-convex structures described above or the concave-convex structures described above may be provided in a part of the surfaces of the optical substrates. In the following description, the concave-convex structure described above is referred to as a concave-convex structure G, and a concave-convex structure that does not correspond to the concave-convex structure described above is referred to as a concave-convex structure B.

In at least a part of the optical substrates (I) 1 and (II) 2, the concave-convex structure G is included. In other words, the whole surfaces of the optical substrates may be covered with the concave-convex structure G or a part thereof may be covered therewith. Here, a region that is not covered with the concave-convex structure G is referred to as a "non-G region". Here, the non-G region is formed with the concave-convex structure B and/or a flat portion. Even when the non-G region is provided in a part of the surface of the optical substrate, since in a region covered with the concave-convex structure G, it is possible to realize the already described effects, it is possible to simultaneously improve the internal quantum efficiency IQE and the light extraction efficiency LEE and to reduce the leak current.

(a) Preferably, when the average interval $P_{ave}$ is used, the concave-convex structure G provided in the surface of the optical substrate is provided at least within a region having an area of 10 $P_{ave}$×10 $P_{ave}$, and thus the effects described above are achieved. In other words, for example, when the surface of the optical substrate is observed with a scanning electron microscope, the interior of the region having an area of 10 $P_{ave}$×10 $P_{ave}$ is preferably formed with the concave-convex structures G. In particular, the sum of the concave-convex structures G filling the interior of the region having an area of 10 $P_{ave}$×10 $P_{ave}$ preferably satisfies the ratio or the size of the concave-convex structures G which will be described below. In other words, a range having an area of 10 $P_{ave}$×10 $P_{ave}$ is formed with the concave-convex structures G, and a plurality of ranges described above can be provided. In particular, the area is preferably 20 $P_{ave}$ ave×20 $P_{ave}$, and is more preferably 25 $P_{ave}$×25 $P_{ave}$ because the effect of disturbing the growth mode of the semiconductor crystal layer and the effect of enhancing optical scattering caused by the concave-convex structure G are made remarkable. Even in this case, the sum of the concave-convex structures G preferably satisfies the ratio or the size of the concave-convex structures G which will be described below. Furthermore, preferably, a region having an area of 50 $P_{ave}$×50 $P_{ave}$ or more and more preferably 75 $P_{ave}$×75 $P_{ave}$ or more, is formed with the concave-convex structures G, and thus in a non-G region adjacent to the region covered with the concave-convex structures G, the internal quantum efficiency IQE and the light extraction efficiency LEE are improved. The present effect is more achieved as the area is increased from 100 $P_{ave}$×100 $P_{ave}$ or more to 150 $P_{ave}$×150 $P_{ave}$ or more and to 450 $P_{ave}$×450 $P_{ave}$ or more. Even in these cases, the sum of the concave-convex structures G preferably satisfies the ratio or the size of the concave-convex structures G which will be described below.

(β) When a non-G region is provided in the region covered with the concave-convex structure G, the ratio of the non-G region to the concave-convex structure G is equal to or less than 1/5. Thus, it is possible to achieve the effect of the concave-convex structure G. In terms of more achieving the same effect, the ratio is more preferably equal to or less than 1/10, is more preferably equal to or less than 1/25 and is most preferably equal to or less than 1/50. When the ratio is equal to or less than 1/100, it is possible to more enhance the effect of improving the internal quantum efficiency IQE. In particular, preferably, when the ratio is equal to or less than 1/500 and is more preferably equal to or less than 1/1000, the evenness of the light emitted from the interior of the semiconductor light-emitting element is enhanced. In the same terms, the ratio is preferably equal to or less than 1/10000, is preferably equal to or less than 1/100000 and is preferably equal to or less than 1/1000000. The lower limit value is not particularly limited; the lower limit value is preferably lower because as the lower limit value is lower, that is, it is closer to 0, the effect of the concave-convex structure G is made more remarkable.

(γ) The ratio of the concave-convex structure G to the surface of the optical substrate is preferably equal to or more than 0.002% because the already described effect of the concave-convex structure G can be achieved though it depends on the outer shape or the size of the semiconductor light-emitting element. In particular, since the optical substrate includes the concave-convex structure G with a ratio of 0.02% or more and more preferably a ratio of 0.2% or more, and thus the dispersion of dislocations within the semiconductor crystal layer is enhanced, the evenness of the internal quantum efficiency IQE is enhanced. Furthermore, the optical scattering points are dispersed, and thus the evenness of the light extraction efficiency LEE is enhanced. Accordingly, the internal quantum efficiency IQE and the light extraction efficiency LEE in the non-G region are enhanced, and thus it is preferable. Furthermore, the optical substrate includes the concave-convex structure G with a ratio of 2.3% or more and more preferably a ratio of 10% or more, and thus it is possible to more achieve the effect described above. Since when the ratio is equal to or more than 20%, the in-plane evenness of the semiconductor crystal layer formed into a film on the optical substrate is enhanced, the yield of obtaining the semiconductor light-emitting element in which the internal quantum efficiency IQE and the light extraction efficiency LEE are simultaneously enhanced is enhanced. In terms of more achieving the present effect, 30% or more of the concave-convex structure G is preferably included, 40% or more are more preferably included and 50% or more are most preferably included. When 60% or more of the concave-convex structure G is included, the transmission of the effect of the concave-convex structure G over the non-G region is enhanced. In other words, the semiconductor crystal layer in which dislocations are reduced by the concave-convex structure G is transmitted to the non-G region, and thus the degree of enhancement of the internal quantum efficiency IQE over the non-G region is increased. On the other hand, since the dispersion of the interface between the concave-convex structure G and the non-G region is increased, the optical scattering on the interface is enhanced. Hence, the light extraction efficiency LEE is also enhanced. In terms of more achieving the effect described above, 70% or more of the concave-convex structure G is preferably included, 80% or more are more preferably included and 90% or more are most preferably included. When 100% of the concave-convex structure G is included, that is, when the surface of the optical substrate is completely covered with the concave-convex structure G, since the semiconductor crystal layer is evenly grown within the plane of the optical substrate, the evenness of the degree of the enhancement of the internal quantum efficiency IQE and the light extraction efficiency LEE is facilitated. In other words, the performance distribution curve of the semiconductor light-emitting element becomes sharp.

(δ) A case where the optical substrate is used as an LED substrate will be described. Here, the concave-convex structure G included in the surface of the optical substrate is preferably equal to or more than $0.0025\times10^{-6}$ $m^2$. This range is satisfied, and thus the light emission output when it is regarded as an LED chip is increased. Although this depends on the size and the outer shape of the LED chip, this can be determined from a probability that the emitted light guided within the LED chip collides with the concave-convex structure G. When this range is satisfied, the initial growth of the semiconductor crystal layer formed into a film on the concave-convex structure G is made satisfactory. In other words, since the nucleation and the growth rate of the semiconductor crystal layer can be lowered by the concave-convex structure G, the dislocations are reduced, and the internal quantum efficiency IQE is enhanced. In terms of more achieving the effect described above, the concave-convex structure G included in the surface of the optical substrate is preferably equal to or more than $0.01\times10^{-6}$ $m^2$, is more preferably equal to or more than $0.04\times10^{-6}$ $m^2$ and is most preferably equal to or more than $0.09\times10^{-6}$ $m^2$. Furthermore, since when the concave-convex structure G is equal to or more than $0.9\times10^{-6}$ $m^2$, the in-plane evenness of the semiconductor crystal layer formed into a film on the optical substrate is enhanced, the yield of obtaining the semiconductor light-emitting element in which the internal quantum efficiency IQE and the light extraction efficiency LEE are simultaneously enhanced is enhanced. In terms of more achieving the effect described above, the concave-convex structure G is more preferably equal to or more than $9\times10^{-6}$ $m^2$ and is most preferably equal to or more than $90\times10^{-6}$ $m^2$. When the concave-convex structure G is equal to or more than $900\times10^{-6}$ $m^2$ and is more preferably equal to or more than $1.8\times10^{-3}$ $m^2$, the transmission of the effect of the concave-convex structure G over the non-G region is enhanced. In other words, the semiconductor crystal layer in which dislocations are reduced by the concave-convex structure G is transmitted to the non-G region, and thus the degree of enhancement of the internal quantum efficiency IQE over the non-G region is increased. On the other hand, since the dispersion of the interface between the concave-convex structure G and the non-G region is increased, the optical scattering on the interface is enhanced. Hence, the light extraction efficiency LEE is also enhanced. In particular, when the concave-convex structure G is equal to or more than $3.6\times10^{-3}$ $m^2$ and is more preferably equal to or more than $7.5\times10^{-3}$ $m^2$, even if an outer edge portion of an LED substrate is used, it is possible to obtain a satisfactory LED. One or more concave-convex structures G that satisfy the size of the concave-convex structure G described above are provided on the surface of the optical substrate, and this it is possible to obtain an LED substrate with which it is possible to manufacture high-efficient LED. A plurality of concave-convex structures G that satisfy the size of the concave-convex structure G described above can be provided. In this case, at least one concave-convex structure G satisfies the size described above. In particular, 50% or more of the concave-convex structures G preferably satisfy the range of the size described above, and 100% of the concave-convex structures G most preferably satisfy the range of the size described above.

Figure 19A:
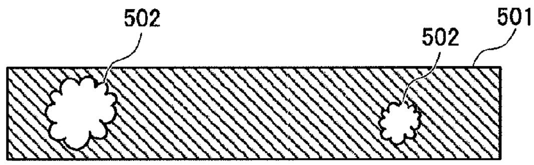
FIG. 19 An illustrative diagram showing a relationship between a concave-convex structure G and a non-G region on the optical substrate according to the present embodiment.
Figure 19C:
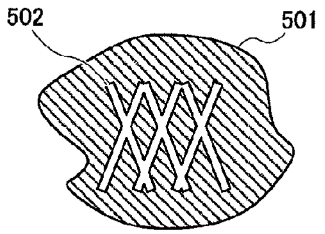
Figure 19B:
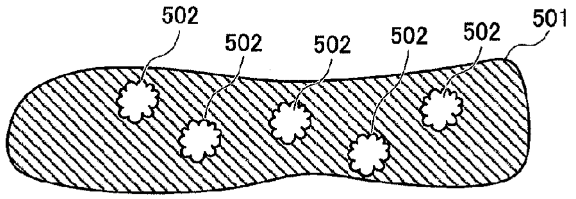
Figure 19D:
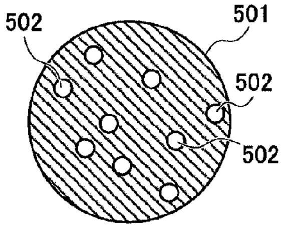

The arrangement relationship between the concave-convex structure G and the non-G region is not particularly limited as long as it satisfies what has been described above. For example, there is a relationship below. When the concave-convex structure G and the non-G region are considered, as the arrangement relationship between the concave-convex structure G and the non-G region, there can be an arrangement that will be described below. The concave-convex structure G refers to an aggregation of concave-convex structures G that satisfy one or more of α, β, γ and δ, that is, a concave-convex structure G region. When as shown in FIG. 19, non-G regions 502 are provided within a concave-convex structure G region 501, as long as the non-G regions 502 satisfy the ratio described in β discussed above, its shape, regularity and non-regularity are not limited. FIG. 19 is an illustrative diagram showing a relationship between the concave-convex structure G and the non-G region on the optical substrate according to the present embodiment. In FIGS. 19A and 19B, in the concave-convex structure G region 501, a plurality of non-G regions 502 whose outlines are indefinite are arranged. In FIG. 19C, in the concave-convex structure G region 501, a non-G region 502 in the form of a lattice is provided. In FIG. 19D, in the concave-convex structure G region 501, a plurality of substantially circular non-G regions 502 are formed.

The shape of the outline of the concave-convex structure G region 501 is not particularly limited. In other words, the shape of the interface between the concave-convex structure G region 501 and the non-G regions 502 is not limited. Hence, for example, examples of the shape of the interface between the concave-convex structure G region 501 and the non-G regions 502 include an n-gon (n≥3), a non-n-gon (n≥3), a lattice shape and a line shape. The n-gon may be a regular n-gon or a non-regular n-gon.

FIG. 20 is a schematic diagram showing the shapes of outlines formed in the concave-convex structure G region on the optical substrate according to the present embodiment. For example, examples of a tetragon include a regular tetragon (square), a rectangle, a parallelogram, a trapezoid and a shape in which one or more pairs of sides opposite each other in a tetragon are not parallel. Furthermore, when in an n-gon (n≥3), n is 4 or more, shapes as shown in FIGS. 20A to 20D are included. FIG. 20A is a tetragon, FIG. 20B is a hexagon, FIG. 20C is an octagon and FIG. 20D is a dodecagon. Examples of the non-n-gon include structures that include a corner portion whose radius of curvature exceeds 0, such as a circle and an oval, a shape in which the corners of the n-gon described above are rounded (shape in which the corners of the n-gon described above exceed 0) or the n-gon described above that includes a rounded corner (part whose radius of curvature exceeds 0). Hence, for example, shapes illustrated in FIGS. 20E to 20H are included. As the shapes of the outlines of the non-G region, the shapes of the outlines of the aggregation of the concave-convex structures G described above can be adopted.

Figure 20A:
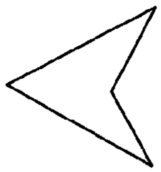
FIG. 20 A schematic diagram showing the shapes of outlines formed in a concave-convex structure G region on the optical substrate according to the present embodiment.
Figure 20B:
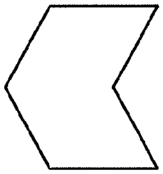
Figure 20C:
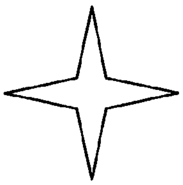
Figure 20D:
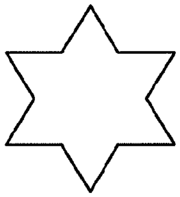
Figure 20E:
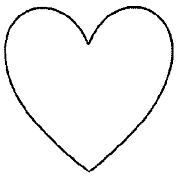
Figure 20F:
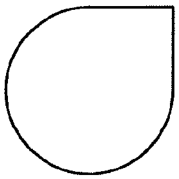
Figure 20G:
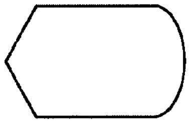
Figure 20H:
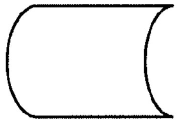
Figures 21A, 21B, 21C, 21D, 21E, 21F:
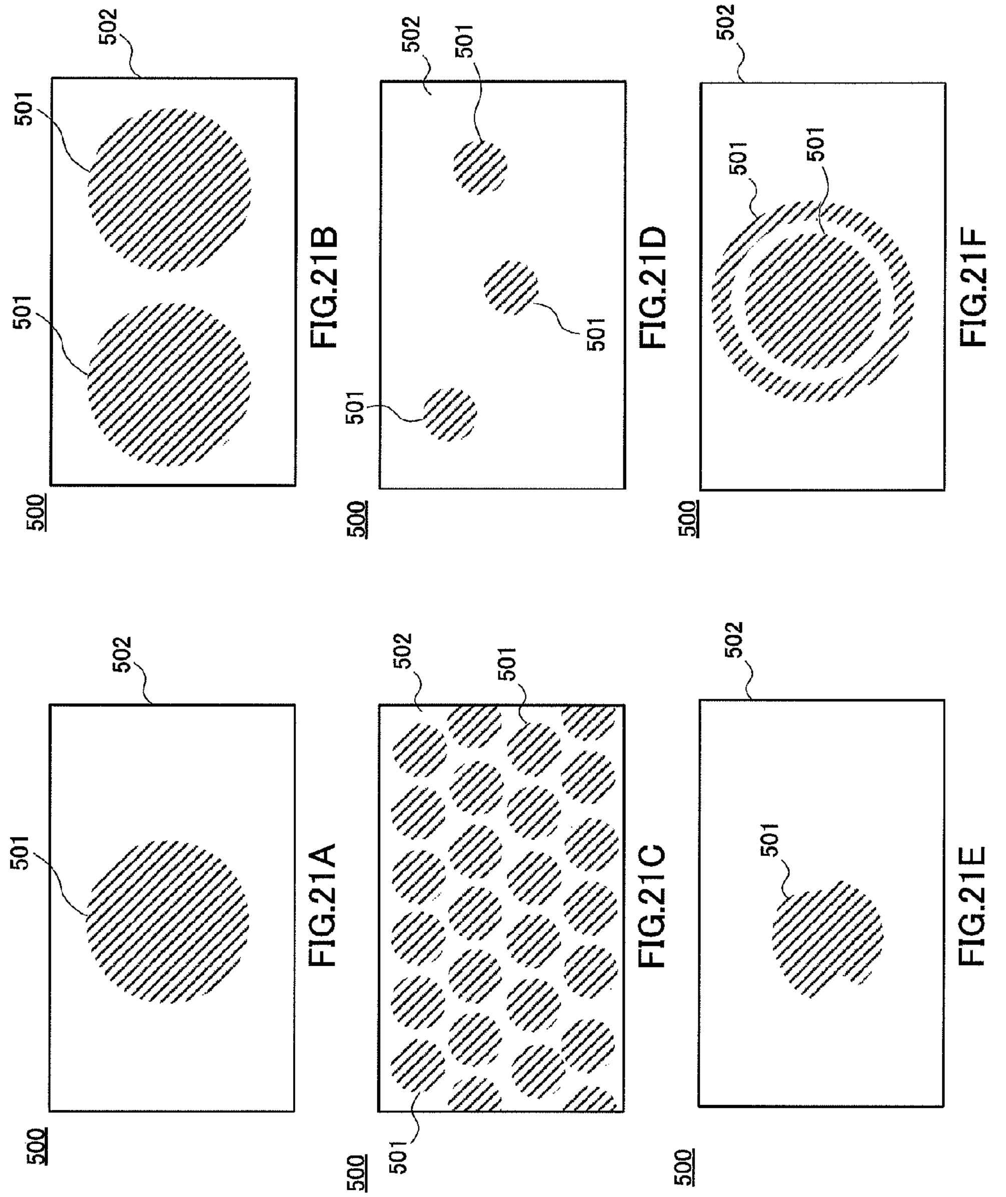
FIG. 21 A schematic plan view showing a state where the optical substrate according to the present embodiment is observed from its front surface.

First, there is a state where the concave-convex structure G region 501 is surrounded or sandwiched by the non-G regions 502. FIG. 21 is a schematic plan view showing a state where the optical substrate according to the present embodiment is observed from the front surface. FIGS. 21A to 21F show states where the concave-convex structure G region 501 is surrounded by the non-G region 502. As shown in FIG. 21A, the concave-convex structure G region 501 may be provided on the surface of the optical substrate 500, and the outside thereof may be formed with the non-G region 502. The concave-convex structure G region 501 preferably satisfies the ratio described above. The concave-convex structure G region 501 also satisfies the size that has already been described. As shown in FIG. 21B or 21C, on the surface of the optical substrate, a plurality of concave-convex structure G regions 501 may be arranged apart from each other, and the area between the concave-convex structure G regions 501 and the outside of the concave-convex structure G regions 501 may be filled with the non-G region 502. In this case, the total area of the concave-convex structure G preferably satisfies the rate described above. At least one concave-convex structure G preferably satisfies the already described size, and all the concave-convex structures G more preferably satisfy the already described size. When a plurality of concave-convex structures G are provided, as shown in FIG. 21C, the concave-convex structure G regions 501 may be arranged regularly or as shown in FIG. 21D, the concave-convex structure G regions 501 may be arranged irregularly. Examples of the regular arrangement include a square arrangement, a hexagonal arrangement, an arrangement in which these arrangements are extended in the direction of one axis or an arrangement in which these arrangements are extended in the directions of two axes. Furthermore, although the shape of the outline of the concave-convex structure G region 501 is circular in FIGS. 21A to 21D, as shown in FIG. 21E, an indefinite shape can be adopted. For example, examples of the outer shape of the concave-convex structure G region 501 can include an n-gon (n≥3), an n-gon (n≥3) whose corners are rounded, a circle, an oval, a line shape, a star shape and a lattice shape. As shown in FIG. 21F, an arrangement can be adopted in which the concave-convex structure G region 501 is surrounded by the non-G regions 502, its outer circumference is surrounded by the concave-convex structure G region 501 and furthermore its outer circumference is surrounded by the non-G regions 502. Although in FIGS. 21A to 21D, the concave-convex structure G regions 501 are circular, as the shape of the outline of the concave-convex structure G region 501, the shapes that have been described with reference to FIG. 20 can be adopted.

FIG. 22 is a schematic plan view showing the state where the optical substrate according to the present embodiment is observed from the front surface. FIG. 22 shows a case where the concave-convex structure G region 501 is sandwiched by the non-G regions 502. As shown in FIGS. 22A and 22B, the concave-convex structure G region 501 may be provided on the surface of the optical substrate 500, and the outside thereof may be formed with the non-G region 502. The concave-convex structure G preferably satisfies the rate described above. The concave-convex structure G also preferably satisfies the already described size. As shown in FIG. 22C, on the surface of the optical substrate 500, a plurality of concave-convex structure G regions 501 may be arranged apart from each other, and the area between the concave-convex structure G regions 501 and the outside of the concave-convex structure G regions 501 may be filled with the non-G region 502. In this case, the total area of the concave-convex structure G preferably satisfies the rate described above. At least one concave-convex structure G preferably satisfies the already described size, and all the concave-convex structures G more preferably satisfy the already described size. As shown in FIG. 22D, the concave-convex structure G regions 501 can be continuously arranged so as to contain the non-G regions 502. In this case, the area of the concave-convex structures G preferably satisfies the rate described above. The concave-convex structure G also preferably satisfies the already described size. The shape of the interface between the concave-convex structure G region 501 and the non-G region 502 may be straight or be bent as shown in FIG. 22E. Examples of the shape of the concave-convex structure G region 501 include a straight shape, a lattice shape and a mesh shape. As shown in FIG. 22F, the concave-convex structure G region 501 can be sandwiched by the non-G regions 502, its outer circumference can be sandwiched by the concave-convex structure G regions 501 and furthermore, its outer circumference can be sandwiched by the non-G regions 502. Although in FIG. 22, the outlines formed by the concave-convex structure G regions 501 are drawn by straight lines or schematic lines, the shapes described with reference to FIG. 20 can be adopted.

Even when a plurality of concave-convex structure G regions 501 described above are provided, the shape of the interface between each of the concave-convex structure G regions 501 and the non-G region 502 may be single or different for each of the concave-convex structure G regions 501.

In the arrangement relationship between the concave-convex structure G region 501 and the non-G region 502 described above, the case where the concave-convex structure G region 501 is surrounded by the non-G regions 502 and the case where the concave-convex structure G region 501 is sandwiched by the non-G regions 502 can be mixed.

Figure 22A:
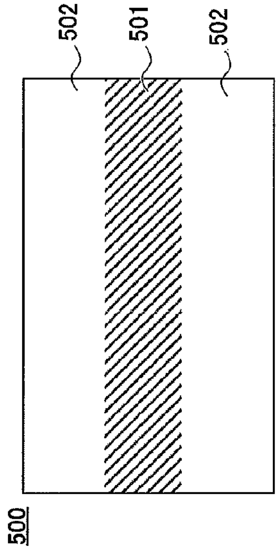
FIG. 22 A schematic plan view showing the state where the optical substrate according to the present embodiment is observed from its front surface.
Figure 22B:
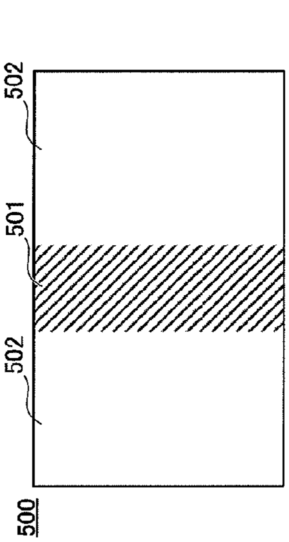
Figure 22C:
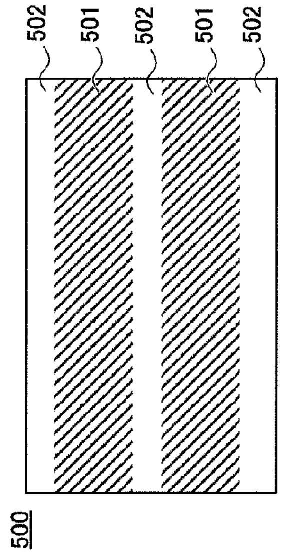
Figure 22D:
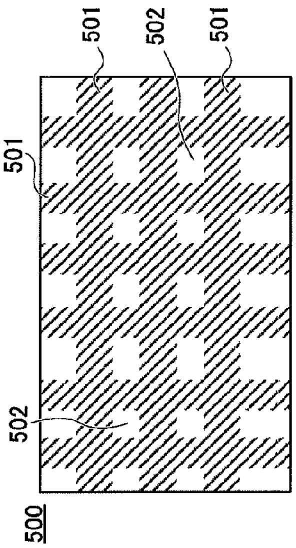
Figure 22E:
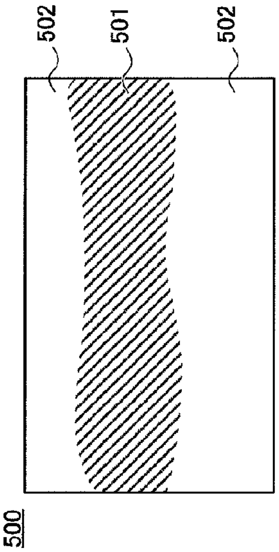
Figure 22F:
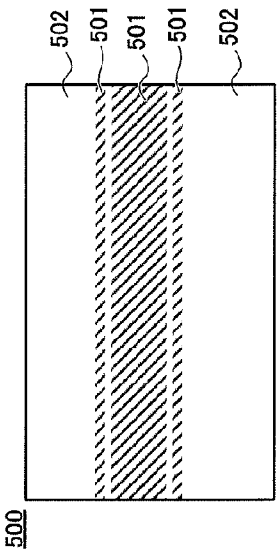

When as shown in FIGS. 21F and 22F, the first non-G regions 502 are provided outside the concave-convex structure G region 501 (G1), furthermore the second concave-convex structure G regions 501 (G2) are provided outside it and furthermore, the non-G regions 502 are provided outside it, the second concave-convex structure G regions 501 (G2) may be discontinuous.

The non-G region may be formed with the concave-convex structure B, the flat portion or the concave-convex structure B and the flat portion.

The concave-convex structure G may be the concave-convex structure (I) 12 according to the first embodiment or the concave-convex structure (II) 22 according to the second embodiment. The concave-convex structure B may be a concave-convex structure (III) described below and according to a third embodiment and/or a concave-convex structure (IV) according to a first embodiment.

Although in the above description, all the outer shapes of the optical substrate 500 are drawn to be rectangular, the shape of the optical substrate 500 is not limited to these shapes, and a circle, a shape that includes an arc having a curvature of a circle and a straight line, an n-gon (n≥3), a non-n-gon (n≥3), a lattice shape and a line shape can be adopted. The n-gon may be a regular n-gon or a non-regular n-gon. For example, examples of a tetragon include a regular tetragon (square), a rectangle, a parallelogram, a trapezoid and a shape in which one or more pairs of sides opposite each other in a tetragon are not parallel. Furthermore, when in an n-gon (n≥3), n is 4 or more, shapes as shown in FIGS. 20A to 20D are included. FIG. 20A is a tetragon, FIG. 20B is a hexagon, FIG. 20C is an octagon and FIG. 20D is a dodecagon. The non-n-gon is a structure having no corners such as a circle, an oval, a shape in which the corners of the n-gon described above are rounded (shape in which the radius of curvature of the corners of the n-gon described above exceeds 0) or the n-gon (n≥3) described above that includes a rounded corner (corner portion whose radius of curvature exceeds 0). Hence, for example, shapes illustrated in FIGS. 20F to 20H are included. Among them, a shape symmetric with respect to a line can be preferably adopted.

The materials and processing methods of the substrate main body 11 and the concave-convex structure (I) 12 in the optical substrate (I) 1 shown in FIG. 7A and according to the first embodiment and a semiconductor element using them will be described below. In particular, the configuration other than what will be described below is the same as in the optical substrate (II) 2 according to the second embodiment.

First, in the optical substrate (I) 1, the substrate main body 11 and the concave-convex structure (I) 12 may be formed of the same material or may be individually formed of a different material. The substrate main body 11 may be directly processed to provide the concave-convex structure (I) 12 or the layer of the concave-convex structure (I) 12 may be added separately on the substrate main body 11. When the layer of the concave-convex structure (I) 12 is separately provided on the substrate main body 11, it is possible to adopt a method of forming a predetermined layer into a film on the substrate main body 11 and directly processing the layer formed into a film, a method of separately growing a layer so as to form the concave-convex structure (I) 12 on the substrate main body 11 or a method of providing the concave-convex structure (I) 12 by transfer so as to form the concave-convex structure (I) 12 on the substrate main body 11.

Examples of the method of providing the concave-convex structure (I) 12 by processing include an electron beam lithography method (EB method), a photolithography method using a photosensitive resist, a thermal lithography method using a heat-sensitive resist, an interference exposure method, a nano-imprint lithography method, a method of performing processing through a mask produced by self-organization, a method of processing nanoparticles as a mask, a nano-imprint lithography method that utilizes a mold which has, on its surface, a concave-convex structure containing a mask layer within the concave portion of the concave-convex structure and that does not need to process the residual film.

Figure 7B:
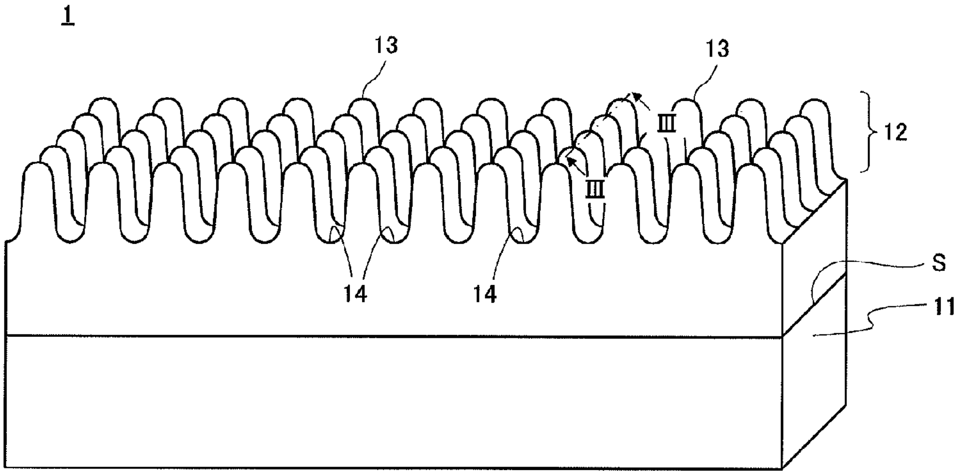

Examples of the method of separately providing the concave-convex structure (I) 12 on the substrate main body 11 as shown in FIG. 7B includes a nano-imprint method, a macro-layer separation method, a micro-layer separation method, an alternate layer depositing method and a method of applying (such as a spin coat method or a dip coat method) minute particles or a mixture of minute particles and an organic substance. The following method may be used: with a vacuum film formation method (such as an evaporation method, a sputtering method or an MOCVD method) or a wet method (such as a cast method or a spin coat method), a metal, a metal oxide, AlN, spin-on carbon, spin-on glass, SiC or the like is formed into a film, and to the layer formed into a film, an electron beam lithography method (EB method), a photolithography method using a photosensitive resist, a thermal lithography method using a heat-sensitive resist, a nano-imprint lithography method, a nano-imprint lithography method that utilizes a mold which has, on its surface, a concave-convex structure containing a mask layer within the concave portion of the concave-convex structure and that does not need to process the residual film or the like is applied. The following method may be used: a concave-convex structure made of resin or the like is previously formed on the substrate main body 11 to process the residual film, thereafter with a vacuum film formation method (such as an evaporation method, a sputtering method or an MOCVD method) or a wet method (such as a cast method or a spin coat method), a metal, a metal oxide, AlN, spin-on carbon, spin-on glass, SiC or the like is embedded in the concave portion and then the resin layer is lifted off.

In the optical substrates (I) 1 and (II) 2 according to the present embodiment, the material of the substrate main body is not particularly limited as long as it can be used as a semiconductor light-emitting element base member. Examples of the base material that can be used include: sapphire, SiC, SiN, GaN, W—Cu, silicon, zinc oxide, magnesium oxide, manganese oxide, zirconium oxide, manganese oxide zinc iron, magnesium oxide aluminum, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, GaP and GaAs. Among them, in terms of lattice matching with the semiconductor layer, a base material such as sapphire, GaN, GaP, GaAs or SiC is preferably applied. Furthermore, it may be used singly or a substrate of a heterostructure in which another base material is provided on the substrate main bodies 11 and 21 using these may be used. As the crystal plane of the substrate main body 11, a crystal plane suitable for the semiconductor light-emitting element can be selected as necessary. For example, in a sapphire substrate, a crystal plane such as a c-plane, an m-plane and an a-plane and planes in which these planes have an off angle can be adopted.

In the semiconductor light-emitting element using the optical substrates (I) 1 and (II) 2 according to the present embodiment, the material of the p-type semiconductor layer is not particularly limited as long as it can be used as the p-type semiconductor layer suitable for an LED. For example, it is possible to apply materials obtained by doping elemental semiconductors such as silicon and germanium and compound semiconductors such as group III-V, group II-VI and group VI-VI with various elements as necessary.

In the semiconductor light-emitting element using the optical substrates (I) 1 and (II) 2 according to the present embodiment, the material of the transparent conductive film is not particularly limited as long as it can be used as the transparent conductive film suitable for an LED. For example, it is possible to apply metal thin films such as an Ni/Au electrode, conductive oxide films such as ITO, ZnO, $In_2O_3$, $SnO_2$, IZO and IGZO. In particular, in terms of transparency and conductivity, ITO is preferably used.

The materials of the concave-convex structures (I) 12 and (II) 22 when the layers of the concave-convex structures (I) 12 and (II) 22 are formed separately in the optical substrates (I) 1 and (II) 22 are not particularly limited as long as they can be used as the semiconductor light-emitting element. Examples of the materials that can be used include inorganic particles (metal particles, metal oxide particles), inorganic filler, metal alkoxide, metal alkoxide such as a silane coupling agent, AlN, SiC, spin-on glass, spin-on carbon, GaN, a nitride semiconductor, AlN, GaAsP, GaP, AlGaAs, InGaN, GaN, AlGaN, ZnSe and AlHaInP.

Among them, the state where the materials are more preferable as the semiconductor light-emitting element is a case where the materials of the substrate main bodies 11 and 21 and the concave-convex structures (I) 12 and (II) 22 are the same and the substrate main bodies 11 and 21 are sapphire, SiC or a nitride semiconductor or a case where the substrate main bodies 11 and 21 are sapphire, SiC or t a nitride semiconductor and the concave-convex structures (I) 12 and (II) 22 are a nitride semiconductor.

The semiconductor light-emitting element using the optical substrate (I) 1 according to the first embodiment will then be described.

The semiconductor light-emitting element according to the present embodiment includes at least one or more of the optical substrates (I) 1 and (II) 2 described above and according to the present embodiment. The optical substrate according to the present embodiment is included in the configuration, and thus it is possible to enhance the internal quantum efficiency IQE, the electron injection efficiency EIE and the light extraction efficiency LEE. Furthermore, it is possible to reduce the leak current.

The semiconductor light-emitting element according to the present embodiment includes a deposited semiconductor layer that is formed by depositing, for example, on the substrate main surface, at least two or more of semiconductor layers and light-emitting layers. The deposited semiconductor layer includes a concave-convex structure layer containing dots formed with a plurality of convex portions or concave portions extending from the outermost surface of the semiconductor layer main surface in the direction toward the outside of the surface, and the concave-convex structure layer corresponds to the concave-convex structure of the optical substrate (I) 1 and (II) 2 according to the embodiment described above. The deposited semiconductor layer has been described with reference to FIGS. 1 to 3.

In the semiconductor light-emitting element according to the present embodiment, the n-type semiconductor layer is not particularly limited as long as it can be used as the n-type semiconductor layer suitable for an LED. For example, it is possible to apply materials obtained by doping elemental semiconductors such as silicon and germanium and compound semiconductors such as group III-V, group II-VI and group VI-VI with various elements as necessary. On the n-type semiconductor layer and the p-type semiconductor layer, as necessary, unillustrated n-type clad layer and p-type clad layer can be provided.

The light-emitting semiconductor layer is not particularly limited as long as it has light emission characteristics as an LED. For example, as the light-emitting semiconductor layer, a semiconductor layer such as AsP, GaP, AlGaAs, InGaN, GaN, AlGaN, ZnSe, AlHaInP or ZnO can be applied. The light-emitting semiconductor layer may be doped with various elements as necessary according to the characteristics.

When the n-type semiconductor layer, the light-emitting semiconductor layer and the p-type semiconductor layer are sequentially provided on the concave-convex structure surface of the optical substrate, a low-temperature growth buffer layer (for example, $Al_xGa_{1-x}N$, $0 \le x \le 1$) may be provided on the on the concave-convex structure surface of the optical substrate. On the low-temperature growth buffer layer, an undoped semiconductor layer (for example, undoped GaN) may be provided. In other words, the n-type semiconductor layer described above is assumed to include the low-temperature growth buffer layer and the undoped semiconductor layer.

These deposited semiconductor layers (the n-type semiconductor layer, the light-emitting semiconductor layer and the p-type semiconductor layer) can be formed into a film on the surface of the optical substrate by a known technology. For example, as the film formation method, a metal organic chemical vapor deposition method (MOCVD), a hydride vapor phase epitaxy method (HVPE) and a molecular beam epitaxy method (MBE) or the like can be applied.

In the semiconductor light-emitting element according to the present invention, the structure described with respect to FIGS. 1 to 3 is a basic structure, and furthermore, a concave-convex structure can be added separately in the interface for reducing the total reflection. The separately provided concave-convex structure is not limited as long as it does not adversely affect the internal quantum efficiency IQE, the light extraction efficiency LEE and the electron injection efficiency EIE of the semiconductor light-emitting element. For example, in terms of enhancing scattering and further enhancing the light extraction efficiency LEE, the average interval of the separately provided concave-convex structure is preferably 50 times or more as long as the wavelength of the light emitted by the semiconductor light-emitting element. In this case, it is possible to utilize light scattering as an optical phenomenon. When it is desired to simultaneously realize the emission of the light in a specific direction and the enhancement of the light extraction efficiency LEE, the average interval of the separately provided concave-convex structure is preferably 0.8 times or more but 50 times or less as long as the wavelength of the light emitted by the semiconductor light-emitting element. In this case, it is possible to utilize light diffraction as an optical phenomenon. In terms of enhancing the light extraction efficiency and reducing a time for producing the separately provided concave-convex structure, the average interval of the separately provided concave-convex structure is preferably 0.8 times or less as long as the wavelength of the light emitted by the semiconductor light-emitting element. In this case, in order to more enhance the light extraction efficiency, it is preferable to satisfy the concave-convex structure according to the present invention.

A method of manufacturing the optical substrate (I) 1 according to the first embodiment will then be described. The manufacturing method that will be described below is an example, and the method of manufacturing the optical substrate (I) 1 is not limited to this method.

Figure 23:
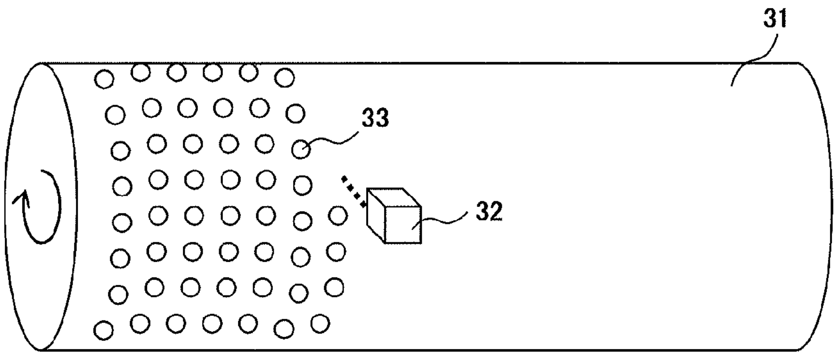
FIG. 23 A schematic diagram showing an example of a method of manufacturing the optical substrate (I) according to the first embodiment.

FIG. 23 is a schematic diagram showing an example of the method of manufacturing the optical substrate (I) 1. First, a cylindrical mold 31 is produced in which a thermal reaction resist (resist layer) is evenly formed into a film on its surface. Then, in a state where the cylindrical mold 31 is rotated, while a pulse laser is being applied from a laser application portion 32 to the surface of the cylindrical mold 31, scanning is performed in the direction of the cylindrical axis of the cylindrical mold 31. By the rotation frequency of the cylindrical mold 31 and the pulse frequency of the pulse laser, a pattern 33 is recorded at arbitrarily intervals in a resist layer on the outer circumferential surface of the cylindrical mold 31 in the rotation direction. Here, by setting, at one period, an operation of applying x pulses and thereafter not applying y pulses, setting at one period, an operation of applying x pulses with power q and applying y pulses with power r or performing an operation on laser light applied at a certain frequency such that pulses are not produced randomly or the energy of the pulse is changed, it is possible to arbitrarily set the distance Tcv−ave or tcv−ave or the distance Tcc−ave or tcc−ave and the convex portion height hn or the concave portion depth do in the optical substrates (I) 1 and (II) 2 and the existence probability Z of the minimal convex portion 133 or the minimal concave portions 233 shown in FIGS. 9 and 10. Since the pulse laser is scanned in the direction of the cylindrical axis of the cylindrical mold 31, when the cylindrical mold 31 goes into a 360-degrees roll from an arbitrary position, the laser application portion 32 is displaced in the direction of the cylindrical axis.

A method of transferring the pattern 33 obtained as described above to the substrate main body 11 is not particularly limited, and for example, a nano-imprint lithography method can be used. When this nano-imprint lithography method is used, a mold which has, on its surface, a concave-convex structure containing a mask layer within the concave portion of the concave-convex structure is utilized, and thus it is possible to omit the residual film removing.

When the nano-imprint lithography method is used, the pattern 33 (the concave-convex structure) is transferred to a film from the cylindrical mold 31 having the pattern 33 obtained as described above, and thus a resin mold is manufactured. Then, the obtained resin mold is used as a template, the substrate main body 11 is processed by the nano-imprint lithography method and thus it is possible to manufacture the optical substrate (I) 1. With this method, it is possible to increase the efficiency of utilizing the mold to absorb the flatness of the substrate main body 11.

A method of transferring the pattern 33 from the cylindrical mold 31 to the resin mold is not particularly limited, and for example, a direct nano-imprint method can be applied. Examples of the direct nano-imprint method include a thermal nano-imprint method and a photo-nano-imprint method.

In the thermal nano-imprint method, the interior of the cylindrical mold 31 is filled with a thermosetting resin while heated at a predetermined temperature, the cylindrical mold 31 is cooled, then the cured thermosetting resin is released from the mold and thus it is possible to obtain the resin mold in the form of a film or a reel. In the photo-nano-imprint method, light of a predetermined wavelength is applied to a photocrosslinkable resin with which the interior of the cylindrical mold 31 is filled, the photocrosslinkable resin is cured, then the cured photocrosslinkable resin is released from the cylindrical mold 31 and thus it is possible to obtain the resin mold in the form of a film or a reel.

The resin mold method is preferably used because repeated transfer is easily performed. The "repeated transfer" here means either of (1) and (2) or both thereof: (1) to manufacture a plurality of concave-convex pattern transfer items by transfer reversal from the resin mold (+) having a convex-concave pattern shape or (2) to obtain, especially when a curable resin composition is used as a transfer agent, a transfer member (−) obtained by reversal from the resin mold (+), then use the transfer member (−) as a resin mold (−) to obtain a transfer member (+) obtained by reversal transfer and perform repeated pattern reversal transfer of A/B/A/B/ . . . /(A indicates a convex-concave pattern shape, and B indicates a concave-convex pattern shape).

Furthermore, there is, as an example, a method of electroforming such as Ni on the resin mold obtained as described above to produce a flat-shaped electroformed mold, and of using the flat-shaped electroformed mold to form the pattern by the nano-imprint lithography method. The case where the electroformed mold is formed is preferable in that the life of the cylindrical mold 31, which is the original mold, is extended. Furthermore, it is also possible to manufacture the resin mold by processing the obtained electroformed mold in a cylindrical shape and performing, on the cylindrical electroformed moldt, the operation of obtaining the resin mold described above.

As an example of the method of using the resin mold obtained as described above to process the substrate main body 11 by the nano-imprint lithography method, the following method is present.

The resist layer is first formed on the substrate main body 11. Then, the concave-convex structure surface side of the resin mold is pressed onto the resist layer. Alternatively, the resist layer is formed into a film on the concave-convex structure surface side of the resin mold, and the resist layer formed into a film is laminated and pressed onto the substrate main body 11. In the pressed state, energy rays such UV light are applied to the resist layer, and thus the resist layer is cured. Then, the resin mold is released from the substrate main body 11, and thus a layered product of the resist layer/substrate main body 11 to which the concave-convex structure is transferred is obtained. Then, the residual film of the resist layer in the layered product is removed from the resist layer surface side. For example, it is possible to remove the residual film by an etching method using oxygen gas. As the etching using oxygen gas, etching using oxygen plasma is present, and can be performed by oxygen ashing or ICP-RIE (Inductively coupled plasma reactive ion etching). Thereafter, the resist pattern formed on the substrate main body 11 is used as a mask, and the substrate main body 11 is processed by the etching method.

The etching method is not particularly limited as long as the resist layer is used as a mask, and thus concave and convex portions are formed in the substrate main body 11, and it is possible to apply wet etching, dry etching or the like. In particular, since the concave and convex portions can be formed deeply in the substrate main body 11, the dry etching method is preferable. Among the dry etching methods, anisotropic dry etching is preferable, and ICP-RIE or ECM-RIE is preferable. A reactive gas used in the dry etching is not particularly limited as long as it reacts with the substrate main body, and for example, $BCl_3$, $Cl_2$, $CHF_3$ or a mixture gas of these is preferable, and Ar, $O_2$ or the like can be mixed as necessary. On the other hand, the wet etching is applied, and thus it is possible to reduce damage to the substrate main body 11. A method of performing the wet etching will be described later.

As another method of using the resin mold to process the substrate main body 11 by the nano-imprint lithography method, the following method is present as an example.

A resist layer (1) is first formed on the substrate main body 11. Then, a resist layer (2) is formed on the resist layer (1). Then, the concave-convex structure surface side of the resin mold is pressed onto the resist layer (2). Then, when at least either of the resist layer (1) and the resist layer (2) is a photopolymerizable resist, in the pressed state, energy rays such UV light are applied to the resist layer (1) and the resist layer (2). Then, the resin mold is released from the substrate main body 11, and thus a layered product of the resist layer (2)/resist layer (1)/substrate main body 11 to which the concave-convex structure is transferred is obtained. When the resist layer (2) is spin-on glass (SOG), hydrogen silsesquioxane (HSQ), silsesquioxane having an organic group (O-HSQ) and a sol-gel material such as metal alkoxide, the pressing is performed at around room temperature, and thereafter the mold can be released. The residual film of the resist layer (2) is removed from the resist layer (2) surface side. For example, it is possible to remove the residual film by an etching method using oxygen gas. As the etching using oxygen gas, etching using oxygen plasma is present, and can be performed by oxygen ashing or ICP-RIE (Inductively coupled plasma reactive ion etching). Thereafter, the resist pattern formed on the resist layer (1) is used as a mask, and the resist layer (1) is processed by the etching method. For example, it is possible to etch the resist layer (1) by the etching method using oxygen gas. As the etching using oxygen gas, etching using oxygen plasma is present, and can be performed by oxygen ashing or ICP-RIE. A structure formed with the resist layer (1) and the resist layer (2) processed is regarded as a mask, the etching method is applied and thus the substrate main body 11 can be processed.

As long as the structure formed with the resist layer (1) and the resist layer (2) is used as a mark, and thus concave and convex portions can be formed in the substrate main body 11, as the etching method, the same method as the etching method described above can be used.

As the nano-imprint lithography method, under the following conditions, a mold which has, on its surface, a concave-convex structure containing a mask layer within the concave portion of the concave-convex structure can be utilized, and thus it is possible to omit the residual film processing.

The resin mold described in the nano-imprint lithography method is manufactured by the method described above. Then, the diluted mask layer (resist layer (2)) material is applied onto the concave-convex structure surface of the resin mold, and a solvent is removed. By this operation, it is possible to put the mask layer (resist layer (2)) within the concave portion of the resin mold. The mold containing the mask layer (resist layer (2)) within the concave portion of the resin mold is laminated and pressed to the substrate main body 11 on which the resist layer (1) is formed into a film. Alternatively, on the concave-convex structure surface of the mold containing the mask layer (resist layer (2)) within the concave portion of the resin mold, the diluted resist layer (1) is formed into a film, and the solvent is removed. Then, the resist layer (1) is laminated to the substrate main body 11. Then, energy rays such UV light are applied to the mask layer (resist layer (2)) and the resist layer (1), and the resin mold is released. The dry etching is performed on the obtained mask layer (resist layer (2)/resist layer (1))/substrate main body 11 from the mask layer (resist layer (2)) surface side, and thus it is possible to obtain a pattern formed with the mask layer (resist layer (2)/resist layer (1)). In other words, in this operation, the residual film processing of the mask layer (resist layer (2)) is not performed. Then, the pattern formed with the mask layer (resist layer (2)/resist layer (1)) is regarded as a mask, the etching method is applied and thus the substrate main body 11 can be processed. As the etching method on the substrate main body 11, the same method as the nano-imprint lithography method described above and the etching using oxygen gas can be used. As the etching using oxygen gas, etching using oxygen plasma is present, and can be performed by oxygen ashing or ICP-RIE.

The nano-imprint lithography method is applied, and thus it is possible to easily form the minimal convex portion 133 non-cyclically. In the nano-imprint lithography method, the operation of laminating the concave-convex structure (I) 12 of the mold and the substrate main body 11 through the resist is performed without fail. A pressing force when the laminating operation is performed is adjusted, and thus it is possible to mix bubbles into the concave-convex structure of the mold in an arbitrary manner. Moreover, bubbles are previously mixed into the resist, and thus it is also possible to bring the bubbles into the mold. Here, the photocrosslinkable resin is used as the resist, and thus the resist of the bubble portion is prevented from being cured. In other words, the mold is released After the coating of light, and thus a transfer failure occurs in the resist in a place corresponding to a part of the concave-convex structure of the mold where the bubbles are mixed. Thus, it is possible to obtain the resist pattern having the non-cyclical minimal convex portion 133 on the optical substrate. Although the generation of the minimal convex portion 133 or the minimal concave portion 233 by the mechanism described above can be controlled as necessary by conditions of the laminating operation, in particular, it is preferable that an contact angle with the surface of the mold of the photocrosslinkable resin be equal to or more than 60 degrees because the control is made easy. In particular, in terms of disturbing the fluidity of the photocrosslinkable resin into the concave portion of the mold and effectively generating the minimal convex portion 133 or the minimal concave portion 233, the contact angle is preferably equal to or more than 80 degrees, and is more preferably equal to or more than 85 degrees. It is preferable that the contact angle be equal to or more than 90 degrees because a pressure at the time of laminating is used as a parameter and the control on the minimal convex portion 133 or the minimal concave portion 233 is enhanced. In the same terms, the contact angle is most preferably equal to or more than 92 degrees. On the other hand, the upper limit value is determined by the size of an aggregation of the minimal convex portions 133 or the minimal concave portions 233. In terms of satisfying the size of the aggregation described above, the contact angle is preferably equal to or less than 120 degrees, is more preferably equal to or less than 112 degrees and is most preferably equal to or less than 102 degrees. The pattern is used as a mask, the substrate main body 11 is processed and thus it is possible to directly from the concave-convex structure having the minimal convex portion 133 on the substrate main body 11. When the resin mold is produced from a cylindrical master stamper by the photo-nano-imprint method, the method described above is adopted, and thus it is possible to manufacture the resin mold having the minimal convex portion 133. The resin mold having the minimal convex portion 133 is used as a template, the substrate main body 11 is processed by the nano-imprint lithography method and thus it is possible to directly form the concave-convex structure having the minimal convex portion 133 on the substrate main body 11.

The wet etching method and the mask suitable for the wet etching with respect to the etching on the substrate main body described above will then be described.

When the mask pattern is produced on the substrate main body 11 by the above method, and the substrate main body 11 is etched by the wet etching, since as compared with the dry etching method, the etching is performed exactly according to the mask pattern, a concave-convex structure having a truncated convex portion may be formed without the substrate main body 11 directly below the mask being etched. As compared with the concave-convex structure having a truncated convex portion, in a concave-convex structure having a tent-shaped convex portion, it is possible to more effectively realize the effect of enhancing the internal quantum efficiency IQE and the effect of reducing the leak current described above.

Here, a layered product mask that will be described below is used, and thus it is possible to manufacture a concave-convex structure having a tent-shaped convex portion even when the wet etching is used. With a concave-convex structure having a tent-shaped convex portion, according to the already described principle, it is possible to simultaneously enhance the internal quantum efficiency IQE and the light extraction efficiency LEE and to reduce the specific growth of the semiconductor crystal layer or effectively reduce the collision of the specifically grown semiconductor crystal layers.

The layered product mask is a layered product mask that is used when the substrate main body is wet-etched, and includes a first mask layer provided on the substrate main body and a second mask layer provided on the first mask layer. The first mask layer is formed with a material that is higher in etching resistance to an etching solution used in the wet etching than the substrate main body but is lower in etching resistance than the second mask layer. In the following discussion, in order to clarify the principle of the wet etching, a description will be given using a sapphire substrate as an example of the substrate main body.

With this layered product mask, in a sapphire substrate, a region that is not wet-etched by the presence of the layered product mask at the time of the start of the wet etching is wet-etched as the volume of the first mask layer formed with the material which is not resistant to the etching solution used in the wet etching is reduced. Here, the volume of the first mask layer is reduced, and thus a planate superior surface portion (table top portion) formed in the sapphire substrate is reduced by being etched, and thus it is possible to obtain a concave-convex structure having a tent-shaped convex portion. Hence, it is possible to obtain the concave-convex structure (I) 12 (hereinafter also referred to as the concave-convex structure (I)) of the optical substrate (I) 1 according to the first embodiment or the concave-convex structure 22 (hereinafter also referred to as the concave-convex structure (II)) of the optical substrate (II) 2 according to the second embodiment, which effectively realize the effect of improving the internal quantum efficiency IQE and the effect of reducing the leak current.

The mask used in the etching will first be described. In general, for a mask for etching, a material that has etching resistance is used. In other words, in order to perform etching by controlling the interval, the shape and the like of a mask pattern to transfer a shape corresponding to the mask pattern, it is dispensable for the mask to have etching resistance. Thus, for the mask for the wet etching of the sapphire substrate, a material that is resistant to conditions of the wet etching is being examined. As the mask using the material that is resistant to the conditions of the wet etching, for example, a mask in which an etching selectivity, between a material to be etched and the mask is equal to or more than 10 can be used, and the etching selectivity, is preferably equal to or more than 20.

For the wet etching of the sapphire substrate, in general, an etching solution obtained by heating sulfuric acid or phosphoric acid alone or a solution obtained by mixing them is used. Hence, silicon oxide, silicon nitride, aromatic polyimide and the like, which are resistant to the etching solution are used as mask materials.

Figure 24A:
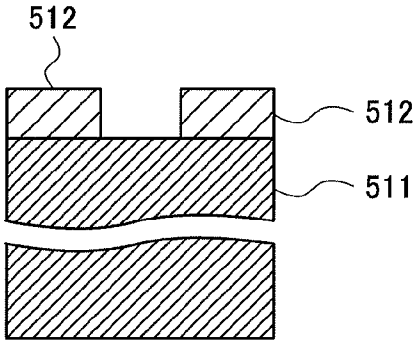
FIG. 24 An illustrative diagram when a mask according to a reference example of the present invention and having wet etching resistance is used in wet etching on a sapphire substrate.

FIG. 24 is an illustrative diagram when a mask according to a reference example of the present invention and having wet etching resistance is used in the wet etching of the sapphire substrate. FIG. 24A shows a state before the start of the wet etching. As shown in FIG. 24A, on the sapphire substrate 511, the mask 512 having a shape corresponding to the mask pattern is provided. The mask 512 is a mask which has wet etching resistance and in which the etching selectivity, between the sapphire substrate 511 and the mask 512 is equal to or more than 10.

Figure 24B:
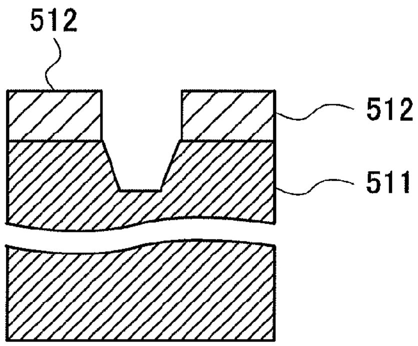

FIG. 24B shows a state when the wet etching is completed. When the sapphire substrate 511 is wet-etched from the state shown in FIG. 24A, the etching is performed exactly according to the mask pattern of the mask 512. Consequently, the sapphire substrate 511 directly below the mask 512 is not etched, and as shown in FIG. 24B, in the sapphire substrate 511 after being etched, a concave-convex structure having a truncated convex portion with a planate superior surface portion (table top portion) is formed. A concave-convex structure that has a tent-shaped convex portion where a table top is small as compared with the truncated convex portion described above or there is substantially no table top is used, and a film in which epitaxial grow is performed is used on the sapphire substrate 511 to produce a light-emitting element, with the result that the efficiency of light emission of the light-emitting element is more enhanced. This is because the effect of disturbing the growth mode of the semiconductor crystal layer is enhanced and it is possible to reduce the semiconductor crystal layer which is rapidly grown from the apex of the convex portion in the concave-convex structure. When the tent-shaped convex portion is provided, the flat surface of the apex of the minimal convex portion 133 described above and shown in FIG. 9 can be reduced. On the other hand, in the optical substrate (II) 2 described above and according to the second embodiment, when the tent-shaped convex portion is provided, the flat area of the convex portion apex can be reduced. In this case, it is easy to reduce the specific growth of the semiconductor crystal layer, and thus the diode characteristic of the semiconductor light-emitting element is enhanced.

Hence, a wet etching method that will be described below is used, and thus it is possible to form a concave-convex structure having a tent-shaped convex portion in the sapphire substrate. In this way, it is possible to simultaneously improve the internal quantum efficiency IQE and the light extraction efficiency LEE and to obtain a semiconductor light-emitting element having a low leak current.

Figure 25A:
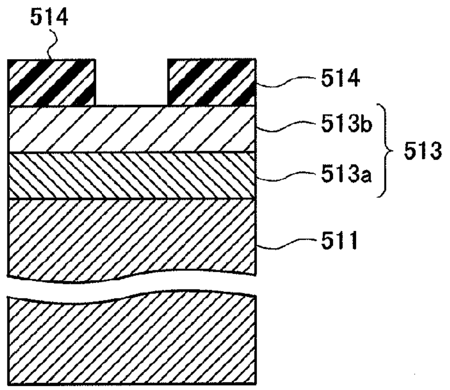
FIG. 25 An illustrative diagram when a layered product mask according to the present embodiment is used in the wet etching of the sapphire substrate.

FIGS. 25 and 26 are illustrative diagrams when a layered product mask according to the present embodiment is used in the wet etching of the sapphire substrate. FIG. 25A is a diagram showing a state before the start of the wet etching. As shown in FIG. 25A, on the sapphire substrate 511, a layered product mask 513 in which a first mask layer 513*a* and a second mask layer 513*b* are deposited and a mask 514 having a shape corresponding to the mask pattern.

The mask 514 is provided so that a pattern transfer is performed on the second mask layer 513*b* in the layered product mask 513. The pattern of the mask 514 is formed by using a method of using a UV resist material or a heat reaction type resist material to form a pattern by exposure, a method of using a mold separately to transfer a pattern to a UV resist material or the like.

Figure 25B:
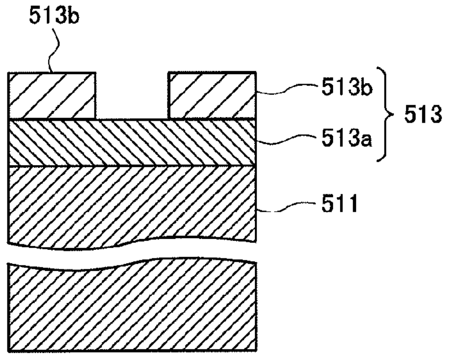

Then, the mask 514 is used to perform a pattern transfer to the second mask layer 513*b* in the layered product mask 513 (see FIG. 25B). The layered product mask 513 shown in FIG. 25B is the layered product mask according to the present embodiment. The pattern transfer to the second mask layer 513*b* can be performed by dry etching accurately and easily. Hence, as the material of the second mask layer 513*b*, a material that is easily etched by dry etching is suitable. Furthermore, a material that does not affect the wet etching which is subsequently performed on the sapphire substrate 511 is preferable. For example, the material of the second mask layer 513*b* described above is at least one selected from a group consisting of silicon, silicon oxide, silicon nitride and aromatic polyimide.

Figure 25C:
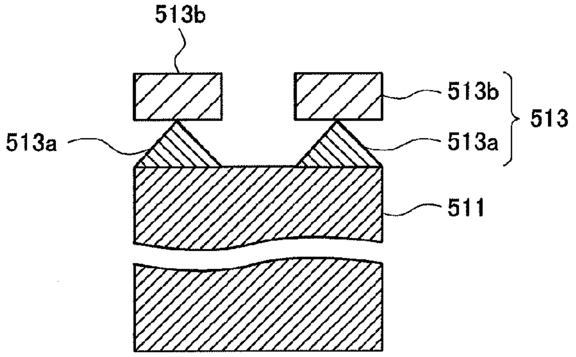
Figure 26A:
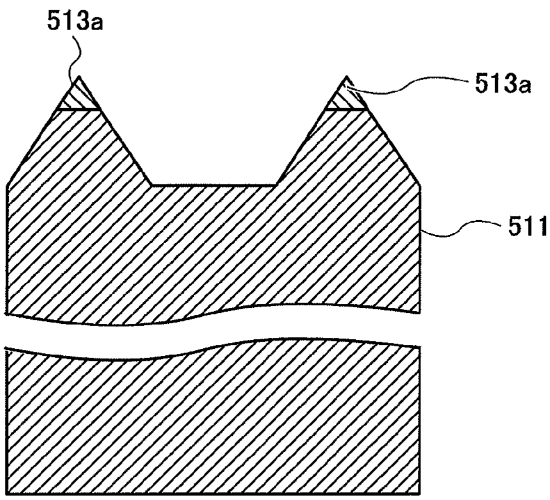
FIG. 26 An illustrative diagram when the layered product mask according to the present embodiment is used in the wet etching of the sapphire substrate.
Figure 26B:
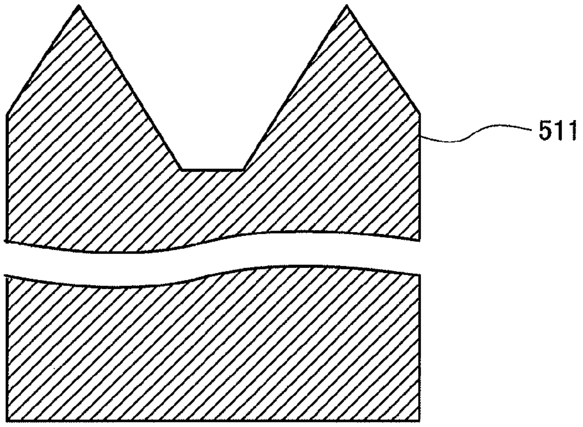

Then, the second mask layer 513*b* on which the pattern transfer has been performed is used as a mask, and the first mask layer 513*a* and the sapphire substrate 511 are wet-etched (see FIGS. 25C, 26A and 26B). The first mask layer 513*a* is formed with a material that is higher in etching resistance to an etching solution used in the wet etching of the sapphire substrate 511 than the sapphire substrate 511 but is lower in etching resistance than the second mask layer 513*b*. For example, the selectivity between the first mask layer 513*a* and the sapphire substrate 511 is equal to or more than 10, and is preferably equal to or more than 20, and the selectivity between the second mask layer 513*b* and the sapphire substrate 511 is less than 10, is preferably equal to or less than 5 and is more preferably equal to or less than 3. The selectivity is made to fall within the above range, and thus it becomes easy to control the tent-shaped concave and convex portions. It is possible to select the selectivity according to the shape (for example, the interval and the depth) of the sapphire substrate 511 formed according to the volume of the mask used, an etching time and the like.

The first mask layer 513*a* is configured such that as the sapphire substrate 511 is wet-etched, its volume is gradually reduced. For example, the material of the first mask layer 513*a* described above is at least one selected from a group consisting of germanium, tin, lead, antimony, bismuth, selenium, tellurium, vanadium, niobium, chromium, molybdenum and tungsten and their oxides. Among them, in terms of the etching selectivity, the material of the first mask layer 513*a* is preferably at least one selected from chromium, molybdenum and tungsten and their oxides, is more preferably any of chromium, tungsten and their oxides and is most preferably chromium and a chromium oxide.

In the present invention, a material having no etching resistance and a material having etching resistance are mixed to achieve desired resistance, and thus it is possible to obtain the first mask layer 513*a*. In this case, the ratio of the mixture is controlled, and thus it is possible to control the rate of reduction in volume by the etching of the mask, with the result that it is possible to form a concave-convex structure having a tent-shaped convex portion. As the material of the mask in this case, for example, a mixture of tungsten oxide and silicon oxide and a mixture of chromium oxide and silicon oxide are suitable. For example, in the combination of tungsten oxide and silicon oxide, when tungsten in the tungsten oxide and silicon in the silicon oxide are expressed by mole fraction (%), tungsten is preferably equal to or more than 50 mol % but equal to or less than 95 mol %, is more preferably equal to or more than 65 mol % but equal to or less than 95 mol %, is further preferably equal to or more than 80 mol % but equal to or less than 95 mol % and is most preferably equal to or more than 95 mol % but equal to or less than 100 mol %.

The combination that is most preferable in the layered product mask 513 is that the material of the first mask layer 513*a* is chromium or chromium oxide, and that the material of the second mask layer 513*b* is silicon oxide.

FIG. 25C is a diagram showing a state in the middle of the wet etching. When the sapphire substrate 511 is wet-etched from the state shown in FIG. 25C, the volume of the first mask layer 513*a* in the layered product mask 513 is gradually reduced as the wet etching is performed. Since the wet etching is performed exactly according to the mask pattern of the first mask layer 513*a*, as the first mask layer 513*a* is reduced, the sapphire substrate 511 of a portion where the first mask layer 513*a* is reduced is etched.

FIG. 26A is a diagram showing a state in the middle of the wet etching. As the volume of the first mask layer 513*a* is reduced, the second mask layer 513*b* cannot be left on the first mask layer 513*a*, and the second mask layer 513*b* goes out into the etching solution. However, since the second mask layer 513*b* is formed of the material that does not affect the etching solution, the wet etching of the sapphire substrate 511 is not affected.

FIG. 26B is a diagram showing a state after the completion of the wet etching. The wet etching is further performed from the state shown in FIG. 26A, and consequently, the first mask layer 513*a* reduced as the wet etching is performed is all etched and removed. As shown in FIG. 26B, the sapphire substrate 511 is etched as the layered product mask 513 is reduced and removed, and in the sapphire substrate 511 after being etched, a concave-convex structure having a tent-shaped convex portion with an apex is formed. On the sapphire substrate 511 where the concave-convex structure having a tent-shaped convex portion with the apex as described above is formed, a film on which epitaxial growth is performed is used to produce a light-emitting element, with the result that it is possible to enhance the efficiency of light emission of the light-emitting element. The apex here includes a corner portion whose radius of curvature exceeds 0.

The area of the planate superior surface portion (table top portion) in the concave-convex structure having a tent-shaped convex portion formed in the sapphire substrate 511 after being wet-etched can be controlled by the ratio of reduction in the layered product mask 513. Here, the concave-convex structure having a tent-shaped convex portion refers to a concave-convex structure where the convex portion of the concave-convex structure is configured in the form of, for example, a cone shape, a pyramid shape, a truncated cone shape or the like. The apex in the form of a pyramid shape may be a corner portion whose radius curvature is 0 or may be a rounded corner whose radius of curvature exceeds 0. In particular, when the apex is a rounded corner whose radius of curvature exceeds 0, the effect of reducing a crack produced within the semiconductor crystal layer is enhanced, with the result that it is possible to enhance the long-term reliability of the semiconductor light-emitting element.

Furthermore, in the concave-convex structure having a tent-shaped convex portion, the area ratio (value obtained by dividing the area of the table top portion by the area of the bottom surface of the concave-convex structure) between the bottom surface and the top surface (table top portion) of the concave-convex structure is preferably equal to or less than 0.3, is more preferably equal to or less than 0.2, is further preferably equal to or less than 0.1 and is most preferably equal to or less than 0.05. The area ratio between the bottom surface and the top surface of the concave-convex structure is decreased, and thus the concave-convex structure having a truncated convex portion is formed, with the result that the effect of enhancing the efficiency of light emission of the light-emitting element is enhanced.

The film thickness of the layered product mask 513 can be selected as necessary according to the tent-shaped structure of a target, the speed of the etching of the layered product mask 513, the interval in the pattern and the like.

As the etching solution used in the wet etching of the sapphire substrate 511, phosphoric acid, sulfuric acid or a mixture thereof at a temperature equal to or more than 200° C. but equal to or less than 300° C. is preferable. In general, phosphoric acid, sulfuric acid or a mixture thereof is used at room temperature, and thus it is impossible to etch the sapphire substrate 511. On the other hand, when phosphoric acid, sulfuric acid or a mixture thereof is heated to 200° C. or more, oxo acid (pyrophosphoric acid, pyrosulfuric acid) is generated, these act on the sapphire substrate 511 and thus it is possible to etch the sapphire substrate 511. However, when phosphoric acid, sulfuric acid or a mixture thereof is heated to 300° C. or more, meta-acid is generated and a lysate such as $AlPO_4$ is precipitated, with the result that the efficiency of etching the sapphire substrate 511 is significantly lowered or the etching is stopped. Hence, the etching solution used in the wet etching of the sapphire substrate 511 is preferably phosphoric acid, sulfuric acid or a mixture thereof at a temperature equal to or more than 200° C. but equal to or less than 300° C.

As described above, the mask layered product for the wet etching is used, and thus the internal quantum efficiency IQE and the light extraction efficiency LEE are improved, and it is possible to provide the optical substrate having a low leak current value. Furthermore, even when a wet etching method that will be described below is applied, likewise, the internal quantum efficiency IQE and the light extraction efficiency LEE are improved, and it is possible to provide the optical substrate having a low leak current value.

Figure 27A:
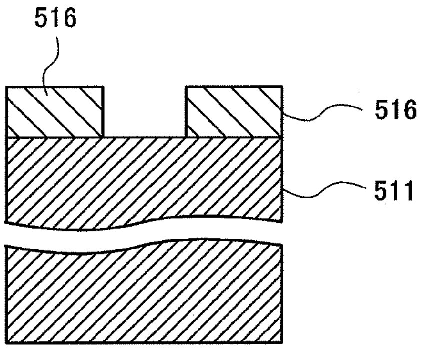
FIG. 27 An illustrative diagram when a mask whose volume is reduced as the wet etching of the sapphire substrate according to the present embodiment is performed.

FIG. 27 is an illustrative diagram when a mask whose volume is reduced as the wet etching of the sapphire substrate according to the present embodiment is performed. FIG. 27A is a diagram showing a state before the start of the wet etching. As shown in FIG. 27A, on the sapphire substrate 511, a mask 516 having a shape corresponding to the mask is provided. The mask 516 is a mask whose volume is reduced as the etching is performed.

Figure 27B:
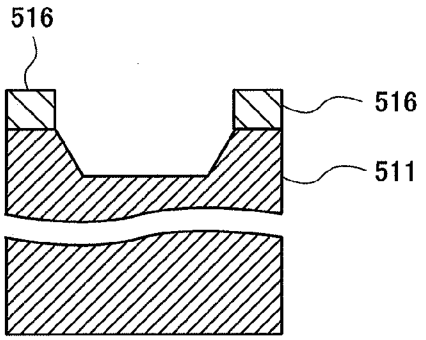

FIG. 27B is a diagram showing a state in the middle of the wet etching. When the sapphire substrate 511 is wet-etched from the state shown in FIG. 27A, the volume of the mask 516 is gradually reduced as the etching is performed. Since the wet etching is performed exactly according to the mask of the mask 516, as shown in FIG. 27B, as the mask 516 is reduced, the sapphire substrate 511 of a portion where the mask 516 is reduced is also etched.

Figure 27C:
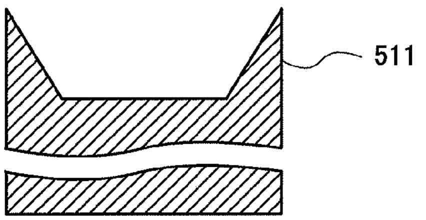

FIG. 27C is a diagram showing a state where all the mask 516 is etched. The wet etching is further performed from the state shown in FIG. 27B, and consequently, the mask 516 reduced as the etching is performed is all etched and removed. As shown in FIG. 27C, the sapphire substrate 511 is etched as the mask 516 is reduced and removed, and in the sapphire substrate 511 after being etched, a concave-convex structure having a complete tent-shaped convex portion with an apex is formed. On the sapphire substrate 511 where the concave-convex structure having a tent-shaped convex portion with the apex as described above is formed, a film on which epitaxial growth is performed is used to produce a light-emitting element, with the result that it is possible to enhance the efficiency of light emission of the light-emitting element.

As the mask 516, for example, a mask whose volume is gradually reduced after the start of the wet etching of the sapphire substrate 511 is used. When the volume of the mask 516 is reduced by 50% or more, the wet etching is assumed to be completed. The selectivity between the mask 516 described above and the sapphire substrate 511 is less than 10. The mask 516 described above is used, and thus in the sapphire substrate 511, a region that is not wet-etched by the presence of the original mask 516 is wet-etched as the volume of the mask 516 is reduced. Here, the volume of the mask 516 is reduced by 50% or more, and the table top portion formed in the sapphire substrate 511 is reduced by being etched, with the result that it is possible to obtain a concave-convex structure having a tent-shaped convex portion.

The area of the planate superior surface portion (table top portion) in the concave-convex structure having a tent-shaped convex portion formed in the sapphire substrate 511 after the wet etching can be controlled by the ratio of reduction in the mask 516. Here, the concave-convex structure having the tent-shaped convex portion refers to a concave-convex structure where the convex portion of the concave-convex structure is configured in the form of, for example, a cone shape, a pyramid shape, a truncated cone shape or the like.

Furthermore, in the concave-convex structure having the tent-shaped convex portion, the area ratio (value obtained by dividing the area of the table top portion by the area of the bottom surface of the concave-convex structure) between the bottom and the top surface (table top portion) of the concave-convex structure is preferably equal to or less than 0.3, is more preferably equal to or less than 0.2, is further preferably equal to or less than 0.1 and is most preferably equal to or less than 0.05. The area ratio between the bottom surface and the top surface of the concave-convex structure is decreased, and thus the concave-convex structure having a truncated convex portion is formed, with the result that the effect of enhancing the efficiency of light emission of the light-emitting element is enhanced.

As the mask 516 whose volume is reduced as the etching is performed, as compared with the time when the wet etching of the sapphire substrate 511 is started, a mask whose volume is reduced by 80% or more at the time of the completion is more preferable, and a mask whose volume is reduced by 100% is most preferable. In other words, the mask whose volume is reduced by 100% refers to a state where when the wet etching of the sapphire substrate 511 is completed, the mask 516 is removed. Control is performed such that the mask 516 is removed when the wet etching is completed, and thus it is possible to form, in the sapphire substrate 511, a concave-convex structure having a complete tent-shaped convex portion.

The film thickness of the mask 516 can be selected as necessary according to the tent-shaped structure of a target, the speed of the etching of the mask 516, the interval in the pattern and the like.

As the etching solution used in the wet etching of the sapphire substrate 511, phosphoric acid, sulfuric acid or a mixture thereof at a temperature equal to or more than 200° C. but equal to or less than 300° C. is preferable. In general, phosphoric acid, sulfuric acid or a mixture thereof is used at room temperature, and thus it is impossible to etch the sapphire substrate 511. On the other hand, when phosphoric acid, sulfuric acid or a mixture thereof is heated to 200° C. or more, oxo acid (pyrophosphoric acid, pyrosulfuric acid) is generated, these act on the sapphire substrate 511 and thus it is possible to etch the sapphire substrate 511. However, when phosphoric acid, sulfuric acid or a mixture thereof is heated to 300° C. or more, meta-acid is generated and a lysate such as $AlPO_4$ is precipitated, with the result that the efficiency of etching the sapphire substrate 511 is significantly lowered or the etching is stopped. Hence, the etching solution used in the wet etching of the sapphire substrate 511 is preferably phosphoric acid, sulfuric acid or a mixture thereof at a temperature equal to or more than 200° C. but equal to or less than 300° C.

Methods A and B of manufacturing the optical substrate in which the method of etching the substrate while reducing the volume of the mask is different will be described below.

(Manufacturing Method A)

In the manufacturing method A, in the method of etching the substrate while reducing the volume of the mask, the mask is formed with a material that has resistance to the etching solution used in the wet etching of the sapphire substrate, and the wet etching of the sapphire substrate and the etching of the mask are alternately performed.

Here, the expression “has resistance” means that for the etching solution used in the wet etching of the sapphire substrate, the selectivity between the mask and the sapphire substrate is equal to or more than 10. When the selectivity is equal to or more than 10, it is easy to control the tent-shaped concave and convex portions, and more preferably, the selectivity is equal to or more than 20. The selectivity can be selected by the shape (for example, the interval and the depth) of the sapphire substrate formed according to the volume of the mask used, the etching time and the like.

FIG. 28 is an illustrative diagram showing the individual steps of an example of the method of manufacturing the optical substrate according to the present embodiment. FIGS. 28A and 28B show a case where a mask 517 is used and the sapphire substrate 511 is wet-etched. The mask 517 is formed with a material that has resistance to the etching solution used in the wet etching of the sapphire substrate 511. FIG. 28A a diagram showing a state before the start of the wet etching. As shown in FIG. 28A, on the sapphire, the mask 517 having a shape corresponding to the mask is provided.

Figure 28A:
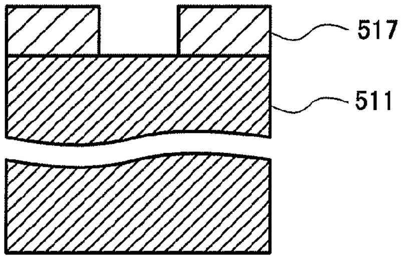
FIG. 28 An illustrative diagram showing the individual steps of an example of the method of manufacturing the optical substrate according to the present embodiment.
Figure 28B:
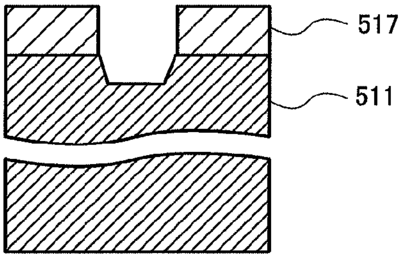
Figure 28C:
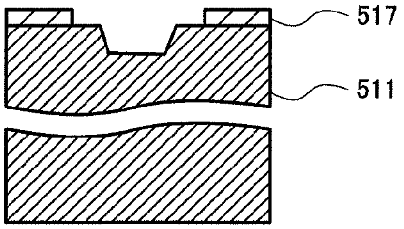
Figure 28D:
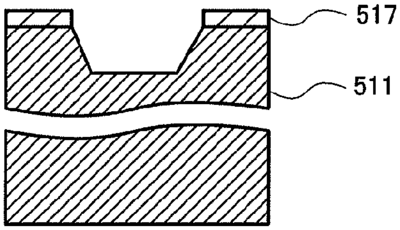
Figure 28E:
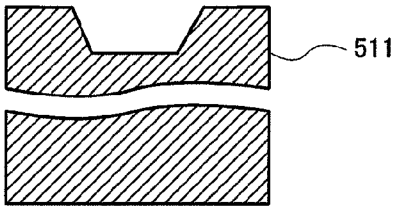
Figure 28F:
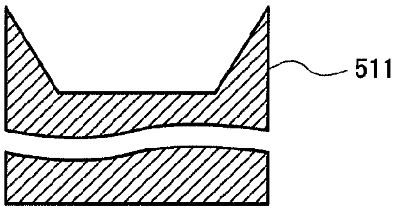

First, as shown in FIG. 28B, on the sapphire substrate 511, a first round of wet etching is performed. Here, the mask 517 is not etched because the mask 517 has resistance to the etching solution. Then, as shown in FIG. 28C, the mask 517 is etched, and thus the volume of the mask 517 is reduced. Then, as shown in FIG. 28D, in a state where the volume of the mask 517 is reduced, on the sapphire substrate 511, a second round of wet etching is performed. Here, since the volume of the mask 517 is reduced, and thus part of the sapphire substrate 511 is exposed, the sapphire substrate 511 is wet-etched. Then, as shown in FIG. 28E, the etching is completely performed until the mask 517 is removed. In this state, the wet etching is performed on the sapphire substrate 511, and thus in the sapphire substrate 511, a concave-convex structure having a complete tent-shaped convex portion with an apex as shown in FIG. 28F is formed.

By increasing the number of steps from FIGS. 28A to 28E, it is possible to control the concave-convex structure having a tent-shaped convex portion.

Since the sapphire substrate 511 has high resistance to various conditions of etching, it is possible to select conditions of etching of the mask 517 in a wide range.

The above-described material of the mask 517 having resistance to the etching solution used in the wet etching of the sapphire substrate 511 can be selected from any of silicon, silicon oxide, silicon nitride, gold, silver, platinum, palladium, ruthenium and aromatic polyimide.

As the method of etching the mask 517 described above, it is possible to apply dry etching or wet etching. The method of etching the mask 517 is preferably selected according to the material of the mask 517.

For example, a case where the mask 517 is formed with silicon oxide will be described. When the mask 517 is dry-etched, when a fluorine-based etching gas is used, it is possible to etch only the mask 517 without etching the sapphire substrate 511. When the mask 517 is wet-etched, when a hydrofluoric acid solution is used, it is possible to etch only the mask 517 without etching the sapphire substrate 511.

For example, when the mask 517 is formed with a noble metal, it is possible to etch only the mask 517 with aqua regia or the like. When the mask 517 is formed with another metal, it is possible to etch only the mask 517 with a general acid or alkaline solution. When the mask 517 is formed with aromatic polyimide, it is possible to etch only the mask 517 with $O_2$ gas.

When the dry etching is used as the method of etching the mask 517, the material with which the mask 517 is formed is preferably silicon, silicon oxide, silicon nitride or aromatic polyimide, and is most preferably silicon oxide in terms of stability and ease of film formation.

When the wet etching is used as the method of etching the mask 517, the material with which the mask 517 is formed is preferably gold, silver, platinum, palladium or ruthenium, and is most preferably gold, silver or platinum in terms of stability and ease of film formation.

As described above, the conditions of etching of the mask 517 are selected as necessary, and the wet etching of the sapphire substrate 511 and the etching of the mask 517 can be alternately performed.

(Manufacturing Method B)

In the manufacturing method B, in the method of etching the substrate while reducing the volume of the mask, the mask is formed with a material that does not have resistance to the etching solution used in the wet etching of the sapphire substrate, and the wet etching of the sapphire substrate and the etching of the mask are simultaneously performed.

Here, the expression “does not have resistance” means that for the etching solution used in the wet etching of the sapphire substrate, the selectivity between the mask and the sapphire substrate is less than 10. When the selectivity is less than 10, it is easy to control the tent-shaped concave and convex portions. The selectivity can be selected by the shape (for example, the interval and the depth) of the sapphire substrate formed according to the volume of the mask used, the etching time and the like.

When the mask formed with the material that does not have resistance to the etching solution used in the wet etching of the sapphire substrate is used, the etching solution used in the wet etching of the sapphire substrate causes the volume of the mask to be gradually reduced simultaneously with the wet etching of the sapphire substrate, with the result that it is possible to control the shape of the table top portion formed in the sapphire substrate. As compared with the case where the mask 517 according to the manufacturing method A is used, since it is possible to reduce the number of steps, it is possible to increase the manufacturing efficiency.

The above-described material of the mask that does not have resistance to the etching solution used in the wet etching of the sapphire substrate can be formed with at least one selected from a group consisting of, for example, germanium, tin, lead, antimony, bismuth, selenium, tellurium, vanadium, niobium, chromium, molybdenum and tungsten and oxides thereof.

In terms of development characteristics, the material of the mask is preferably chromium, molybdenum, tungsten or an oxide thereof, is more preferably chromium, tungsten or an oxide thereof and is most preferably chromium or chromium oxide.

In the present invention, the mask material that does not have resistance to the etching solution and the mask material that has resistance to the etching solution are mixed, and thus it is possible to achieve desired resistance.

It is possible to select a mixture of these materials and the material of the mask 517 having resistance to the etching solution used in the wet etching of the sapphire substrate 511 according to the manufacturing method A. In this case, the ratio of the mixture is controlled, and thus it is possible to control the rate of reduction in volume by the etching of the mask, with the result that it is possible to form a concave-convex structure having a tent-shaped convex portion. As the material of the mask in this case, for example, a mixture of tungsten oxide and silicon oxide and a mixture of chromium oxide and silicon oxide are suitable. For example, in the combination of tungsten oxide and silicon oxide, when tungsten in the tungsten oxide and silicon in the silicon oxide are expressed by mole fraction (%), tungsten is preferably equal to or more than 50 mol % but equal to or less than 95 mol %, is more preferably equal to or more than 65 mol % but equal to or less than 95 mol %, is further preferably equal to or more than 80 mol % but equal to or less than 95 mol % and is most preferably equal to or more than 95 mol % but equal to or less than 100 mol %.

By adopting the method described above, it is possible to easily manufacture the substrate for the semiconductor light-emitting element according to the present invention, and by depositing the semiconductor layer and the light-emitting layer on the manufactured substrate for the semiconductor light-emitting element, it is possible to manufacture the semiconductor light-emitting element. Here, when the semiconductor light-emitting element is manufactured, it is preferable to prepare the substrate for the semiconductor light-emitting element, thereafter performing a step of optically inspect the substrate for the semiconductor light-emitting element and then manufacture the semiconductor light-emitting element.

As has already been described, since the concave-convex structure according to the present invention includes the minimal convex portion 133 (or the minimal concave portion 233), regardless of the minute concave-convex structure, it is possible to realize optical scattering. Hence, the optical substrate is prepared, thereafter an optical measurement is performed and thus it is possible to previously grasp the accuracy of the concave-convex structure. For example, when in order to simultaneously enhance the internal quantum efficiency IQE and the light extraction efficiency LEE, the concave-convex structure is provided to the sapphire substrate, an optical measurement is performed on the sapphire substrate, the scattering component of the optical measurement is evaluated and thus it is possible to grasp the accuracy of the concave-convex structure. Hence, it is possible to previously predict the performance rank of an LED element to be produced. Since it is possible to sort an optical substrate that cannot be used, the yield is improved. Here, the optical measurement can be performed by using either a transmission measurement or a reflection measurement. In the transmission measurement, the scattering component of transmitted light is preferably detected. Hence, it is preferable either to directly evaluate the scattering component or to utilize haze. In particular, haze is preferable because a known commercial device can be used. Haze is determined from the total transmittance T of light that is transmitted through a sample after being applied by a light source and the transmittance D of light that is diffused and scattered in the sample and off the surface of the sample, and haze is defined as haze value $H=D/T\times100$. These are specified by JIS K 7105, and it is possible to more easily measure them with a commercially available turbidimeter (for example, NDH-10.025DP made by Nippon Denshoku Industries Co., Ltd.). Since the essence of haze is the scattering component of transmitted light, as long as a device that detects the scattering component of transmitted light when light is made to enter the optical substrate is available, it is possible to quantify the presence of the minimal convex portion 133 (or the minimal concave portion 233) described above. In particular, when finer distribution is measured, the entrance light is preferably made to enter at a predetermined angle instead of being made to enter vertically. On the other hand, in the reflection measurement, it is preferable to use either a regular reflection component or a diffuse reflection component. The regular reflection component is utilized, and thus it is possible to evaluate the accuracy of the outline shape of the concave-convex structure, and the diffuse reflection component is utilized, and thus it is possible to evaluate the volume distribution accuracy of the concave-convex structure. Which of them is adopted can be selected as necessary according to the concave-convex structure used and the purpose. It is also possible to use the rate of the diffuse reflection component and the regular reflection component, (diffuse reflection component−regular reflection component), (diffuse reflection component−regular reflection component)/regular reflection component, (diffuse reflection component−regular reflection component)/diffuse reflection component and the like. In the optical measurement described above, the wavelength of the light source is increased by the average interval $P_{ave}$ of the concave-convex structure, and thus it is possible to extract the effect of the minimal convex portion 133 (or the minimal concave portion 233). Since this means that the effect of the minimal convex portion 133 (or the minimal concave portion 233) is purely evaluated, it means that it is possible to perform highly accurate management. Even in the reflection measurement, since its output is increased, a measurement with oblique entrance is preferably performed.

As described above, in the optical substrate (I) 1 according to the first embodiment, the average interval $P_{ave}$ between the convex portions 13 in the concave-convex structure (I) 12 is set within the range indicated by formula (1) described previously, and thus when the semiconductor layer is provided in the surface of the optical substrate (I) 1, the CVD growth mode of the semiconductor layer is disturbed, and dislocation defects caused by phase growth collide and disappear, with the result that it is possible to produce the effect of reducing the dislocation defect. The dislocation defect within the semiconductor crystal is reduced, and thus it is possible to enhance the internal quantum efficiency IQE of the semiconductor light-emitting element. Here, since it is possible either to reduce the specific growth of the semiconductor crystal layer or to reduce the collision of the specifically grown semiconductor crystal layers, it is also possible to reduce the leak current. Moreover, in the optical substrate (I) 1 according to the first embodiment, the average interval $P_{ave}$ between the convex portions 13 in the concave-convex structure (I) 12 is set within the range indicated by formula (1) described previously, and thus the contact area between the optical substrate (I) 1 and the electrode is increased, and the ohmic resistance is reduced. Since the ohmic contact is made satisfactory accordingly, it is possible to enhance the electron injection efficiency EIE.

In the optical substrate (II) 2 according to the second embodiment, likewise, the average interval $P_{ave}$ between the concave portions 23 in the concave-convex structure (II) 22 is set within the range indicated by formula (5) described previously, and thus it is possible to obtain the same effects.

In the optical substrate (I) 1 according to the first embodiment, the minimal convex portions 133 whose convex portion height hn satisfies formula (2) described previously are present with the existence probability Z that satisfies formula (3) described previously, and thus points where refractive index is sharply and locally changed are arranged with the existence probability Z. In this way, light scattering occurs in light emitted from the light-emitting layer, and the waveguide mode is resolved by this light scattering, with it is possible to enhance the light extraction efficiency LEE. As described above, since the internal quantum efficiency IQE or the electron injection efficiency EIE is enhanced, and the light extraction efficiency LEE is enhanced simultaneously, the external quantum efficiency EQE is enhanced, and it is possible to manufacture a high-performance light-emitting device.

Even in the optical substrate (II) 2 according to the second embodiment, the minimal concave portions 233 whose concave portion depth do satisfies formula (6) described previously are present with the existence probability Z that satisfies formula (7), and thus the same effects are obtained.

Optical Substrate (III) According to the Third Embodiment

An optical substrate (III) according to the third embodiment will then be described. The optical substrate (III) according to the third embodiment is used, and thus it is possible to simultaneously improve the light extraction efficiency LEE and the internal quantum efficiency IQE. Moreover, the optical substrate (III) according to the third embodiment is used, and thus it is possible to enhance the productivity of the semiconductor light-emitting element. Furthermore, the concave-convex structure of the optical substrate (III) according to the third embodiment includes the minimal convex portion described in the first embodiment, and thus it is possible to enhance the light extraction efficiency LEE and satisfactorily maintain the leak current.

In the semiconductor light-emitting element, a high-density concave-convex structure makes it possible to enhance the internal quantum efficiency IQE while light scattering caused by a concave-convex structure whose volume is significantly changed is utilized, and thus it is possible to enhance the light extraction efficiency LEE. In other words, when the high-density concave-convex structure is provided so as to enhance the internal quantum efficiency IQE, the change of the volume of the concave-convex structure is decreased, and optical scattering (light diffraction or light scattering) is lowered, with the result that the enhancement of the light extraction efficiency LEE is limited. This can be explained by an optical phenomenon in the light emitted by the semiconductor light-emitting element. This is because although the concave-convex structure having a sufficient density so as to enhance the internal quantum efficiency IQE is on about the same or low scale as the wavelength of the emitted light, as the wavelength of the emitted light is increased with respect to the size of the concave-convex structure, an effective medium approximation effect is produced as an optical phenomenon, with the result that optical scattering is lowered. On the other hand, when the change of the volume of the concave-convex structure is increased, and thus the light extraction efficiency LEE is enhanced, since the density of the concave-convex structure is lowered, the effect of dispersing dislocations is lowered, with the result that the improvement of the internal quantum efficiency IQE is limited.

It has been discovered from what has been described above that it is important to add a portion which can also improve the internal quantum efficiency IQE to a concave-convex structure having a significant effect of improving the light extraction efficiency LEE so as to enhance the external quantum efficiency EQE of the semiconductor light-emitting element. Then, the present invention has been completed.

In the third embodiment, in order to improve the light extraction efficiency LEE and the internal quantum efficiency IQE, a unique convex portion is included in a plurality of convex portion groups in the optical substrate (III) according to the third embodiment. Specifically, the optical substrate according to the third embodiment includes a substrate main body and a concave-convex structure formed in a part or the whole of the surface of the substrate main body, the concave-convex structure includes a plurality of convex portion groups arranged apart from each other, a plurality of convex portion groups described above include a unique convex portion which will be described below and the average interval $P_{ave}$ in the concave-convex structure is equal to or more than 1.5 μm but equal to or less than 10 μm. The unique convex portion is the convex portion in which at least one or more convex members or concave members are included in the surface of the convex portion.

In this configuration, first, since the average interval $P_{ave}$ in the concave-convex structure is equal to or more than 1.5 μm but equal to or less than 10 μm, the size of the convex portion in the concave-convex structure is increased as seen from the light emitted by the semiconductor light-emitting element. In other words, since light scattering or light ray traceability is significantly realized, the light extraction efficiency LEE is enhanced. Then, since the concave-convex structure is formed with a plurality of convex portions, the semiconductor crystal layer can be grown from the bottom portion of the concave portion in the concave-convex structure, and thus it is possible to stabilize the growth of the semiconductor crystal layer. Here, the unique convex portion is included in a plurality of convex portion groups in the concave-convex structure. Here, the unique convex portion refers to a convex portion in which at least one or more convex members or concave members are included in the surface of the convex portion. As described above, the unique convex portion is included in a plurality of convex portion groups, and thus the internal quantum efficiency IQE is enhanced. This is probably because the convex member or the concave member in the surface of the unique convex portion disturbs the growth mode, and thus dislocations in the semiconductor crystal layer are reduced. Hence, the above requirements are simultaneously satisfied, and thus it is possible to simultaneously enhance the light extraction efficiency LEE and the internal quantum efficiency IQE. Furthermore, the concave-convex structure (hereinafter also referred to as the concave-convex structure (III)) of the optical substrate (III) according to the third embodiment includes the unique convex portion, and thus as compared with the case where the unique convex portion is not included, light scattering is enhanced. This is because when an optical behavior is considered on a microscopic scale such as one unique convex portion, the convex member or the concave member provided in the surface of the unique convex portion causes the direction of travel of light to be significantly changed. Hence, in a stage before the semiconductor light-emitting element is manufactured, an optical inspection is performed on the optical substrate (III), for example, variations in reflectance or haze are measured, and thus it is possible to previously predict the accuracy of the concave-convex structure (III) in the optical substrate (III). In other words, since the performance of the semiconductor light-emitting element can be ranked without the semiconductor light-emitting element being made, it is possible to enhance the productivity of the semiconductor light-emitting element.

Preferably, in the optical substrate (III) according to the third embodiment, the unique convex portion includes, in the surface of the convex portion, at least one or more convex members or concave members, and a coverage of the convex members or concave members in the surface of the convex portion is more than 0% but less than 100%.

In this configuration, it is possible to more enhance the effect of improving the internal quantum efficiency IQE with the unique convex portion. First, when the coverage of the convex members or concave members in the unique convex portion over the surface of the convex portion is 0%, since a plurality of convex portion groups in the optical substrate (III) do not include the unique convex portion, the effect of improving the internal quantum efficiency IQE is not realized. From this point of view, the coverage is more than 0%. Then, when the coverage of the convex members or concave members in the unique convex portion over the surface of the convex portion is 100%, the surface of the unique convex portion is covered by the convex members or the concave members without any gap. In this case, the roughness of the surface of the unique convex portion is rapidly degraded, and thus emitted light that forms, with the concave-convex structure (III), the waveguide mode within the semiconductor crystal layer is changed randomly in all directions. This is because the ratio of the emitted light forming the waveguide mode again is increased. More specifically, it is thought that the amount of light travelling upward or downward of the semiconductor light-emitting element is reduced, and that the amount of light travelling toward the side surface of the semiconductor light-emitting element is increased.

Furthermore, preferably, in the optical substrate (III), more than 0% but 100% or less of the unique convex portion is included in the convex portion in the concave-convex structure.

In this configuration, it is possible to more enhance the effect of improving the internal quantum efficiency IQE with the unique convex portion. First, when the existence ratio of the unique convex portions in a plurality of convex portions is 0%, since a plurality of convex portion groups in the optical substrate (III) do not include the unique convex portion, the effect of enhancing the internal quantum efficiency IQE is not realized. From this point of view, the existence ratio is more than 0%. Then, when the existence ratio of the unique convex portions in a plurality of convex portions is 100%, the concave-convex structure is formed with only the unique convex portion. In this case, the disturbance of the average refractive index is formed over a plurality of surfaces of the convex portions in the concave-convex structure (III) for each of the convex portions. In this way, the direction of travel of the emitted light forming the waveguide mode within the semiconductor crystal layer is disturbed, and the efficiency of extracting the emitted light from the semiconductor light-emitting element is reduced. More specifically, it is thought that the amount of light travelling upward or downward of the semiconductor light-emitting element is reduced, and that the amount of light travelling toward the side surface of the semiconductor light-emitting element is increased.

The concave-convex structure (III) in the optical substrate (III) is formed with a plurality of convex portion groups apart from each other. Here, the convex portion group of the concave-convex structure (III) in the optical substrate (III) is at least 100 convex portions. Specifically, at least 100 convex portions are included in the surface of the optical substrate (III), and these convex portions satisfy the average interval $P_{ave}$ that will be described below and include the unique convex portion that will be described below, with the result that the optical substrate (III) is formed. The concave-convex structure (III) is formed with 100 or more convex portions, and thus it is possible both to enhance the light extraction efficiency LEE and enhance the internal quantum efficiency IQE described above. Furthermore, it is possible to achieve the enhancement of the productivity of the semiconductor light-emitting element described above. This has been able to be determined from the probability that emitted light forming the waveguide mode within the semiconductor light-emitting element collides with the concave-convex structure (III). In particular, in terms of more effectively disturbing the waveguide mode to enhance the internal quantum efficiency IQE, the concave-convex structure (III) is preferably formed with 1000 or more convex portions, is more preferably formed with 4000 or more convex portions and is most preferably formed with 6000 or more convex portions. In other words, the optical substrate (III) is preferably configured such that even if all the surface of the optical substrate (III) is covered with the concave-convex structure (III) or the concave-convex structure (III) is partially provided, the concave-convex structure (III) is formed with convex portion groups that satisfy the number of convex portions described above.

Here, as the shape of the convex portion, the following shapes can be adopted: a cone, a cone-shaped member where the side surface portion of a cone is stepwise inclined, a cone-shaped member where the side surface portion of a cone is convex upward, a cone-shaped member where the bottom surface of a cone is distorted, an n-sided pyramid, an n-sided pyramid in which a corner portion of the bottom surface of the n-sided pyramid is so rounded such that its radius of curvature exceeds 0, a cone-shaped member where the outer shape of the bottom surface of a cone has three or more inflection points, a truncated cone having the bottom surface shape described in the cone-shaped member, a cylinder or a polygonal column having the bottom surface shape described in the cone-shaped member and the like. These cone-shaped members may be in the form of a truncated cone. These cone-shaped members may include a corner portion in which the radius of curvature of the apex thereof is 0 or a corner portion which is so rounded such that the radius of curvature of the apex thereof exceeds 0. In particular, preferably, since a corner portion which is so rounded such that the radius of curvature of the apex thereof exceeds 0 is provided, and thus the change of the volume of the concave-convex structure (III) as seen from the semiconductor crystal layer of the semiconductor light-emitting element is increased, the effect of disturbing the waveguide mode is increased. Moreover, in particular, in terms of enhancing the light extraction efficiency LEE and reducing a crack produced by the growth of the semiconductor crystal layer, as the shape of the convex portion, the following shapes are preferable: a cone, a cone-shaped member where the curvature of the apex of a cone exceeds 0, a truncated cone, a triangular pyramid, a cone-shaped member where the curvature of the apex of a triangular pyramid exceeds 0, a six-sided pyramid, a cone-shaped member where the curvature of the apex of a six-sided pyramid exceeds 0 and a convex portion which is a convex portion upper surface that is a multangular shape having a larger number of sides than those of a multangular shape of the bottom surface of the convex portion. More preferably, in a triangular pyramid, a cone-shaped member where the curvature of the apex of a triangular pyramid exceeds 0, a six-sided pyramid and a cone-shaped member where the curvature of the apex of a six-sided pyramid exceeds 0, the multangular shape of the bottom surface of the convex portion is formed with a corner portion whose curvature exceeds 0. Furthermore, the following shapes are preferable: a cone, a cone-shaped member where the curvature of the apex of a cone exceeds 0, a cone-shaped member where the curvature of the apex of a triangular pyramid exceeds 0 and a convex portion where the bottom surface of the convex portion is substantially triangular and the top surface of the convex portion is substantially circular. More preferably, in a cone-shaped member where the curvature of the apex of a triangular pyramid exceeds 0, the triangular shape of the bottom surface of the convex portion is formed with a corner portion whose curvature exceeds 0. The "substantial triangle" means that the curvature of the corner portion of the triangle exceeds 0. The concave-convex structure (III) is formed with the convex portion described above, and thus it is possible to produce optical scattering or light ray traceability for the emitted light forming the waveguide mode within the semiconductor crystal layer by an inclination surface of the bottom surface of the concave portion in the concave-convex structure (III) of the optical substrate (III) and the side surface of the convex portion protruding therefrom. In this way, since the emitted light in the waveguide mode trapped within the semiconductor light-emitting layer can be emitted especially in the direction of thickness of the semiconductor light-emitting element, the light extraction efficiency LEE is enhanced.

From this point of view, the average interval $P_{ave}$ between a plurality of convex portions in the concave-convex structure (III) is equal to or more than 1.5 μm but equal to or less than 10 μm. Since when the average interval $P_{ave}$ is equal to or more than 1.5 μm, it is possible to effectively realize the optical scattering or the light ray traceability described above, the degree of enhancement of the light extraction efficiency LEE is increased. In the same terms, the average interval $P_{ave}$ is than preferably equal to or more than 2.0 μm, is more preferably equal to or more than 2.5 μm and is most preferably equal to or more than 2.8 μm. On the other hand, the upper limit value is determined by the internal quantum efficiency IQE and effects according to the manufacturing of the semiconductor light-emitting element. Since the average interval $P_{ave}$ ave is equal to or less than 10 μm, and thus the crack produced when the semiconductor crystal layer is grown is reduced, the internal quantum efficiency IQE can be enhanced. In particular, in terms of achieving this effect and reducing a time for the film formation of the semiconductor crystal layer, the average interval $P_{ave}$ is more preferably equal to or less than 8 μm and is most preferably equal to or less than 5.5 μm.

Here, the average interval $P_{ave}$ is the arithmetic mean of the intervals P. The interval P is a distance from a convex portion (convex portion A) selected from a plurality of convex portions to a convex portion B that is closest to the convex portion A. Here, the distance between the convex portions is a distance between the center portions of the apexes of the convex portions. When an apex is present in the convex portion, it is the distance between the apexes whereas when a flat surface is present on the apex of the convex portion, it is the distance between the centers of the flat surfaces. The average interval $P_{ave}$ is the arithmetic mean of the intervals P. The average interval $P_{ave}$ is calculated according to the following definition. First, the concave-convex structure surface of the optical substrate (III) is observed. Here, for the observation, a scanning electron microscope, a laser microscope or a digital microscope can be used. The concave-convex structure surface is observed, and the magnification is increased until at least 100 convex portions can be clearly observed. Thereafter, 100 convex portions are selected within the observed image. Then, 10 convex portions are arbitrarily selected from the selected 100 convex portions, and the intervals P described above are calculated for each of the convex portions. The average interval $P_{ave}$ is the arithmetic mean of the calculated 10 intervals P (P1, P2, . . . and P10), that is, is given as (P1+P2+ . . . +P10)/10. A unique convex portion included in the concave-convex structure (III), which will be described below, is determined from the 100 convex portions used for the calculation of the average interval $P_{ave}$. In other words, the selected 100 convex portions are analyzed more specifically, and thus the unique convex portion is determined, with the result that the ratio of the unique convex portion (the ratio of unique convex portions included in the 100 convex portions) is obtained. Likewise, the 100 convex portions are analyzed more specifically, and thus the state of the surface of the unique convex portion is grasped.

The height of the convex portion will then be described. The height of the convex portion is defined as the average convex portion height. Here, the average convex portion height is defined by using the 100 convex portions used for determining the average interval $P_{ave}$. The definition of the average is as follows. First, 10 convex portions are arbitrarily selected from the 100 convex portions. Then, the height is measured for each of the convex portions. Here, the height is the shortest distance between a surface B of the bottom portion of the concave portion in the concave-convex structure and a surface T passing through the apex of the concave portion and parallel to the surface B. The average convex portion height is the arithmetic mean of the calculated 10 heights H (H1, H2, . . . and H10), that is, is given as (H1+H2+ . . . +H10)/10.

The average convex portion height is preferably 0.1 times or more but 1.5 times or less as great as the average interval $P_{ave}$. Since when the average convex portion height is 0.1 times or more as great, optical scattering strength or light ray traceability is increased, the improvement of the light extraction efficiency LEE is increased. On the other hand, since when the average convex portion height is 1.5 times or less as great, the growth of the semiconductor crystal layer is stabilized, the effect of reducing the crack produced within the semiconductor crystal layer is enhanced, with the result that the effect of improving the internal quantum efficiency IQE is enhanced. In terms of the same effect, the average convex portion height is more preferably 0.3 times or more but 1.3 times or less as great, and is most preferably 0.45 times or more but 1.0 times or less as great.

The diameter of the convex bottom portion will then be described. The diameter of the convex bottom portion is defined as the average diameter. Here, the average height is defined by using the 100 convex portions used for determining the average interval $P_{ave}$. The definition of the average is as follows. First, 10 convex portions are arbitrarily selected from the 100 convex portions. Then, the diameter of the convex bottom portion is measured for each of the convex portions. Here, the diameter of the convex bottom portion is the diameter of the bottom portion of the convex portion in the concave-convex structure. The maximum distance from a certain point of the outline of the bottom portion of the convex portion to another point is the diameter of the bottom portion of the convex portion. The average diameter is the arithmetic mean of the diameters of the calculated 10 convex portion bottom portions $\phi$ ($\phi$1, $\phi$2, . . . and $\phi$10), that is, is given as ($\phi$1+$\phi$2+ . . . +$\phi$10)/10.

The average diameter of the convex bottom portion in the concave-convex structure (III) is preferably 0.1 times or more but 0.9 times or less as great as the average interval $P_{ave}$. Since when the average diameter is 0.1 times or more as great, optical scattering strength or light ray traceability is increased, the light extraction efficiency LEE is enhanced. On the other hand, when the average diameter is 0.9 times or less as great, the growth of the semiconductor crystal layer is made satisfactory. In terms of the same effect, the average diameter of the convex bottom portion is more preferably 0.3 times or more but 0.8 times or less as great as the average interval $P_{ave}$, and is most preferably 0.5 times or more but 0.8 times or less as great.

The unique convex portion included in the concave-convex structure (III) will then be described. Here, "the unique convex portion is included in the concave-convex structure (III)" means that for example, when the concave-convex structure (III) is formed with Z convex portions, Y unique convex portions are included in the Z convex portions. As will be described below, Z=100. Specifically, when a non-unique convex portion is mentioned as a normal convex portion, the normal convex portions and the unique convex portions constitute the concave-convex structure (III), the total number of convex portions in the normal convex portions and the unique convex portions is the number of convex portions in the concave-convex structure (III).

The concave-convex structure (III) is formed with the convex portion group including the unique convex portion, and thus it is possible not only to enhance the light extraction efficiency LEE but also to enhance the internal quantum efficiency IQE. This is probably because the convex member or the concave member in the surface of the unique convex portion disturbs the growth mode of the semiconductor crystal layer, and thus dislocations in the semiconductor crystal layer are reduced. Furthermore, since the unique convex portion is included, as compared with the case where the unique convex portion is not included, light scattering is increased. Hence, optical inspections for the optical substrate (III) according to the third embodiment, for example, an inspection using a reflectance and an inspection using haze are performed, and thus it is possible to previously grasp the accuracy of the optical substrate (III). Thus, in a stage preceding the manufacturing of the semiconductor light-emitting element, the concave-convex structure (III) in the optical substrate (III) can be sorted, with the result that it is possible to enhance the productivity of the semiconductor light-emitting element.

The unique convex portion is determined from the 100 convex portions used for determining the average interval $P_{ave}$, and is characterized. First, the 100 convex portions are observed more specifically. Here, a scanning electron microscope, a laser microscope or a digital microscope is used. All the 100 convex portions are observed, and the convex portions that satisfy the definition described below are determined to be the unique convex portions. The coverage of the convex member and the concave member in the unique convex portion described below is defined as the arithmetic mean of the coverages for the individual unique convex portions included in the 100 convex portions. The existence ratio of the unique convex portion described below is an existence probability of the unique convex portion included in the 100 convex portions. Specifically, when Y (≥1) unique convex portions are included, the existence probability is Y/100*100=Y %. When no unique convex portion is recognized in the observation of the 100 convex portions, K (K>100) convex portions including the 100 convex portions are observed, and the unique convex portion is searched for. K is sequentially increased to 300, to 500, to 1000, to 2000, to 5000 and then to 10000. When no unique convex portion can be observed in the observation of up to 10000, the existence probability of the unique convex portion is assumed to be 0%. Specifically, if the unique convex portions are recognized at the time of K=300, when the number of unique convex portion described above is assumed to be Y, the existence probability is Y/300×100=Y/3%. Here, if no unique convex portion is present in the 300 convex portions, when it is assumed that K=500, the existence probability Y/5% is determined. Likewise, if no unique convex portion is present at the time of K=500, when it is assumed that K=1000, the existence probability Y/10% is determined. Thereafter, if no unique convex portion is likewise present, the value of K is increased.

In terms of further achieving the effect of the unique convex portion, the coverage of the convex member and the concave member provided in the surface of the unique convex portion is preferably more than 0% but less than 100%. Here, the coverage refers to a flat surface occupancy of the convex member and the concave member in the surface of the convex portion. Specifically, when a flat surface area in the observation of a certain unique convex portion from the upper surface side of the convex portion is assumed to be S, and then the total flat surface area of the convex member and the concave member arranged in the surface of the unique convex portion within the observed image is assumed to be Si, the coverage is (Si/S)×100.

FIG. 29 is a schematic diagram showing the unique convex portion in the optical substrate according to the third embodiment. In FIG. 29, one unique convex portion 520 is selected and shown. FIGS. 29A and 29B show a case where the unique convex portion 520 is observed from the side of the side surface, and FIGS. 29C and 29D show a case where the unique convex portion 520 is observed from the side of its apex. An image obtained by observing the unique convex portion 520 of FIG. 29A from the side of the apex is FIG. 29C, and an image obtained by observing the unique convex portion 520 of FIG. 29B from the side of the apex is FIG. 29D.

Figure 29A:
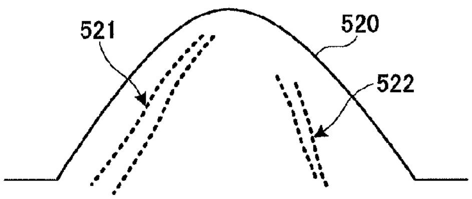
FIG. 29 A schematic diagram showing a unique convex portion in an optical substrate (III) according to the third embodiment.

In FIG. 29A, two convex members (or concave members; the same is true in the following description) 521 and 522 are present in the side surface portion of the unique convex portion 520. The image obtained by observing the unique convex portion 520 from the side of the apex is FIG. 29C, and in this example, the shape of the outline of the bottom portion of the unique convex portion 520 is a circle. When an area surrounded by the outline of the unique convex portion 520 in the flat surface image obtained by observing the unique convex portion 520 from the side of the apex is assumed to be S, and the areas of the convex member and the concave member are assumed to be Si1 and Si2, the coverage is given as (Si1+Si2)/S×100.

Figure 29B:
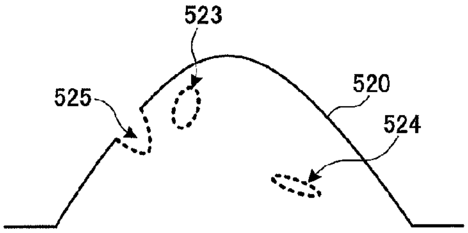
Figure 29C:
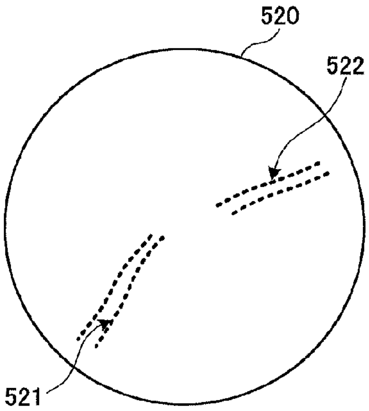
Figure 29D:
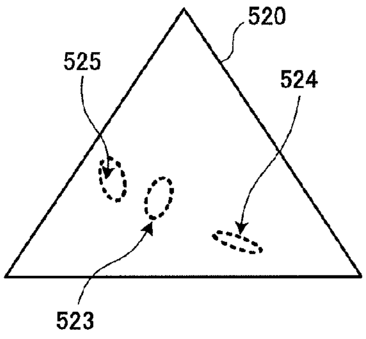

Likewise, in FIG. 29B, three convex members 523, 524 and 525 are present in the side surface portion of the unique convex portion 520. The image obtained by observing the unique convex portion 520 from the side of the apex is FIG. 29D, and in this example, a shape of the outline of the bottom portion of the unique convex portion 520 is a triangle. When an area surrounded by the outline of the unique convex portion 520 in the flat surface image obtained by observing the unique convex portion 520 from the side of the apex is assumed to be S, and the areas of the convex members 523, 524 and 525 are assumed to be Si1, Si2, and Si3, the coverage is given as (Si1+Si2+Si3)/S×100.

The coverage of the convex member and the concave member in the unique convex portion in the surface of the unique convex portion exceeds 0, and thus since a plurality of convex portion groups in the optical substrate (III) include the unique convex portion, the effect of enhancing the internal quantum efficiency IQE is realized by the principle described above. On the other hand, the coverage of the convex member and the concave member in the unique convex portion in the surface of the unique convex portion is less than 100%, and thus since the surface of the convex portion which is not covered by the convex member or the concave member is present, it is possible to reduce the increase in roughness of the surface of the convex portion. Accordingly, the concave-convex structure (III) in the optical substrate (III) according to the third embodiment disturbs the direction of travel of the emitted light forming the waveguide mode within the semiconductor crystal layer, and the efficiency of emitting the emitted light to the outside of the semiconductor light-emitting element is enhanced. In the same terms, the coverage is preferably equal to or less than 90%, is more preferably equal to or less than 80% and is most preferably equal to or less than 50%. Moreover, in the same terms, the coverage is preferably equal to or more than 0.01%, is more preferably equal to or more than 0.1% and is most preferably equal to or more than 0.15%. In the semiconductor light-emitting element, in particular, when the internal quantum efficiency is desired to be enhanced, in the widest range described above, the coverage is preferably equal to or more than 50% but equal to or less than 90%, is more preferably equal to or more than 60% but equal to or less than 86% and is most preferably equal to or more than 70% but equal to or less than 84%. When these ranges are satisfied, the effect of disturbing the growth mode of the semiconductor crystal layer by the convex member or the concave member in the unique convex portion is enhanced, and it is possible to make dislocations collide with each other in the vicinity of the unique convex portion and thereby reduce them. On the other hand, when the light extraction efficiency is particularly desired to be enhanced, in the widest range described above, the coverage is preferably equal to or more than 0.1% but equal to or less than 30%, is more preferably equal to or more than 0.1% but equal to or less than 10% and is most preferably equal to or more than 0.1% but equal to or less than 5%. Since these ranges are satisfied, and thus it is possible to reduce the reformation of the waveguide mode by the emitted light where the waveguide mode is disturbed, the light extraction efficiency is more enhanced.

In the third embodiment, the existence ratio of the unique convex portion in a plurality of convex portions in the concave-convex structure (III) is preferably more than 0% but less than 100%. The existence ratio of the unique convex portion in a plurality of convex portions is more than 0%, it is possible to realize the effect of the unique convex portion described above. On the other hand, the existence ratio is less than 100%, and thus since it is possible to decrease the disturbance of the average refractive index formed in the surface of the convex portion in the concave-convex structure (III), it is possible to disturb the direction of travel of the emitted light forming the waveguide mode within the semiconductor crystal layer and thereby increase the amount of light travelling upward or downward of the semiconductor light-emitting element. In the same terms, the existence probability is preferably equal to or less than 90%, is more preferably equal to or less than 80% and is most preferably equal to or less than 50%. In the same terms, the existence probability is preferably equal to or more than 0.01%, is more preferably equal to or more than 0.1% and is most preferably equal to or more than 0.15%. In the semiconductor light-emitting element, in particular, when the internal quantum efficiency is desired to be enhanced, in the widest range described above, the existence probability is preferably equal to or more than 50% but equal to or less than 95%, is more preferably equal to or more than 60% but equal to or less than 90% and is most preferably equal to or more than 70% but equal to or less than 80%. When these ranges are satisfied, the effect of disturbing the growth mode of the semiconductor crystal layer by the convex member or the concave member in the unique convex portion is enhanced, and it is possible to make dislocations collide with each other in the vicinity of the unique convex portion and thereby reduce them. On the other hand, when the light extraction efficiency is particularly desired to be enhanced, in the widest range described above, the existence probability is preferably equal to or more than 0.025% but equal to or less than 30%, is more preferably equal to or more than 0.05% but equal to or less than 10% and is most preferably equal to or more than 0.1% but equal to or less than 5%. Since these ranges are satisfied, and thus it is possible to reduce the reformation of the waveguide mode by the emitted light where the waveguide mode is disturbed, the light extraction efficiency is more enhanced.

Figure 30A:
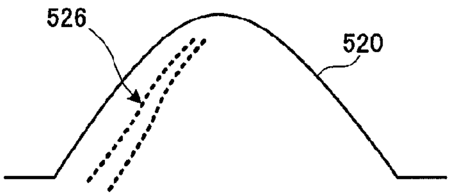
FIG. 30 A schematic diagram showing the unique convex portion in the optical substrate (III) according to the third embodiment.
Figure 30B:
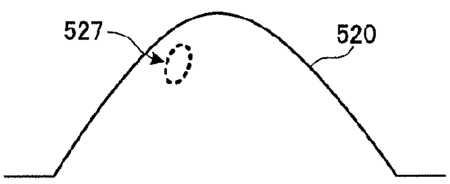
Figure 30C:
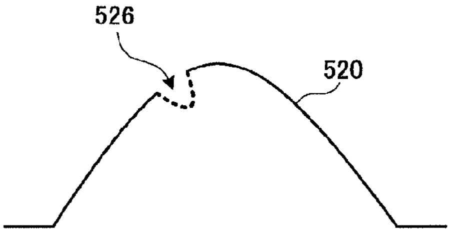
Figure 30D:
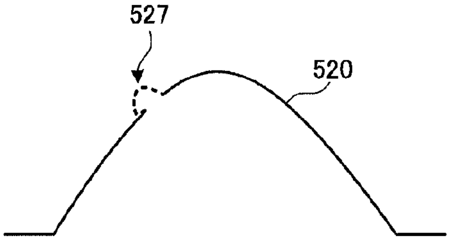

The unique convex portion is a convex portion that includes at least one or more convex members or concave members in its surface, among a plurality of convex portions in the concave-convex structure (III) according to the third embodiment. FIG. 30 is a schematic diagram showing the unique convex portion in the optical substrate (III) according to the third embodiment. In FIG. 30, the surface of one unique convex portion 520 is shown, and the unique convex portion 520 is observed from the side surface. The portions indicated by broken lines in FIG. 30 are a convex member 527 or a concave member 526 in the surface of the convex portion, which characterizes the unique convex portion 520. FIG. 30A shows a case where the convex member 526 is formed in the shape of a line. Here, the convex member 526 is between two broken lines. FIG. 30B shows a case where the convex member 527 is formed in the shape of a circle or an oval. FIGS. 30C and 30D are schematic diagrams showing cases where the direction of observation of the unique convex portion 520 shown in FIG. 30B is changed. FIG. 30C shows the concave member 526, and FIG. 30D shows the convex member 527.

Figure 31:
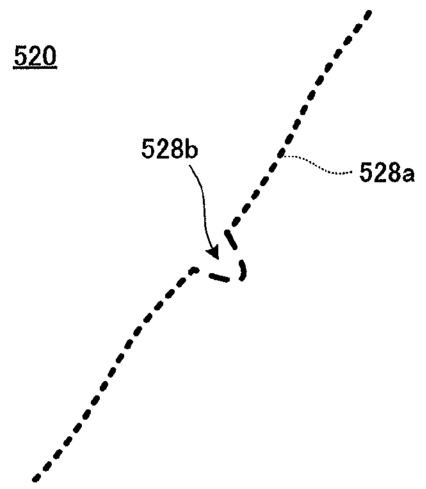
FIG. 31 A schematic diagram showing the unique convex portion in the optical substrate (III) according to the third embodiment.

The shape of the outline of the convex member or the concave member included in the unique convex portion is not particularly limited, and may be an n-gon (n≥3), an n-gon (n≥3) having a corner portion whose radius of curvature exceeds 0, a straight line shape, a curved line shape or a curved line shape partially having an edge in the curved line. FIG. 31 is a schematic diagram showing the unique convex portion in the optical substrate according to the third embodiment. Here, the edge refers to the corner portion. In other words, the "curved line shape partially having an edge in the curved line" is a state, as shown in FIG. 31, where a smooth curved line portion 528*a* and a corner portion 528*b* are mixed. The corner portion 528*b* may be rounded such that its radius of curvature exceeds 0. Although in FIG. 31, only the one corner portion 528*b* is shown, a plurality of corner portions may be provided.

When two or more concave members or convex members are included in the unique convex portion 520, their shapes may be the same or may be different. Only the convex members or only the concave members may be included or the convex members and the concave members may be mixed.

When two or more unique convex portions 520 are included in the concave-convex structure (III), the convex members or the concave members in the unique convex portions 520 may be different from each other or the same as each other in shape.

The height or depth of the convex member or the concave member in the unique convex portion 520 is preferably more than 0 but less than the average convex portion height H. Here, the height of the convex member is a distance that extends, when the surface of a non-convex member portion in the unique convex portion 520 is assumed to be a reference surface, from the reference surface to a position of the convex member farthest away from the reference surface. On the other hand, the depth of the concave member is a distance that extends, when the surface of a non-concave member portion in the unique convex portion 520 is assumed to be a reference surface, from the reference surface to a position of the concave member farthest away from the reference surface. The height or depth of the convex member or the concave member in the unique convex portion 520 exceeds 0, and thus it is possible to achieve the effect of the unique convex portion 520 described above. On the other hand, since the height or depth is less than the average convex portion height H, and thus the evenness of optical scattering is enhanced, the improvement of the light extraction efficiency LEE is enhanced. Furthermore, since it is possible to reduce the specific growth of the semiconductor crystal layer, the stability of the p-n junction interface is enhanced, and the diode characteristic is enhanced. In other words, it is possible to reduce the leak current. In the same terms, the height or depth of the convex member or the concave member is preferably equal to or more than 10 nm, is more preferably equal to or more than 30 nm and is most preferably equal to or more than 50 nm. Moreover, in terms of the same effect, the height or depth is preferably equal to or less than half the average convex portion height H, is more preferably equal to or less than one-fifth and is most preferably equal to or less than one-tenth.

The arrangement of the unique convex portions 520 is not particularly limited, and the unique convex portions 520 may be arranged either regularly or irregularly with respect to a plurality of convex portions in the concave-convex structure of the optical substrate according to the third embodiment. The unique convex portions may be arranged such that the unique convex portions are adjacent to each other, that is, an aggregation of two or more is formed or the unique convex portions are dispersed.

The convex member or the concave member in the unique convex portion 520 is preferably provided at least in the upper part of the convex portion in the unique convex portion. The height of the unique convex portion 520 is assumed to be hn. A surface obtained by moving the surface of the bottom portion of the convex portion in the unique convex portion 520 to the side of the apex of the convex portion by hn/3 is assumed to be a reference surface. A part included in the side of the apex of the convex portion from the reference surface is the upper part of the convex portion. At least the convex member or the concave member is provided in the upper part of the convex portion in the unique convex portion, and thus the effect of improving the light extraction efficiency LEE described already is enhanced. This is because the convex member or the concave member is provided in the upper part of the convex portion, and thus the disturbance of the refractive index of the semiconductor crystal layer is increased. In particular, preferably, when the hn/3 is hn/2, and more preferably is hn/1.5, the effect of disturbing the direction of travel of the emitted light producing the waveguide mode is enhanced. In terms of more achieving the effect described above, 30% or more of the convex member or the concave member in the unique convex portion are preferably provided only in the upper part of the convex portion, 60% or more are more preferably provided only in the upper part of the convex portion and 85% or more are most preferably provided only in the upper part of the convex portion.

The arrangement of the convex portions in the third embodiment will then be described. The arrangement of the convex portions is determined from the relationship between the internal quantum efficiency IQE and the light extraction efficiency LEE. In terms of enhancing the light extraction efficiency LEE, the arrangement of the convex portions is preferably either symmetric or substantially symmetric with respect to at least one axis that is, a line. In particular, the arrangement of the convex portions is more preferably either symmetric or substantially symmetric with respect to two axes perpendicular to each other, that is, lines. The arrangement of the convex portions is most preferably either symmetric or substantially symmetric with respect to three axes overlapping each other by a rotation angle of 60 degrees×n (n≥1), that is, lines. The concave-convex structure (III) is produced by the convex portions satisfying such an arrangement, and thus it is possible to make optical reflection or optical scattering greatly act on the emitted light forming the waveguide mode. In other words, since it is possible to reduce the reproduction of the waveguide mode by the emitted light where the waveguide mode is disturbed, the light extraction efficiency LEE is more enhanced. Furthermore, since it is possible to enhance the evenness of the distance between the convex portions apart from each other, it is possible to reduce the specific growth of the semiconductor crystal layer, with the result that the effect of reducing the leak current is enhanced. Among them, preferably, when the arrangement is either symmetric or substantially symmetric with respect to three axes overlapping each other by a rotation angle of 60 degrees×n (n≥1), the effect described above is further achieved. Examples of such an arrangement include an arrangement in the form of a regular hexagonal lattice, an arrangement in the form of a semiregular hexagonal lattice and an arrangement in which when an arrangement axis A and an arrangement axis B obtained by rotating 90 degrees with respect to the arrangement axis A are present in a regular hexagonal lattice, modulation occurs at periodic intervals in the directions the axes A and B.

A convex portion having the same idea as the minimal convex portion 133 (see FIG. 9) described in the first embodiment is included in the concave-convex structure (III) of the optical substrate (III), and thus the light extraction efficiency LEE is more enhanced, and the existence probability is made to fall within the range described in the first embodiment, and thus it is possible to reduce the leak current. In particular, the minimal convex portion that is the unique convex portion is included, and thus these effects are further enhanced. Here, the minimal convex portion in the third embodiment is a convex portion whose convex portion height is lower than the average convex portion height H and which particularly has a height of 0.6 H or less. The minimal convex portion can be determined by observing the concave-convex structure of the optical substrate with an atomic force microscope. A method of counting the minimal convex portions when the existence probability of the minimal convex portion is determined is the same as the existence probability of the unique convex portion described above.

The material of the optical substrate (III) is the same as that of the optical substrate (I) 1 according to the first embodiment.

In the semiconductor light-emitting element using the optical substrate (III), the optical substrate (I) and the concave-convex structure (I) in the first embodiment are preferably replaced with the optical substrate (III) and the concave-convex structure (III) according to the third embodiment.

A method of manufacturing the concave-convex structure (III) of the optical substrate (III) will be described. The method of manufacturing the concave-convex structure (III) including the unique convex portion can be classified into two methods. The first method is to produce a concave-convex structure having no unique convex portion and thereafter process part of the normal convex portion into the unique convex portion. The second method is to manufacture a concave-convex structure including the unique convex portion. In either of the methods, it is possible to manufacture it with the method that has already been described in the first embodiment. In particular, it is preferable to adopt a photolithography method. As the photolithography method, one of known general methods can be applied. Among them, fine particles and impurities are dispersed in a photoresist, and thus it is possible to efficiently manufacture the unique convex portion. A concave-convex structure having no unique convex portion or a concave-convex structure having almost no unique convex portion is produced, a minute pattern is pressed onto or scrubbed onto the concave-convex structure and thus it is possible to form the unique convex portion. The average interval in the minute pattern is lower than the average interval in the concave-convex structure (III), and thus it is possible to effectively generate the unique convex portion. In particular, the average interval in the minute pattern is more preferably 0.8 times or less as low as that in the concave-convex structure (III), is more preferably 0.5 times or less as low as that in the concave-convex structure (III) and is most preferably 0.3 times or less as low as that in the concave-convex structure (III). As the minute pattern, the mold described in the first embodiment can be used. The minute pattern described above is pressed or scrubbed, and thus part of the normal convex portion is processed into the unique convex portion. Among them, the hardness of the material of the minute pattern is preferably higher than that of the optical substrate.

Optical Substrate (IV) According to a Fourth Embodiment

An optical substrate (IV) according to a fourth embodiment will then be described. The optical substrate (IV) is used, and thus it is possible to simultaneously improve the internal quantum efficiency IQE and the light extraction efficiency LEE. Since it is possible to reduce the generation of a crack in the semiconductor crystal layer, it is possible to enhance the long-term reliability of the semiconductor light-emitting element. Furthermore, the concave-convex structure of the optical substrate (IV) includes the concave-convex structure (I) 12 of the optical substrate (I) 1 according to the first embodiment or the concave-convex structure (II) 22 of the optical substrate (II) 2 according to the second embodiment described above, and thus it is possible to more enhance the light extraction efficiency LEE and more satisfactorily maintain the leak current.

In the semiconductor light-emitting element, a high-density concave-convex structure is used, and thus it is possible to enhance the internal quantum efficiency IQE, and on the other hand, light scattering caused by a concave-convex structure having great variations in volume is utilized, and thus it is possible to enhance the light extraction efficiency LEE. In other words, when in order to enhance the internal quantum efficiency IQE, a high-density concave-convex structure is provided, volume variations of the concave-convex structure are decreased, and optical scattering (light diffraction or light scattering) is reduced, with the result that the enhancement of the light extraction efficiency LEE is limited. This can be explained by an optical phenomenon as seen from the light emitted from the semiconductor light-emitting element. This is because although a concave-convex structure having a sufficient density to enhance the internal quantum efficiency IQE is on a scale about equal to or less than the wavelength of the emitted light, since as the wavelength of the emitted light is increased with respect to the concave-convex structure, the effective medium approximation effect functions as an optical phenomenon, the optical scattering is reduced. On the other hand, when volume variations of the concave-convex structure are increased to enhance the light extraction efficiency LEE, since the density of the concave-convex structure is lowered, the effect of dispersing dislocations is reduced, with the result that the improvement of the internal quantum efficiency IQE is limited.

It has been discovered from what has been described that it is important that in order to simultaneously improve the internal quantum efficiency IQE and the light extraction efficiency LEE so as to enhance the external quantum efficiency EQE of the semiconductor light-emitting element, the concave-convex structure that can improve the internal quantum efficiency IQE and the concave-convex structure that can improve the light extraction efficiency LEE are provided and the concave-convex structures are arranged so as not to degrade their functions. Thus, the optical substrate (IV) according to the fourth embodiment has been completed.

In the optical substrate (IV) according to the fourth embodiment, in order to improve the internal quantum efficiency IQE and the light extraction efficiency LEE, the difference between the average intervals $P_{ave}$ in a plurality of concave-convex structures included in the optical substrate is utilized. Specifically, in the optical substrate (IV) according to the fourth embodiment, a concave-convex structure (L) having an average interval PL and a concave-convex structure (S) having an average interval PS are provided, and thus the average interval PL and the average interval PS are made to differ within a predetermined ratio range.

Here, the concave-convex structure (L) having a higher average interval $P_{ave}$ realizes the function of enhancing the light extraction efficiency LEE, and the concave-convex structure (S) having a lower average interval $P_{ave}$ realizes the function of improving the internal quantum efficiency IQE. Furthermore, in order for the functions of the concave-convex structures (L, S) to achieve a synergistic effect to complement each other, that is, in order for the light extraction efficiency LEE not to be lowered by the concave-convex structure (S) for improving the internal quantum efficiency IQE and in order for the internal quantum efficiency IQE not to be lowered by the concave-convex structure (L) for enhancing the light extraction efficiency LEE, in at least a part of the surface of one concave-convex structure (L or S), the other concave-convex structure (S or L) is provided.

Figure 32A:
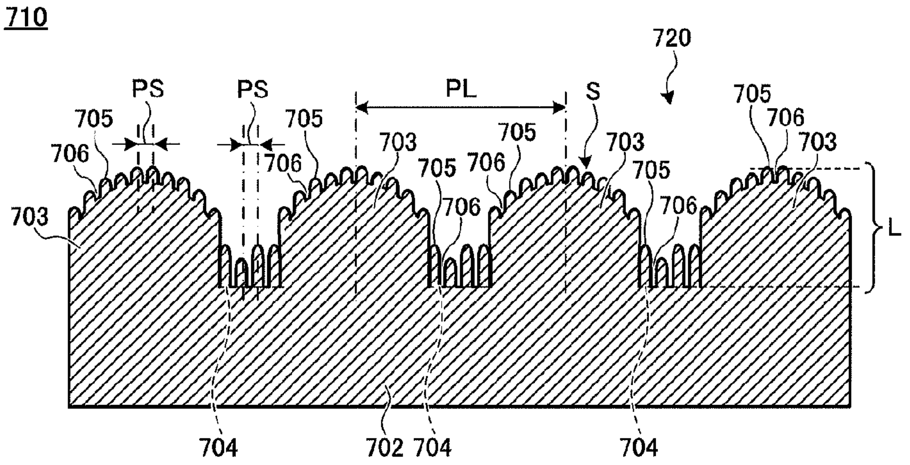
FIG. 32 A cross-sectional schematic view showing an example of an optical substrate (IV) according to a fourth embodiment.
Figure 32B:
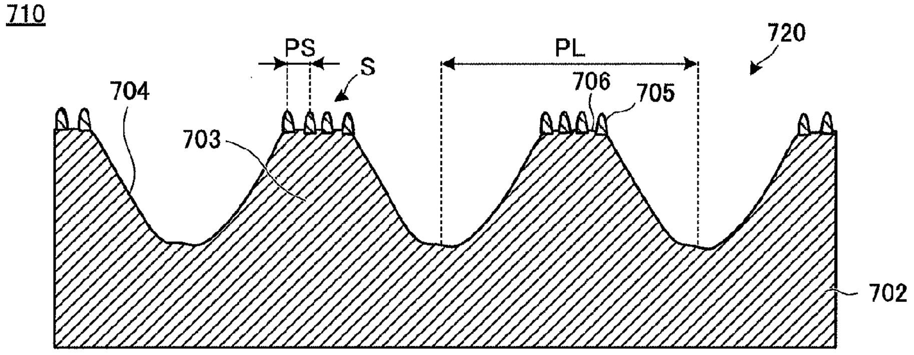

FIGS. 32A and 32B are cross-sectional schematic views showing examples of the optical substrate (IV) according to the fourth embodiment. In an optical substrate 710 shown in FIGS. 32A and 32B, a concave-convex structure surface 720 is provided on the main surface of a substrate main body 702, and the concave-convex structure surface 720 is formed with a first concave-convex structure (hereinafter referred to as a concave-convex structure (L)) and a second concave-convex structure (hereinafter referred to as a concave-convex structure (S)). The concave-convex structure (L) is formed with convex portions 703 (or concave portions 704) provided apart from each other and the concave portions 704 (or the convex portion 703) connecting the adjacent convex portions 703 (or the concave portions 704). A plurality of convex portions 703 (or concave portions 704) have the average interval PL.

On the other hand, the concave-convex structure (S) is formed with a plurality of convex portions 705 (or concave portions 706) provided on the surface of the convex portions 703 and the concave portions 704 of the concave-convex structure (L) and the concave portions 706 (or the convex portions 705) connecting a plurality of convex portions 705 (or concave portions 706). A plurality of convex portions 705 (or concave portions 706) have the average interval PS. In FIG. 32A, the concave-convex structure (S) is provided on the surfaces of the apexes of a plurality of convex portions 703 and the bottom portions of the concave portions 704. On the other hand, in FIG. 32B, the concave-convex structure (S) is provided on the apex of the convex portion 703 connecting a plurality of independent concave portions 704. The concave-convex structure (S) is not limited to the examples of FIGS. 32A and 32B, and is preferably provided on at least one of the convex portion 703 and the concave portion 704.

The concave-convex structure (S) can be provided on the side surface of the convex portion 703 connecting the convex portion 703 and the bottom portion of the concave portion 704. When the concave-convex structure (S) is provided on the side surface of the convex portion 703, it is thought that the effect of disturbing the waveguide mode is further enhanced and the direction of travel of the disturbed emitted light can be more changed to the direction of thickness of the semiconductor light-emitting element. Hence, it is easy to select a sealant when the semiconductor light-emitting element is packaged.

In particular, preferably, a first concave-convex structure (L) is formed with a plurality of convex portion 703 apart from each other, and the convex portions 705 or the concave portions 706 of a second concave-convex structure (S) is provided at least on the bottom portion of the first concave-convex structure (L).

In this case, the growth of the semiconductor crystal layer can be started from the starting point, that is, the bottom surface of the concave portion 704 in the concave-convex structure (L). In particular, since the concave-convex structure (S) is provided on the bottom surface of the concave portion 704, and thus it is possible to disturb the growth mode of the semiconductor crystal layer, it is possible to reduce dislocations in the semiconductor crystal layer in the vicinity of the concave-convex structure (S). Moreover, since the concave-convex structure (L) is formed with a plurality of convex portions 703, it is possible to reduce cracks in the vicinity of the convex portion 703 in the semiconductor crystal layer grown from the bottom portion of the concave portion 704. In other words, it is possible to enhance the internal quantum efficiency IQE and enhance the reliability of the semiconductor light-emitting element. As will be described below, since the concave-convex structure (L) and the concave-convex structure (S) satisfy the relationship of predetermined average intervals, optical scattering is increased. In particular, since the concave-convex structure (S) is provided at least on the bottom portion of the concave portion 704, it is possible to more disturb the waveguide mode with light scattering or optical reflection, and thus it is possible to reduce the guiding of the waveguide mode again, with the result that the light extraction efficiency LEE is simultaneously enhanced.

Preferably, the first concave-convex structure (L) is formed with a plurality of convex portion 704 apart from each other, and the convex portions 705 or the concave portions 706 of the second concave-convex structure (S) is provided at least on the apex of the convex portion 703 of the first concave-convex structure (L).

In this case, the growth of the semiconductor crystal layer can be started from the starting point, that is, the apex of the convex portion 703 in the concave-convex structure (L). In particular, since the concave-convex structure (S) is provided on the apex of the convex portion 703, and thus it is possible to disturb the growth mode of the semiconductor crystal layer, it is possible to reduce dislocations in the semiconductor crystal layer in the vicinity of the concave-convex structure (S). Here, the semiconductor crystal layer grown from the apex of the convex portion 703 is satisfactory in growth as compared with the semiconductor crystal grown from the bottom portion of the concave portion 704. Hence, the internal quantum efficiency IQE is effectively enhanced. Depending on the growth conditions of the semiconductor crystal layer, it is possible to effectively couple the semiconductor crystal layer grown from the bottom portion of the concave portion 704 and the semiconductor crystal layer grown from the apex of the convex portion 703. In this case, it is possible to effectively reduce cracks in the semiconductor crystal layer in the vicinity of the convex portion 703. Depending on the growth conditions of the semiconductor crystal layer, it is easy to generate a gap within the concave portion 704. In this case, the accuracy of removal when the optical substrate (IV) 710 is removed by, for example, laser lift-off is enhanced. As will be described below, since the concave-convex structure (L) and the concave-convex structure (S) satisfy the relationship of the predetermined average intervals, optical scattering is increased. In particular, since the concave-convex structure (L) is formed with a plurality of concave portions 704, variations in volume are more increased, and thus the effect of disturbing the waveguide mode is enhanced, with the result that the light extraction efficiency LEE is enhanced.

In the optical substrate (IV) 710 described above and according to the fourth embodiment, the coverage of the concave-convex structure (S) in the concave-convex structure (L) is preferably more than 0 but less than 100%.

In this case, since in the convex portion 703 or the concave portion 704 of the concave-convex structure (L), the concave-convex structure (S) is provided without fail, by the principle described above, it is possible to effectively enhance the internal quantum efficiency IQE and reduce cracks within the semiconductor crystal layer. On the other hand, all the convex portion 703 and the concave portion 704 in the concave-convex structure (L) are prevented from being filled with the concave-convex structure (S). In this way, it is possible to reduce the lowering of, with the concave-convex structure (S), the effect of enhancing the light extraction efficiency LEE produced by the concave-convex structure (L). In other words, the effect of simultaneously enhancing the internal quantum efficiency IQE and the light extraction efficiency LEE is more enhanced.

Among them, preferably, in the optical substrate (IV) 710, the diameter of the convex portion 705 in the second concave-convex structure (S) is decreased as it extends from the bottom portion to the apex.

In this configuration, it is possible to reduce dislocations in the semiconductor crystal layer grown from the concave portion 706 in the concave-convex structure (S) and reduce cracks in the vicinity of the convex portion 705 in the concave-convex structure (S) of the semiconductor crystal layer. Hence, it is possible to enhance the long-term reliability of the semiconductor light-emitting element.

When at least one of the concave-convex structure (S) and the concave-convex structure (L) is the concave-convex structure (I) 12 according to the first embodiment or the concave-convex structure (II) 22 according to the second embodiment described above, since the light extraction efficiency LEE is more enhanced, and it is possible to reduce the specific growth of the semiconductor crystal layer, it is possible to more satisfactorily reduce the leak current. In particular, when at least the concave-convex structure (S) satisfies the concave-convex structure (I) 12, the effect described above is further achieved.

Figure 32C:
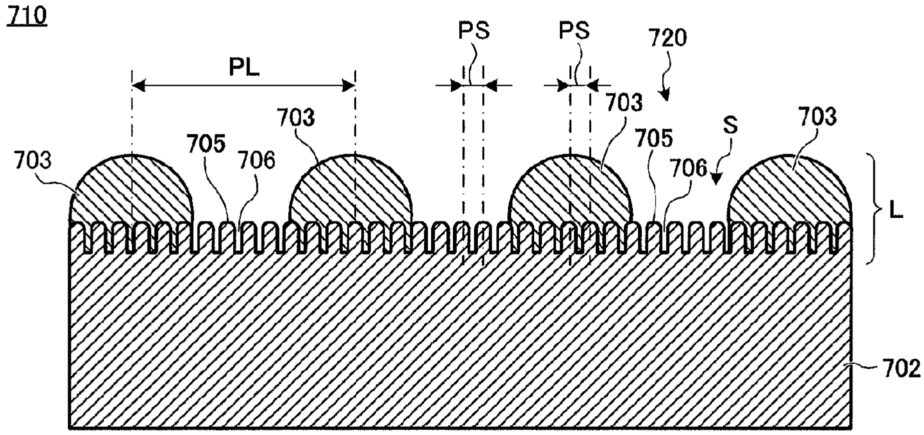

FIG. 32C is a cross-sectional schematic view showing another example of the optical substrate (IV). In the optical substrate 710, the concave-convex structure surface 720 is provided on the main surface of the substrate main body 702, and the concave-convex structure surface 720 is formed with the first concave-convex structure (hereinafter referred to as the concave-convex structure (S)) and the second concave-convex structure (hereinafter referred to as the concave-convex structure (L)). The concave-convex structure (S) is formed with the convex portions 705 provided apart from each other and the concave portion 706 connecting the adjacent convex portions 705. A plurality of convex portions 705 have the average interval PS.

On the other hand, the concave-convex structures (L) are provided apart from each other such that on the surface of the concave-convex structure (S), part of the concave-convex structure (S) is exposed, and are formed with a plurality of convex portions 703 provided on the convex portions 705 and the concave portions 706 of the concave-convex structure (S). The plurality of convex portions 703 have the average interval PL.

When at least one of the concave-convex structure (S) and the concave-convex structure (L) is the concave-convex structure (I) 12 of the optical substrate (I) 1 according to the first embodiment or the concave-convex structure (II) 22 of the optical substrate (II) according to the second embodiment described above, since the light extraction efficiency LEE is more enhanced, and it is possible to reduce the specific growth of the semiconductor crystal layer, it is possible to more satisfactorily reduce the leak current. In particular, when at least the concave-convex structure (S) satisfies the concave-convex structure (I) 12, the effect described above is further achieved.

A ratio between the average interval PL of the concave-convex structure (L) and the average interval PS of the concave-convex structure (S) in the optical substrate (IV) 710 described above with reference to FIGS. 32A, 32B and 32C is more than 1 but equal to or less than 2000. When the ratio is more than 1 but equal to or less than 2000, it is possible to enhance the internal quantum efficiency IQE and enhance the light extraction efficiency LEE. In particular, in terms of increasing the difference between the average interval PL and the average interval PS to reduce the problem on the light extraction efficiency LEE caused by the concave-convex structure (S) and the problem on the internal quantum efficiency IQE caused by the concave-convex structure (L), the ratio (PL/PS) is preferably equal to or more than 1.1, is more preferably equal to or more than 1.5 and is further preferably equal to or more than 2.5. Furthermore, in terms of enhancing the accuracy of processing of the concave-convex structure (S) to more enhance the internal quantum efficiency IQE, the ratio (PL/PS) is preferably equal to or more than 5.5, is more preferably equal to or more than 7.0 and is most preferably equal to or more than 10. On the other hand, in terms of enhancing optical scattering (light diffraction or light scattering) by the concave-convex structure (S) to achieve the improvement of the internal quantum efficiency IQE by the concave-convex structure (S) and the improvement of the light extraction efficiency LEE by the concave-convex structure (L) and the concave-convex structure (S), the ratio (PL/PS) is preferably equal to or less than 700, is more preferably equal to or less than 300 and is further preferably equal to or more than 100. Furthermore, in terms of increasing volume variations of the concave-convex structure (L), enhancing the density of the concave-convex structure (S) and enhancing the accuracy of processing of the concave-convex structure (L) and the concave-convex structure (S), the ratio (PL/PS) is preferably equal to or less than 50, is more preferably equal to or less than 40 and is most preferably equal to or more than 30. When the range of the ratio (PL/PS) between the average interval PS of the concave-convex structure (S) and the average interval PL of the concave-convex structure (L) is satisfied, it is thought that on the growth of the semiconductor crystal layer, the balance of a growth rate in the vicinity of the apex of the convex portion 703 in the semiconductor crystal layer is made satisfactory. In other words, since a stress on the semiconductor crystal layer is reduced, it is possible to reduce cracks in the semiconductor crystal layer.

Figure 34:
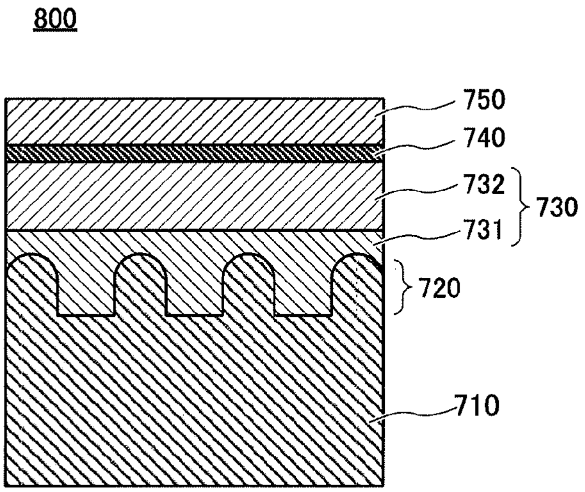
FIG. 34 A cross-sectional schematic view showing another example of the semiconductor light-emitting element according to the fourth embodiment.

The semiconductor light-emitting element according to the fourth embodiment will then be described with reference to the figures. FIG. 34 is a cross-sectional schematic view showing the semiconductor light-emitting element according to the fourth embodiment. Although in the concave-convex structure surface 720 provided on the surface of the optical substrate (IV) 710, only the outer shape of the concave-convex structure (L) is shown for convenience, as shown in FIGS. 32A to 32C, the concave-convex structure surface 720 is formed with the concave-convex structure (L) and the concave-convex structure (S). A semiconductor light-emitting element that is obtained by replacing the concave-convex structure surface 720 with the concave-convex structure (I) 12 according to the first embodiment, the concave-convex structure (II) 22 according to the second embodiment or the concave-convex structure (III) according to the third embodiment already described is also the semiconductor light-emitting element according to the fourth embodiment.

Figure 33:
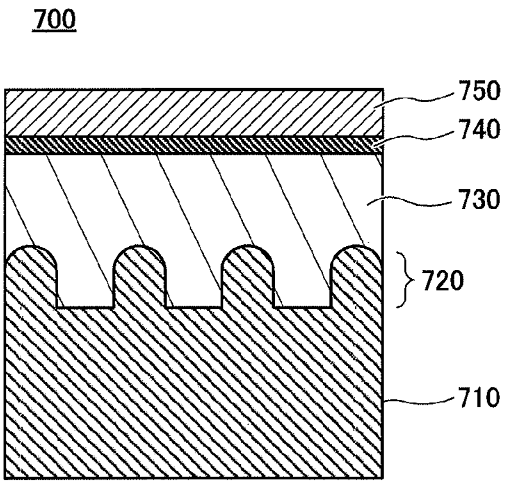
FIG. 33 A cross-sectional schematic view showing a semiconductor light-emitting element according to the fourth embodiment.

As shown in FIG. 33, in the semiconductor light-emitting element 700, the concave-convex structure surface 720 is provided on the surface of the optical substrate (IV) 710. On the surface including the concave-convex structure surface 720 of the optical substrate (IV) 710, a first semiconductor layer 730, a light-emitting semiconductor layer 740 and a second semiconductor layer 750 are sequentially deposited. Here, light generated in the light-emitting semiconductor layer 740 is extracted from the second semiconductor layer 750 or the optical substrate (IV) 710. Furthermore, the first semiconductor layer 730 and the second semiconductor layer 750 are semiconductor layers that are different from each other. Here, the first semiconductor layer 730 preferably flatten the concave-convex structure surface 720. Since the first semiconductor layer 730 is provided so as to flatten the concave-convex structure surface 720, and thus it is possible to reflect the performance of the first semiconductor layer 730 as a semiconductor on the light-emitting semiconductor layer 740 and the second semiconductor layer 750, the internal quantum efficiency IQE is enhanced.

As shown in FIG. 34, the first semiconductor layer 730 may be formed with an undoped first semiconductor layer 731 and a doped first semiconductor layer 732. FIG. 34 is a cross-sectional view showing another example of the semiconductor light-emitting element according to the fourth present embodiment. In this case, as shown in FIG. 34, in a semiconductor light-emitting element 800, the optical substrate (IV) 710, the undoped first semiconductor layer 731 and the doped first semiconductor layer 732 are sequentially deposited, and thus it is possible not only to achieve the improvement of the internal quantum efficiency IQE and effect of reducing warpage but also to reduce a time for manufacturing the semiconductor light-emitting element 800. Here, since the undoped first semiconductor layer 731 is provided so as to flatten the concave-convex structure surface 720, and thus it is possible to reflect the performance of the undoped first semiconductor layer 731 as a semiconductor on the doped first semiconductor layer 732, the light-emitting semiconductor layer 740 and the second semiconductor layer 750, the internal quantum efficiency IQE is enhanced.

Figure 35:
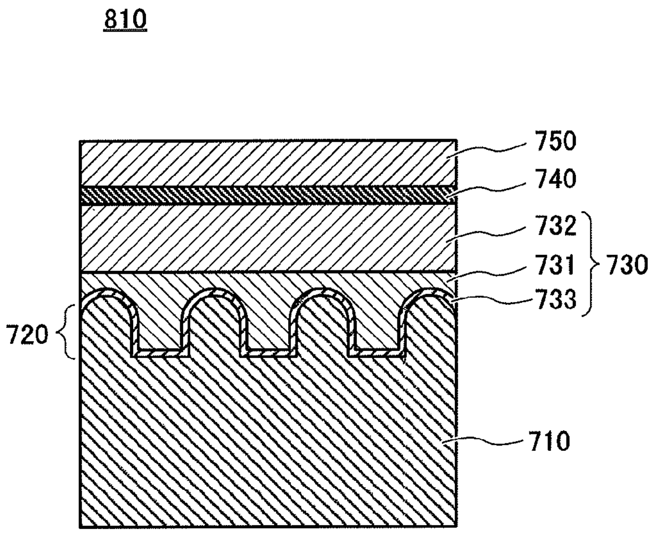
FIG. 35 A cross-sectional schematic view showing another example of the semiconductor light-emitting element according to the fourth embodiment.

Furthermore, as shown in FIG. 35, the undoped first semiconductor layer 731 preferably includes a buffer layer 733. FIG. 35 is a cross-sectional schematic view showing another example of the semiconductor light-emitting element according to the fourth embodiment. As shown in FIG. 35, in a semiconductor light-emitting element 810, the buffer layer 733 is provided on the concave-convex structure surface 720, and then the undoped first semiconductor layer 731 and the doped first semiconductor layer 732 are sequentially deposited, and thus nucleation and core growth that are the initial conditions of crystal growth of the first semiconductor layer 730 are made satisfactory, and the performance of the first semiconductor layer 730 as a semiconductor is enhanced, with the result that the degree of the improvement of the internal quantum efficiency IQE is enhanced. Here, although the buffer layer 733 may be arranged so as to flatten the concave-convex structure surface 720, since the growth rate of the buffer layer 733 is low, in terms of reducing a time for manufacturing the semiconductor light-emitting element 810, the concave-convex structure surface 720 is preferably flattened by the undoped first semiconductor layer 731 provided on the buffer layer 733. The undoped first semiconductor layer 731 is provided so as to flatten the concave-convex structure surface 720, and thus it is possible to reflect the performance of the undoped first semiconductor layer 731 as a semiconductor on the doped first semiconductor layer 732, the light-emitting semiconductor layer 740 and the second semiconductor layer 750, with the result that the internal quantum efficiency IQE is enhanced. Although in FIG. 35, the buffer layer 733 is arranged so as to cover the surface of the concave-convex structure surface 720, the buffer layer 733 can be partially provided on the surface of the concave-convex structure surface 720. In particular, the buffer layer 733 can be preferentially provided on the bottom portion of the convex portion in the concave-convex structure surface 720.

Although the semiconductor light-emitting elements 700, 800 and 810 shown in FIGS. 33 to 35 are examples where the semiconductor light-emitting element of a double heterostructure is applied, the multilayer structure of the first semiconductor layer 730, the light-emitting semiconductor layer 740 and the second semiconductor layer 750 is not limited to these examples.

Figure 36:
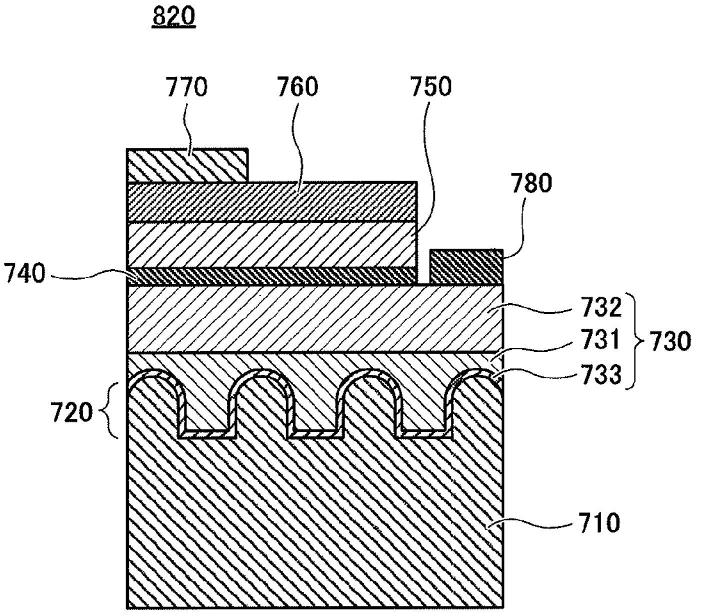
FIG. 36 A cross-sectional schematic view showing another example of the semiconductor light-emitting element according to the fourth embodiment.

FIG. 36 is a cross-sectional schematic diagram showing another example of the semiconductor light-emitting element according to the fourth embodiment. As shown in FIG. 36, in a semiconductor light-emitting element 820, a transparent conductive film 760 can be provided on the second semiconductor layer 750, an anode electrode 770 can be provided on the surface of the transparent conductive film 760 and a cathode electrode 780 can be provided on the surface of the first semiconductor layer 730. Although the arrangement of the transparent conductive film 760, the anode electrode 770 and the cathode electrode 780 is limited because it can be optimized by the semiconductor light-emitting element as necessary, in general, they are provided as illustrated in FIG. 36.

Figure 37:
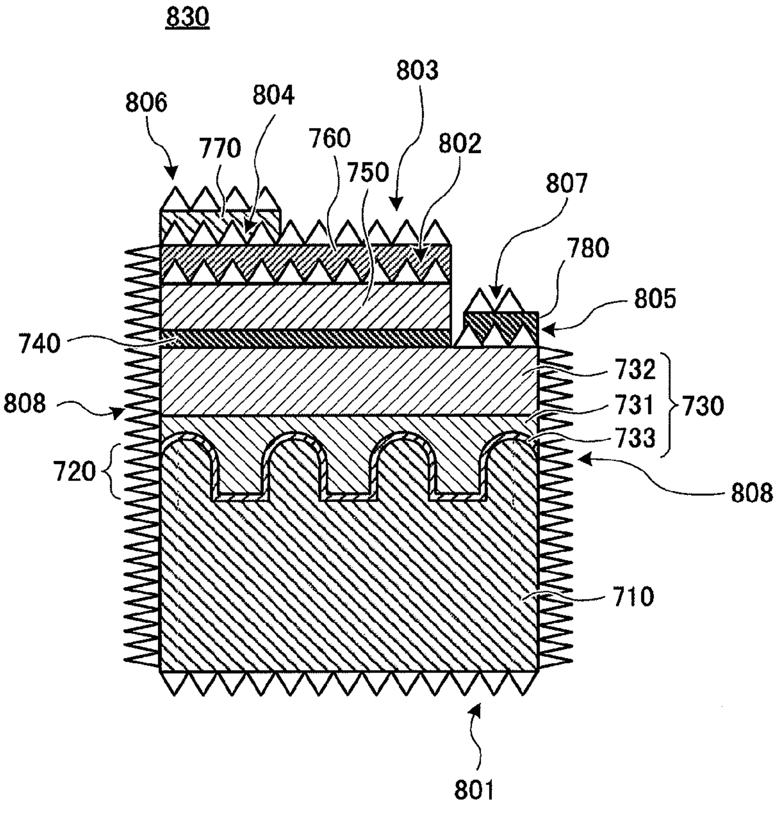
FIG. 37 A cross-sectional schematic view showing another example of the semiconductor light-emitting element according to the fourth embodiment.

Furthermore, although in the semiconductor light-emitting element 820 shown in FIG. 36, the concave-convex structure surface 720 is provided between the optical substrate (IV) 710 and the first semiconductor layer 730, as shown in FIG. 37, another concave-convex structure surface can be further provided. FIG. 37 is a cross-sectional schematic diagram showing another example of the semiconductor light-emitting element according to the fourth embodiment. As shown in FIG. 37, in a semiconductor light-emitting element 830, as a concave-convex structure that is separately provided, the following concave-convex structure is present:

A concave-convex structure 801 that is provided on the surface of the optical substrate (IV) 710 on the opposite side to the light-emitting semiconductor layer 740

A concave-convex structure 802 that is provided between the second semiconductor layer 750 and the transparent conductive film 760

A concave-convex structure 803 that is provided on the surface of the transparent conductive film 760

A concave-convex structure 804 that is provided between the transparent conductive film 760 and the anode electrode 770

A concave-convex structure 805 that is provided between the first semiconductor layer 730 and the cathode electrode 780

A concave-convex structure 806 that is provided on the surface of the anode electrode 770

A concave-convex structure 807 that is provided on the surface of the cathode electrode 780

A concave-convex structure 808 that is provided on the side surfaces of the first semiconductor layer 730, the light-emitting semiconductor layer 740, the second semiconductor layer 750 and the optical substrate (IV) 710

In addition to the concave-convex structure surface 720, at least one of the concave-convex structures 801 to 808 is further provided, and thus it is possible to realize the effects corresponding to the concave-convex structures 801 to 808 that will be described below.

Since the concave-convex structure 801 is provided to enhance the light extraction efficiency LEE, the internal quantum efficiency IQE is enhanced, and thus it is possible to effectively extract the emitted light from the semiconductor light-emitting element 830. In other words, it is possible to more effectively extract, from the semiconductor light-emitting element 830, the light effectively emitted by enhancing the internal quantum efficiency IQE with the concave-convex structure surface 720. Furthermore, it is also possible to reduce the warpage of the semiconductor light-emitting element 830. Hence, in the semiconductor light-emitting element 830 using the optical substrate (IV) 710 according to the fourth embodiment, the concave-convex structure 801 is preferably provided.

Since the concave-convex structure 802 is provided, and thus it is possible to enhance the light extraction efficiency LEE, the external quantum efficiency EQE is significantly improved. Furthermore, since the diffusion of electrons in the transparent conductive film 760 is enhanced, it is possible to increase the size of a semiconductor light-emitting element chip.

The concave-convex structure 803 is provided, and thus it is possible to enhance the light extraction efficiency LEE. Hence, preferably, in the semiconductor light-emitting element using the optical substrate (IV) 710 according to the fourth embodiment, the concave-convex structure 803 is further provided. Since the concave-convex structure 803 is formed with the concave-convex structure (I) 12 according to the first embodiment or the concave-convex structure (II) 22 according to the second embodiment already described above, even if the transparent conductive film 760 is thin, it is possible to satisfactorily realize optical scattering, with the result that it is possible to enhance the light extraction efficiency LEE.

Since the concave-convex structure 804 is provided, and thus it is possible to increase the contact area between the transparent conductive film 760 and the anode electrode 770, it is possible to reduce the separation of the anode electrode 770. Furthermore, since the ohmic resistance is reduced, and thus it is possible to enhance the ohmic contact, it is possible to improve the electron injection efficiency EIE, with the result that it is possible to enhance the external quantum efficiency EQE. Hence, preferably, in the semiconductor light-emitting elements 700, 800, 810, 820 and 830 using the optical substrate (IV) 710 according to the fourth embodiment, the concave-convex structure 804 is further provided. As has already been described, the concave-convex structure 804 may be the concave-convex structure (I) 12 or the concave-convex structure (II) 22. Even in this case, the electron injection efficiency EIE is enhanced, and optical scattering is realized, and thus it is possible to enhance the light extraction efficiency LEE.

Since the concave-convex structure 805 is provided to increase the contact area between the first semiconductor layer 730 and the cathode electrode 780, it is possible to reduce the separation of the cathode electrode 780.

Since the concave-convex structure 806 is provided to enhance the fixing strength of wiring connected to the anode electrode 770, it is possible to reduce the separation.

Since the concave-convex structure 807 is provided to enhance the fixing strength of wiring provided on the surface of the cathode electrode 780, it is possible to reduce the separation.

Since the concave-convex structure 808 is provided, and thus it is possible to increase the amount of light emitted from the side surfaces of the first semiconductor layer 730, the light-emitting semiconductor layer 740, the second semiconductor layer 750 and the optical substrate (IV) 710, it is possible to reduce the ratio of the emitted light that is attenuated and removed in the waveguide mode. Hence, the light extraction efficiency LEE is enhanced, and thus it is possible to increase the external quantum efficiency EQE.

As described above, the optical substrate (IV) 710 according to the fourth embodiment is used, and thus it is possible to enhance the internal quantum efficiency IQE and the light extraction efficiency LEE of the semiconductor light-emitting elements 700, 800, 810, 820 and 830. Furthermore, at least one of the concave-convex structures 801 to 808 described above is further provided, and thus it is possible to realize the effects produced by the concave-convex structures 801 to 808. In particular, in terms of further enhancing the light extraction efficiency LEE, at least one of the concave-convex structure 801 and the concave-convex structure 803 is preferably provided. In terms of further enhancing the electron injection efficiency EIE, the concave-convex structure 804 is preferably provided. At least any one of the concave-convex structures described above is preferably the concave-convex structure (I) 12 according to the first embodiment, the concave-convex structure (II) 22 according to the second embodiment or the concave-convex structure (III) according to the third embodiment described above.

The optical substrate (IV) 710 may be removed from a layered product where an electrode is formed on the exposed surface of the second semiconductor layer 750 in the semiconductor light-emitting elements 700, 800 and 810 illustrated in FIGS. 33 to 36 described above and where a support base material is arranged on the exposed surface of the electrode. The removal of the optical substrate (IV) 710 can be achieved by lift-off utilizing laser light or the total dissolution or partial dissolution of the optical substrate (IV) 710. Here, the optical substrate (IV) 710 is adopted, and thus it is possible to form a hollow space within the concave portion 704. In this case, the accuracy of the laser lift-off is enhanced. In particular, when a Si substrate is adopted as the optical substrate (IV) 710, the removal by dissolution is preferable in terms of the accuracy of the concave-convex structure surface 720. The optical substrate (IV) 710 is removed in this way, and thus it is possible to further enhance the light extraction efficiency LEE in a state where the improvement of the internal quantum efficiency IQE is maintained. This is because there is a large difference in refractive index between the optical substrate (IV) 710, the first semiconductor layer 730, the light-emitting semiconductor layer 740 and the second semiconductor layer 750. The optical substrate (IV) 710 is removed, and thus it is possible to draw up the light-emitting semiconductor layer in which the first semiconductor layer 730 is the light emission surface. In this case, the light is emitted through the concave-convex structure surface 720 of the present invention. In particular, since the gradient of the refractive index between the first semiconductor layer 730 and the ambient environment (for example, a sealant) is made gentle by the concave-convex structure (S) having a high density, and it is possible to realize optical scattering caused by the concave-convex structure (L) having wide variations in volume, it is possible to more enhance the light extraction efficiency LEE.

Words and phrases used in the description of the elements of the semiconductor light-emitting elements 700, 800, 810, 820 and 830 will then be described.

The configuration of the optical substrate (IV) according to the fourth embodiment will then be described. As with the optical substrate (I) 1 of the first embodiment, the optical substrate (II) 2 of the second embodiment and the optical substrate (III) according to the third embodiment, in the optical substrate (IV) according to the fourth embodiment, as shown in FIGS. 4A and 4B, the concave-convex structure surface 720 (symbol 401 in FIG. 4A) is preferably provided on at least one side of the optical substrate (IV) 710 (symbol 400 in FIG. 4A), and the concave-convex structure surface 720 is preferably formed with, as shown in FIGS. 32A to 32C, the concave-convex structure (L) and the concave-convex structure (S).

As shown in FIG. 4B, the concave-convex structure surface 720 (symbol 401 in FIG. 4B) may be provided on both sides of the optical substrate (IV) 710 (symbol 400 in FIG. 4B). In this case, as shown in FIGS. 32A to 32C, at least one of the concave-convex structure surfaces 720 is preferably formed with the concave-convex structure (L) and the concave-convex structure (S).

The optical substrate (IV) 710 according to the fourth embodiment is used in the semiconductor light-emitting elements 700, 800, 810, 820 and 830, and thus the internal quantum efficiency IQE and the light extraction efficiency LEE are simultaneously enhanced. The reason for this is as follows.

The internal quantum efficiency IQE is reduced by dislocations produced by a mismatch (lattice mismatch) between the lattice constant of the optical substrate and the lattice constant of the semiconductor crystal layer. Here, when on the surface of the optical substrate, a concave-convex structure having about the same density as a dislocation density or higher is provided, it is possible to disturb the crystal growth mode of a semiconductor light-emitting layer, and it is possible to disperse the dislocations within the semiconductor crystal layer according to the concave-convex structure. In other words, it is possible to reduce the dislocation density both microscopically and macroscopically. Hence, it is possible to enhance the internal quantum efficiency IQE.

However, in order to enhance the internal quantum efficiency IQE, it is necessary to provide a minute concave-convex structure having a high density. As the density of the concave-convex structure is enhanced in order to enhance the internal quantum efficiency IQE, the volume of the concave-convex structure as seen from the wavelength of the emitted light is decreased, with the result that the optical scattering effect is reduced. In other words, since the effect of disturbing the waveguide mode is reduced, the degree of the enhancement of the light extraction efficiency LEE is decreased.

Although, likewise, in order to enhance the light extraction efficiency LEE, it is necessary to disturb the waveguide mode with optical scattering, in order to enhance optical scattering, it is necessary to increase volume variations of the concave-convex structure, and the density of the concave-convex structure is lowered, with the result that the degree of the enhancement of the internal quantum efficiency IQE is decreased.

Here, the present inventors et al. have found that within one concave-convex structure surface, the concave-convex structure for improving the internal quantum efficiency IQE and the concave-convex structure for improving the light extraction efficiency LEE are combined so as to have a predetermined arrangement relationship, and that thus it is possible to simultaneously realize their functions. Specifically, the concave-convex structure (concave-convex structure (S)) having a high density and the concave-convex structure (concave-convex structure (L)) having wide variations in volume are provided so as to have a predetermined position relationship, and thus it is possible to improve the internal quantum efficiency IQE with the concave-convex structure (concave-convex structure (S)) having a high density and simultaneously enhance the light extraction efficiency LEE with the concave-convex structure (concave-convex structure (L)) having wide variations in volume. Furthermore, the minimal convex portion or the minimal concave portion is included, and thus it is possible to realize optical scattering (light diffraction or light scattering). In other words, the concave-convex structure (S) is formed with the concave-convex structure (I) 12 or the concave-convex structure (II) 22 described above, and thus it is possible to maintain the effect of enhancing the internal quantum efficiency IQE and to more enhance the light extraction efficiency LEE.

On the other hand, the concave-convex structure (L) satisfies the concave-convex structure (I) 12 or the concave-convex structure (II) 22, and thus, depending on the average interval of the concave-convex structure (L), it is possible to increase, for example, the number of modes of light diffraction. In this case, it is thought that since the effect of changing the direction of travel of light in the waveguide mode guided within the semiconductor crystal layer is increased, light scattering is increased, and thus the light extraction efficiency LEE is enhanced.

Hence, the concave-convex structure (S) is formed with the concave-convex structure (I) 12 or the concave-convex structure (II) 22, and thus the effect of enhancing the light extraction efficiency is added to the effect of improving the internal quantum efficiency whereas the concave-convex structure (L) is formed with the concave-convex structure (I) 12 or the concave-convex structure (II) 22, and thus the improvement of the light extraction efficiency LEE is made more remarkable. Here, as will be described below, the concave-convex structure (L) is a structure larger than the concave-convex structure (S). In other words, as the concave-convex structure (L), it is possible to enhance the light extraction efficiency LEE optically by any of light diffraction, light scattering and light ray traceability. In such as case, since the effect of improving the light extraction efficiency LEE with the concave-convex structure (L) is significant, the degree of the further enhancement of the light extraction efficiency when the concave-convex structure (L) is formed with the concave-convex structure (I) 12 or the concave-convex structure (II) 22 is apparently lowered. Hence, at least the concave-convex structure (S) is preferably formed with the concave-convex structure (I) 12 or the concave-convex structure (II) 22.

When the concave-convex structure (S) is formed with the concave-convex structure (I) 12, as compared with the case where the concave-convex structure (S) is formed with the concave-convex structure (II) 22, the effect of improving the internal quantum efficiency IQE is more increased. This is because since the concave-convex structure (S) is formed with the concave-convex structure (I) 12, and thus the semiconductor crystal layer can be grown from the bottom portion of the concave portion in the concave-convex structure (S), the dispersion of dislocations is more facilitated.

Furthermore, when the concave-convex structure (S) or the concave-convex structure (L) is formed with the concave-convex structure (I) 12 or the concave-convex structure (II) 22, with the mechanism already described, it is possible to reduce the leak current. This is because the conditions of the concave-convex structure (I) 12 or the concave-convex structure (II) 22 are satisfied to reduce the specific growth of the semiconductor crystal layer or it is possible to reduce the collision of the semiconductor crystal layers specifically grown. In other words, since it is possible to reduce the disturbance of the p-n junction interface, the diode characteristic is enhanced.

The concave-convex structure surface 720 of the optical substrate (IV) 710 according to the fourth embodiment will then be described.

The concave-convex structure surface 720 is formed with two concave-convex structures having different average intervals $P_{ave}$. Here, the two concave-convex structures are referred to as the concave-convex structure (L) and the concave-convex structure (S). The average interval of the concave-convex structure (L) is PL, and the average interval of the concave-convex structure (S) is PS. The average interval PS and the average interval PL are different from each other, and the ratio (PL/PS) satisfies a predetermined range. Furthermore, the arrangement relationship between the concave-convex structure (S) and the concave-convex structure (L) satisfies any one of the following cases.

1. The concave-convex structure (S) is arranged on at least one of the surfaces of a plurality of convex portions (in FIG. 32, symbol 703) and concave portions (in FIG. 32, symbol 704) in the concave-convex structure (L).
2. The concave-convex structures (L) are provided apart from each other such that part of the concave-convex structure (S) is exposed on the surface of the concave-convex structure (S) (FIG. 32C)

In the fourth embodiment, the average interval PL of the concave-convex structure (L) is significantly longer than the average interval PS of the concave-convex structure (S). Specifically, the ratio (PL/PS) between the average interval PL of the concave-convex structure (L) and the average interval PS of the concave-convex structure (S) is more than 1 but equal to or less than 2000. Since the ratio is more than 1 but equal to or less than 2000, and thus one of the concave-convex structures allows the effect of the other concave-convex structure to be realized without being inhibited, it is possible to simultaneously enhance the improvement of the internal quantum efficiency IQE with the concave-convex structure (S) and the improvement of the light extraction efficiency LEE with the concave-convex structure (L). Furthermore, in terms of increasing the difference between the average interval PL and the average interval PS to reduce the problem on the light extraction efficiency LEE caused by the concave-convex structure (S) and the problem on the internal quantum efficiency IQE caused by the concave-convex structure (L), the ratio (PL/PS) is preferably equal to or more than 1.1, is more preferably equal to or more than 1.5 and is further preferably equal to or more than 2.5. Furthermore, in terms of enhancing the accuracy of processing of the concave-convex structure (S) to more enhance the internal quantum efficiency IQE, the ratio (PL/PS) is preferably equal to or more than 5.5, is more preferably equal to or more than 7.0 and is most preferably equal to or more than 10. On the other hand, in terms of enhancing optical scattering (light diffraction or light scattering) by the concave-convex structure (S) to achieve the improvement of the internal quantum efficiency IQE by the concave-convex structure (S) and the improvement of the light extraction efficiency LEE by the concave-convex structure (L) and the concave-convex structure (S), the ratio (PL/PS) is preferably equal to or less than 700, is more preferably equal to or less than 300 and is further preferably equal to or more than 100. Furthermore, in terms of increasing volume variations of the concave-convex structure (L), enhancing the density of the concave-convex structure (S) and enhancing the accuracy of processing of the concave-convex structure (L) and the concave-convex structure (S), the ratio (PL/PS) is preferably equal to or less than 50, is more preferably equal to or less than 40 and is most preferably equal to or more than 30.

<Characteristic of the Concave-Convex Structure>

The characteristic of the concave-convex structure common in the concave-convex structure (L) and the concave-convex structure (S) of the concave-convex structure surface 720 in the optical substrate (IV) 710 according to the fourth embodiment will then be descried. In the following description, unless otherwise particularly specified, each of the concave-convex structure (L) and the concave-convex structure (S) is simply referred to as the "concave-convex structure."

The shape and the arrangement of the concave-convex structures of the concave-convex structure surface 720 are not limited as long as the concave-convex structure includes the concave portion and the concave portion, and as long as the arrangement relationship and the ratio (PL/PS) in the concave-convex structure (S) and the concave-convex structure (L) satisfy the predetermined ranges as described above, the light extraction efficiency LEE and the internal quantum efficiency IQE can be increased while the enhancement thereof is maintained. Hence, for example, it is possible to adopt a line and space structure where a plurality of fence-shaped members are arranged, a lattice structure where a plurality of fence-shaped members cross each other, a dot structure where a plurality of dot-shaped (convex portion, protrusion) structures are arranged, a hole structure where a plurality of hole-shaped (concave portion) structures are arranged and the like. Examples of the dot structure and the hole structure include a cone, a cylinder, a square pyramid, a rectangular prism, a hexagonal pyramid, a hexagonal column, an n-sided pyramid (n≥3), an n-sided column (n≥3), a double ring-shape and a multi-ring-shape. The examples also include a shape where the diameter of its bottom surface is distorted, a shape where the corner portion of the bottom surface of an n-gon has a radius of curvature exceeding 0 and is rounded, a shape where its side surface is curved and a shape where its apex has a radius of curvature exceeding 0 and is rounded. Furthermore, at least one of the concave-convex structure (S) and the concave-convex structure (L) is formed with the concave-convex structure (I) 12 or the concave-convex structure (II) 22 described above, and thus the light extraction efficiency LEE is more enhanced.

The dot structure is a structure where a plurality of convex portions are arranged independently of each other. In other words, the individual convex portions are separated by the continuous concave portion. The individual convex portions may be smoothly connected by the continuous concave portion. On the other hand, the hole structure is a structure where a plurality of concave portions are arranged independently of each other. In other words, the individual concave portions are separated by the continuous convex portion.

The individual concave portions may be smoothly connected by the continuous convex portion.

Which of the dot structure and the hole structure is selected can be selected as necessary according to a device used in the manufacturing of the semiconductor light-emitting element and the application of the semiconductor light-emitting element. In particular, when the internal quantum efficiency IQE is desired to be improved, the concave-convex structure is preferably the dot-shaped structure. This is because in order to enhance the internal quantum efficiency IQE with the concave-convex structure (S) having the average interval PS, it is necessary to facilitate the dispersion of dislocations by the density of the concave-convex structure (S). Furthermore, this is also because even the concave-convex structure (L) having a long average interval PL allows the growth of the semiconductor crystal layer in the horizontal direction (Epitaxial Lateral Overgrowth) to be induced, cracks in the apex of the convex portion to be reduced and the internal quantum efficiency IQE to be enhanced. On the other hand, when the light extraction efficiency LEE is particularly desired to be increased, the concave-convex structure is preferably the hole structure. This is because in the hole structure, variations in refractive index as seen from the semiconductor crystal layer are appropriate with respect to optical scattering. As the combination (the concave-convex structure (L), the concave-convex structure (S)) of the concave-convex structure (S) and the concave-convex structure (L), any one of (the dot structure, the dot structure), (the hole structure, the hole structure), (the dot structure, the hole structure) and (the hole structure, the dot structure) may be adopted.

In particular, in order to enhance the internal quantum efficiency IQE, the concave-convex structure (S) is preferably a structure, among dot-shaped structures, that does not have a flat surface in the apex of the convex portion. Here, examples of the structure that does not have a flat surface in the apex of the convex portion include a case where the apex of the convex portion is a corner portion whose radius of curvature is 0 and a case where the apex of the convex portion is a corner portion whose radius of curvature exceeds 0. In particular, the case where the apex of the convex portion has a corner portion whose radius of curvature exceeds 0 is preferable because when the apex of the convex portion has a corner portion whose radius of curvature exceeds 0, in the vicinity of the convex portion 705 in the concave-convex structure (S), the effect of making dislocations in the semiconductor crystal layer collide with each other is enhanced. Furthermore, in order for the internal quantum efficiency IQE to be more enhanced, the bottom portion of the concave portion in the concave-convex structure (S) preferably has a flat surface. The size of the flat surface is preferably equal to or more than 30 nm. Here, the size of the flat surface is defined as the shortest distance between the outer edge portions of the bottom portions of the convex portions closest to each other. Since the size of the flat surface is equal to or more than 30 nm, and thus it is possible to satisfactorily maintain the initial growth of the semiconductor crystal layer, the effect of improving the internal quantum efficiency IQE is increased. In the same terms, the size of the flat surface is more preferably equal to or more than 60 nm, and is most preferably equal to or more than 80 nm.

Preferably, in order for the production of cracks in the first semiconductor layer provided in the concave-convex structure to be reduced, the diameter of the convex portion in the concave-convex structure provided in the concave-convex structure surface 720 is decreased as the convex portion extends from the bottom portion to the apex. More preferably, the inclination angle changes in two or more stages from the bottom portion of the convex portion to the apex of the convex portion. Most preferably, the inclination angle of the side surface portion of the convex portion changes more gently as the convex portion extends from the bottom portion of the convex portion to the apex of the convex portion.

When the flat surface (hereinafter referred to as a "flat surface B") of the bottom portion of the concave portion in the concave-convex structure is parallel to a surface (hereinafter referred to as a "parallel stable growth surface") approximately parallel to the stable growth surface of the first semiconductor layer provided on the concave-convex structure, since the disturbance of the growth mode of the first semiconductor layer in the vicinity of the concave portion in the concave-convex structure is increased, and thus it is possible to effectively reduce dislocations within the first semiconductor layer with the concave-convex structure (S), with the result that the internal quantum efficiency IQE is enhanced. The stable growth surface refers to a surface whose growth rate is the lowest in the material to be grown. In general, it is known that the stable growth surface appears as a facet surface in the middle of growth. For example, in a gallium nitride compound semiconductor, a flat surface parallel to an A axis, such as an M plane, is the stable growth surface. The stable growth surface of GaN semiconductor layer is the M plane (1-100), (01-10) and (-1010) of a hexagonal crystal, and is one of the flat surfaces parallel to the A axis. Depending on the growth conditions, another flat surface including the A axis that is a flat surface other than the M plane of the GaN semiconductor layer may be the stable growth surface.

<Average Interval $P_{ave}$>

Figure 38:
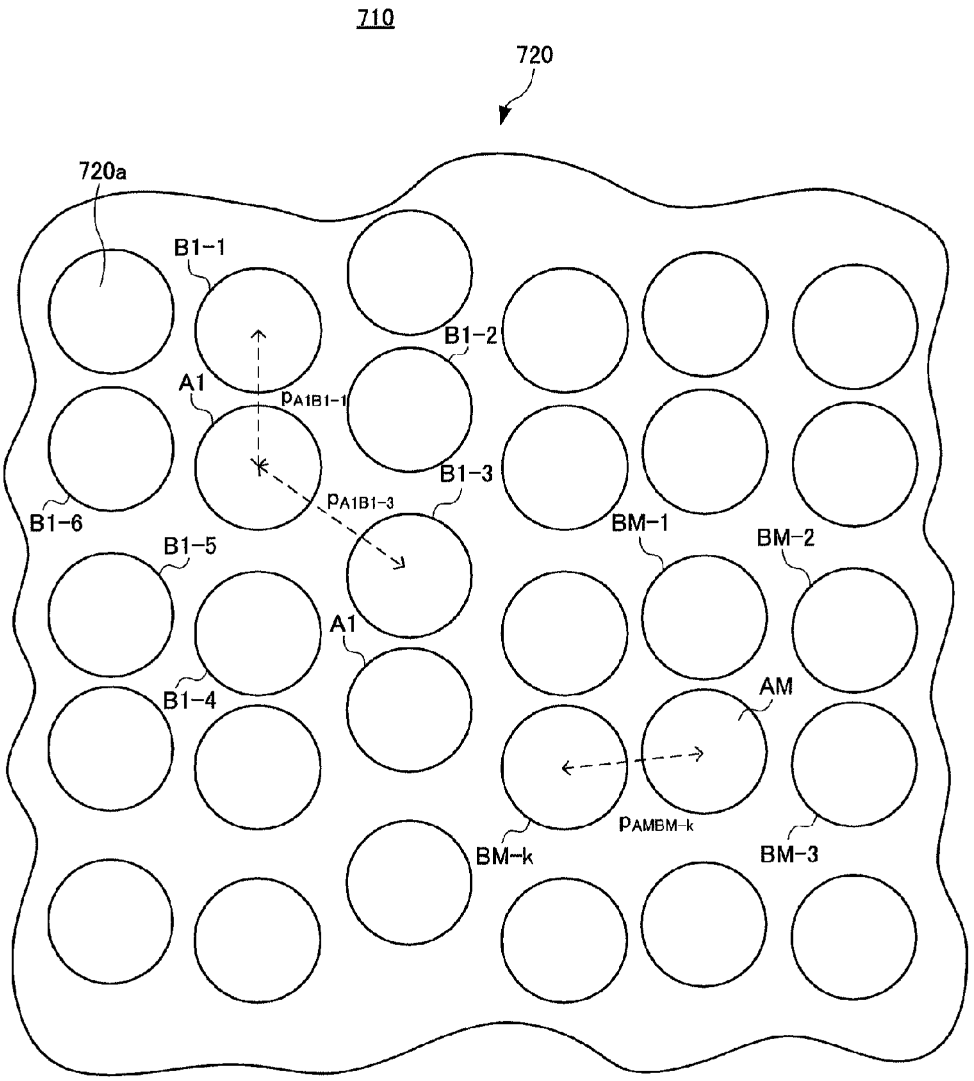
FIG. 38 A top view of an example of the optical substrate (IV) according to the fourth embodiment as seen from the side of a concave-convex structure surface.
Figure 39:
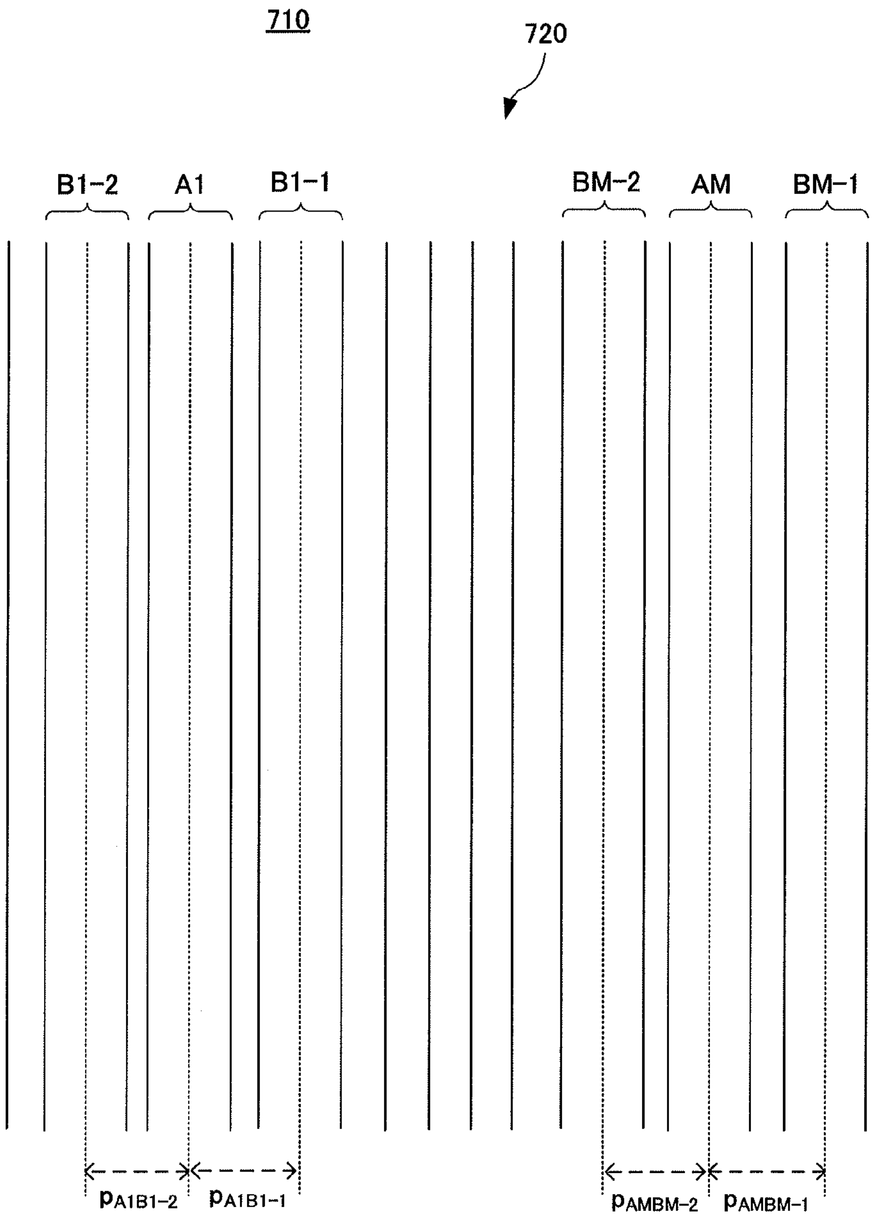
FIG. 39 A top view of the example of the optical substrate (IV) according to the fourth embodiment as seen from the side of the concave-convex structure surface.

FIGS. 38 and 39 are top views of an example of the optical substrate (IV) 710 according to the fourth embodiment as seen from the side of the concave-convex structure surface. When as shown in FIG. 38, the concave-convex structure of the concave-convex structure surface 720 is formed with the dot structure where a plurality of convex portions 720*a* are arranged, distances $P_{A1B1-1}$ to $P_{A1B1-6}$ between the center of a certain convex portion A1 and the centers of convex portions B1-1 to B1-6 adjacent to the convex portion A1 are defined as intervals P. The arithmetic mean of the intervals P is the average interval $P_{ave}$. First, on the concave-convex structure surface 720 of the optical substrate (IV) 710, a 50 μm×50 μm square region parallel to the main surface of the optical substrate (IV) 710 is taken. Then, the 50 μm×50 μm square region is divided into twenty five 10 μm×10 μm square regions without being overlapped. Then, 5 regions are arbitrarily selected from the twenty five 10 μm×10 μm regions. Here, the selected 10 μm×10 μm square regions are referred to as a region A, a region B, a region C, a region D and a region E. Thereafter, the region A is observed at high magnification, and is magnified until at least 100 concave portions are clearly observed. Then, 3 concave portions are arbitrarily selected from the observed concave portions (A1, A2 and A3). (2) Intervals $P_{AMBM-1}$ to $P_{AMBM-k}$ between a convex portion AM and convex portions (BM-1 to BM-k) adjacent to the convex portion AM (1≤M≤10) are measured. (3) For convex portions A1 to A3, as in (2), the intervals P are measured. (4) The arithmetic mean of the intervals $P_{A1B1-1}$ to $P_{A3B3-k}$ is assumed to be an average interval PA in the region A. The same operation is performed on the regions B to E, and thus the average intervals PA to PE are determined. The average interval $P_{ave}$ is (PA+PB+PC+PD+PE)/5. Here, k is assumed to be equal to or more than 4 but equal to or less than 6. In the hole structure, the average interval $P_{ave}$ can be defined by replacing the convex portion described in the dot structure with the opening portion of the concave portion.

As shown in FIG. 39, when the concave-convex structure of the concave-convex structure surface 720 is a line and space structure, the intervals P are defined as the shortest distances $P_{A1B1\text{-}1}$ and $P_{A1B1\text{-}2}$ between the center line of a certain convex line A1 and the center lines of a convex line B1-1 to a convex line B1-2 adjacent to the convex line A1. The arithmetic mean of the intervals P is the average interval $P_{ave}$. First, on the concave-convex structure surface of the optical substrate (IV) 710, a 50 μm×50 μm square region parallel to the main surface of the optical substrate (IV) 710 is taken. Then, the 50 μm×50 μm square region is divided into twenty five 10 μm×10 μm square regions without being overlapped. Then, 5 regions are arbitrarily selected from the twenty five 10 μm×10 μm regions. Here, the selected 10 μm×10 μm square regions are referred to as a region A, a region B, a region C, a region D and a region E. Thereafter, the region A is observed at high magnification, and is magnified until at least 10 convex lines are clearly observed. Then, 3 convex lines are arbitrarily selected from the observed convex lines (A1, A2 and A3). (2) Intervals $P_{AMBM\text{-}1}$ to $P_{AMBM\text{-}2}$ between a convex line AM and convex lines (BM-1 to BM-2) adjacent to the convex line AM (1≤M≤3) are measured. (3) For convex lines A1 to A3, as in (2), the intervals P are measured. (4) The arithmetic mean of the intervals $P_{A1B1\text{-}1}$ to $P_{A3B3\text{-}2}$ is assumed to be an average interval PA in the region A. The same operation is performed on the regions B to E, and thus the average intervals PA to PE are determined. The average interval $P_{ave}$ is (PA+PB+PC+PD+PE)/5.

The average interval PS of the concave-convex structure (S) is assumed to be calculated from the intervals P measured for the concave-convex structure (S), and the average interval PL of the concave-convex structure (L) is assumed to be calculated from the intervals P measured for the concave-convex structure (L).

<Height H>

The height of the concave-convex structure is defined as the shortest distance between the average position of the bottom portions of the concave portions in the concave-convex structure and the average position of the apexes of the convex portions in the concave-convex structure. 10 or more samples are preferably used when the average position is calculated. The height of the concave-convex structure (S) is measured using samples used for determining the average interval $P_{ave}$ of the concave-convex structure (S) for the concave-convex structure (S), and the height of the concave-convex structure (L) is measured using samples used for determining the average interval $P_{ave}$ of the concave-convex structure (L) for the concave-convex structure (L).

<Convex Portion Apex Width Icvt, Concave Portion Opening Width Icct, Convex Portion Bottom Portion Width Icvb and Concave Portion Bottom Portion Width Iccb>

Figure 40:
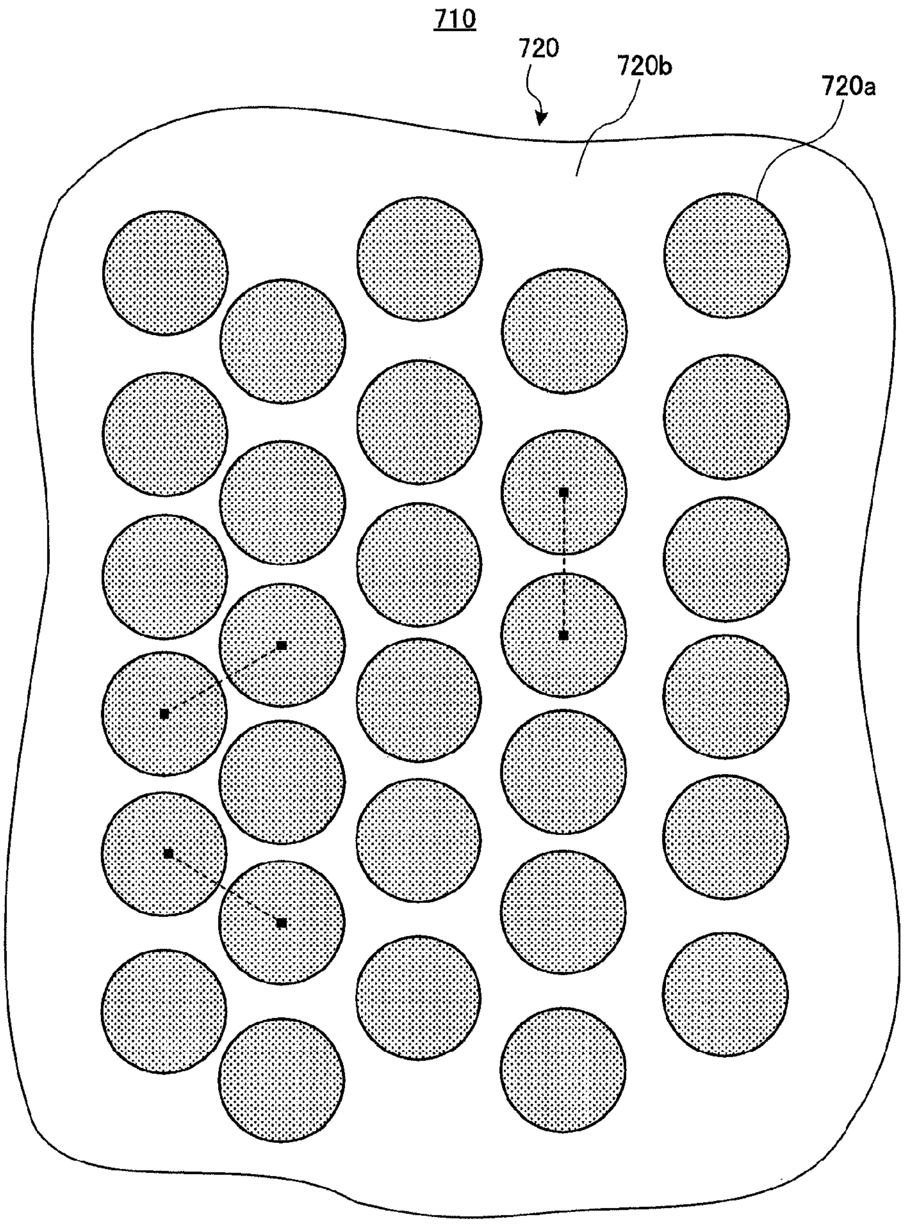
FIG. 40 A top view of an example of the optical substrate (IV) according to the fourth embodiment as seen from the side of the concave-convex structure surface.
Figure 41A:
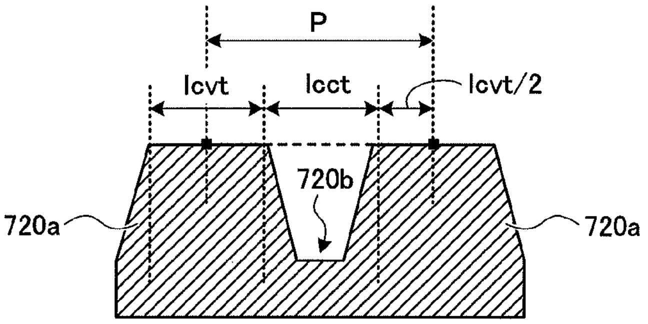
FIG. 41 A cross-sectional schematic view of a concave-convex structure taken along a line segment position corresponding to an interval P shown in FIG. 40.
Figure 41B:
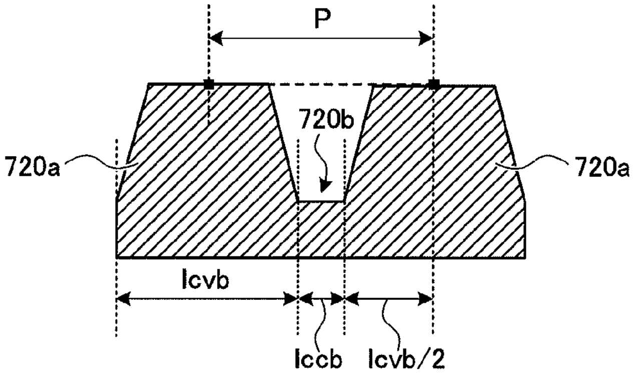

FIG. 40 shows a top view when the concave-convex structure of the concave-convex structure surface 720 is the dot structure. A line segment indicated by a broken line shown in FIG. 40 is a distance between the center of a certain convex portion 720*a* and the center of a convex portion 720*a* closest to the convex portion 720*a*, and means the interval P described above. FIGS. 41A and 41B are cross-sectional schematic views of the concave-convex structure taken along the line segment position corresponding to the intervals P shown in FIG. 40.

As shown in FIG. 41A, a convex portion apex width Icvt is defined as the width of a convex portion apex, and a concave portion opening width Icct is defined as a difference value (P−Icvt) between the interval P and the convex portion apex width Icvt.

As shown in FIG. 41B, a convex portion bottom portion width Icvb is defined as the width of a convex portion bottom portion, and a concave portion bottom portion width Iccb is defined as a difference value (P−Icvb) between the interval P and the convex bottom portion width Icvb.

Figure 42:
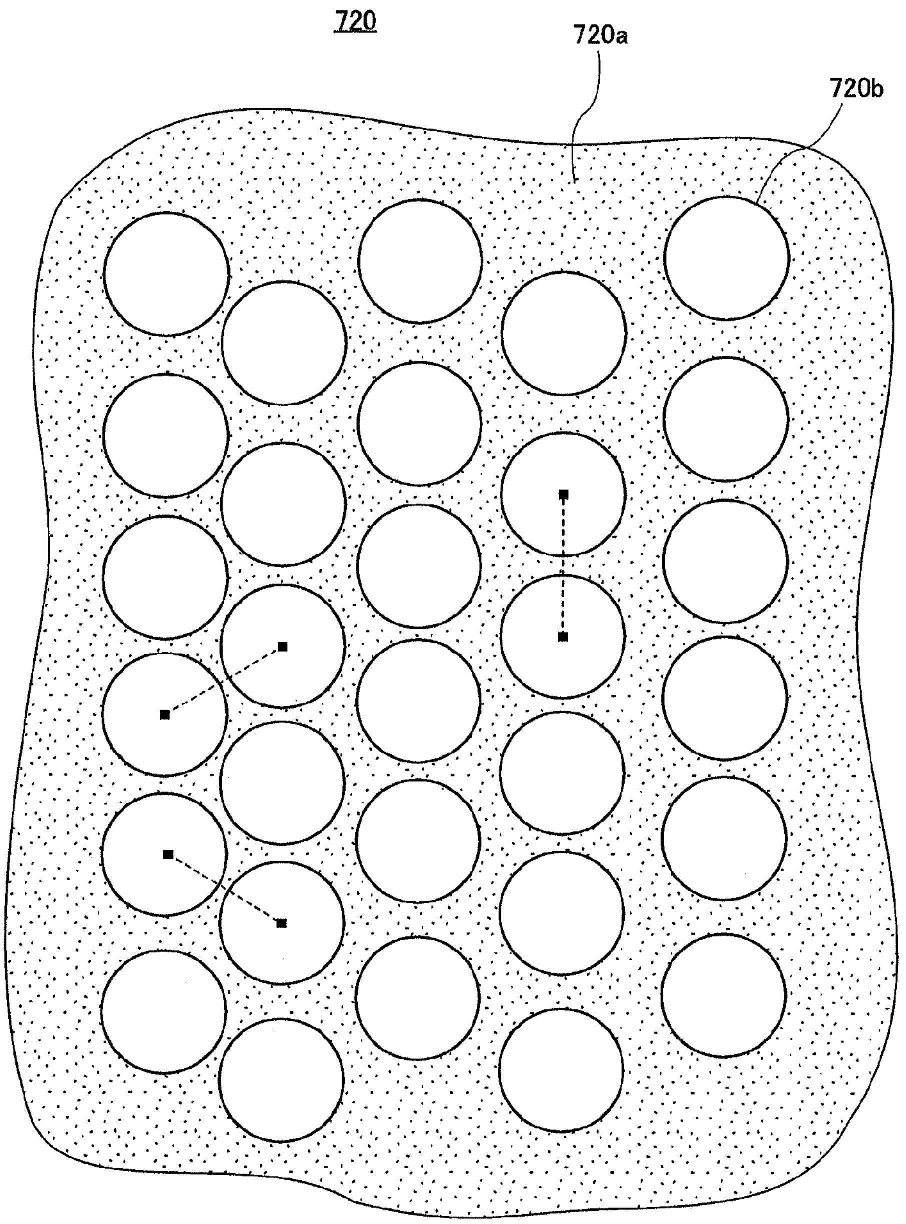
FIG. 42 A top view of an example of the optical substrate (IV) according to the fourth embodiment as seen from the side of the concave-convex structure surface.
Figure 43A:
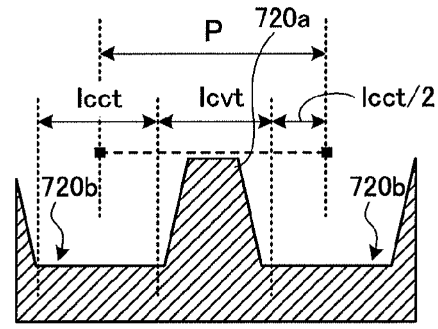
FIG. 43 A cross-sectional schematic view of a concave-convex structure taken along a line segment position corresponding to an interval P shown in FIG. 42.
Figure 43B:
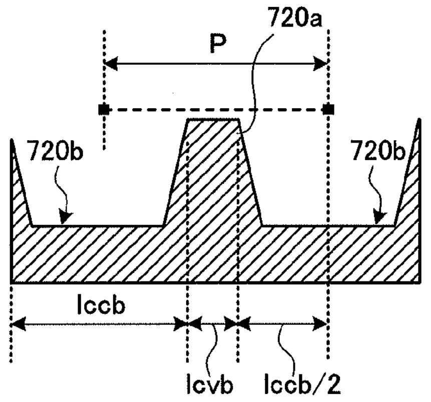
Figure 44A:
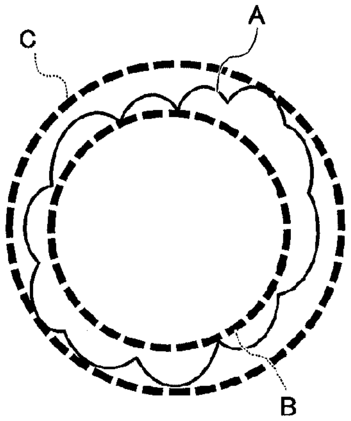
FIG. 44 A top view when the optical substrate (IV) according to the fourth embodiment is observed from the side of the concave-convex structure surface.
Figure 44D:
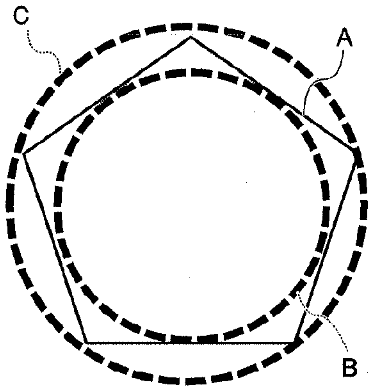
Figure 44B:
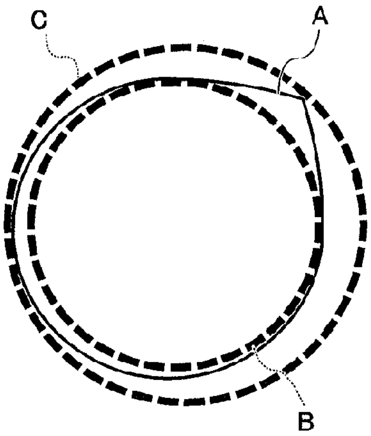
Figure 44E:
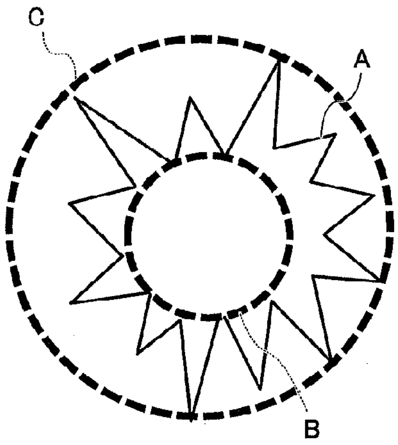
Figure 44C:
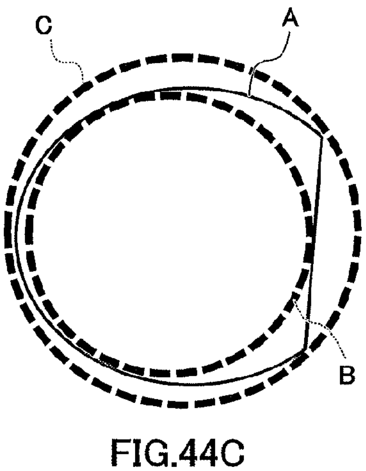

FIG. 42 shows a top view when the concave-convex structure surface 720 is the hole structure. A line segment indicated by a broken line shown in FIG. 42 is a distance between the center of a certain convex portion 720*b* and the center of a convex portion 720*b* closest to the convex portion 720*b*, and means the interval P described above. FIGS. 43A and 43B are cross-sectional schematic views of the concave-convex structure 720 taken along the line segment position corresponding to the intervals P shown in FIG. 42.

As shown in FIG. 43A, a concave portion opening width Icct is defined as the opening diameter of the concave portion 720*b*, and a convex portion apex width Icvt is defined as a difference value (P−Icct) between the interval P and the concave portion opening width Icct.

As shown in FIG. 43B, a convex portion bottom portion width Icvb is defined as the width of a convex portion bottom portion, and a concave portion bottom portion width Iccb is defined as a difference value (P−Icvb) between the interval P and the convex bottom portion width Icvb.

The convex portion apex width Icvt, the concave portion opening width Icct, the convex bottom portion width Icvb and the concave portion bottom portion width Iccb in the concave-convex structure (S) are measured using samples used for determining the average interval $P_{ave}$ of the concave-convex structure (S) for the concave-convex structure (S). The convex portion apex width Icvt, the concave portion opening width Icct, the convex bottom portion width Icvb and the concave portion bottom portion width Iccb in the concave-convex structure (L) are measured using samples used for determining the average interval $P_{ave}$ of the concave-convex structure (L) for the concave-convex structure (L).

<Duty>

A duty is expressed as a ratio (Icvb/P) between the convex bottom portion width Icvb and the interval P. It is assumed that the duty of the concave-convex structure (S) is measured using samples used for determining the average interval $P_{ave}$ of the concave-convex structure (S) for the concave-convex structure (S), and that the duty of the concave-convex structure (L) is measured using samples used for determining the average interval $P_{ave}$ of the concave-convex structure (L) for the concave-convex structure (L).

<Aspect Ratio>

When the concave-convex structure of the concave-convex structure surface 720 is the dot structure, an aspect ratio is defined as the height of the concave-convex structure H/Icvb, using Icvb described above. On the other hand, when the concave-convex structure is the hole structure, an aspect ratio is defined as the depth of the concave-convex structure/Icct, using Icct described above. It is assumed that the aspect ratio of the concave-convex structure (S) is measured for the concave-convex structure (S), and that the aspect ratio of the concave-convex structure (L) is measured for the concave-convex structure (L).

<Convex Portion Bottom Portion Circumscribed Circle Diameter ϕOut, Convex Portion Bottom Portion Inscribed Circle Diameter ϕin>

FIGS. 44A to 44E show top view images when the optical substrate (IV) 710 is observed from the side of the concave-convex structure. The convex portion in the concave-convex structure of the concave-convex structure surface 720 may be bent. The outline (hereinafter referred to as a convex portion bottom portion outline) when the concave-convex structure is observed from the side of the concave-convex structure surface is indicated by "A" in FIGS. 44A to 44E. Here, when the convex bottom portion outline A is not a perfect circle, an inscribed circle and a circumscribed circle on the convex bottom portion outline A do not coincide with each other. In FIGS. 44A to 44E, the inscribed circle is indicated by "B", and the circumscribed circle is indicated by "C".

The diameter of the inscribed circle B on the convex bottom portion outline A is defined as the convex bottom portion inscribed circle diameter ϕin. Here, ϕin is assumed to be the diameter of the inscribed circle B when the size of the inscribed circle B is the largest. The inscribed circle B is a circle that is arranged inside the convex bottom portion outline A, and makes contact with part of the convex bottom portion outline A and is prevented from extending out from the convex bottom portion outline A.

On the other hand, the diameter of the circumscribed circle C on the convex bottom portion outline A is defined as the convex bottom portion circumscribed circle diameter ϕout. Here, ϕout is assumed to be the diameter of the circumscribed circle C when the size of the circumscribed circle C is the largest. The circumscribed circle C is a circle that is arranged outside the convex bottom portion outline A, and makes contact with part of the convex bottom portion outline A and is prevented from entering the inside of the convex bottom portion outline A.

It is assumed that the convex bottom portion circumscribed circle diameter ϕout and the convex bottom portion inscribed circle diameter ϕin in the concave-convex structure (S) are measured using samples used for determining the average interval $P_{ave}$ of the concave-convex structure (S) for the concave-convex structure (S), and that the convex bottom portion circumscribed circle diameter ϕout and the convex bottom portion inscribed circle diameter ϕin of the concave-convex structure (L) are measured using samples used for determining the average interval $P_{ave}$ of the concave-convex structure (L) for the concave-convex structure (L).

When the concave-convex structure is formed with a plurality of concave portions, the term "convex portion bottom portion" described above can be replaced by the "concave portion opening portion."

<Convex Portion Side Surface Inclination Angle Θ>

The inclination angle Θ of the convex portion side surface is determined by the shape parameters of the concave-convex structure described above. The concave portion side surface inclination angle Θ is determined in the same manner. The convex portion side surface inclination angle Θ of the concave-convex structure (S) is measured using samples used for determining the average interval $P_{ave}$ of the concave-convex structure (S) for the concave-convex structure (S), and the convex portion side surface inclination angle Θ of the concave-convex structure (L) is measured using samples used for determining the average interval $P_{ave}$ of the concave-convex structure (L) for the concave-convex structure (L).

<Disturbance of the Concave-Convex Structure>

The concave-convex structure of the concave-convex structure surface 720 can include disturbance described below. Since the disturbance is included, and thus optical scattering (light scattering or light diffraction) is enhanced, the effect of disturbing the waveguide mode is enhanced, with the result that the light extraction efficiency LEE is more enhanced. Although the disturbance may be included in one of the concave-convex structure (S) and the concave-convex structure (L) or may be included in both thereof, in terms of maintaining the improvement of the IQE and more enhancing the light extraction efficiency LEE, the disturbance is preferably included in at least the concave-convex structure (S).

It is estimated that when the concave-convex structure (L) includes the disturbance, the number of modes of light diffraction, particularly, the number of modes of the emitted light forming the waveguide mode is increased. In order for the waveguide mode to be disturbed to enhance the light extraction efficiency LEE, the emitted light in which the waveguide mode is disturbed forms the waveguide mode again, and thus it is necessary to reduce absorption by the light-emitting semiconductor layer and the second semiconductor layer. Specifically, in the emitted light in which the waveguide mode is disturbed and which is extracted from the semiconductor light-emitting element, until it is extracted from the semiconductor light-emitting element, it is necessary to decrease the number of times the emitted light is reflected by the waveguide mode. It is estimated that since the concave-convex structure (L) has the disturbance, and thus the number of modes of light diffraction is increased, the number of times the reflection occurs is reduced, with the result that the light extraction efficiency LEE is more enhanced.

It is thought that since the concave-convex structure (S) has the disturbance, and thus it is possible to newly provide optical scattering (light diffraction or light scattering) corresponding to the disturbance of the concave-convex structure (S), it is possible to maintain the enhancement of the internal quantum efficiency IQE and to more enhance the light extraction efficiency LEE. When the optical phenomenon of the emitted light on the concave-convex structure (S) is caused by light diffraction, the light extraction efficiency LEE is enhanced by the principle described on the concave-convex structure (L). On the other hand, when effective medium approximation acts, it is thought that the disturbance of the refractive index can be introduced into the thin film of the refractive index of the effective medium approximation. In other words, since the disturbance of the refractive index functions as a scattering point, optical scattering is realized, with the result that light extraction efficiency LEE is enhanced.

When the disturbance of the concave-convex structure has cyclicity, newly realized optical scattering is caused by light diffraction whereas when the disturbance of the concave-convex structure has low regularity, newly realized optical scattering is caused by light scattering.

The elements of the concave-convex structure having the disturbance are not limited, and examples of elements that cause the disturbance of the concave-convex structure include: the interval P, the duty, the aspect ratio, the convex portion apex width lcvt, the convex bottom portion width lcvb, the concave portion opening width lcct, the concave portion bottom portion width lccb, the inclination angle of the convex portion side surface, the number of times the inclination angle of the convex portion side surface switches, the convex bottom portion inscribed circle diameter ϕin, the convex bottom portion circumscribed circle diameter ϕout, the convex portion height, the area of the convex portion apex, the number of minute protrusions (density) on the convex portion surface and information (for example, the shape of the convex portion) which can be estimated from the ratio thereof or the arrangement of the concave-convex structures.

Among these elements, the interval P means the disturbance of the arrangement of the concave-convex structures, and the elements other than the interval P mean the disturbance of the shape of the concave-convex structure. The disturbance thereof may be disturbance of only one type of elements described above or may be combined disturbance. In particular, preferably, in terms of more achieving optical scattering, effectively breaking the waveguide mode and enhancing the light extraction efficiency LEE, a plurality of elements simultaneously satisfy disturbance indicated by formula (A) that will be described below. Preferably, among them, when the intervals P, the duty, the height H, the aspect, the convex bottom portion circumscribed circle diameter ϕout or the ratio (ϕout/ϕin) has disturbance, it is thought that optical scattering caused by an increase in the number of diffraction modes or optical scattering caused by the distribution of the effective medium approximation refractive index Nema is increased, and thus the effect of disturbing the waveguide mode is increased. Among them, two or more disturbances are simultaneously included, and thus the enhancement of the light extraction efficiency LEE can be made more remarkable. Among them, preferably, when any one of the interval P, the height H, the convex bottom portion circumscribed circle diameter ϕout and the convex bottom portion circumscribed circle diameter ϕout/the convex bottom portion inscribed circle diameter ϕin has disturbance that satisfies formula (A), which will be described below, the effect of optical scattering is made remarkable. More preferably, the disturbance caused by combination of these is present.

The disturbance of the elements that causes the disturbance of the concave-convex structure has (standard deviation/arithmetic mean) indicated by formula (A) below. In formula (A), the (standard deviation/arithmetic mean) of the concave-convex structure is a value for the elements of the concave-convex structure. For example, when the concave-convex structure is formed with three elements, A, B and C, as in standard deviation for the element A/arithmetic mean for the element A, (standard deviation/arithmetic mean) is defined as a ratio of standard deviation and arithmetic mean for the same element.

$$0.025 \leq (\text{standard deviation/arithmetic mean}) \leq 0.8 \qquad (A)$$

(Arithmetic Mean)

When it is assumed that N measurements in the distribution of a certain element (variate) are x1, x2 . . . and xn, an arithmetic mean value is defined by formula below.

[Formula 1]

$$\bar{x} = \frac{\sum_{i=1}^{N} xi}{N}$$

(Standard Deviation)

When it is assumed that N measurements in the distribution of a certain element (variate) are x1, x2 . . . and xn, a standard deviation is defined by formula below using the arithmetic mean value defined as described above.

[Formula 2]

$$\sigma = \sqrt{\frac{1}{N}\sum_{i=1}^{N}(xi - \bar{x})^2}$$

The number N of samples when the arithmetic mean is calculated is defined as 10. The number of samples when the standard deviation is calculated is assumed to be the same as the number N of samples when the arithmetic mean is calculated.

The (standard deviation/arithmetic mean), that is, a coefficient of variation is defined not as a value within the surface of the optical substrate but as a value for a local part of the optical substrate. In other words, the (standard deviation/arithmetic mean) is not calculated by measuring N points over the surface of the optical substrate but a local observation on the optical substrate is performed, and the (standard deviation/arithmetic mean) within the observation range is calculated. Here, the local range used in the observation is defined as a range about 5 to 50 times as long as the average interval P of the concave-convex structure. For example, when the average interval P is 300 nm, the observation is performed in an observation range of 1500 nm to 15000 nm. Hence, for example, a field image of 2500 nm is sensed, the image sensing is used to determine a standard deviation and an arithmetic mean and the (standard deviation/arithmetic mean) is calculated. In particular, disturbance is measured from a region used for calculating the average interval $P_{ave}$. For the disturbance of the concave-convex structure (S), the average interval PS is used, and for the disturbance of the concave-convex structure (L), the average interval PL is used.

The disturbance is added to the concave-convex structure, and thus it is possible to add optical scattering (light scattering or light diffraction) corresponding to the disturbance. When the disturbance has regularity, new optical scattering is caused by light diffraction whereas when the disturbance has irregularity, new optical scattering is caused by light scattering. Formula (A) above indicates standardized variations in a certain element of the concave-convex structure. This is directly connected with an optical scattering component. In other words, the range in formula (A) above is satisfied, and thus it is possible to disturb the waveguide mode by the optical scattering corresponding to the disturbance, with the result that it is possible to more enhance the light extraction efficiency LEE.

Although the optimum value of the (standard deviation/arithmetic mean) is present for each of the elements of the concave-convex structure, formula (A) is satisfied regardless of the element that causes the disturbance of the concave-convex structure, and thus it is possible to enhance the light extraction efficiency LEE. Here, the lower limit value is determined by the degree of the enhancement of the light extraction efficiency LEE, and the upper limit value is determined by the degree of the maintenance of the enhancement of the internal quantum efficiency IQE. In terms of more decreasing the effects of the manufacturing conditions of the LED element and the type of optical substrate and thereby increasing both the internal quantum efficiency IQE and the light extraction efficiency LEE, the lower limit value is more preferably equal to or more than 0.03. On the other hand, the upper limit value is preferably equal to or less than 0.5, is preferably equal to or less than 0.35, is more preferably equal to or less than 0.25 and is most preferably equal to or less than 0.15.

Preferably, one or more elements selected from a group consisting of the interval P, the convex bottom portion circumscribed circle diameter ϕout, the convex bottom portion circumscribed circle diameter ϕout/convex portion bottom portion inscribed circle diameter ϕin and the height H satisfy formula (A) above, and thus it is possible to increase the intensity of realizing new optical scattering based on the disturbance of the concave-convex structure. In other words, it is possible to increase the light extraction efficiency LEE in a state where the enhancement of the internal quantum efficiency IQE is maintained. This is because in order to increase the optical scattering caused by the disturbance of the concave-convex structure, volume variations refractive index of the concave-convex structure are important. The element described above has disturbance, and thus it is possible to increase volume variations refractive index of the concave-convex structure, with the result that it is possible to increase a contrast in a part corresponding to an increase in the number of light diffraction modes or the disturbance of the effective medium approximation refractive index Nema. In other words, it is possible to increase optical scattering and enhance the light extraction efficiency LEE. In particular, with the interval P and the height H, it is easy to add regular disturbance. In this case, by regular disturbance, it is possible to utilize light diffraction as new optical scattering. The disturbance of the element described above is provided in at least one of the concave-convex structure (L) and the concave-convex structure (S), and thus it is possible to increase optical scattering. In particular, in terms of enhancing, with the concave-convex structure (S), the internal quantum efficiency IQE and the light extraction efficiency LEE and further enhancing, with the concave-convex structure (L), the light extraction efficiency LEE, at least the concave-convex structure (S) preferably includes the disturbance of the element described above.

The adoption of any value in the range satisfying formula (A) above is selected in various ways according to the state of the surface of the optical substrate and the purpose, and it is possible to select the optimum structure. For example, in the selection for simultaneously enhancing the internal quantum efficiency IQE and the light extraction efficiency LEE, when an optical substrate a CVD device or CVD conditions which are relatively unlikely to cause a dislocation defect, can be applied, a high (standard deviation/arithmetic mean) in the scope satisfying formula (A) above is preferably adopted so as to enhance the effect of light scattering. When an optical substrate a CVD device or CVD device conditions which are relatively likely to cause a dislocation defect, can be applied, a low (standard deviation/arithmetic mean) in the scope satisfying formula (A) above is preferably adopted so as to reduce the dislocation defect and enhance the internal quantum efficiency IQE.

Preferably, the concave-convex structure having the disturbance satisfying formula (A) above is included in at least a concave-convex structure having a short average interval P, and thus it is possible to maintain the enhancement of the internal quantum efficiency IQE and simultaneously more enhance the light extraction efficiency LEE.

The concave-convex structure (S) and the concave-convex structure (L) of the concave-convex structure surface 720 will then be described.

Figure 45A:
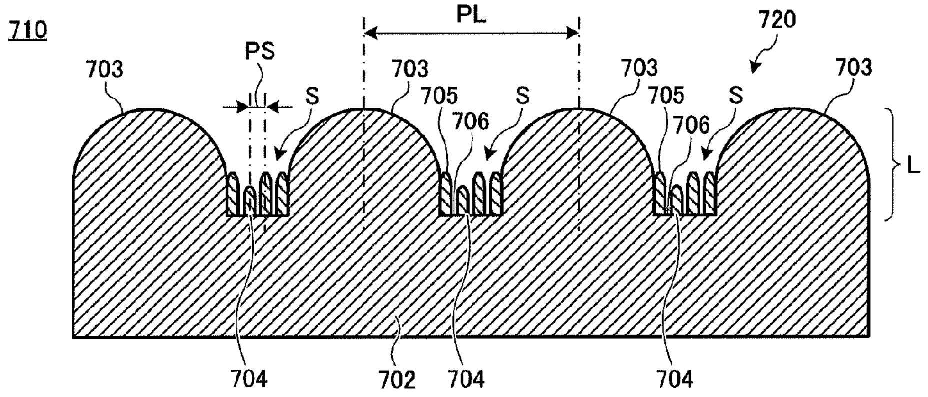
FIG. 45 A cross-sectional schematic view showing an example of the optical substrate (IV) according to the fourth embodiment.
Figure 45B:
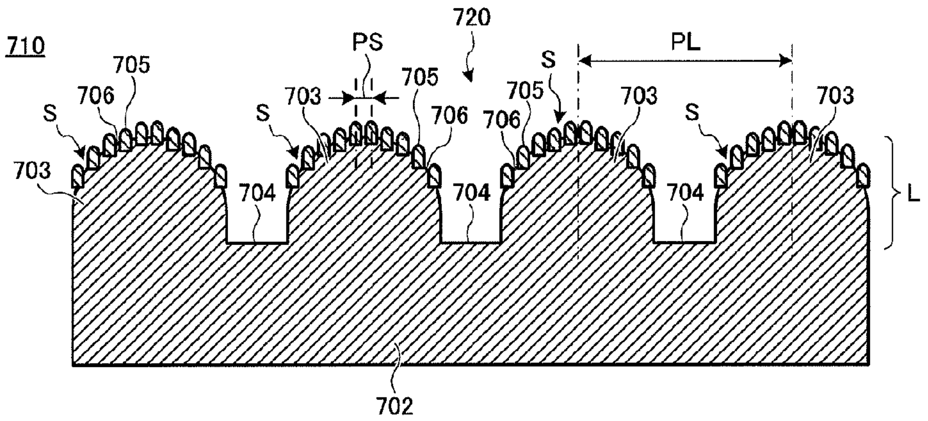
Figure 45C:
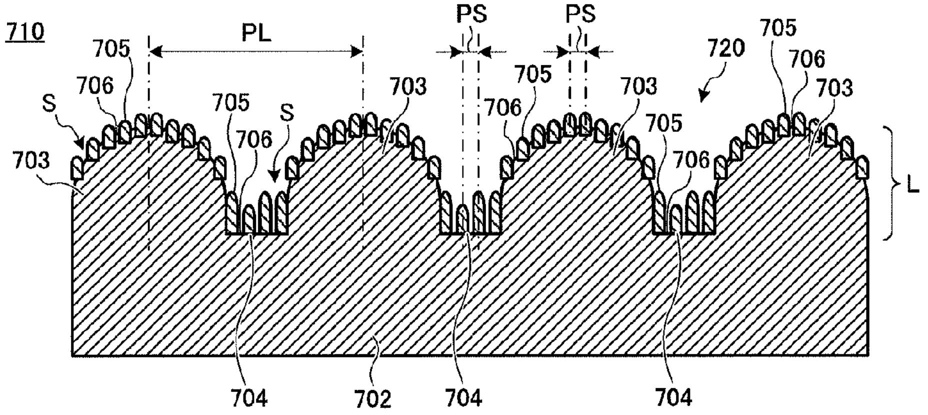

FIG. 45 is a cross-sectional schematic diagram showing an example of the optical substrate according to the fourth embodiment. As shown in FIGS. 45A to 45C, in the surface of the optical substrate (IV) 710, the concave-convex structure (L) having wide variations in volume is provided, and on at least one of the convex portion 703 and the concave portion 704 of the concave-convex structure (L), the concave-convex structure (S) having a high structure density is provided. In this configuration, it is possible to enhance, with the concave-convex structure (S), the internal quantum efficiency IQE and to enhance, with optical scattering (light diffraction or light scattering) caused by the concave-convex structure (L), the light extraction efficiency LEE. FIGS. 45A to 45C show examples of the arrangement of the concave-convex structure (S) and the concave-convex structure (L).

In particular, preferably, the first concave-convex structure (L) is formed with a plurality of convex portion 703 apart from each other, and the convex portions 705 or the concave portions 706 of the second concave-convex structure (S) are provided at least on the bottom portion of the concave portion 704 of the first concave-convex structure (L).

In this case, the growth of the semiconductor crystal layer can be started from the starting point, that is, the bottom surface of the concave portion 704 in the concave-convex structure (L). In particular, since the concave-convex structure (S) is provided on the bottom surface of the concave portion 704, and thus it is possible to disturb the growth mode of the semiconductor crystal layer, it is possible to reduce dislocations in the semiconductor crystal layer in the vicinity of the concave-convex structure (S). Moreover, since the concave-convex structure (L) is formed with a plurality of convex portions 703, it is possible to reduce cracks in the vicinity of the convex portion 703 in the semiconductor crystal layer grown from the bottom portion of the concave portion 704. In other words, it is possible to enhance the internal quantum efficiency IQE and enhance the reliability of the semiconductor light-emitting element. Since the concave-convex structure (L) and the concave-convex structure (S) satisfy the relationship of the predetermined average intervals, optical scattering is increased. In particular, since the concave-convex structure (S) is provided at least on the bottom portion of the concave portion 704, it is possible to more disturb the waveguide mode with light scattering or optical reflection, and thus it is possible to reduce the guiding of the waveguide mode again, with the result that the light extraction efficiency LEE is simultaneously enhanced.

Preferably, the first concave-convex structure (L) is formed with a plurality of convex portion 704 apart from each other, and the convex portions 705 or the concave portions 706 of the second concave-convex structure (S) are provided at least on the apex of the convex portion 703 of the first concave-convex structure (L).

In this case, the growth of the semiconductor crystal layer can be started from the starting point, that is, the apex of the convex portion 703 in the concave-convex structure (L). In particular, since the concave-convex structure (S) is provided on the apex of the convex portion 703, and thus it is possible to disturb the growth mode of the semiconductor crystal layer, it is possible to reduce dislocations in the semiconductor crystal layer in the vicinity of the concave-convex structure (S). Here, the semiconductor crystal layer grown from the apex of the convex portion 703 is satisfactory in growth as compared with the semiconductor crystal grown from the bottom portion of the concave portion 704. Hence, the internal quantum efficiency IQE is effectively enhanced. Furthermore, it is easy to generate a hollow space within the concave portion 704. In this case, the accuracy of removal when the optical substrate (IV) 710 is removed by, for example, laser lift-off is enhanced. Since the concave-convex structure (L) and the concave-convex structure (S) satisfy the relationship of the predetermined average intervals, optical scattering is increased. In particular, since the concave-convex structure (L) is formed with a plurality of concave portions 704, variations in volume are more increased, and thus the effect of disturbing the waveguide mode is enhanced, with the result that the light extraction efficiency LEE is enhanced.

In the optical substrate (IV) 710 described above, the coverage of the concave-convex structure (S) in the concave-convex structure (L) is preferably more than 0 but less than 100%.

In this case, since in the convex portion 703 or the concave portion 704 of the concave-convex structure (L), the concave-convex structure (S) is provided without fail, by the principle described above, it is possible to effectively enhance the internal quantum efficiency IQE. On the other hand, all the convex portion 703 and the concave portion 704 in the concave-convex structure (L) are prevented from being filled with the concave-convex structure (S). In this way, it is possible to reduce the lowering of, with the concave-convex structure (S), the effect of enhancing the light extraction efficiency LEE produced by the concave-convex structure (L). In other words, the effect of simultaneously enhancing the internal quantum efficiency IQE and the light extraction efficiency LEE is more enhanced.

In particular, in terms of reducing the increase in the roughness of the surface of the concave-convex structure (L), and disturbing the direction of travel of the emitted light forming the waveguide mode within the semiconductor crystal layer, the coverage is preferably equal to or less than 90%, is more preferably equal to or less than 80% and is most preferably equal to or less than 50%. Moreover, in terms of achieving the effect of enhancing the internal quantum efficiency IQE with the concave-convex structure (S), reducing the amount of semiconductor crystal layer used and enhancing the productivity of the semiconductor crystal layer, the coverage is preferably equal to or more than 0.01%, is more preferably equal to or more than 0.1% and is most preferably equal to or more than 0.15%. In the semiconductor light-emitting element, in particular, when the internal quantum efficiency is desired to be enhanced, in the widest range described above, the coverage is preferably equal to or more than 50% but equal to or less than 90%, is more preferably equal to or more than 60% but equal to or less than 86% and is most preferably equal to or more than 70% but equal to or less than 84%. When these ranges are satisfied, the effect of disturbing the growth mode of the semiconductor crystal layer by the convex member is enhanced, and it is possible to make dislocations collide with each other in the vicinity of the concave-convex structure (S) and thereby reduce them. Furthermore, the effect of providing optical scattering by disturbance or the effect of reducing the specific growth of the semiconductor crystal layer is enhanced. On the other hand, when the light extraction efficiency is particularly desired to be enhanced, in the widest range described above, the coverage is preferably equal to or more than 0.1% but equal to or less than 30%, is more preferably equal to or more than 0.1% but equal to or less than 10% and is most preferably equal to or more than 0.1% but equal to or less than 5%. Since these ranges are satisfied, and thus it is possible to reduce the reformation of the waveguide mode by the emitted light where the waveguide mode is disturbed, the light extraction efficiency is more enhanced.

Here, the coverage refers to a flat surface occupancy of the convex portion 705 and the concave portion 706 of the concave-convex structure (S) in the surface of the convex portion 703 and concave portion 704 of the concave-convex structure (L). Specifically, when a flat surface area of the convex portion 703 and the concave portion 704 surrounding the outline of the convex portion 703 in the observation of a certain convex portion 703 from the upper surface side is assumed to be S, and then the total flat surface area of the convex portion 705 and the concave portion 706 of the concave-convex structure (S) within the observed image is assumed to be Si, the coverage is (Si/S)×100.

Figure 46A:
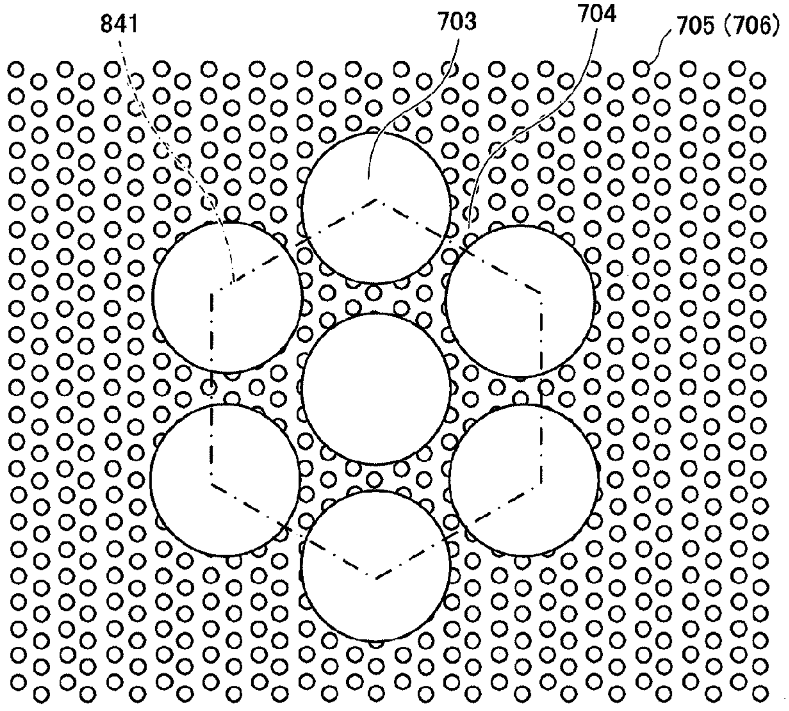
FIG. 46 A schematic view showing a concave-convex structure in the optical substrate (IV) according to the fourth embodiment.
Figure 46B:
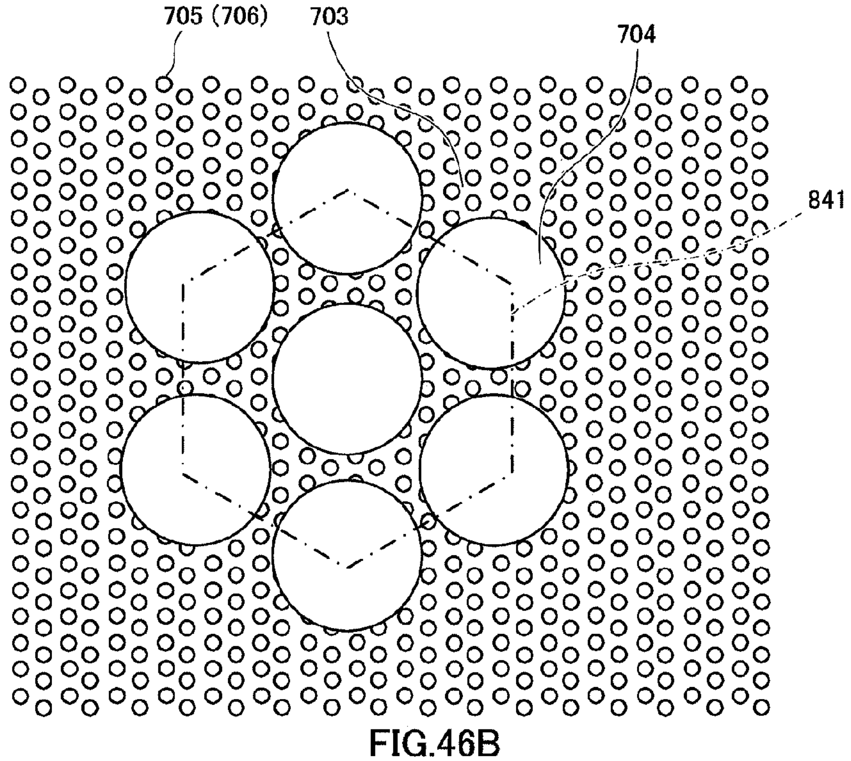

FIG. 46 is a schematic diagram showing the concave-convex structure in the optical substrate (IV) 710 according to the fourth embodiment. FIG. 46A shows a case where the concave-convex structure (L) is formed with a plurality of independent convex portions 703, particularly, a case where the concave-convex structure (S) is provided on the bottom surface of the concave portion 704. In this example, the outline shape of the bottom portion of the convex portion 703 and the outline shape of the bottom portion of the convex portion 705 are circular. The area of the convex portion 703 in a flat surface image observed from the side of the apex of the convex portion 703 and the concave portion 704 surrounding the outline of the convex portion 703 is assumed to be S. Here, the area S is the area of a polygon 841 obtained by connecting the center portions of the apexes of other convex portions 703 adjacent to a certain convex portion 703. When the total area of the areas formed by the outlines of the bottom portions of the convex portions 705 in the concave-convex structure (S) included in the area S or the total area of the opening portions of the concave portions 706 is assumed to be Si, the coverage is given as (Si/S)×100. Although FIG. 46A illustrates the case where the concave-convex structure (S) is arranged on only the bottom portion of the concave portion in the concave-convex structure (L), the arrangement of the concave-convex structure (S) is not limited to this configuration as has already been described. Likewise, FIG. 46B shows a case where the concave-convex structure (L) is formed with a plurality of independent concave portions 704, particularly, a case where the concave-convex structure (S) is provided on the upper surface of the convex portion 703. In this example, the opening shape of the concave portion 704 and the outline shape of the bottom portion of the convex portion 703 are circular. The area of the concave portion 704 in a flat surface image observed from the side of the apex of the convex portion 703 and the convex portion 703 surrounding the outline of the concave portion 704 is assumed to be S. Here, the area S is the area of a polygon 841 obtained by connecting the center portions of the opening portions of other concave portions 704 adjacent to a certain concave portion 704. When the total area of the areas formed by the outlines of the bottom portions of the convex portions 705 in the concave-convex structure (S) included in the area S or the total area of the opening portions of the concave portions 706 is assumed to be Si, the coverage is given as Si/S×100. Although FIG. 46B illustrates the case where the concave-convex structure (S) is arranged on only the apex of the convex portion 703 in the concave-convex structure (L), the arrangement of the concave-convex structure (S) is not limited to this configuration as has already been described.

When as shown in FIG. 46B, the concave-convex structure (S) is provided on only the upper surface of the apex of the convex portion 703 in the concave-convex structure (L), the area of the upper surface of the apex of the convex portion 703 in an observation from the side of the apex of the convex portion 703 is assumed to be S, the total of the flat surface areas of the concave-convex structure (S) included in the upper surface of the apex of the convex portion 703 having the area S is assumed to be Si and thus it is possible to determine the coverage Si/S×100. This coverage is referred to as a coverage T on the upper surface of the apex of the convex portion 703. Likewise, when as shown in FIG. 46A, the concave-convex structure (S) is provided on only the bottom surface of the concave portion 704 in the concave-convex structure (L), the area of the bottom surface of the concave portion 704 in an observation from the side of the apex of the convex portion 705 is assumed to be S, the total of the flat surface areas of the concave-convex structure (S) included in the bottom surface of the concave portion 704 having the area S is assumed to be Si and thus it is possible to determine the coverage (Si/S×100). This coverage is referred to as a coverage B on the bottom surface of the concave portion 704. The coverage T on the upper surface of the apex of the convex portion 703 and the coverage B on the bottom surface of the concave portion 704 are preferably equal to or more than 1% but equal to or less than 90%. In particular, in terms of satisfactorily enhancing the internal quantum efficiency IQE and enhancing the light emission output of the semiconductor light-emitting element, the coverage T on the upper surface of the apex of the convex portion 703 and the coverage B on the bottom surface of the concave portion 704 are preferably equal to or more than 3% but equal to or less than 60%, are more preferably equal to or more than 5% but equal to or less than 55% and are most preferably equal to or more than 10% but equal to or less than 40%. Even when the concave-convex structure (S) is provided on the apex of the convex portion 703 and the side surface of the convex portion 703 and the bottom portion of the concave portion 704 in the concave-convex structure (L), the coverage of the concave-convex structure (S) on the upper surface of the apex of the convex portion 703 in the concave-convex structure (L) or the coverage of the concave-convex structure (S) on the bottom surface of the concave portion 704 in the concave-convex structure (L) preferably satisfies the coverage T on the upper surface of the apex of the convex portion 703 and the coverage B on the bottom surface of the concave portion 704.

When in the concave-convex structure (L), a plurality of convex portions 703 are provided separately on the substrate main body 702, the concave-convex structure (L) is formed with the main surface of the substrate main body 702 and a plurality of convex portions 703. In this case, a plurality of convex portions 703 correspond to the convex portion in the concave-convex structure (L), and a portion which is present between the convex portions 703 and from which the main surface of the substrate main body 702 is exposed corresponds to the concave portion 704 in the concave-convex structure (L).

On the other hand, when the substrate main body 702 is directly processed to provide the concave-convex structure (L), the materials of the concave-convex structure (L) and the substrate main body 702 are the same.

FIG. 45A shows a case where the concave-convex structure (L) is formed with a plurality of independent convex portions 703 and the concave-convex structure (S) is provided on the surface of the concave portion 704 in the concave-convex structure (L). FIG. 45B shows a case where the concave-convex structure (L) is formed with a plurality of independent convex portions 703 and the concave-convex structure (S) is provided on the surface of the convex portion 703 in the concave-convex structure (L). FIG. 45C shows a case where the concave-convex structure (L) is formed with a plurality of independent convex portions 703 and the concave-convex structure (S) is provided on the surface of the convex portion 703 and the concave portion 704 in the concave-convex structure (L).

As shown in FIG. 45A, the concave-convex structure (S) is provided on the concave portion 704 in the concave-convex structure (L), and thus it is possible to satisfactorily enhance the internal quantum efficiency IQE. Furthermore, the concave-convex structure (L) is formed with a plurality of independent convex portions 703, and thus it is possible to reduce cracks in the semiconductor crystal layer. This is because the growth of the semiconductor crystal layer is started by the concave portion 704 in the concave-convex structure (L). In other words, since it is possible to disturb the growth mode of the semiconductor crystal layer, in the concave portion 704 in the concave-convex structure (L), it is possible to disperse dislocations. Although in FIG. 45A, the concave-convex structure (S) is not shown on the side surface portion of the convex portion 703, the concave-convex structure (S) can be provided on the side surface of the convex portion 703. In this case, it is thought that the effect of disturbing the waveguide mode is further increased, and that it is possible to more change the direction of travel of the disturbed and emitted light to the direction of thickness of the semiconductor light-emitting element. Hence, it is easy to select the sealant when the semiconductor light-emitting element is packaged.

When the concave-convex structure (L) is formed of the same material as the substrate main body 702, in order for dislocations produced from the apex of the convex portion 703 in the concave-convex structure (L) to be reduced, the diameter of the convex portion 703 in the concave-convex structure (L) is preferably decreased as the convex portion 703 extends from the bottom portion to the apex. In particular, preferably, the apex of the convex portion 703 in the concave-convex structure (L) is continuously connected to the side surface portion of the convex portion 703 in the concave-convex structure (L), that is, the convex portion apex width lcvt is closer to 0. Although the concave-convex structure (L) can be in the form of a disk shape, a conical shape, an n-sided column (n≥3) or an n-sided pyramid, among them, in terms of enhancing the evenness of the growth of the first semiconductor layer 730 and reducing cracks and dislocations produced within the first semiconductor layer 730, the concave-convex structure (L) is preferably in the form of any one of a conical shape, a disk shape, a triangular prism, a triangular pyramid, a hexagonal prism and a hexagonal pyramid. The apex of the pyramid described above may be a corner portion whose radius of curvature is 0 or a corner portion whose radius of curvature exceeds 0 and which is rounded. In particular, in the case of the pyramid shape, since the corner portion whose radius of curvature exceeds 0 is included, and thus it is possible to reduce cracks produced when the semiconductor crystal layer is grown, the long-term reliability of the semiconductor light-emitting element is enhanced. In particular, preferably, in these shapes, the inclination angle of the side surface portion of the convex portion 703 has one or more but five or less switching points. More preferably, it has one or more but three or less switching points. The side surface portion of the convex portion 703 may have a bulge instead of being in the form of a straight line.

On the other hand, when the concave-convex structure (L) and the substrate main body 702 are formed of different materials, the convex portion 703 in the concave-convex structure (L) may be in the form of not only a shape such as a conical shape or an n-sided column (n≥3) but also a shape such as a disk shape or an n-sided pyramid (n≥3) where the convex portion apex width lcvt and the convex bottom portion width Icvb are substantially the same. In particular, preferably, in terms of enhancing the evenness of the growth of the first semiconductor layer 730 and reducing cracks and dislocations produced within the first semiconductor layer 730, the convex portion 703 is preferably in the form of any one of a conical shape, a disk shape, a triangular prism, a triangular pyramid, a hexagonal prism and a hexagonal pyramid. In terms of reducing cracks produced within the first semiconductor layer, the diameter of the convex portion 703 in the concave-convex structure (L) is preferably decreased as the convex portion 703 extends from the bottom portion to the apex. In particular, preferably, in these shapes, the inclination angle of the side surface portion of the convex portion 703 has one or more but five or less switching points. More preferably, it has one or more but three or less switching points. The side surface portion of the convex portion 703 may have a bulge instead of being in the form of a straight line. When the concave-convex structure (L) and the substrate main body 702 are formed of different materials, the absolute value $|nL-ns|$ of a difference between the refractive index nL of the concave-convex structure (L) and the refractive index ns of the substrate main body is preferably equal to or more than 0.1. The range described above is satisfied, and thus it is possible to increase the optical presence of the concave-convex structure (L) as seen from the semiconductor crystal layer. In other words, since optical scattering is increased, the effect of disturbing the waveguide mode is increased. Furthermore, it is easy to design light extraction from the direction of the side surface of the semiconductor light-emitting element or light extraction from the direction of the upper surface.

Preferably, in terms of more enhancing the internal quantum efficiency IQE, the concave-convex structure (S) provided in the bottom portion of the concave portion 704 in the concave-convex structure (L) is a dot structure that is formed with a plurality of convex portions 705, and the bottom portion of the concave portion 706 in the concave-convex structure (S) has a flat surface. Furthermore, preferably, the diameter of the convex portion 705 in the concave-convex structure (S) is decreased as the convex portion 705 extends from the bottom portion to the apex, and thus the dispersion of dislocations is more facilitated. Most preferably, the convex portion apex width Icvt is closer to 0, and the apex and the side surface portion of the convex portion 705 is continuous. In the side surface of the convex portion 705, the inclination of the convex portion side surface of the concave-convex structure (L) becomes steeper in the direction from the apex to the bottom portion of the convex portion 705 in the concave-convex structure (L), and thus it is possible to reduce cracks produced within the first semiconductor layer 730.

Even when as shown in FIG. 45B, the concave-convex structure (S) is provided in the convex portion 703 in the concave-convex structure (L), and thus a flat surface is present on the apex of the convex portion 703 in the concave-convex structure (L), it is possible to satisfactorily enhance the internal quantum efficiency IQE. This is because the growth of the semiconductor crystal layer is started from the flat surface in the concave-convex structure (L). In other words, since it is possible to disturb the growth mode of the semiconductor crystal layer on the flat surface of the apex of the convex portion 703 in the concave-convex structure (L), it is possible to disperse dislocations in the convex portion 703 in the concave-convex structure (L). In the semiconductor crystal layer grown from the bottom portion of the concave portion 704 in the concave-convex structure (L), it is possible to reduce dislocations by the growth of the semiconductor crystal layer in the horizontal direction. Hence, the dislocation density of the semiconductor crystal layer is lowered and thus it is possible to enhance the internal quantum efficiency IQE. In this case, in order for the growth of the semiconductor crystal layer to be facilitated, the bottom portion of the concave portion 704 in the concave-convex structure (L) preferably has a flat surface. Furthermore, the apex of the convex portion 703 in the concave-convex structure (L) is preferably smaller than the bottom portion. Preferably, in terms of satisfactorily maintaining the internal quantum efficiency IQE with the concave-convex structure (S), the concave-convex structure (S) is a dot structure formed with a plurality of convex portions 705, and the bottom portion of the concave portion 706 in the concave-convex structure (S) has a flat surface. Furthermore, preferably, when the diameter of the convex portion 703 in the concave-convex structure (S) is decreased as the convex portion 703 extends from the bottom portion to the apex, the dispersion of dislocations is facilitated. Most preferably, the convex portion apex width Icvt is closer to 0, and the apex and the side surface portion of the convex portion 703 are continuous. Although the concave-convex structure (L) can be in the form of a disk shape, a conical shape, an n-sided column ($n \geq 3$) or an n-sided pyramid, among them, in terms of enhancing the evenness of the growth of the first semiconductor layer 730 and reducing cracks and dislocations produced within the first semiconductor layer 730, the concave-convex structure (L) is preferably in the form of any one of a conical shape, a disk shape, a triangular prism, a triangular pyramid, a hexagonal prism and a hexagonal pyramid. The apex of the pyramid described above may be a corner portion whose radius of curvature is 0 or a corner portion whose radius of curvature exceeds 0 and which is rounded. In particular, in the case of the pyramid shape, since the corner portion whose radius of curvature exceeds 0 is included, and thus it is possible to reduce cracks produced when the semiconductor crystal layer is grown, the long-term reliability of the semiconductor light-emitting element is enhanced. In particular, preferably, in these shapes, the inclination angle of the side surface portion of the convex portion 703 has one or more but five or less switching points. More preferably, it has one or more but three or less switching points. The side surface portion of the convex portion 703 may have a bulge instead of being in the form of a straight line. When the concave-convex structure (S) is provided on the apex of the convex portion 703 in the concave-convex structure (L), since it is easy to more remove the optical substrate (IV) 710 by, for example, laser lift-off, it is possible to increase light emission intensity per input power of the semiconductor light-emitting element.

With the structure shown in FIG. 45C, it is possible to combine the effects realized by the structures of FIGS. 45A and 45B described above.

Although FIG. 45 illustrates the case where the concave-convex structure (L) is formed with a plurality of independent convex portions 703, the concave-convex structure (L) may be formed with a plurality of independent concave portions 704.

Figure 47A:
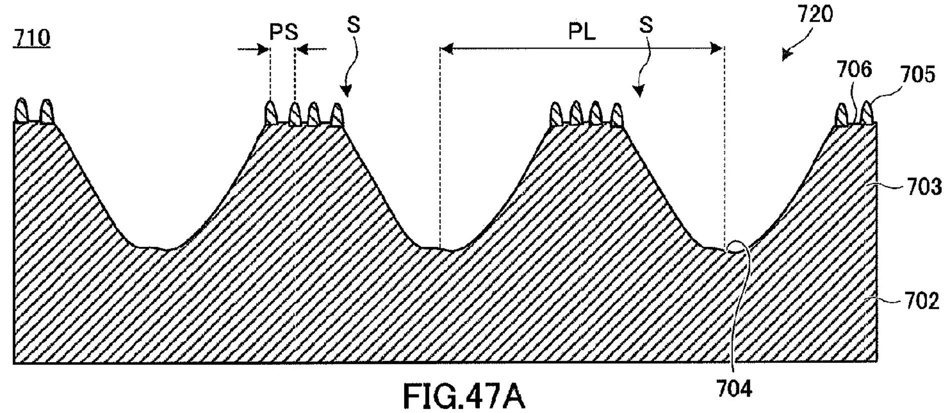
FIG. 47 A cross-sectional schematic view showing an example of the optical substrate (IV) according to the fourth embodiment.
Figure 47B:
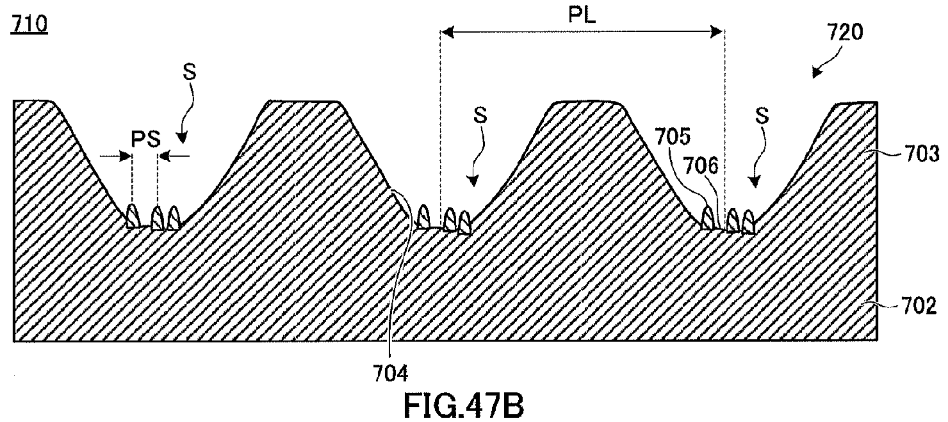
Figure 47C:
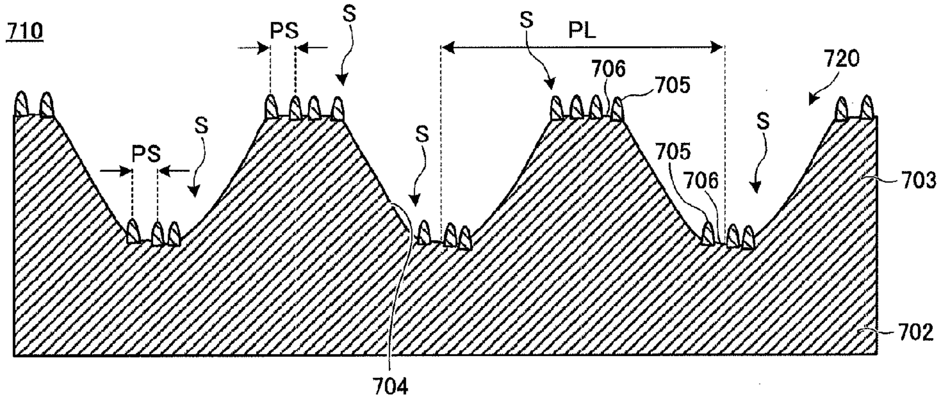

FIG. 47 is a cross-sectional schematic view showing an example of the optical substrate according to the fourth embodiment. FIG. 47A shows a case where the concave-convex structure (L) is formed with a plurality of independent concave portions 704, and where the concave-convex structure (S) is provided on the surface of the convex portion 703 in the concave-convex structure (L). FIG. 47B shows a case where the concave-convex structure (L) is formed with a plurality of independent concave portions 704, and where the concave-convex structure (S) is provided on the surface of the concave portion 704 in the concave-convex structure (L). FIG. 47C shows a case where the concave-convex structure (L) is formed with a plurality of independent concave portions 704, and where the concave-convex structure (S) is provided on the surface of the convex portion 703 and the concave portion 704 in the concave-convex structure (L).

As shown in FIG. 47A, the concave-convex structure (S) is provided on the convex portion 703 in the concave-convex structure (L), and thus it is possible to satisfactorily enhance the internal quantum efficiency IQE. Furthermore, the concave-convex structure (L) is formed with a plurality of independent concave portions 704, and thus it is easy to form a hollow space within the concave portion 704 in the concave-convex structure (L). In this case, the accuracy of removal of the optical substrate by laser lift-off is enhanced. Furthermore, when a hollow space is formed, since the difference in refractive index between the semiconductor crystal layer and the hollow space is significantly increased, the degree of increase in the light extraction efficiency LEE is suddenly increased. The same is true for the concave-convex structure shown in FIG. 47B or 47C.

As described above, the main function of the concave-convex structure (S) is to improve the internal quantum efficiency IQE. Hence, the material of the concave-convex structure (S) is preferably the same as the material of the substrate main body 702 of the optical substrate (IV) 710. On the other hand, the main function of the concave-convex structure (L) is to improve the light extraction efficiency LEE. Hence, the material of the concave-convex structure (L) may be the same as or different from the material of the substrate main body 702 of the optical substrate (IV) 710. For example, each of the concave-convex structure (S) and the concave-convex structure (L) is formed with sapphire, SiC (silicon carbide), a nitride semiconductor, Si (silicon) or spinel; the concave-convex structure (S) is formed with sapphire, SiC, a nitride semiconductor, Si or spinel, and the concave-convex structure (L) is formed with SiO.

Particularly preferably, the arrangement of the concave-convex structure (L) and the concave-convex structure (S) for enhancing both the internal quantum efficiency IQE and the light extraction efficiency LEE described above satisfies the following arrangement and shape.

<Concave-Convex Structure (S)>

The main function of the concave-convex structure (S) is to enhance the internal quantum efficiency IQE. Hence, when the density (the average interval PS) of the concave-convex structure (S) described below is satisfied, its arrangement is not limited, and it is possible to adopt a hexagonal arrangement, a quasi-hexagonal arrangement, a quasi-tetragonal arrangement, a square arrangement, an arrangement obtained by combing these arraignments or an arrangement having low regularity. In particular, preferably, as the arrangement regularity of the concave-convex structure (S) is lowered, it is also possible to realize the effect of optical scattering by the concave-convex structure (S).

The average interval PS of the concave-convex structure (S) is an index that indicates the density of the concave-convex structure (S). The concave-convex structure (S) is provided, and thus it is possible to disturb the growth mode of the semiconductor crystal layer, and since it is possible to disperse dislocations according to the concave-convex structure (S), it is possible to reduce dislocations both microscopically and macroscopically, with the result that it is possible to enhance the internal quantum efficiency IQE.

The average interval PS is preferably equal to or more than 50 nm but equal to or less than 1500 nm. In particular, when the average interval PS is equal to or less than 1500 nm, the density of the concave-convex structure (S) is enhanced. Accordingly, it is possible to disperse dislocations within the semiconductor crystal layer, and since it is possible to reduce the dislocation density both microscopically and macroscopically, it is possible to increase the internal quantum efficiency IQE. In terms of achieving the effect described above, the average interval PS is preferably equal to or less than 1200 nm, is more preferably equal to or less than 900 nm and is most preferably equal to or less than 750 nm. On the other hand, the average interval PS of the concave-convex structure (S) is equal to or more than 50 nm, and thus it is possible to increase optical scattering (light diffraction or light scattering) as the concave-convex structure (S). In other words, since it is possible to add optical scattering (light diffraction or light scattering) caused by the concave-convex structure (L) or optical scattering (light diffraction or light scattering) caused by the concave-convex structure (S) to reflection, the light extraction efficiency LEE is more enhanced. In terms of achieving the effect described above, the average interval PS is preferably equal to or more than 200 nm, is more preferably equal to or more than 300 nm and is most preferably equal to or more than 350 nm.

The disturbance described above is added to the interval P of the concave-convex structure (S), and thus it is possible to more enhance optical scattering (light diffraction or light scattering) by the concave-convex structure (S) in a state where the enhancement of the internal quantum efficiency IQE by the concave-convex structure (S) is maintained. In other words, since the effect of improving the internal quantum efficiency IQE and the light extraction efficiency LEE with the concave-convex structure (S) is increased, the degree of the enhancement of both the internal quantum efficiency IQE and the light extraction efficiency LEE as the concave-convex structure surface 720 of the optical substrate is increased. The (standard deviation/arithmetic mean) for the interval P of the concave-convex structure (S) is, in the widest range described above (0.025 or more but 0.8 or less), preferably equal to or more than 0.03 but equal to or less than 0.4. In particular, when the (standard deviation/arithmetic mean) is equal to or more than 0.03, contribution to the light extraction efficiency LEE is made satisfactory whereas when the (standard deviation/arithmetic mean) is equal to or less than 0.4, contribution to the internal quantum efficiency IQE is made satisfactory. In the same terms, the (standard deviation/arithmetic mean) is preferably equal to or more than 0.035 and is more preferably equal to or more than 0.04. The (standard deviation/arithmetic mean) is more preferably equal to or less than 0.35, is more preferably equal to or less than 0.25 and is most preferably equal to or less than 0.15.

The disturbance of the interval P in the concave-convex structure (S) may have high regularity or low regularity. For example, in a concave-convex structure including a unique structure that irregularly contains a hexagonal arrangement, a quasi-hexagonal arrangement, a quasi-tetragonal arrangement and a square arrangement, the regularity of the disturbance of the interval P in the concave-convex structure is lowered, and light scattering can be realized as new optical scattering. On the other hand, in a concave-convex structure including a unique structure where in a regular hexagonal arrangement, the interval P is increased and decreased periodically, the disturbance of the interval P has high regularity, and light diffraction can be realized as new optical scattering. For example, when in a regular hexagonal arrangement which is a basic structure, an irregular hexagonal arrangement (for example, a square arrangement) part which is a unique structure is locally arranged, the unique structure is dispersed irregularly, and thus the regularity of the disturbance of the interval P in the concave-convex structure is lowered, with the result that light scattering can be realized as new optical scattering. On the other hand, when in a regular hexagonal arrangement which is a basic structure, an irregular hexagonal arrangement (for example, a square arrangement) part which is a unique structure is locally arranged, and the unique structure is provided regularly, the disturbance of the interval P in the concave-convex structure (S) has high regularity, and thus light diffraction can be realized as new optical scattering.

The ratio (Icvt/Icct) between the convex portion apex width Icvt and the concave portion opening width Icct in the concave-convex structure (S) is preferably lower, and is most preferably substantially 0. Icvt/Icct=0 means Icvt=0 nm. However, for example, even when Icvt is measured with a scanning electron microscope, it is impossible to measure 0 nm accurately. Hence, Icvt here is assumed to include all cases where measurement resolution cannot be achieved. When the ratio (Icvt/Icct) is equal to or less than 3, it is possible to effectively enhance the internal quantum efficiency IQE. This is because dislocations produced from the top of the apex of the convex portion 705 in the concave-convex structure (S) are reduced, the dispersion of dislocations is enhanced and the microscopical and macroscopical dislocation densities are reduced. Furthermore, (Icvt/Icct) is equal to or less than 1, and thus it is possible to enhance the light extraction efficiency LEE. This is because the distribution of the refractive index of the concave-convex structure (S) formed with the optical substrate (IV) 710 and the semiconductor crystal layer is appropriate as seen from the emitted light. In terms of significantly enhancing both the internal quantum efficiency IQE and the light extraction efficiency LEE described above, (Icvt/Icct) is equal to or less than 0.4, is more preferably equal to or less than 0.2 and is further preferably equal to or less than 0.15.

Preferably, the bottom portion of the concave portion 706 in the concave-convex structure (S) has a flat surface, and thus it is possible to enhance the internal quantum efficiency IQE and to decrease the difference between semiconductor crystal film formation devices. In order to enhance the internal quantum efficiency IQE in the LED element, it is necessary to disperse dislocations within the semiconductor crystal layer and to reduce the microscopical and macroscopical dislocation densities. Here, the initial conditions of these physical phenomena are nucleation and core growth when the semiconductor crystal layer is formed into a film by chemical vapor deposition (CVD). Since a flat surface is included on the bottom portion of the concave portion 706 in the concave-convex structure (S), and thus it is possible to more preferably produce nucleation, it is possible to more realize the effect of reducing dislocations within the semiconductor crystal layer with the density of the concave-convex structure (S). Consequently, it is possible to more increase the internal quantum efficiency IQE. In terms of what has been described above, the ratio (Icvb/Iccb) between the convex bottom portion width Icvb and the concave portion bottom portion width Iccb in the concave-convex structure (S) is preferably equal to or less than 5. In particular, in terms of more facilitating the growth of the semiconductor crystal layer where the bottom portion of the concave portion 706 in the concave-convex structure (S) is a reference plane, (Icvb/Iccb) is more preferably equal to or less than 2, and is most preferably equal to or less than 1.

The size of this flat surface is preferably equal to or more than 30 nm. Here, the size of the flat surface is defined as the shortest distance between the outer edge portions of the bottom portions of the convex portions 705 closest to each other. Since the size of the flat surface is equal to or more than 30 nm, and thus it is possible to satisfactorily maintain the initial growth of the semiconductor crystal layer, the effect of improving the internal quantum efficiency IQE is increased. In the same terms, the size of the flat surface is more preferably equal to or more than 60 nm, and is most preferably equal to or more than 80 nm.

Furthermore, when the convex portion apex width Icvt is smaller than the convex bottom portion width Icvb, it is easy to simultaneously satisfy the ratio (Icvt/Icct) and the ratio (Icvb/Iccb) described above, with the result that it is possible to increase the internal quantum efficiency IQE by the mechanism already described.

When the concave-convex structure (S) is a dot structure, it is easy to control the convex portion apex width Icvt and the convex bottom portion width Icvb, and it is easy to simultaneously satisfy the ratio (Icvt/Icct) and the ratio (Icvb/Iccb), with the result that it is possible to increase the internal quantum efficiency IQE by the mechanism already described.

In terms of enhancing the internal quantum efficiency IQE, the duty expressed by the ratio (Icvb/P) between the convex bottom portion width Icvb and the interval P is preferably equal to or more than 0.03 but equal to or less than 0.83. When the ratio is equal to or more than 0.03, the effect of disturbing the crystal mode of the semiconductor crystal layer is increased, and thus it is possible to improve the internal quantum efficiency IQE. In terms of the same effect, the ratio (Icvb/P) is more preferably equal to or more than 0.17, and is most preferably equal to or more than 0.33. On the other hand, when the ratio is equal to or less than 0.83, it is possible to satisfactorily perform nucleation and core growth by chemical vapor deposition on the semiconductor crystal layer, and thus it is possible to enhance the internal quantum efficiency IQE. In terms of the same effect, the ratio (Icvb/P) is more preferably equal to or less than 0.73, and is most preferably equal to or less than 0.6.

Preferably, the convex bottom portion circumscribed circle diameter $\phi$out and the convex bottom portion circumscribed circle diameter $\phi$out/convex portion bottom portion inscribed circle diameter $\phi$in satisfy formula (A) above, and thus it is possible to effectively realize optical scattering. That the convex bottom portion circumscribed circle diameter $\phi$out has disturbance means that the duty has disturbance.

The aspect ratio is equal to or more than 0.1, and thus it is possible to enhance the light extraction efficiency LEE with the concave-convex structure (S) through optical scattering. In particular, in terms of more enhancing the light extraction efficiency LEE with new optical scattering through the disturbance of the height H of the concave-convex structure (S) and the disturbance of the interval P of the concave-convex structure (S) described above, the aspect ratio is preferably equal to or more than 0.3, is more preferably equal to or more than 0.5 and is most preferably equal to or more than 0.8. On the other hand, preferably, the aspect ratio is equal to or less than 5, and thus it is possible to reduce the dislocation density, to reduce a time for manufacturing the concave-convex structure (S) and to reduce the amount of semiconductor crystal. In terms of the same effect, the aspect ratio is more preferably equal to or less than 2, and is most preferably equal to or less than 1.5.

Preferably, when the height H has the disturbance that satisfies formula (A) above, optical scattering is effectively increased. In this case, the aspect ratio has disturbance simultaneously. The disturbance of the height H of the concave-convex structure (S) may have high regularity or lower regularity. In other words, the disturbance of the aspect ratio may have high regularity or lower regularity. For example, when there is a concave-convex structure (S) that has a center height H0, the minimum height H1 and the maximum height H2 and that includes a unique structure in which the height H falls within the above range and which has low regularity and disturbance, the regularity of the disturbance of the height H of the concave-convex structure (S) is lowered, and light scattering can be realized as new optical scattering. On the other hand, in a concave-convex structure including a unique structure where the height H is increased and decreased periodically, the disturbance of the height H has high regularity, and light diffraction can be realized as new optical scattering. For example, when in a basic structure which is an aggregation of the height H1, a unique part of the height H2 is locally arranged, the unique part is dispersed irregularly, and thus the regularity of the disturbance of the height H in the concave-convex structure (S) is lowered, with the result that light scattering can be realized as new optical scattering. On the other hand, when in a basic structure which is an aggregation of the height H1, a unique part of the height H2 is locally arranged, and the unique part is provided regularly, the disturbance of the height H has high regularity, and light diffraction can be realized as new optical scattering.

The ratio (ϕout/ϕin) between the convex bottom portion circumscribed circle diameter ϕout and the convex bottom portion inscribed circle diameter ϕin is a scale for indicating the distortion of the convex bottom portion outline A. The ratio (ϕout/ϕin) is preferably equal to or more than 1 but equal to or less than 3. When the ratio (ϕout/ϕin) is equal to 1, the convex bottom portion outline A is a perfect circle. In this case, since in design for the concave-convex structure (S), it is possible to make an optical simulation preferably act, it is easy to design the LED element. In terms of enhancing the light extraction efficiency LEE, the ratio (ϕout/ϕin) is preferably more than 1. On the other hand, the ratio (ϕout/ϕin) is equal to or less than 3, and thus it is possible to enhance the internal quantum efficiency IQE. That the ratio (ϕout/ϕin) is high means that the diameter of the convex bottom portion is significantly bent. In other words, it means that the convex bottom portion width lcvb and the concave portion bottom portion width lccb described above change depending on the direction of the measurement. In particular, since the concave portion bottom portion width lccb is important as a reference plane for the growth of the semiconductor crystal layer, the range described above needs to be satisfied. From this point of view, the ratio (ϕout/ϕin) is preferably equal to or less than 3, is more preferably equal to or less than 2 and is most preferably equal to or less than 1.5.

In terms of applying the disturbance of the convex bottom portion circumscribed circle diameter ϕout to the enhancement of the light extraction efficiency LEE in a state where the internal quantum efficiency IQE is maintained by the mechanism described above, the (standard deviation/arithmetic mean) for the convex bottom portion circumscribed circle diameter ϕout in the concave-convex structure (S) which is a factor for the disturbance is, in the widest range described above (0.025 to 0.8), preferably equal to or more than 0.03 but equal to or less than 0.4. In particular, when the (standard deviation/arithmetic mean) is equal to or more than 0.03, contribution to the light extraction efficiency LEE is made satisfactory whereas when the (standard deviation/arithmetic mean) is equal to or less than 0.4, contribution to the internal quantum efficiency IQE is made satisfactory. In the same terms, the (standard deviation/arithmetic mean) is preferably equal to or more than 0.04, is more preferably equal to or more than 0.05 and is most preferably equal to or more than 0.06. The (standard deviation/arithmetic mean) is preferably equal to or less than 0.35, is more preferably equal to or less than 0.25 and is most preferably equal to or less than 0.15.

In terms of applying the disturbance of the ratio (ϕout/ϕin) to the enhancement of the light extraction efficiency LEE in a state where the internal quantum efficiency IQE is maintained by the mechanism described above, the (standard deviation/arithmetic mean) for the ratio (ϕout/ϕin) of the concave-convex structure which is a factor for the disturbance is, in the widest range described above (0.025 to 0.8), preferably equal to or more than 0.03 but equal to or less than 0.35. In particular, when the (standard deviation/arithmetic mean) is equal to or more than 0.03, contribution to the light extraction efficiency LEE is made satisfactory whereas when the (standard deviation/arithmetic mean) is equal to or less than 0.35, contribution to the internal quantum efficiency IQE is made satisfactory. In the same terms, the (standard deviation/arithmetic mean) is preferably equal to or more than 0.04, is more preferably equal to or more than 0.05 and is most preferably equal to or more than 0.06. The (standard deviation/arithmetic mean) is preferably equal to or less than 0.25, is more preferably equal to or less than 0.15 and is most preferably equal to or less than 0.10.

Preferably, the convex bottom portion circumscribed circle diameter ϕout and the convex bottom portion circumscribed circle diameter ϕout/convex portion bottom portion inscribed circle diameter ϕin satisfy the range described above, and thus it is possible to increase the intensity of realizing new optical scattering (light diffraction or light scattering) based on the disturbance of the concave-convex structure (S). In other words, it is possible to increase the light extraction efficiency LEE in a state where the enhancement of the internal quantum efficiency IQE is maintained. This is because in order to increase the optical scattering caused by the disturbance of the concave-convex structure (S), volume variations of the concave-convex structure (S) are important. The element described above has disturbance, and thus it is possible to increase volume variations of the concave-convex structure (S), with the result that it is possible to increase a contrast in a part corresponding to an increase in the number of light diffraction modes or the disturbance of the effective medium approximation refractive index Nema. In other words, it is possible to increase optical scattering and enhance the light extraction efficiency LEE.

Preferably, the convex bottom portion circumscribed circle diameter ϕout and the height H described above satisfy the range of formula (A) above, and thus volume variations of the concave-convex structure (S) described above are increased, and the degree of the enhancement of the light extraction efficiency LEE is more increased. In terms of the same effect, the convex bottom portion circumscribed circle diameter ϕout, the height H and the interval P preferably satisfy the range of formula (A) above, and the convex bottom portion circumscribed circle diameter ϕout, the height H, the interval P and the convex bottom portion circumscribed circle diameter ϕout/convex portion bottom portion inscribed circle diameter ϕin more preferably satisfy the range of formula (A) above.

Preferably, in terms of the internal quantum efficiency IQE, the time for manufacturing the concave-convex structure (S) and the amount of semiconductor crystal used, the convex portion height H in the concave-convex structure (S) is twice or less as great as the interval P. In particular, when the height H is equal to or less than the average interval PS, the distribution of the refractive index of the concave-convex structure (S) is appropriate as seen from the emitted light, and thus it is possible to more enhance the light extraction efficiency LEE. From this point of view, the height H of the concave-convex structure (S) is more preferably 0.8 times or less as great as the average interval PS and is most preferably 0.6 times or less as great as the average interval PS.

In terms of applying the disturbance of the height H to the enhancement of the light extraction efficiency LEE in a state where the internal quantum efficiency IQE is maintained by the mechanism described above, the (standard deviation/arithmetic mean) for the height H of the concave-convex structure (S) which is a factor for the disturbance is, in the widest range described above (0.025 to 0.8), preferably equal to or more than 0.03 but equal to or less than 0.40. In particular, when the (standard deviation/arithmetic mean) is equal to or more than 0.03, contribution to the light extraction efficiency LEE is made satisfactory whereas when the (standard deviation/arithmetic mean) is equal to or less than 0.4, contribution to the internal quantum efficiency IQE is made satisfactory. In the same terms, the (standard deviation/arithmetic mean) is preferably equal to or more than 0.04, is more preferably equal to or more than 0.05 and is most preferably equal to or more than 0.12. The (standard deviation/arithmetic mean) is preferably equal to or less than 0.35, is more preferably equal to or less than 0.30 and is most preferably equal to or less than 0.25.

Preferably, the height H described above satisfies the range described above, and thus it is possible to increase the intensity of realizing new optical scattering (light diffraction or light scattering) based on the disturbance of the concave-convex structure (S). In other words, it is possible to increase the light extraction efficiency LEE in a state where the enhancement of the internal quantum efficiency IQE is maintained. This is because in order to increase the optical scattering caused by the disturbance of the concave-convex structure (S), volume variations of the concave-convex structure (S) are important. The element described above has disturbance, and thus it is possible to increase volume variations of the concave-convex structure (S), with the result that it is possible to increase a contrast in a part corresponding to an increase in the number of light diffraction modes or the disturbance of the effective medium approximation refractive index Nema. In other words, it is possible to increase optical scattering and enhance the light extraction efficiency LEE. In particular, preferably, since the height H and the interval P satisfy formula (A) above, and thus the effect of optical scattering is increased, the light extraction efficiency LEE is more enhanced. In terms of the same principle, more preferably, the height H, the interval P and the convex bottom portion circumscribed circle diameter ϕout satisfy formula (A) above, and more preferably, the height H, the interval P, the convex bottom portion circumscribed circle diameter ϕout and the convex bottom portion circumscribed circle diameter ϕout/convex portion bottom portion inscribed circle diameter ϕin satisfy formula (A) above.

The disturbance of the height H may have high regularity or lower regularity. For example, when there is a concave-convex structure (S) that has a center height H0, the minimum height H1 and the maximum height H2 and that includes a unique structure in which the height H falls within the above range and which has low regularity and disturbance, the regularity of the disturbance of the height H of the concave-convex structure (S) is lowered, and light scattering can be realized as new optical scattering. On the other hand, in a concave-convex structure (S) including a unique structure where the height H is increased and decreased periodically, the disturbance of the height H has high regularity, and light diffraction can be realized as new optical scattering. For example, when in a basic structure which is an aggregation of the height H1, a unique part of the height H2 is locally arranged, the unique part is dispersed irregularly, and thus the regularity of the disturbance of the height H in the concave-convex structure (S) is lowered, with the result that light scattering can be realized as new optical scattering. On the other hand, when in a basic structure which is an aggregation of the height H1, a unique part of the height H2 is locally arranged, and the unique part is provided regularly, the disturbance of the height H has high regularity, and light diffraction can be realized as new optical scattering.

The inclination angle Θ of the side surface of the convex portion 705 is determined by the shape parameters of the concave-convex structure (S) described above. In particular, preferably, the inclination angle is changed in a large number of steps from the apex to the bottom portion of the convex portion 705. For example, when inflection points in which the side surface of the convex portion 705 has an upward bulge draw one curve, the number of inclination angles is two. The inclination angles in a large number of steps described above are included, and thus it is possible to more increase the effect of optical scattering (light diffraction or light scattering) by the disturbance of the concave-convex structure, with the result that it is possible to enhance the light extraction efficiency LEE. By the materials of the optical substrate (IV) 710 and the semiconductor crystal layer, the inclination angle of the side surface of the convex portion 705 can be selected from the crystal surface that appears on the side surface. In this case, it is thought that the growth of the semiconductor crystal layer is made satisfactory, and thus it is possible to increase the internal quantum efficiency IQE.

<Concave-Convex Structure (L)>

The main function of the concave-convex structure (L) is to enhance the light extraction efficiency LEE. Hence, the structure is preferably a structure in which an optical scattering (light scattering or light diffraction) phenomenon or a reflection phenomenon is effectively produced on the light emitted from the semiconductor light-emitting element, and it is possible to adopt the concave-convex structure (L) that will be described below.

In terms of effectively realizing optical scattering (light diffraction or light scattering) or refection, the average interval PL of the concave-convex structure (L) is preferably equal to or more than 1000 nm but equal to or less than 100 μm. In particular, in terms of much more realizing light diffraction to effectively disturb the waveguide mode and thereby enhancing the light extraction efficiency LEE, the average interval PL is preferably equal to or more than 1200 nm, is more preferably equal to or more than 1500 nm and is most preferably equal to or more than 2000 nm. On the other hand, in terms of a time for manufacturing the concave-convex structure (L) and the amount of semiconductor crystal layer used, the upper limit value is preferably equal to or less than 50 μm, is more preferably equal to or less than 20 μm and is most preferably equal to or less than 10 μm.

It is thought that when the disturbance described above is added to the interval P of the concave-convex structure (L), and thus the principle for enhancing the light extraction efficiency LEE with the concave-convex structure (L) depends on optical scattering (light diffraction or light scattering), the degree of the enhancement of the light extraction efficiency LEE is more increased. This is attributable to the fact that the light extraction efficiency LEE is the essence of changing the direction of travel of the emitted light which is reflected multiple times by the waveguide mode. In other words, in order to effectively enhance the light extraction efficiency LEE, it is necessary to extract the emitted light reaching the concave-convex structure (L) from the semiconductor light-emitting element without the waveguide mode being formed again. It is also necessary to reduce the number of times the emitted light where the waveguide mode is disturbed is reflected until it is extracted from the semiconductor light-emitting element. It is thought that since the concave-convex structure (L) has disturbance, and thus the number of light diffraction modes by the concave-convex structure (L) is increased, the diversity of the direction of travel of the emitted light is increased. It is thought that since this means that the probability that the emitted light reaching the concave-convex structure (L) forms the waveguide mode again is reduced, it is possible to control attenuation caused by the absorption of the emitted light in the first semiconductor layer 730, the light-emitting semiconductor layer 740 and the second semiconductor layer 750. In terms of what has described above, the (standard deviation/arithmetic mean) for the interval P of the concave-convex structure (L) is, in the widest range described above (0.025 or more but 0.8 or less), preferably equal to or more than 0.03 but equal to or less than 0.5. In particular, when the (standard deviation/arithmetic mean) is equal to or more than 0.03, contribution to the light extraction efficiency LEE is made satisfactory whereas when the (standard deviation/arithmetic mean) is equal to or less than 0.4, contribution to the internal quantum efficiency IQE is made satisfactory. In the same terms, the (standard deviation/arithmetic mean) is preferably equal to or more than 0.035 and is more preferably equal to or more than 0.04. The (standard deviation/arithmetic mean) is more preferably equal to or less than 0.35, is more preferably equal to or less than 0.25 and is most preferably equal to or less than 0.15.

The disturbance of the interval P of the concave-convex structure (L) may have high regularity or low regularity as with the disturbance of the interval P of the concave-convex structure (S) described above.

As the arrangement of the concave-convex structure (L), in terms of enhancing the light extraction efficiency LEE, it is possible to adopt a hexagonal arrangement, a quasi-hexagonal arrangement, a quasi-tetragonal arrangement, a square arrangement, an arrangement obtained by combing these arraignments or an arrangement having low regularity. In particular, in terms of enhancing the internal quantum efficiency IQE even with the concave-convex structure (L), a hexagonal arrangement is preferably adopted. It is also possible to adopt an arrangement obtaining by thinning out convex portions partially from a plurality of convex portions provided in a hexagonal arrangement. By adopting such an arrangement, it is possible to reduce the increase in the forward potential of the semiconductor light-emitting element. For example, there is an arrangement in which in a state where a convex portion is provided on the lattice point of a hexagonal lattice, the center point of the hexagonal lattice is closely packed with units having no convex portion.

The convex portion apex width Icvt of the concave-convex structure (L) is not particularly limited to the material of the concave-convex structure (L) as long as the concave-convex structure (S) is provided on the convex portion 703 of the concave-convex structure (L). This is because when the materials of the concave-convex structure (L) and the substrate main body 702 are different, the first semiconductor layer 730 is grown from the surface to which the substrate main body 702 is exposed. On the other hand, this is because when the materials of the concave-convex structure (L) and the substrate main body 702 are the same, dislocations produced from the apex of the convex portion 703 in the concave-convex structure (L) can be reduced by the concave-convex structure (S). When the materials of the concave-convex structure (L) and the substrate main body 702 are the same, in terms of enhancing the internal quantum efficiency IQE and the light extraction efficiency LEE regardless of the arrangement of the concave-convex structure (S) with respect to the concave-convex structure (L), the ratio (Icvt/Icct) between the convex portion apex width Icvt and the concave portion opening width Icct in the concave-convex structure (L) is preferably minimized, and practically the ratio is most preferably 0. Icvt/Icct=0 means Icvt=0 nm. However, for example, even when Icvt is measured with a scanning electron microscope, it is impossible to measure 0 nm accurately. Hence, Icvt here is assumed to include all cases where measurement resolution cannot be achieved. When the ratio (Icvt/Icct) is equal to or less than 3, it is possible to satisfactorily maintain the film formation of the semiconductor light-emitting element. This is because it is possible to reduce the amount of semiconductor crystal grown from the apex of the convex portion 703 in the concave-convex structure (L). Furthermore, (Icvt/Icct) is equal to or less than 1, and thus it is possible to enhance the light extraction efficiency LEE. This is because the distribution of the refractive index of the concave-convex structure (L) formed with the optical substrate (IV) 710 and the semiconductor crystal layer is appropriate as seen from the emitted light. In terms of significantly enhancing both the internal quantum efficiency IQE and the light extraction efficiency LEE described above, (Icvt/Icct) is equal to or less than 0.4, is more preferably equal to or less than 0.2 and is further preferably equal to or less than 0.15.

Preferably, in a case where the materials of the concave-convex structure (L) and the substrate main body 702 are the same, when the bottom portion of the concave portion 704 in the concave-convex structure (L) has a flat surface, it is possible to enhance the internal quantum efficiency IQE and reduce the difference between the semiconductor crystal film formation devices. In order to enhance the internal quantum efficiency IQE in the LED element, it is necessary to disperse dislocations within the semiconductor crystal layer and to reduce the microscopical and macroscopical dislocation densities. Here, the initial conditions of these physical phenomena are nucleation and growth when the semiconductor crystal layer is formed into a film by chemical vapor deposition (CVD). Since a flat surface is included on the bottom portion of the concave portion 704 in the concave-convex structure (L), and thus it is possible to preferably produce nucleation, it is possible to stabilize the growth of the semiconductor crystal layer. Consequently, it is possible to more increase the internal quantum efficiency IQE. In terms of what has been described above, the ratio (Icvb/Iccb) between the convex bottom portion width Icvb and the concave portion bottom portion width Iccb in the concave-convex structure (S) is preferably equal to or less than 5. In particular, in terms of more facilitating the growth of the semiconductor crystal layer where the bottom portion of the concave portion 704 in the concave-convex structure (S) is a reference plane, (Icvb/Iccb) is more preferably equal to or less than 2, and is most preferably equal to or less than 1.

On the other hand, when the materials of the concave-convex structure (L) and the substrate main body 702 are different, the concave-convex structure (L) is partially provided on the substrate main body 702, that is, the exposed surface is present on the substrate main body 702, and thus the growth of the first semiconductor layer 730 is realized. Hence, the concave-convex structure (L) when the materials of the concave-convex structure (L) and the substrate main body 702 are different is formed with a plurality of convex portions provided on the substrate main body 702 and the exposed substrate main body 702 where no convex portion is provided. For example, when the substrate main body 702 is formed of sapphire, SiC, a nitride semiconductor, Si or spinel, it is possible to provide the convex portion 703 which is formed of $SiO_2$. In other words, the concave-convex structure (L) is formed with the substrate main body 702 and $SiO_2$.

Furthermore, when the convex portion apex width Icvt is smaller than the convex bottom portion width Icvb, it is easy to simultaneously satisfy the ratio (Icvt/Icct) and the ratio (Icvb/Iccb) described above, with the result that it is possible to increase the internal quantum efficiency IQE by the mechanism already described. When the convex portion apex width Icvt is smaller than the convex bottom portion width Icvb, since it is possible to effectively realize the growth of the semiconductor crystal layer in the horizontal direction, the effect of reducing the dislocation density is further enhanced, and the degree of the enhancement of the internal quantum efficiency IQE is increased.

When the concave-convex structure (L) is a dot structure, it is easy to control the convex portion apex width Icvt and the convex bottom portion width Icvb, and it is easy to simultaneously satisfy the ratio (Icvt/Icct) and the ratio (Icvb/Iccb), with the result that it is possible to increase the internal quantum efficiency IQE and the light extraction efficiency LEE by the mechanism already described.

In terms of enhancing the internal quantum efficiency IQE, the duty expressed by the ratio (Icvb/P) between the convex bottom portion width Icvb and the interval P is preferably equal to or more than 0.03 but equal to or less than 0.83. When the ratio is equal to or more than 0.03, the stability of the growth of the semiconductor crystal layer is increased, and the effect of the growth of the semiconductor crystal layer in the horizontal direction is increased. In terms of the same effect, the ratio (Icvb/P) is more preferably equal to or more than 0.17, and is most preferably equal to or more than 0.33. On the other hand, when the ratio is equal to or less than 0.83, it is possible to satisfactorily perform nucleation and core growth by chemical vapor deposition on the semiconductor crystal layer, and thus it is possible to enhance the internal quantum efficiency IQE. In terms of the same effect, the ratio (Icvb/P) is more preferably equal to or less than 0.73, and is most preferably equal to or less than 0.6.

The convex bottom portion circumscribed circle diameter ϕout and the convex bottom portion circumscribed circle diameter ϕout/convex portion bottom portion inscribed circle diameter ϕin satisfy formula (A) above, and thus it is possible to effectively realize optical scattering, with the result that it is possible to effectively increase the light extraction efficiency LEE. That the convex bottom portion circumscribed circle diameter ϕout has disturbance means that the duty has disturbance.

The aspect ratio is equal to or more than 0.1, and thus it is possible to enhance the light extraction efficiency LEE with the concave-convex structure (L) through optical scattering. In particular, in terms of more enhancing the light extraction efficiency LEE with new optical scattering through the disturbance of the height H of the concave-convex structure (L) and the disturbance of the interval P of the concave-convex structure (L) described above, the aspect ratio is preferably equal to or more than 0.3, is more preferably equal to or more than 0.5 and is most preferably equal to or more than 0.8. On the other hand, preferably, the aspect ratio is equal to or less than 5, and thus it is possible to reduce a time for manufacturing the concave-convex structure (L) and to reduce the amount of semiconductor crystal. In terms of the same effect, the aspect ratio is more preferably equal to or less than 2, and is most preferably equal to or less than 1.5.

Preferably, when the height H has the disturbance that satisfies formula (A) above, optical scattering is effectively increased as described in the concave-convex structure (S). In this case, the aspect ratio has disturbance simultaneously. The disturbance of the height H of the concave-convex structure (L) may have high regularity or lower regularity. In other words, the disturbance of the aspect ratio may have high regularity or lower regularity. For example, when there is a concave-convex structure (L) that has a center height H0, the minimum height H1 and the maximum height H2 and that includes a unique structure in which the height H falls within the above range and which has low regularity and disturbance, the regularity of the disturbance of the height H of the concave-convex structure (L) is lowered, and light scattering can be realized as new optical scattering. On the other hand, in the concave-convex structure (L) including a unique structure where the height H is increased and decreased periodically, the disturbance of the height H has high regularity, and light diffraction can be realized as new optical scattering. For example, when in a basic structure which is an aggregation of the height H1, a unique part of the height H2 is locally arranged, the unique part is dispersed irregularly, and thus the regularity of the disturbance of the height H in the concave-convex structure (L) is lowered, with the result that light scattering can be realized as new optical scattering. On the other hand, when in a basic structure which is an aggregation of the height H1, a unique part of the height H2 is locally arranged, and the unique part is provided regularly, the disturbance of the height H has high regularity, and light diffraction can be realized as new optical scattering.

The ratio (ϕout/ϕin) between the convex bottom portion circumscribed circle diameter ϕout and the convex bottom portion inscribed circle diameter ϕin is a scale for indicating the distortion of the convex bottom portion outline A. The ratio (ϕout/ϕin) is preferably equal to or more than 1 but equal to or less than 10. When the ratio (ϕout/ϕin) is equal to 1, the convex bottom portion outline A is a perfect circle. In this case, since in design for the concave-convex structure (L), it is possible to make an optical simulation preferably act, it is easy to design the LED element. In terms of enhancing the light extraction efficiency LEE, the ratio (ϕout/ϕin) is preferably more than 1. On the other hand, the ratio (ϕout/ϕin) is equal to or less than 10, and thus it is possible to enhance the internal quantum efficiency IQE. That the ratio (ϕout/ϕin) is high means that the diameter of the bottom portion of the convex portion 703 is significantly bent. In other words, it means that the convex bottom portion width Icvb and the concave portion bottom portion width Iccb described above change depending on the direction of the measurement. In particular, since the concave portion bottom portion width Iccb is important as a reference plane for the growth of the semiconductor crystal layer, the range described above needs to be satisfied. From this point of view, the ratio (ϕout/ϕin) is preferably equal to or less than 5, is more preferably equal to or less than 3 and is most preferably equal to or less than 2.

In terms of applying the disturbance of the convex bottom portion circumscribed circle diameter ϕout to the enhancement of the light extraction efficiency LEE in a state where the internal quantum efficiency IQE is maintained by the mechanism described above, the (standard deviation/arithmetic mean) for the convex bottom portion circumscribed circle diameter ϕout in the concave-convex structure (L) which is a factor for the disturbance can satisfy the range described in the concave-convex structure (S).

In terms of applying the disturbance of the ratio (ϕout/ϕin) to the enhancement of the light extraction efficiency LEE in a state where the internal quantum efficiency IQE is maintained by the mechanism described above, the (standard deviation/arithmetic mean) for the ratio (ϕout/ϕin) of the concave-convex structure (L) which is a factor for the disturbance can satisfy the range described in the concave-convex structure (S).

Preferably, the convex bottom portion circumscribed circle diameter ϕout and the convex bottom portion circumscribed circle diameter ϕout/convex portion bottom portion inscribed circle diameter ϕin satisfy the range described above, and thus it is possible to increase the intensity of realizing new optical scattering (light diffraction or light scattering) based on the disturbance of the concave-convex structure (L). This is because in order to increase the optical scattering caused by the disturbance of the concave-convex structure (L), volume variations of the concave-convex structure (L) are important. The element described above has disturbance, and thus it is possible to increase volume variations of the concave-convex structure (L), with the result that it is possible to increase the number of light diffraction modes. In other words, it is possible to increase optical scattering and enhance the light extraction efficiency LEE.

Preferably, the convex bottom portion circumscribed circle diameter ϕout and the height H described above satisfy the range of formula (A) above, and thus volume variations of the concave-convex structure (L) described above are increased, and the degree of the enhancement of the light extraction efficiency LEE is more increased. In terms of the same effect, the convex bottom portion circumscribed circle diameter ϕout, the height H and the interval P preferably satisfy the range of formula (A) above, and the convex bottom portion circumscribed circle diameter ϕout, the height H, the interval P and the convex bottom portion circumscribed circle diameter ϕout/convex portion bottom portion inscribed circle diameter ϕin more preferably satisfy the range of formula (A) above.

Preferably, in terms of the time for manufacturing the concave-convex structure (L) and the amount of semiconductor crystal used, the height H of the convex portion 703 in the concave-convex structure (L) is twice or less as great as the average interval P. In particular, when the height H is equal to or less than the average interval PL, the distribution of the refractive index of the concave-convex structure (L) is appropriate as seen from the emitted light, and thus it is possible to more enhance the light extraction efficiency LEE. From this point of view, the height H of the concave-convex structure (L) is more preferably 0.8 times or less as great as the average interval P and is most preferably 0.6 times or less as great as the average interval P.

In terms of applying the disturbance of the height H to the enhancement of the light extraction efficiency LEE in a state where the internal quantum efficiency IQE is maintained by the mechanism described above, the (standard deviation/arithmetic mean) for the height H of the concave-convex structure (L) which is a factor for the disturbance can satisfy the range described in the concave-convex structure (S).

Preferably, the height H described above satisfies the range described above, and thus it is possible to increase the intensity of realizing new optical scattering (light diffraction or light scattering) based on the disturbance of the concave-convex structure (L). This is because in order to increase the optical scattering caused by the disturbance of the concave-convex structure (L), volume variations of the concave-convex structure (L) are important. The element described above has disturbance, and thus it is possible to increase volume variations of the concave-convex structure (L), with the result that it is possible to increase the number of light diffraction modes. In other words, it is possible to increase optical scattering and enhance the light extraction efficiency LEE. In particular, preferably, since the height H and the interval P satisfy formula (A) above, and thus the effect of optical scattering is increased, the light extraction efficiency LEE is more enhanced. In terms of the same principle, more preferably, the height H, the interval P and the convex bottom portion circumscribed circle diameter ϕout satisfy formula (A) above, and more preferably, the height H, the interval P, the convex bottom portion circumscribed circle diameter ϕout and the convex bottom portion circumscribed circle diameter ϕout/convex portion bottom portion inscribed circle diameter ϕin satisfy formula (A) above.

The disturbance of the height H may have high regularity or lower regularity. For example, when there is a concave-convex structure (L) that has a center height H0, the minimum height H1 and the maximum height H2 and that includes a unique structure in which the height H falls within the above range and which has low regularity and disturbance, the regularity of the disturbance of the height H of the concave-convex structure (L) is lowered, and light scattering can be realized as new optical scattering. On the other hand, in the concave-convex structure (L) including a unique structure where the height H is increased and decreased periodically, the disturbance of the height H has high regularity, and light diffraction can be realized as new optical scattering. For example, when in a basic structure which is an aggregation of the height H1, a unique part of the height H2 is locally arranged, the unique part is dispersed irregularly, and thus the regularity of the disturbance of the height H in the concave-convex structure (L) is lowered, with the result that light scattering can be realized as new optical scattering. On the other hand, when in a basic structure which is an aggregation of the height H1, a unique part of the height H2 is locally arranged, and the unique part is provided regularly, the disturbance of the height H has high regularity, and light diffraction can be realized as new optical scattering.

The inclination angle Θ of the side surface of the convex portion 703 is determined by the shape parameters of the concave-convex structure (L) described above. In particular, preferably, the inclination angle is changed in a large number of steps from the apex to the bottom portion of the convex portion 703. For example, when inflection points in which the side surface of the convex portion 703 has an upward bulge draw one curve, the number of inclination angles is two. The inclination angles in a large number of steps described above are included, and thus it is possible to more increase the effect of optical scattering (light diffraction or light scattering) by the disturbance of the concave-convex structure (L), with the result that it is possible to enhance the light extraction efficiency LEE. By the materials of the optical substrate (IV) 710 and the semiconductor crystal layer, the inclination angle of the side surface of the convex portion 703 can be selected from the crystal surface that appears on the side surface. In this case, it is thought that the growth of the semiconductor crystal layer is made satisfactory, and thus it is possible to increase the internal quantum efficiency IQE.

FIG. 32C is a cross-sectional schematic diagram showing another example of the optical substrate (IV) according to the fourth embodiment. As shown in FIG. 32C, on the surface of the optical substrate (IV) 710, the concave-convex structure (S) having a high structure density is provided, and on at least a part of the surface of the concave-convex structure (S), the concave-convex structure (L) having wide variations in volume is provided. More specifically, on the main surface of the substrate main body 702 in the optical substrate (IV) 710, the concave-convex structure (S) formed with a plurality of convex portions 705 and concave portions 706 is formed, furthermore, a plurality of convex portions 703 are formed apart from each other such that the surface of the concave-convex structure (S) is partially exposed and thus the concave-convex structure (L) is formed.

In this configuration, it is possible to enhance the internal quantum efficiency IQE with the concave-convex structure (S) exposed between the convex portions 703 of the concave-convex structure (L), and thus it is possible to enhance the light extraction efficiency LEE with the concave-convex structure (L) through optical scattering (light diffraction or light scattering).

As shown in FIG. 32C, the concave-convex structure (L) is provided on part of the surface of the concave-convex structure (S), and thus it is possible to enhance the internal quantum efficiency IQE and to enhance the light extraction efficiency LEE. This is because it is possible to disperse and reduce dislocations within the semiconductor crystal layer with the concave-convex structure (S) and it is also possible to disturb the waveguide mode with optical scattering by concave-convex structure (L).

When the materials of the concave-convex structure (L) and the substrate main body 702 are different, the concave-convex structure (L) may be a structure such a disk shape or an n-sided column ($n \geq 3$) where the convex portion apex width Icvt and the convex bottom portion width Icvb are substantially the same. In particular, preferably, in terms of reducing cracks produced within the first semiconductor layer 730, the convex portion apex width Icvt of the concave-convex structure (L) is smaller than the convex bottom portion width Icvb of the concave-convex structure (L).

On the other hand, when the materials of the concave-convex structure (L) and the substrate main body 702 are the same, in order for dislocations produced from the apex of the convex portion 703 in the concave-convex structure (L) to be reduced, the apex of the convex portion 703 in the concave-convex structure (L) is smaller than the bottom portion thereof. In particular, preferably, the apex of the convex portion 703 in the concave-convex structure (L) is continuously connected to the side surface portion thereof, that is, the convex portion apex width Icvt is closer to 0.

Furthermore, in terms of more enhancing the internal quantum efficiency IQE even with the concave-convex structure (L), the concave-convex structure (L) is preferably a dot structure formed with a plurality of convex portions 703. This is because it is possible to reduce, by growth in the horizontal direction, dislocations within the semiconductor crystal layer grown from the concave portion 704 provided between the convex portions 703. In terms of the same effect, the convex portion apex width Icvt of the concave-convex structure (L) is preferably smaller than the convex bottom portion width Icvb.

On the other hand, preferably, in terms of enhancing the internal quantum efficiency IQE, the concave-convex structure (S) is a dot structure formed with a plurality of convex portions 705, and the bottom portion of the concave portion 706 in the concave-convex structure (S) has a flat surface. Furthermore, preferably, the convex portion apex width Icvt of the concave-convex structure (S) is smaller than the convex bottom portion width Icvb, and thus the dispersion of dislocations is facilitated. Most preferably, the convex portion apex width Icvt is closer to 0, and the apex of the convex portion 705 and the side surface portion are continuous. The size of the flat surface is preferably equal to or more than 30 nm. Here, the size of the flat surface is defined as the shortest distance between the outer edge portions of the bottom portions of the convex portions 705 closest to each other. Since the size of the flat surface is equal to or more than 30 nm, and thus it is possible to satisfactorily maintain the initial growth of the semiconductor crystal layer, the effect of improving the internal quantum efficiency IQE is increased. In the same terms, the size of the flat surface is more preferably equal to or more than 60 nm, and is most preferably equal to or more than 80 nm.

As described above, the main function of the concave-convex structure (S) is to improve the internal quantum efficiency IQE. Hence, the material of the concave-convex structure (S) is preferably the material of the optical substrate (IV) 710. On the other hand, the main function of the concave-convex structure (L) is to improve the light extraction efficiency LEE. Hence, the material of the concave-convex structure (L) may be the same as or different from the material of the optical substrate (IV) 710.

Particularly preferably, the arrangement of the concave-convex structure (L) and the concave-convex structure (S) for enhancing both the internal quantum efficiency IQE and the light extraction efficiency LEE with the concave-convex structure surface 720 described above and shown in FIG. 32C satisfies the following arrangement and shape.

<Concave-Convex Structure (S)>

The main function of the concave-convex structure (S) is to enhance the internal quantum efficiency IQE. Hence, in terms of the same effect, it is possible to adopt the arrangement and the shape of the concave-convex structure (S) described with reference to FIGS. 45A to 45C.

<Concave-Convex Structure (L)>

The main function of the concave-convex structure (L) is to enhance the light extraction efficiency LEE. Hence, in terms of the same effect, it is possible to adopt the arrangement and the shape of the concave-convex structure (L) described with reference to FIGS. 45A to 45C.

A case where the optical substrate according to the fourth embodiment is applied to the semiconductor light-emitting element (LED) will then be described. The concave-convex structure surface 720 is formed with the concave-convex structure (L) and the concave-convex structure (S), and thus the optical substrate according to the present embodiment realizes two major effects.

(1) Enhancement of the Internal Quantum Efficiency IQE

It is possible to disturb the growth mode of the semiconductor crystal layer with a minute concave-convex structure (S). Thus, it is possible to remove, in the vicinity of the concave-convex structure (S), dislocations produced by a lattice mismatch between the semiconductor crystal layer and the optical substrate. In other words, the dislocations within the semiconductor crystal layer are dispersed according to the concave-convex structure (S), and the dislocation density is reduced. It is thought that this enhances the internal quantum efficiency IQE.

(2) Enhancement of the Light Extraction Efficiency LEE

With the concave-convex structure (L) having wide variations in volume, it is possible to remove the waveguide mode of the emitted light produced within the semiconductor crystal layer by optical scattering (light diffraction or light scattering). This means that the direction of travel of the emitted light which can travel only in a predetermined direction due to the waveguide mode is changed. In other words, the light emitted from the light-emitting layer is extracted from the element by optical scattering caused by the concave-convex structure (L).

As described with reference to FIGS. 32C and 45A to 45C, the concave-convex structure surface 720 is formed with the concave-convex structure (L) and the concave-convex structure (S), and thus it is possible to simultaneously realize the effects of (1) and (2) above. In other words, the enhancement of the internal quantum efficiency IQE is realized, and thus it is possible to increase the light extraction efficiency LEE in a state where the enhancement of the internal quantum efficiency IQE is maintained.

In other words, it is possible to enhance the efficiency of light emission itself and effectively extract the emitted light from the LED. Hence, the LED element manufactured with the optical substrate (IV) 710 according to the fourth embodiment has a small amount of heat generation. The small amount of heat generation means that it is possible not only to enhance the long-term stability of the LED element but also to reduce a load (for example, the provision of a heat generating member excessively) for heat generation measures.

In the optical substrate (IV) 710 according to the fourth embodiment, as the material of the substrate main body 702, the same material as in the optical substrate (I) 1 according to the first embodiment, the optical substrate (II) 2 according to the second embodiment and the optical substrate (III) according to the third embodiment can be adopted.

The optical substrate (IV) 710 may be removed at least in a step after the deposition of the first semiconductor layer 730. Since the optical substrate (IV) 710 is removed, and thus the effect of disturbing the waveguide mode is increased, the light extraction efficiency LEE is significantly enhanced. In this case, preferably, the surface through which the light is emitted from the semiconductor light-emitting element is on the side of the first semiconductor layer 730 as seen from the light-emitting semiconductor layer 740.

As the material of the concave-convex structure when the materials of the substrate main body 702 and the concave-convex structure are different, for example, the material of the substrate main body 702 described above, $SiO_2$ or the like can be used.

The semiconductor light-emitting element to which the optical substrate (IV) according to the fourth embodiment is applied will then be described.

In the semiconductor light-emitting element according to the fourth embodiment, at least one or more optical substrates (IV) 710 described above are included in the configuration. The optical substrates (IV) 710 are included in the configuration, and thus it is possible to achieve the enhancement of the internal quantum efficiency IQE and the enhancement of the light extraction efficiency LEE.

The semiconductor light-emitting element according to the fourth embodiment includes a deposited semiconductor layer formed by depositing, for example, on the concave-convex structure surface 720, at least two or more semiconductor layers and the light-emitting semiconductor layers.

In the semiconductor light-emitting element according to the fourth embodiment, as an n-type semiconductor layer, the n-type semiconductor layer of the semiconductor light-emitting element using the optical substrate (I) 1 according to the first embodiment, the optical substrate (II) 2 according to the second embodiment or the optical substrate (III) according to the third embodiment can be adopted.

The light-emitting semiconductor layer 740 is not particularly limited as long as it has light emission characteristics as an LED; the light-emitting semiconductor layer of the semiconductor light-emitting element using the optical substrate (I) 1 according to the first embodiment, the optical substrate (II) 2 according to the second embodiment or the optical substrate (III) according to the third embodiment can be adopted.

The material of the p-type semiconductor layer is not particularly limited as long as it can be used as a p-type semiconductor layer suitable for an LED. For example, the p-type semiconductor layer of the semiconductor light-emitting element using the optical substrate (I) 1 according to the first embodiment, the optical substrate (II) 2 according to the second embodiment or the optical substrate (III) according to the third embodiment can be adopted.

The material of the transparent conductive film 760 is not particularly limited as long as it can be used as a transparent conductive film suitable for an LED. For example, the transparent conductive film of the semiconductor light-emitting element using the optical substrate (I) 1 according to the first embodiment, the optical substrate (II) 2 according to the second embodiment or the optical substrate (III) according to the third embodiment can be adopted.

The deposited semiconductor layer (the n-type semiconductor layer, the light-emitting semiconductor layer and the p-type semiconductor layer) can be formed into a film on the surface of the concave-convex structure surface 710 by a known technology. For example, as the film formation method, a metal organic chemical vapor deposition method (MOCVD), a hydride vapor phase epitaxy method (HVPE), and a molecular beam epitaxy method (MBE) can be applied.

The concave-convex structures 801 to 808 in the semiconductor light-emitting element 830 discussed above will be described. As the outer shape and the arrangement of the concave-convex structure of the concave-convex structure 801, the outer shape and the arrangement of the concave-convex structure of the concave-convex structure surface 720 described above can be adopted. When the emitted light that is reflected off the surface opposite to the light-emitting semiconductor layer 740 of the optical substrate (IV) 710 is extracted with the concave-convex structure 801, as an optical phenomenon, any of effective medium approximation, light diffraction and light scattering can be adopted. When the wavelength of the emitted light is assumed to be $\lambda$, and the average interval P in the concave-convex structure 801 substantially satisfies $P/\lambda \leq 0.5$, treatment as effective medium approximation can be performed. In this case, it is impossible to remove a critical angle. However, when the light emission characteristics are controlled with the concave-convex structure surface 720, and the emitted light is directed up substantially vertically, the light extraction efficiency LEE is significantly enhanced. On the other hand, preferably, light diffraction or light scattering is utilized, and thus the effect of disturbing the waveguide mode is increased. In particular, more preferably, for the concave-convex structure 801, optical scattering (light diffraction or light scattering) is utilized. Hence, the average interval $P_{ave}$ in the concave-convex structure 801 is preferably equal to or more than 200 nm but equal to or less than 50 μm, is more preferably equal to or more than 450 nm but equal to or less than 10 μm and is most preferably equal to or more than 800 nm but equal to or less than 5 μm.

As the concave-convex structures 802 to 808, the shape, the arrangement, the size and the like of the concave-convex structure of the concave-convex structure surface 720 described above can be adopted, and thus it is possible to realize the effects (the enhancement of the electron injection efficiency EIE, the enhancement of the light extraction efficiency LEE, the increase of the area of the semiconductor light-emitting element, the reduction of electrical separation and the reduction of wiring separation) corresponding to the concave-convex structure.

In the fourth optical substrate (IV) 710 described above, the concave-convex structures (the concave-convex structures (S) and the concave-convex structures (L)) described above are arranged on a part or the whole of the surface of the optical substrate. A part or the whole mentioned here is the same as in the description of the optical substrate (I) 1 according to the first embodiment and the optical substrate (II) 2 according to the second embodiment. The expressions used in the description are preferably changed as necessary so as to be applied to the fourth embodiment.

A method of manufacturing the optical substrate (IV) 710 according to the fourth embodiment will then be described.

The method of manufacturing the optical substrate (IV) 710 according to the present embodiment is not limited as long as the conditions described above are satisfied and the concave-convex structure is included.

In the case of the optical substrate (IV) 710, the concave-convex structure (L) is produced, then the concave-convex structure (S) is produced and thus it is possible to manufacture the concave-convex structure surface 720. The method of manufacturing the concave-convex structure (L) can be divided into two.

(1) Case where the Substrate Main Body is Directly Processed to Provide the Concave-Convex Structure (L)

Examples of a method of directly processing the substrate main body 702 to provide the concave-convex structure (L) include a transfer method, a photolithography method, a thermal lithography method, an electron beam drawing method, an interference exposure method, a lithography method using nanoparticles as a mask and a lithography method using a self-organized structure as a mask. In particular, preferably, in terms of the processing accuracy and the processing speed of the concave-convex structure in the substrate main body 702, a photolithography method or a transfer method is adopted. As an etching method, either of wet etching and dry etching may be adopted. In particular, when the surface orientation of the side surface of the convex portion in the concave-convex structure (L) is accurately controlled, wet etching is preferably adopted. A transfer method will be described later.

(2) Case where the Concave-Convex Structure (L) is Separately Provided on the Substrate Main Body Examples of a method of separately providing the concave-convex structure (L) on the substrate main body 702 include: a transfer method; a method of forming, on the substrate main body 702, a thin film containing particles and thereafter removing a binder filling the areas between the particles; a method of partially removing a resist formed into a film on the substrate main body 702, filling the removed part with the material of the concave-convex structure (L) (for example, evaporation, a sputtering method or an electroforming method) and finally removing the resist; and a method of forming the material of the concave-convex structure (L) into a film on the substrate and directly processing the material of the concave-convex structure (L) formed into a film.

With the method described above, the concave-convex structure (L) is produced, then the concave-convex structure (S) is produced and thus it is possible to manufacture the concave-convex structure surface 720.

Examples of a method of providing the concave-convex structure (S) on the concave-convex structure (L) include a transfer method, a photolithography method, a thermal lithography method, an electron beam drawing method, an interference exposure method, a lithography method using nanoparticles as a mask and a lithography method using a self-organized structure as a mask. In particular, preferably, in terms of the processing accuracy and the processing speed of the concave-convex structure in the substrate main body 702, a lithography method using nanoparticles as a mask or a transfer method is adopted. A transfer method will be described later.

The concave-convex structure (S) is produced, then the concave-convex structure (L) is produced and thus it is also possible to manufacture the concave-convex structure surface 720.

Examples of a method of providing the concave-convex structure (S) include a transfer method, a photolithography method, a thermal lithography method, an electron beam drawing method, an interference exposure method, a lithography method using nanoparticles as a mask and a lithography method using a self-organized structure as a mask. In particular, preferably, in terms of the processing accuracy and the processing speed of the concave-convex structure in the substrate main body 702, a lithography method using nanoparticles as a mask or a transfer method is adopted. A transfer method will be described later.

The concave-convex structure (L) is produced in the substrate main body 702 including the concave-convex structure (S), and thus it is possible to manufacture the concave-convex structure surface 720.

The concave-convex structure (S) in the substrate main body 702 is further processed, and thus it is possible to manufacture the concave-convex structure surface 720. Examples of a method of further processing the concave-convex structure (S) include a transfer method, a photolithography method, a thermal lithography method, an electron beam drawing method, an interference exposure method, a lithography method using nanoparticles as a mask and a lithography method using a self-organized structure as a mask. In particular, preferably, in terms of the processing accuracy and the processing speed of the concave-convex structure in the optical substrate (IV) 710, a photolithography method or a transfer method is adopted. A transfer method will be described later.

When as described with reference to FIG. 7B, the optical substrate (IV) 710 is separately provided with a concave-convex structure layer having the concave-convex structure surface 720 in the substrate main body 702, the concave-convex structure (S) is produced, then the concave-convex structure (L) is produced and thus it is possible to manufacture the concave-convex structure surface 720.

Examples of a method of providing the concave-convex structure (S) include a transfer method, a photolithography method, a thermal lithography method, an electron beam drawing method, an interference exposure method, a lithography method using nanoparticles as a mask and a lithography method using a self-organized structure as a mask. In particular, preferably, in terms of the processing accuracy and the processing speed of the concave-convex structure in the concave-convex structure surface 720, a lithography method using nanoparticles as a mask or a transfer method is adopted. A transfer method will be described later.

The concave-convex structure (L) is separately provided on a substrate including the concave-convex structure (S), and thus it is possible to manufacture the optical substrate (IV) 710.

Examples of a method of separately providing the concave-convex structure (L) include a transfer method and a method of forming, on the substrate main body 702, a thin film containing particles and thereafter removing a binder filling the areas between the particles. The examples also include a method a method of partially removing a resist formed into a film on the substrate main body 702, filling the removed part with the material of the concave-convex structure (S) (for example, evaporation, a sputtering method or an electroforming method) and finally removing the resist. The examples also include a method of forming the material of the concave-convex structure (L) into a film and directly processing the film of the concave-convex structure (L) formed into a film.

(Transfer Method)

A transfer method is defined as a method including a method of transferring, to a processed member (substrate main body), the minute pattern of a mold having a minute pattern on its surface. Specifically, the transfer method is a method that includes at least a method of laminating the minute pattern of the mold and the processed member through a transfer member and a method of separating the mold. More specifically, the transfer method can be divided into two.

The first is a case where the transfer member transferred to the processed member is used as a permanent agent. In this case, the materials of the substrate main body and the concave-convex structure are different. Characteristically, the concave-convex structure is left as the permanent agent, and is used as the semiconductor light-emitting element. Preferably, since the semiconductor light-emitting element is used for a long period of several tens of thousands of hours, when the transfer member is used as the permanent agent, the material of the transfer member contains a metal element. In particular, preferably, a metal alkoxide that produces a hydrolysis-polycondensation reaction or a condensate of a metal alkoxide is contained in a raw material, and thus the function as the permanent agent is enhanced.

As the second, there is an imprint lithography method. The imprint lithography method is a method that includes: a method of transferring the minute pattern of the mold onto the processed member; a method of providing a mask for processing the processed member by etching; and a method of etching the processed member. For example, when one type of transfer member is used, the processed member and the mold are first laminated through the transfer member. Then, the transfer member is cured by heat or light (UV), and the mold is released. The concave-convex structure of the transfer member is etched such as by oxygen ashing, and thus the processed member is partially exposed. Thereafter, the transfer member is used as a mask, and the processed member is processed by etching. As the processing method here, dry etching or wet etching can be adopted. When the height of the concave-convex structure is desired to be great, dry etching is useful. For example, when two types of transfer member are used, a first transfer member layer is first formed into a film on the processed member. Then, the first transfer member layer and the mold are laminated through a second transfer member. Thereafter, the transfer member is cured by heat or light (UV), and the mold is released. The concave-convex structure of the second transfer member is etched such as by oxygen ashing, and thus the first transfer member is partially exposed. Thereafter, the second transfer member is used as a mask, and the first transfer member layer is processed by dry etching. Thereafter, the transfer member is used as a mask, and the processed member is processed by etching. As the processing method here, dry etching or wet etching can be adopted. When the height of the concave-convex structure is desired to be great, dry etching is useful. It is possible to adopt, as the transfer method, a method of manufacturing a nano-process sheet previously including a mask layer and a resist layer to use the sheet. Here, the nano-process sheet is a sheet in which a mask layer is arranged to fill the interior of the concave portion of the minute pattern of the mold, and on the minute pattern of the mold filled with the mask layer, a resist layer is formed into a film so as to flatten the minute pattern. The step of laminating the nano-process sheet to the processed member and the step of separating the mold are included at least in this order, and thus it is possible to obtain a layered product consisting of the processed member/the resist layer/the mask layer. First dry etching processing is performed from the surface side of the mask layer of the obtained layered product, and thus the processed member is partially exposed. Here, as the first dry etching processing, oxygen ashing using oxygen can be adopted. Then, the processed member can be nano-processed by dry etching or wet etching. In particular, dry etching is adopted, and thus it is possible to provide a nano-structure having a high aspect ratio on the processed member. For example, when the processed member is a sapphire substrate, as a gas used for dry etching, a $Cl_2$ gas, a $BCl_3$ gas or a mixture gas of a $Cl_2$ gas and a $BCl_3$ gas can be used. Moreover, Ar may be added to these gases. This type of nano-process sheet is used, and thus in-plane processing uniformity is enhanced. The mask layer of the nano-process sheet can contain a metal element such as Ti, Si or Zr, and a metal alkoxide or a silane coupling member can be selected. As the resist layer, a photo-curable resin or a thermosetting resin can be adopted.

EXAMPLES

Production of a Cylindrical Master Stamper (Mold for Resin Mold Production)

As the base member of a cylindrical master stamper, a cylindrical quartz glass roll 80 mm in diameter and 50 mm in length was used. On the surface of the quartz glass roll, a concave-convex structure was formed as follows by a direct drawing lithography method using a semiconductor pulse later, and three types of cylindrical master stampers (cylindrical master stampers 1 to 3) were produced.

First, the three quartz glass rolls (1) to (3) are washed, and on each of the surfaces of the cleaned quartz glass rolls (1) to (3), a resist layer was formed into a film by a sputtering method. As a target, CuO (containing 8a tm % Si) was used, and the sputtering method was performed at power of RF 100W. The film thickness of the resist layer after the film formation was set at 20 nm.

Then, while the quartz glass rolls (1) to (3) were being rotated at a linear speed of s=1.0 m/sec, the resist layer was exposed with an exposure semiconductor laser having a wavelength of 405 nm. The quartz glass roll (1) was exposed such that the interval in a circumferential direction was set at 200 nm and the interval in a cylindrical direction was set at 173 nm. The quartz glass roll (2) was exposed such that the interval in the circumferential direction was set at 460 nm and the interval in the cylindrical direction was set at 398 nm. The quartz glass roll (3) was exposed such that the interval in the circumferential direction was set at 700 nm and the interval in the cylindrical direction was set at 606 nm. Furthermore, with respect to pulses in the circumferential direction, x pulses were applied with constant application energy, and then a time during which y pulses are not applied was provided. These x pulses and y pulses (imaginary pulses) were set at one period, and the exposure was performed.

After the exposure, the resist layer of the quartz glass rolls (1) to (3) was developed. The development of the resist layer was performed using a 0.03 wt % glycine aqueous solution under conditions in which the processing time was 240 seconds. Then, the developed resist layer was used as a mask, and the quartz glass rolls (1) to (3) were dry-etched. The dry etching was performed with an etching gas of $SF_6$ under conditions in which the processing gas pressure was 1 Pa, the processing power was 300 W and the processing time was 3 to 10 minutes. Then, the quartz glass rolls (1) to (3) with the concave-convex structure provided on the surface were treated with hydrochloric acid of pH 1 for six minutes, and thus only the residue resist layer was separated from the quartz glass rolls (1) to (3), with the result that the cylindrical master stampers (transfer molds) (1) to (3) were produced.

<Production of a Resin Mold>

Durasurf HD-1101Z (made by Daikin Chemical Industry Company), which is a fluorine-based surface release processing material, was applied to the surface of the obtained cylindrical master stampers (1) to (3), and they were heated at 60° C. for 1 hour, were left at room temperature for 24 hours and were immobilized. Thereafter, they were washed three times with Durasurf HD-ZV (made by Daikin Chemical Industry Company), and were subjected to release processing.

Then, the obtained cylindrical master stampers (1) to (3) was used to produce a reel-shaped resin mold. First, a fluorine-based additive (made by Daikin Chemical Industry Company, Optool DAC HP), trimethylol propane (EO-modified) triacrylate (Toagosei Co., Ltd., M350), 1-hydroxy cyclohexyl phenyl ketone (made by BASF Corp., Irgacure (registered trademark) 184) and 2-benzyl-2-dimethylamino-1-(4-morpholinophenyl)-butanone-1 (made by BASF Corp., Irgacure (registered trademark) 369) were mixed in a ratio of 15:100:5.5:2.0 on a parts by weight basis, and thus a photo-curable resin was prepared. Then, the photo-curable resin was applied to the easy-adhesion surface of a PET film (A4100, made by Toyobo Co., Ltd.: 300 mm wide and 100 μm thick) with a micro gravure coating (made by Yasui Seiki Co., Ltd.) such that the thickness of the applied film was 6 μm.

Then, the PET films obtained by applying the photo-curable resin to the cylindrical master stampers (1) to (3) were pressed with a nip roll (0.1 MPa), and a UV exposure device (made by Fusion UV Systems Japan Inc., H valve) was used to apply ultraviolet rays such that an accumulated exposure amount under a lamp in the center was 600 $mJ/cm^2$ under the atmosphere, at a temperature of 25° C., at a humidity of 60%, with the result that light curing was continuously performed. Consequently, the reel-shaped transparent resin molds (1) to (3) in which a concave-convex structure was inversely transferred to the surface were obtained. The reel-shaped transparent resin molds (1) to (3) had a length of 200 m and a width of 300 mm. In the following description, the reel-shaped transparent resin molds (1) to (3) are also simply referred to as the resin molds (1) to (3).

When the reel-shaped transparent resin molds (1) to (3) were observed with a scanning electron microscope that will be described later, in the reel-shaped transparent resin mold (1) using the cylindrical master stamper (1), convex portions in which a cross-sectional shape was ϕ180 nm and the average convex portion height $H_{ave}$ was 200 nm were arranged. In the reel-shaped transparent resin mold (2) using the cylindrical master stamper (2), convex portions in which a cross-sectional shape was ϕ430 nm and the average convex portion height $H_{ave}$ was 460 nm were arranged. In the reel-shaped transparent resin mold (3) using the cylindrical master stamper (3), convex portions in which a cross-sectional shape was ϕ650 nm and the average convex portion height $H_{ave}$ was 700 nm were arranged. As an example of the produced reel-shaped resin mold, a scanning electron microscope photograph of the reel-shaped transparent resin mold (3) was shot, and thus the upper surface was observed. As a result of this, it was found that a plurality of convex portions having an average interval of 700 nm were arranged, and convex portions whose height were extremely low, that is, the minimal convex portions were dispersed. It is estimated that this minimal convex portion corresponds to the part to which the semiconductor laser pulses were not applied. In the scanning electron microscope observation, the minimal convex portion was able to be determined by making the Tilt act and performing an atomic force microscope observation separately.

<Scanning Electron Microscope>

Device: HITACHI s-5500

Acceleration voltage: 10 kV

MODE: Normal

<Production of an Inverted Resin Mold>

A fluorine-based additive (made by Daikin Chemical Industry Company, Optool DAC HP), trimethylol propane (EO-modified) triacrylate (Toagosei Co., Ltd., M350), 1-hydroxy cyclohexyl phenyl ketone (made by BASF Corp., Irgacure (registered trademark) 184) and 2-benzyl-2-dimethylamino-1-(4-morpholinophenyl)-butanone-1 (made by BASF Corp., Irgacure (registered trademark) 369) were mixed in a ratio of 17.5:100:5.5:2.0 on a parts by weight basis, and thus a photo-curable resin was prepared. Then, the photo-curable resin was applied to the easy-adhesion surface of a PET film (A4100, made by Toyobo Co., Ltd.: 300 mm wide and 100 μm thick) with a micro gravure coating (made by Yasui Seiki Co., Ltd.) such that the thickness of the applied film was 2 μm.

Then, the PET films obtained by applying the photo-curable resin to the reel-shaped transparent resin molds (1) to (3) were pressed with a nip roll (0.1 MPa), and a UV exposure device (made by Fusion UV Systems Japan Inc., H valve) was used to apply ultraviolet rays such that an accumulated exposure amount under a lamp in the center was 600 $mJ/cm^2$ under the atmosphere, at a temperature of 25° C., at a humidity of 60%, with the result that light curing was continuously performed. Consequently, the transparent resin molds (hereinafter also referred to as the "inverted resin molds") (1) to (3) in which a concave-convex structure was inversely transferred to the surface were obtained. The inverted resin molds (1) to (3) had a length of 200 m and a width of 300 mm.

When the surfaces of the obtained inverted resin molds (1) to (3) were observed with a scanning electron microscope, in the inverted resin mold (1), concave portions in which the concave portion opening diameter was ϕ180 nm and the average concave portion depth $D_{ave}$ was 200 nm were arranged. In the inverted resin mold (2), concave portions in which the concave portion opening diameter was ϕ430 nm and the average concave portion depth $D_{ave}$ was 460 nm were arranged. In the inverted resin mold (3), concave portions in which the concave portion opening diameter was ϕ650 nm and the average concave portion depth $D_{ave}$ was 700 nm were arranged. It was observed that the inverted resin molds (1) to (3) were the transfer images of the concave-convex structures observed in the reel-shaped transparent resin molds (1) to (3) and including a plurality of convex portions. The minimal convex portion of the inverted resin mold was likewise able to be determined both by a measurement performing the Tilt in the scanning electron microscope observation and by an atomic force microscope observation.

Example 1

On a c-plane sapphire substrate having a diameter ϕ2" and a thickness of 0.33 mm, a mask material was applied by a spin coating method (2000 rpm, 20 seconds) to form a resist layer. As the mask material, an application solution was used which was diluted by propylene glycol monomethyl ether such that the solid content of a photosensitive resin composition was 5 weight %.

As the photosensitive resin composition, the followings were mixed and used: 20 weight parts of 3-ethyl-3 {[3-ethyloxetan-3-yl) methoxy] methyl} oxetane (OXT-221, made by Toagosei Co., Ltd.); 80 weight parts of 3',4'-epoxy cyclohexane carboxylic acid-3,4-epoxy cyclohexyl methyl (Wako Pure Chemical Industries, Ltd.); 50 weight parts of phenoxy diethylene glycol acrylate (Aronix (registered trademark) M-101A, made by Toagosei Co., Ltd.); 50 weight parts of ethylene oxide-modified bisphenol A diacrylate (Aronix (registered trademark) M-211B, made by Toagosei Co., Ltd.); 8 weight parts of DTS-102 (made by Midori Kagaku Co., Ltd.); 1 weight part of 1,9-dibutoxyanthracene (ANTHRACURE (registered trademark) UVS-1331, Kawasaki Kasei Co., Ltd.); 5 weight parts of Irgacure (registered trademark) 184 (made by Ciba Company); 4 weight parts of Optool (registered trademark) DAC HP (a solid content of 20%, made by Daikin Chemical Industry Company).

On the sapphire substrate where the resist layer was formed, the inverted resin mold was cut so as to have a size of 70 mm×70 mm (□70 mm) and was laminated. For the laminating, a film laminating device (made by Suntech Co., Ltd., TMS-S2) was used, and the laminating was performed under conditions in which the laminating nip force was 90N and the laminating rate was 1.5 m/s. Then, the inverted resin mold/the resist layer/the sapphire substrate that were laminated and integrated were sandwiched between two transparent silicone plates (hardness 20) □70 mm×t10 mm. In this state, a nano-imprint device (made by Engineering System Co., Ltd., EUN-4200) was used to perform pressing with a pressure of 0.05 MPa. In the pressed state, ultraviolet rays were applied from the side of the inverted resin mold at a rate of 2500 mJ/cm$^2$, and thus the resist layer was cured. After the curing of the resist layer, the transparent silicone plates and the inverted resin mold were separated, and the resist/sapphire layered product where the pattern was formed was obtained.

Then, oxygen etching was performed on the obtained resist layer pattern, and thus the residual film was removed. Thereafter, the sapphire substrate was etched with a reactive ion etching device (RIE-101iPH, made by Samco Co. Ltd.). The etching was performed under the following conditions.

Etching gas: $Cl_2/(Cl_2+BCl_3)=0.1$

Gas flow rate: 10 sccm

Etching pressure: 0.1 Pa

Antenna: 50 w

Bias: 50 w

After the etching, the surface and the cross section of the sapphire substrate (optical substrate) were observed with a scanning electron microscope. The sapphire substrate (A) produced by using the inverted resin mold (1) had an average convex portion height $H_{ave}$ of 104 nm and an average interval $P_{ave}$ of 200 nm. The minimum value of the convex portion height hn was 0 nm because it is estimated that it was the part to which no pulse was applied. For the minimal convex portion corresponding to hn=0 nm, the bottom surface of the minimal convex portion was observed. The outline of the bottom surface was substantially circular, and roughness was observed on the bottom surface. That is, hn=0 nm does not mean that there is nothing in the part corresponding to the minimal convex portion. In other words, this state of 0 nm is a state where hn is closer to 0 nm. The existence probability Z of the minimal convex portion was determined from the surface observation with a scanning electron microscope. The result was Z=1/6.6. On the other hand, the distance (tcv) was included in a range between 1.0 P to 4P. The results are shown in table 1 below.

The sapphire substrate (B) produced by using the inverted resin mold (2) had an average convex portion height $H_e$ of 300 nm and an average interval $P_{ave}$ of 460 nm. The minimum value of the convex portion height hn was 0 nm because it is estimated that it was the part to which no pulse was applied. As in the case where the inverted resin mold (1) was used, hn=0. The existence probability Z of hn=0 nm was determined from the surface observation with a scanning electron microscope. The result was Z=1/1000. On the other hand, the distance tcv was included in a range between 1.0 P to 3P. The results are shown in table 1 below.

The sapphire substrate (C) produced by using the inverted resin mold (3) had an average convex portion height $H_{ave}$ of 392 nm and an average interval $P_{ave}$ of 700 nm. The minimum value of the convex portion height hn was 0 nm because it is estimated that it was the part to which no pulse was applied. As in the case where the inverted resin mold (1) was used, hn=0. The existence probability Z of hn=0 nm was determined from the surface observation with a scanning electron microscope. The result was Z=1/48.6. On the other hand, the distance tcv was included in a range between 1.0 P to 3P. The results are shown in table 1 below.

Example 2

In the production of the optical substrates (A) to (C) according to example 1, the same operation was performed to produce the sapphire substrates except that the inverted resin molds (1) to (3) were changed to the resin molds (1) to (3). The surface and the cross section of the obtained sapphire substrates were observed with a scanning electron microscope.

The sapphire substrate (D) produced by using the resin mold (1) had an average concave portion depth $D_{ave}$ of 105 nm and an average interval $P_{ave}$ of 200 nm. The minimum value of the concave portion depth dn was 0 nm because it is estimated that it was the part to which no pulse was applied. For the minimal concave portion corresponding to dn=0 nm, the bottom portion of the minimal concave portion was observed. Since roughness was observed in the bottom portion, the outline of the minimal concave portion was able to be observed to be substantially circular. That is, dn=0 nm does not mean that there is nothing in the part corresponding to the minimal concave portion. In other words, this state of 0 nm is a state where dn is closer to 0 nm. The existence probability Z of dn=0 nm was determined from the surface observation with a scanning electron microscope. The result was Z=1/6.4. On the other hand, the distance tcc was included in a range between 1.0 P to 4P. The results are shown in table 1 below.

The sapphire substrate (E) produced by using the resin mold (2) had an average concave portion depth $D_{ave}$ of 299 nm and an average interval $P_{ave}$ of 460 nm. The minimum value of the concave portion depth dn was 0 nm because it is estimated that it was the part to which no pulse was applied. The minimal concave portion of dn=0 nm was the same as in the case where the resin mold (1) was used. The existence probability Z of dn=0 nm was determined from the surface observation with a scanning electron microscope. The result was Z=1/1000. On the other hand, the distance tcc was included in a range between 1.0 P to 3P. The results are shown in table 1 below.

The sapphire substrate (E) produced by using the resin mold (3) had an average concave portion depth $D_{ave}$ of 392 nm and an average interval $P_{ave}$ of 700 nm. The minimum value of the concave portion depth dn was 0 nm because it is estimated that it was the part to which no pulse was applied. The minimal concave portion of dn=0 nm was the same as in the case where the resin mold (1) was used. The existence probability Z of dn=0 nm was determined from the surface observation with a scanning electron microscope. The result was Z=1/50. On the other hand, the distance tcc was included in a range between 1.0 P to 3P. The results are shown in table 1 below.

The meanings of terms used in table 1 are as follows.

Substrate: control symbol for the produced optical substrate $P_{ave}$: average interval in the concave-convex structure $H_{ave}$: average height when the concave-convex structure is a dot-shaped structure $D_{ave}$: average depth when the concave-convex structure is a hole-shaped structure hn or dn: the minimum height of the observed minimal convex portion or the minimum depth of the observed minimal concave portion Z: existence probability of the minimal convex portion or the minimal concave portion tcv: distance between the normal convex portions with the minimal convex portion placed therebetween tcc: distance between the normal concave portions with the minimal concave portion placed therebetween Tcv−ave: average value of the distance between the apexes of the normal convex portions with the minimal convex portion placed therebetween Tcc−ave: average value of the distance between the bottom portion center portions of the normal concave portions with the minimal concave portion placed therebetween

Example 3

Production of a Semiconductor Light-Emitting Element

On the sapphire substrates (the optical substrates (A) to (F)) obtained in examples 1 and 2, the followings were continuously deposited by a metal organic chemical vapor deposition method (MOCVD): (1) AlGaN low-temperature buffer layer, (2) n-type GaN layer, (3) n-type AlGaN clad layer, (4) InGaN light-emitting layer (MQW), (5) p-type AlGaN clad layer, (6) p-type GaN layer and (7) ITO layer, and the semiconductor light-emitting element (A) was produced. The concave and convex portions on the sapphire substrate were embedded and flattened under conditions of film formation when the (2) n-type GaN layer was deposited. Then, the semiconductor light-emitting element (A) was etched, and an electrode pad was attached. In this state, a prober was used to pass a current of 20 mA between a p-electrode pad and an n-electrode pad, and the light emission output of the semiconductor light-emitting element (A) was measured. The light emission output ratio of the semiconductor light-emitting element in example 3 is shown in table 3 below.

Comparative Example 1

The sapphire substrate (G) was produced as in example 1 except that the light-emitting semiconductor layer was formed on a flat sapphire substrate. The results of the evaluation were shown in table 2 below.

Comparative Example 2

The sapphire substrate (H) was produced as in example 1 except that a concave-convex structure in a hexagonal arrangement having a diameter of 3 μm, an interval (P) of 6 μm and a convex portion height of 2 μm was provided by a normal photolithography method on the sapphire substrate. The results of the evaluation were shown in table 2 below.

Comparative Example 3

The sapphire substrate (I) (optical substrate) was produced as in example 1 except that power for each round of pulse application in the direct drawing lithography was set constant. The results of the evaluation were shown in table 2 below.

The meanings of terms used in table 2 are as follows.

Substrate: control symbol for the produced optical substrate $P_{ave}$: average interval in the concave-convex structure $H_{ave}$: average height when the concave-convex structure is a dot-shaped structure $D_{ave}$: average depth when the concave-convex structure is a hole-shaped structure hn or dn: the minimum height of the observed minimal convex portion or the minimum depth of the observed minimal concave portion Z: existence probability of the minimal convex portion or the minimal concave portion tcv, tcc: distance between the normal convex portions with the minimal convex portion placed therebetween, distance between the normal concave portions with the minimal concave portion placed therebetween

Comparative Example 4

The semiconductor light-emitting elements (G) to (I) were produced as in example 3 except that the sapphire substrates obtained in comparative examples 1 to 3 were used, and the light emission output was measured. The results thereof were shown in table 3 below. In table 3 below, the output in comparative example 1 is assumed to be 1, and the light emission output ratio is shown. The semiconductor light-emitting elements (A), (B), (C), (G), (H) and (I) were manufactured with the sapphire substrates (A), (B), (C), (G), (H) and (I).

TABLE 1

| | Substrate | Pave [nm] | Have | $D_{ave}$ [nm] | hn or dn [nm] | Z | tcv | tcc | Tcv-ave | Tcc-ave |
|---|---|---|---|---|---|---|---|---|---|---|
| Example 1 | A | 200 | 104 | — | →0 | 1/6.6 | 1.0P~4P | — | $2.7P_{ave}$ | — |
| | B | 460 | 300 | — | →0 | 1/1000 | 1.0P~3P | — | $2.5P_{ave}$ | — |
| | C | 700 | 392 | — | →0 | 1/48.6 | 1.0P~3P | — | $2.6P_{ave}$ | — |
| Example 2 | D | 200 | — | 105 | →0 | 1/6.4 | — | 1.0P~4P | — | $2.6P_{ave}$ |
| | E | 460 | — | 299 | →0 | 1/1000 | — | 1.0P~3P | — | $2.5P_{ave}$ |
| | F | 700 | — | 392 | →0 | 1/50 | — | 1.0P~3P | — | $2.6P_{ave}$ |

hn and dn represent the minimum value

TABLE 2

| | Substrate | Pave [nm] | Have | $D_{ave}$ [nm] | hn or dn [nm] | Z | tcv, tcc |
|---|---|---|---|---|---|---|---|
| Comparative example 1 | G | — | — | — | — | — | — |
| Comparative example 2 | H | 6000 | 2000 | — | 2000 | →0 | — |
| Comparative example 3 | I | 200 | 200 | — | 200 | →0 | — |

hn and dn represent the minimum value

TABLE 3

| | Element | Light emission output ratio |
|---|---|---|
| Example 3 | A | 1.43 |
| | B | 1.54 |
| | C | 1.60 |
| Comparative example 4 | G | 1.00 |
| | H | 1.35 |
| | I | 1.40 |

Table 3 shows that as compared with the conventional flat sapphire substrate (comparative example 1), the sapphire substrate (comparative example 2) having concave and convex portions on the order of micrometers and the sapphire substrate (comparative example 3) having uniform concave and convex portions on the order of nanometers, in the sapphire substrate (optical substrate (A)) according to example 1, it is possible to obtain a high light emission efficiency ratio. This result is probably because the average interval $P_{ave}$ in the concave-convex structure is made to fall within a predetermined range, and thus it is possible to reduce the number of dislocation defects in the semiconductor layer formed into a film on the sapphire substrate, and the concave-convex structure is provided such that the convex portions whose convex portion height hn is lower than the average convex portion height $H_{ave}$, that is, the minimal convex portions are present with a predetermined probability, and thus it is possible to remove the waveguide mode with light scattering and thereby increase the light extraction efficiency. Although in table 3, only the results of example 1 are shown, it has been found that even when the sapphire substrates of the other examples are used, a high light emission output ratio was likewise shown. Other advantages when the semiconductor light-emitting element is manufactured have been found from this examination by using the sapphire substrates manufactured in examples 1 and 2. First, as compared with the sapphire substrate (comparative example 2) having concave and convex portions on the order of micrometers, it was possible to lower the amount of semiconductor crystal layer used and enhance the time for manufacturing the semiconductor light-emitting element. Moreover, it has been found that it is possible to satisfactorily reduce cracks produced within the semiconductor crystal layer. This is probably because it is possible to reduce a stress on the interface between the sapphire substrate and the semiconductor crystal layer.

Example 4

A method other than the methods in examples 1 to 3 described above was used to produce the sapphire substrate having the minimal convex portion.

<Production of the Cylindrical Master Stamper (Mold for Resin Mold Production)>

As the base member of a cylindrical master stamper, the same one as in examples 1 and 2 was used. As in examples 1 and 2, the resist film was formed.

Then, while the quartz glass roll was being rotated at a linear speed of s=1.0 m/sec, the resist layer was exposed with an exposure semiconductor laser having a wavelength of 405 nm. Here, an adjustment was made such that the interval in a circumferential direction was set at 300 nm and that the interval in an axial direction was a regular hexagonal arrangement. Energy of the application pulse was set constant.

After the exposure, the resist layer of the quartz glass roll was individually developed. The conditions of the development and the subsequent dry etching were set the same as in examples 1 and 2.

<Production of the Resin Mold>

On the surface of the obtained cylindrical master stamper, the same release processing as in examples 1 and 2 was performed.

Then, the obtained cylindrical master stamper was used to produce the reel-shaped resin mold. The manufacturing conditions of the resin mold were set the same as in examples 1 and 2 except the following two items.

1. The accumulated light amount in the application of ultraviolet rays was set at 1200 mJ/$cm^2$.
2. The pressing force of the nip roll was set at 0.01 M Pa.

In the following description, the resin mold having a minute pattern formed with a plurality of convex portions is referred to as the reel-shaped resin mold G1.

When the reel-shaped resin mold G1 was observed with an atomic force microscope (AFM), it was found that minimal convex portions were non-cyclically dispersed. The average interval $P_{ave}$ between the first convex portions was 300 nm. The existence probability Z of the minimal convex portions in the reel-shaped resin mold G1 was 1/11.1, and Tcv–ave was 2.5 $P_{ave}$. As described above, it is found that even when a plurality of concave portions are cyclically and substantially constantly provided on the surface of the cylindrical master stamper, the pressing force when the nano-imprint is laminated is adjusted, and thus it is possible to easily and non-cyclically provide the minimal convex portions on the resin mold.

<Production of the Inverted Resin Mold>

Then, the reel-shaped resin mold G1 was used as a template, and the inverted resin mold was manufactured. The manufacturing conditions of the inverted resin mold were set the same as in examples 1 and 2 except that the accumulated light amount in the application of ultraviolet rays was set at 1300 mJ/cm$^2$. In the following description, the inverted resin mold having a minute pattern formed with a plurality of concave portions is referred to as the reel-shaped resin mold G2.

<Production of a Nano-Processing Film>

A diluting solution of the material 2 below was coated on the nano-structure surface of the reel-shaped resin mold G2. Then, a diluting solution of the material 3 below was coated on the nano-structure surface of the reel-shaped resin mold containing the material 2 within the nano-structure, and a nano-processing film was obtained.

Material 2—TTB:3APTMS:SH710:I. 184:I. 369=65.2 g:34.8 g:5.0 g:1.9 g:0.7 g

Material 3—Bindingpolymer:SR833:SR368:I. 184:I. 369=77.1 g:11.5 g:11.5 g:1.47 g:0.53 g Bindingpolymer: methyl ethyl ketone solution of a binary copolymer of 80 mass % of benzyl methacrylate and 20 mass % of methacrylic acid (a solid content of 50%, a weight average molecular weight of 5600, an acid equivalent of 430, a dispersion degree of 2.7)

TTB: titanium (IV) tetrabutoxide monomer (made by Wako Pure Chemical Industries, Ltd.)

SH710: phenyl-modified silicone (made by Dow Corning Toray Co., Ltd.)

3APTMS: 3-acryloxypropyltrimethoxysilane (KBM5103 (made by Shin-Etsu Silicone Co., Ltd.))

I. 184: 1-hydroxy cyclohexyl phenyl ketone (made by BASF Corp., Irgacure (registered trademark) 184)

I. 369: 2-benzyl-2-dimethylamino-1-(4-morpholinophenyl)-butanone-1 (made by BASF Corp., Irgacure (registered trademark) 369)

SR833: tricyclodecanedimethanol diacrylate (SR833 (made by SARTOMER Co., Ltd.))

SR368: tris (2-hydroxyethyl) isocyanurate triacrylate (SR833 (made by SARTOMER Co., Ltd.))

The same device as in the production of the reel-shaped resin mold G1 was used, and thus the material 2 diluted with propylene glycol monomethyl ether (PGME) was directly coated on the nano-structure surface of the reel-shaped resin mold G2. The dilute concentration here was set such that the solid content contained in the coating raw material (the material 2 diluted with PGME) per unit area was 20% lower than the volume of the nano-structure per unit area. After the coating, the reel-shaped resin mold was passed through a blast drying furnace at 80° C. for 5 minutes, and the reel-shaped resin mold containing the material 2 within the nano-structure was wound and collected.

Then, the reel-shaped resin mold containing the material 2 within the nano-structure was unwound, and the same device as in the production of the reel-shaped resin mold G1 was used, and thus the material 3 diluted with PGME and methyl ethyl ketone (MEK) was directly coated on the nano-structure surface. The dilute concentration here was set such that the distance between the interface between the material 2 arranged within the nano-structure and the material 3 applied and the surface of the material 3 was 500 nm. After the coating, the reel-shaped resin mold was passed through the blast drying furnace at 80° C. for 5 minutes, and a polypropylene cover film was fitted to the surface of the material 3 and the reel-shaped resin mold was wound and collected. The temperature when the cover film was fitted was set at 30° C.

When observations were performed on the obtained nano-processing film with a scanning electron microscope, a transmission electron microscope and energy dispersive X-ray spectroscopy, it was found that the material 2 was arranged to fill the interior of the concave portion in the nano-structure. Furthermore, it was found that the material 3 was formed into a film so as to fill and flatten the nano-structure of the film-shaped resin mold G2 and the material 2.

<Manufacturing of an Optical Substrate>

The produced nano-processing film was used to produce an optical substrate. As the optical substrate, a c-plane sapphire substrate was used.

UV-O3 processing was performed on the sapphire substrate for 5 minutes, and thus particles on the surface were removed and the sapphire substrate was made hydrophilic. Then, the surface of the material 3 of the nano-processing film was laminated to the sapphire substrate. At this time, the laminating was performed while the sapphire substrate was heated to 80° C. Then, a high-pressure mercury lamp light source was used to apply light over the reel-shaped resin mold G2 such that the accumulated light amount was 1200 mJ/cm$^2$. Thereafter, the reel-shaped resin mold G2 was separated, and a layered product consisting of the material 2/the material 3/the sapphire substrate was obtained.

Then, etching using oxygen gas was performed from the surface side of the material 2, the material 2 was regarded as a mask to perform nano-processing on the material 3 and the surface of the sapphire substrate was partially exposed. The oxygen etching was performed under conditions in which the pressure was 1 Pa and the power was 300 W. Thereafter, reactive ion etching using $BCl_3$ gas was performed from the surface side of the material 2, and thus nano-processing was performed on the sapphire. The etching using $BCl_3$ was performed under conditions in which the ICP was 150 W, the BIAS was 50 W and the pressure was 0.2 Pa, and a reactive ion etching device (RIE-101iPH, made by Samco Co., Ltd.) was used.

Finally, washing using a solution obtained by mixing sulfuric acid and hydrogen peroxide in a weight ratio of 2:1 was performed, then washing using pure water was performed and thus the optical substrate was obtained.

When the produced optical substrate was observed with a scanning electron microscope, it was observed that a plurality of convex portions were provided on the surface of the sapphire substrate, and that the minimal convex portions were dispersed. The average convex portion height $H_{ave}$ in the concave-convex structure was 150 nm. The minimal convex portion height hn was observed to be in a range of 0 nm to 30 nm (0.2 $H_{ave}$). About 70% of the minimal convex portions had a height of 0 nm, and about the remaining 30% had a height of about 30 nm. The existence probability of the minimal convex portions was 1/12.5, and Tcv−ave was 2.5 $P_{ave}$. The distance (tcv) between the first convex portions adjacent to each other through the minimal convex portion was more than 300 nm ($P_{ave}$) but equal to or less than 900 nm (3 $P_{ave}$). The above results were likewise able to be observed with a scanning electron microscope using Tilt.

In the surface observation with a scanning electron microscope, minimal convex portions having a height of 0 nm and minimal convex portions having a height of 30 nm were observed in a plurality of first convex portions. The minimal convex portions were determined both by a cross-sectional observation with a scanning electron microscope and by an atomic force microscope observation. It was observed that in the first convex portions, the shapes were not even, and were disturbed. This disturbance was observed as the distribution of the individual convex portion heights, the distribution of the convex bottom portion outline shapes in the individual convex portions and the distribution of the apex positions in the individual convex portions. The outline shape of the convex bottom portion was so indeterminate as to have a plurality of inflection points. This can be controlled by the balance of the conditions of the dry etching using the material 3 described above and $BCl_3$. It is estimated that since the disturbance of the first convex portion described above leads to the disturbance of the averaged refractive index, the light extraction efficiency LEE is more enhanced.

As in example 3, the semiconductor light-emitting element was assembled, and the light emission efficiency was evaluated. The evaluation method was the same as in example 3. It was found that when the output of the semiconductor light-emitting element (G) in comparative example 4 was assumed to be 1, the output of the semiconductor light-emitting element in example 4 was about 1.8. It can be considered that it is because the reason why the output of the semiconductor light-emitting element in example 4 was more than the output of the semiconductor light-emitting element (A) in example 3 was that the average interval $P_{ave}$ was increased. Specifically, it is estimated that the average interval $P_{ave}$ was so short as to be 300 nm, and thus the improvement of the internal quantum efficiency IQE by the dispersion of dislocations in the semiconductor crystal layer and the reduction in local dislocation density was maintained whereas the average interval $P_{ave}$ was increased from 200 nm to 300 nm, and thus the difference in volume between the minimal convex portion and the first convex portion was increased, that is, the disturbance of the averaged refractive index was made remarkable, a large amount of scattering was provided and thus the light extraction efficiency LEE was significantly enhanced. In fact, when the dislocation density was measured with a transmission electron microscope, it was found that in the semiconductor light-emitting element (A) and the semiconductor light-emitting element in example 4, their dislocation densities were equal to each other within a measurement error range. It was found that even in the example 4, as in example 3, it is possible to lower the amount of semiconductor crystal layer used and reduce the time for manufacturing the semiconductor light-emitting element.

Example 5

As in example 4, the reel-shaped resin mold G1 was manufactured. Here, the pressing force of the nip when the reel-shaped resin mold G1 was obtained was set at 0.01 MPa, and the thickness of the film of a photo-curable resin applied (thickness of the film corresponding to the solid content) was changed within a range of 3000 nm to 300 nm. Here, when the thickness of the film applied was equal to or less than 1500 nm, the photo-curable resin was diluted with a mixture solvent of propylene glycol monomethyl ether and acetone, and thus the film thickness was adjusted. The reel-shaped resin mold G1 was observed with a scanning electron microscope and an atomic force microscope, and thus the existence probability of the minimal convex portion was determined. It was found that the existence probability of the minimal convex portion can be adjusted to be within a range of 1/3.3 to 1/50000.

Then, as in example 4, the reel-shaped resin mold G2 was manufactured. Then, in example 4, the application device was changed to be a tabletop bar coater, and the reel-shaped resin mold G2 was processed into a nano-processing film. Furthermore, as in example 4, the nano-processing film was used to process the sapphire substrate, and thus the optical substrate was obtained.

The obtained optical substrate was observed with a scanning electron microscope and an atomic force microscope. The results are shown in table 4. Then, as in example 4, the semiconductor light-emitting element was produced, and the light emission output ratio was determined. The internal quantum efficiency IQE was measured with PL strength. The internal quantum efficiency IQE was defined by (the number of photons emitted from the light-emitting semiconductor layer per unit time/the number of electrons injected into the semiconductor light-emitting element per unit time). In the present specification, as an index for evaluating the internal quantum efficiency IQE, (PL strength measured at 300K/PL strength measured at 10K) was adopted. In order for the effects on the light extraction efficiency LEE and the internal quantum efficiency IQE to be determined, the light emission output ratio was divided back by the internal quantum efficiency IQE, and thus the light extraction efficiency was calculated. The results are shown in table 4. In table 4, information such as Tcv−ave and the existence probability Z of the minimal convex portion is calculated according to the definitions described in the text of the specification.

The meanings of terms used in table 4 are as follows.

No.: control symbol for the produced optical substrate

Z: existence probability of the minimal convex portion

Tcv−ave: the average value of the distances between the apexes of normal convex portions placed between the minimal convex portions IQE: internal quantum efficiency IEE ratio: light extraction efficiency ratio

TABLE 4

| | No. | Z | Tcv-ave [nm] | IQE [%] | LEE ratio | Light emission output ratio |
|---|---|---|---|---|---|---|
| Example 5 | 1 | 1/50000 | $2.59P_{ave}$ | 89 | 1.04 | 1.42 |
| | 2 | 1/5000 | $2.62P_{ave}$ | 89 | 1.06 | 1.45 |
| | 3 | 1/1000 | $2.60P_{ave}$ | 86 | 1.16 | 1.54 |
| | 4 | 1/500 | $2.66P_{ave}$ | 84 | 1.21 | 1.57 |
| | 5 | 1/55 | $2.98P_{ave}$ | 81 | 1.27 | 1.58 |
| | 6 | 1/50 | $3.13P_{ave}$ | 80 | 1.29 | 1.59 |
| | 7 | 1/49 | $3.56P_{ave}$ | 78 | 1.33 | 1.6 |
| | 8 | 1/25 | $9.19P_{ave}$ | 80 | 1.34 | 1.65 |
| | 9 | 1/19 | $5.21P_{ave}$ | 75 | 1.41 | 1.63 |
| | 10 | 1/14 | $3.99P_{ave}$ | 73 | 1.42 | 1.59 |
| | 11 | 1/7.6 | $6.76P_{ave}$ | 74 | 1.34 | 1.53 |
| | 12 | 1/5.4 | $4.99P_{ave}$ | 71 | 1.29 | 1.41 |
| | 13 | 1/3.3 | $5.21P_{ave}$ | 69 | 1.30 | 1.38 |
| Comparative example 4 | Element G | 0 | — | 60 | 1 | 1 |

The followings are found from table 4. First, as the existence probability Z is decreased, the internal quantum efficiency IQE is enhanced. Even when the existence probability Z is 1/3.3, which is the maximum, as compared with the element G in example 4, the internal quantum efficiency IQE is sufficiently high. This is because the minute concave-convex structure having an average interval $P_{ave}$ of 300 nm made it possible to disturb the growth mode of the semiconductor crystal layer, and dislocations were made to collide with each other in the vicinity of the convex portion in the concave-convex structure and were removed. This was actually found by a transmission electron microscope observation. On the other hand, the existence probability Z is increased, and thus the ratio of the minimal convex portion is increased. In this case, the semiconductor crystal layer is formed into a film such that the second convex portion is flattened, and thereafter the apex of the first convex portion is flattened. In other words, it is thought that the density of an internal stress produced from the vicinity of the second convex portion to the vicinity of the first convex portion is increased. Hence, it is estimated that the crystallization of the semiconductor crystal layer is lowered, and thus the internal quantum efficiency IQE is lowered.

Then, although as the existence probability Z is increased, the light extraction efficiency LEE is enhanced, a decrease in light extraction efficiency LEE is started when existence probability Z=1/7.6. Regardless of the existence probability Z, as compared with the element G in example 4, the light extraction efficiency LEE is enhanced. This is probably because the concave-convex structure having an average interval $P_{ave}$ of 300 nm causes the direction of travel of the emitted light guided within the semiconductor crystal layer to be changed by light diffraction. On the other hand, since the existence probability Z is increased, the ratio of the minimal convex portion is increased. This is probably because since this causes a distribution corresponding to the distribution of the minimal convex portions to be added to the average refractive index, it is possible to extract light forming the waveguide mode by light diffraction and light scattering. Here, when the existence probability Z is excessively increased, since the ratio of the minimal convex portion is increased, the average volume of the concave-convex structure is reduced. In other words, it can be considered that since the light diffraction intensity is lowered, the light extraction efficiency LEE is lowered.

As described above, the concave-convex structure is provided, and thus it is possible to enhance the internal quantum efficiency IQE. Here, it is found that when the minimal convex portion is provided in order to enhance the internal quantum efficiency IQE, there is a range in which the light extraction efficiency LEE is optimum by the existence probability Z. Furthermore, it is found that when the existence probability Z of the minimal convex portion is excessively high, the internal quantum efficiency IQE is lowered. As described above, there is an appropriate range of the light emission output light ratio for the existence probability Z. It is found in this examination that the light emission output light ratio is significantly enhanced when the existence probability Z is in a range of 1/5.4 to 1/5000. In particular, it is found that when the light emission output light ratio is more remarkably enhanced when the existence probability Z is in a range of 1/7.6 to 1/1000. This is because the external quantum efficiency EQE described above is determined by the product of the internal quantum efficiency IQE and the light extraction efficiency LEE, and the reason why there is an optimum value for the existence probability Z is due to the examination described above.

Furthermore, when the growth of the semiconductor crystal layer was observed and analyzed, it was found that the existence probability Z was made to fall within the above range, and thus it is possible to more improve the leak current of the semiconductor light-emitting element. On the sapphire substrate (optical substrate), a buffer layer, a uGaN layer, an nGaN layer, a MQW layer and a pGaN layer were formed into films by a MOCVD method, an ITO was formed into a film, mesa etching was performed and finally a metal pad pattern consisting of Cr/Ti/Au was formed. In this state, the leak current was measured. As shown in FIG. 5, it is found that when the existence probability Z is low, the leak current is improved, and a satisfactory diode characteristic is indicated. It is found that when the existence probability Z is increased with around 1/5 being a starting point, the leak current is rapidly increased. For example, the leak current when the existence probability Z is 1/3.3 was 1.7 to 2.9 times as high as the case where the existence probability Z is 1/55. In other words, it was found that the diode characteristic was significantly lowered. Here, when the growth of the semiconductor crystal layer was checked, it was found that as the existence probability Z is increased, the specific growth of the semiconductor crystal layer occurs from the vicinity of the minimal convex portion. Here, the specific growth means that the growth rate is higher than that of the surrounding. FIGS. 6A and 6B shows the results of an observation of the specifically grown semiconductor crystal layer with a cross-section scanning electron microscope. FIG. 6A shows a case where the existence probability Z is 1/3.3 (the probability Z in FIG. 5 corresponds to 0.3 and No. 13 of table 4). In FIG. 6A, it is found that the specific growth causes convex unevenness to be produced in the farthest surface of the semiconductor crystal layer from the optical substrate (sapphire substrate). This is a semiconductor crystal layer that is rapidly grown by the formation of an aggregation of the second convex portions caused by a high existence probability Z. On the other hand, in FIG. 6B, it is found that concave unevenness is produced in the surface on the farthest side of the optical substrate of the specifically grown semiconductor crystal layer. This is produced by the fact that the aggregations of the second convex portions caused by the high existence probability Z are adjacent, and thus the semiconductor crystal layers specifically grown in the second convex portion collide with each other. It is found from what has been described above that the existence probability Z is set equal to or less than a predetermined value, and thus it is possible to reduce the displacement of the p-n junction interface of the semiconductor crystal layer, that is, the displacement of a band gap in a band diagram, with the result that it is possible to satisfactorily reduce the leak current.

Example 6

First, UV-O3 processing was performed on the mirror surface of a c-plane one side mirror surface sapphire (off-angle: 0.2°), and thus the surface was made hydrophilic, and particles were removed. Then, nanoparticles were dispersed in a novolak resin for photoresist. Then, the novolak resin where the nanoparticles were dispersed was formed into a film on the sapphire substrate by a spin coat method, and was prebaked on a hot plate at 120° C. Then, lithography was performed, and thus a large number of conical dots placed in a regular hexagonal arrangement at an average interval of 3.2 μm were produced on the sapphire substrate. When an observation was performed with a scanning electron microscope, normal convex portions and unique convex portions were found. The normal convex portions were found, from the scanning electron microscope observation, to be averagely a dot structure below.

The apex of the dot was a corner portion whose radius of curvature exceeded 0 and which was rounded.

The outline shape of the bottom portion of the dot was substantially circular.

The side surface of the dot had a two-step inclination angle. In the two-step inclination angle, the bottom portion side of the dot had an inclination whose inclination angle was smaller than the upper portion side.

The diameter of the bottom portion of the dot was 1.7 μm.

In example 6, the concentration and the shape of the nanoparticles that were dispersed in the novolak resin were changed. With respect to the shape, the nanoparticle was set circular and was also set filler-shaped. The circular particle was a $TiO_2$ particle having an average particle diameter of 25 nm. On the other hand, the filler-shaped particle was a ZnO rod having a length of 100 nm in a long-axis direction. The concentration of the nanoparticles was changed in a range of 0.01% to 3%. In this way, the existence ratio of the unique convex portion and the coverage of the convex member or the concave member provided in the unique convex portion were adjusted.

The results of the observations of the manufactured optical substrates with a scanning electron microscope and an atomic force microscope were shown in tables 5 and 6. Table 5 was organized such that the existence ratio of the unique convex portion was a parameter, and table 6 was organized such that coverage of the convex member or the concave member in the unique convex portion was a parameter. Although not shown in tables 5 and 6, the height or the depth of the convex member or the concave member provided in the surface of the unique convex portion was observed, with a scanning electron microscope and an atomic force microscope, to be in a range of 10 nm to 400 nm. In particular, a largest number of convex members or concave members 10 nm to 50 nm were contained, and in descending order, the members 50 nm to 100 nm, the members 100 nm to 150 nm and the members 150 nm to 400 nm were contained. The convex members and the concave members located near the apex of the unique convex portion and located near the bottom portion of the unique convex portion were mixed, and the convex members and the concave members located near the apex were higher in ratio.

The meanings of terms used in tables 5 and 6 are as follows.

Normal convex portion: among a plurality of dots of the concave-convex structure, a dot that is not the unique convex portion $P_{ave}$: average interval in the concave-convex structure $H_{ave}$: average height in the concave-convex structure ϕ ave: average value of the diameters of the bottom portions of the dots in the concave-convex structure Unique convex portion: convex portion having a convex member or a concave member in the surface Existence: whether or not the unique convex portion is present; ○ means that the unique convex portion is included, and x means that the unique convex portion is not included Coverage: flat surface occupancy of the convex members and the concave members in the surface of the unique convex portion P/R: existence ratio of the unique convex portion N: number of convex portions counted by determining the existence ratio of the unique convex portion Ratio: existence ratio of the unique convex portion In comparative example 5 in tables 5 and 6, an optical substrate was provided in which no nanoparticles were added to the novolak resin for photoresist, which was manufactured by performing lithography, and in which no unique convex portion was present.

Then, as in example 5, the light emission output ratio, the light extraction efficiency and the internal quantum efficiency were determined. The results were shown in tables 5 and 6.

TABLE 5

| | Normal convex portion | | | Unique convex portion | | | | | | Light emission |
|---|---|---|---|---|---|---|---|---|---|---|
| | $P_{ave}$ | $H_{ave}$ | ϕ ave | | Coverage | P/R | | | | output |
| No. | [μm] | [μm] | [μm] | Existence | [%] | N [piece] | Ratio[%] | IQE [%] | LEEratio | ratio |
| Comparative example 5 | 3.2 | 1.6 | 1.7 | X | — | 100 | 0 | 60 | 1.00 | 1 |
| 1 | 3.2 | 1.6 | 1.7 | ○ | 0.02 | 100 | 1 | 70 | 0.98 | 1.14 |
| 2 | 3.2 | 1.6 | 1.7 | ○ | 0.34 | 100 | 2 | 76 | 0.96 | 1.21 |
| 3 | 3.2 | 1.6 | 1.7 | ○ | 1.76 | 100 | 1 | 74 | 0.99 | 1.22 |
| 4 | 3.2 | 1.6 | 1.7 | ○ | 7.05 | 100 | 3 | 72 | 0.99 | 1.19 |
| 5 | 3.2 | 1.6 | 1.7 | ○ | 8.65 | 100 | 2 | 73 | 0.99 | 1.2 |
| 6 | 3.2 | 1.6 | 1.7 | ○ | 35.3 | 100 | 2 | 69 | 0.95 | 1.09 |

Coverage: flat surface occupancy of the convex members and the concave members in the surface of the unique convex portion

TABLE 6

| | Normal convex portion | | | Unique convex portion | | | | | | Light emission |
|---|---|---|---|---|---|---|---|---|---|---|
| | $P_{ave}$ | $H_{ave}$ | ϕ ave | | Coverage | P/R | | | | output |
| No. | [μm] | [μm] | [μm] | Existence | [%] | N [piece] | Ratio[%] | IQE [%] | LEEratio | ratio |
| Comparative example 5 | 3.2 | 1.6 | 1.7 | X | — | 100 | 0 | 60 | 1.00 | 1 |
| 7 | 3.2 | 1.6 | 1.7 | ○ | 1.76 | 10000 | 0.01 | 61 | 1.01 | 1.03 |
| 8 | 3.2 | 1.6 | 1.7 | ○ | 1.76 | 5000 | 0.02 | 64 | 1.17 | 1.25 |
| 9 | 3.2 | 1.6 | 1.7 | ○ | 1.66 | 1000 | 0.1 | 63 | 1.18 | 1.24 |

TABLE 6-continued

| | Normal convex portion | | | Unique convex portion | | | | | | Light emission |
|---|---|---|---|---|---|---|---|---|---|---|
| | $P_{ave}$ | $H_{ave}$ | ϕ ave | | Coverage | P/R | | | | output |
| No. | [μm] | [μm] | [μm] | Existence | [%] | N [piece] | Ratio[%] | IQE [%] | LEEratio | ratio |
| 10 | 3.2 | 1.6 | 1.7 | ○ | 1.47 | 1000 | 0.2 | 65 | 1.16 | 1.26 |
| 11 | 3.2 | 1.6 | 1.7 | ○ | 1.89 | 1000 | 0.4 | 64 | 1.17 | 1.25 |
| 12 | 3.2 | 1.6 | 1.7 | ○ | 1.91 | 1000 | 0.9 | 66 | 1.10 | 1.21 |
| 13 | 3.2 | 1.6 | 1.7 | ○ | 1.65 | 100 | 2 | 68 | 1.05 | 1.19 |
| 14 | 3.2 | 1.6 | 1.7 | ○ | 1.77 | 100 | 9 | 73 | 0.95 | 1.15 |
| 15 | 3.2 | 1.6 | 1.7 | ○ | 1.65 | 100 | 26 | 72 | 0.94 | 1.13 |
| 16 | 3.2 | 1.6 | 1.7 | ○ | 1.89 | 100 | 57 | 71 | 0.90 | 1.06 |
| 17 | 3.2 | 1.6 | 1.7 | ○ | 2.41 | 100 | 97 | 74 | 0.83 | 1.02 |

Coverage: flat surface occupancy of the convex members and the concave members in the surface of the unique convex portion Tables 5 and 6 show the followings. The unique convex portion is included, and thus the light emission output ratio is increased. Table 5 shows that when the coverage of the convex member and the concave member is increased, the internal quantum efficiency IQE is increased. This is probably because in the convex member or the concave member of the unique convex portion, the growth mode of the semiconductor crystal layer is disturbed. However, in the case where the coverage was 35.3% shown in No. 6 of table 5, the internal quantum efficiency IQE was slightly lowered. This is probably because when one unique convex portion is focused, roughness on its surface is increased, and thus the disturbance of the growth of the semiconductor crystal layer is excessively increased. In other words, it is estimated that a stress caused by the disturbance of the growth of the semiconductor crystal layer is greatly exerted, and thus crystal defects are produced. Table 6 shows that when the ratio of the unique convex portion is increased, the light emission output light ratio is increased. This is probably because light scattering caused by the unique convex portion is increased. In particular, in the unique convex portion, the convex member or the concave member on its surface causes randomness when the waveguide mode is disturbed to be increased. In other words, it is thought that this is because light scattering was able to be given priority over light diffraction. However, a slight decrease in the light emission output light ratio was started approximately when the existence ratio of the unique convex portion shown in No. 14 of table 6 exceeds 9%. This is because the light extraction efficiency LEE is lowered as found from the LEE ratio. The reason why this type of phenomenon occurs is probably because when an excessive number of unique convex portions are present, the probability that the emitted light whose direction of travel has been disturbed once forms the waveguide mode again is increased, and the light emitted to the side surface portion of the semiconductor light-emitting element is increased, with the result that absorption attenuation easily occurs.

It is found from what has been described above that in particular, the coverage of the convex member and the concave member in the unique convex portion is appropriately 0.02% to 8.65%. It is found that among them, the coverage is 0.34% to 8.65%, and thus the light emission output light ratio is enhanced. On the other hand, it is found that in particular, the existence ratio of the unique convex portion is approximately 0.02% to 26%, and among them, the existence ratio is 0.02% to 0.9%, and thus the light emission output light ratio is more enhanced.

Furthermore, when the growth of the semiconductor crystal layer was checked in more detail, it was found that when the optical substrate including the unique convex portion is used, as compared with the case where the optical substrate excluding the unique convex portion is used, it is possible to reduce cracks in the vicinity of the convex portion in the concave-convex structure of the semiconductor crystal layer.

Examples 7 and 8

An optical substrate including the concave-convex structure in its surface was produced, the substrate was used to produce the semiconductor light-emitting element (LED) and the efficiency of the LED was compared.

In the following examination, in order for the optical substrate including the concave-convex structure in its surface to be produced, a concave-convex structure L was produced, and then a concave-convex structure S was produced on the surface of the concave-convex structure L.

Production of the Concave-Convex Structure L

On the C-plane (0001) of the sapphire substrate, a $SiO_2$ film serving as an etching mask was formed into a film, and patterning is performed by a photolithography method. Then, the mask of the $SiO_2$ film was utilized to etch the sapphire substrate, and thus the concave-convex structure L was produced. The etching was performed by wet etching, and as an etching solution, a mixed acid of sulfuric acid and phosphoric acid was used. The temperature of the solution was about 295° C.

The produced concave-convex structure L was observed with a scanning electron microscope. The results were organized in table 7. In the concave-convex structure L of example 7, the convex portions were arranged on the lattice points of a hexagonal lattice having an interval PL of 3000 nm, the average height of the convex portion was 1500 μm and the convex bottom portion width Icvb was 1500 μm. On the side surface of the convex portion, a two-step inclination angle was provided. The side surface inclination angle was switched once from the convex portion apex to the convex bottom portion. A setting was made such that this switching causes the inclination angle to become steep. On the other hand, in example 8, no convex portion is provided in the lattice center portion of a hexagonal lattice. Specifically, a structure was produced in which units where no convex portion is in the center of the hexagonal lattice and the convex portions are present at the lattice points forming the outline of the hexagonal lattice are closely packed. The average interval and the height are as shown in table 7. The state of the side surface of the convex portion was the same as in example 7.

The meanings of terms used in table 7 are as follows.

Arrangement: arrangement of the convex portions in the concave-convex structure L PL: average interval in the concave-convex structure L $H_{ave}$: average height in the concave-convex structure L Icvb: convex portion bottom portion width of the concave-convex structure L

TABLE 7

| | Concave-convex structure L | | | |
|---|---|---|---|---|
| | Arrangement | PL [μm] | $H_{ave}$ [μm] | Icvb [μm] |
| Example 7 | convex portions on the lattice points of a triangular lattice | 3 | 1.5 | 1.5 |
| Example 8 | convex portions on the lattice points of a triangular lattice; when it is regarded as a hexagonal lattice, no convex portion is in the center point of the hexagonal lattice | 4 | 1.22 | 1.22 |

Production of the Concave-Convex Structure S

The concave-convex structure S was produced on the surface of the concave-convex structure L.

(1) A cylindrical master mold was produced, and (2) a light transfer method was applied to the cylindrical master mold to produce the reel-shaped resin mold. (3) Thereafter, the reel-shaped resin mold was processed into the nano-processing film of the optical substrate. Then, (4) the nano-processing film was used to form a mask on the optical substrate including the concave-convex structure L, dry and etching was performed through the obtained mask, with the result that the optical substrate including, in the surface, a concave-convex structure surface of the concave-convex structure L and the concave-convex structure S was produced.

(1) Production of the Cylindrical Master Mold

The same operation as in example 1 was performed, and thus the cylindrical master mold was obtained.

(2) Production of the Reel-Shaped Resin Mold

The produced cylindrical master mold was used as a template, a photo-nano-imprint method was applied and thus the reel-shaped resin mold G1 was continuously produced. Then, the reel-shaped resin mold G1 was used as a template, a photo-nano-imprint method was performed and thus reel-shaped resin mold G2 was continuously obtained.

The reel-shaped resin mold was produced as in example 4. However, the thickness of the film of the photo-curable resin applied was set at 5 μm, and the accumulated light amount in the application of ultraviolet rays was set at 1500 mJ/cm$^2$. Then, the reel-shaped resin mold G1 was used as a template, and thus the reel-shaped resin mold G2 was obtained. The reel-shaped resin mold was produced as in example 4. However, the thickness of the film of the photo-curable resin applied was set at 3 μm, and the accumulated light amount in the application of ultraviolet rays was set at 1200 mJ/cm$^2$.

(3) Production of the Nano-Processing Film

The reel-shaped resin mold G2 was processed into the nano-processing film. The same procedure as in example 4 was used. When the material 3 was applied, the distance between the interface between the material 2 arranged within the nano-structure and the material 3 applied and the surface of the material 3 was set at 1800 nm, and After the coating of the material 3, the reel-shaped resin mold G2 was passed through a blast drying furnace at 95° C. for 5 minutes.

(4) Nano-Processing of the Optical Substrate Including the Concave-Convex Structure L The produced nano-processing film was used, and the processing of the optical substrate including the concave-convex structure L was attempted. As the optical substrate including the concave-convex structure L, the substrate shown in table 7 was used.

UV-O3 processing was performed on the sapphire substrate including the concave-convex structure L for 5 minutes, and thus particles on the surface were removed and the sapphire substrate was made hydrophilic. Then, the surface of the material 3 of the nano-processing film was laminated to the sapphire substrate including the concave-convex structure L. At this time, the laminating was performed while the sapphire substrate including the concave-convex structure L was heated to 115° C. Then, a high-pressure mercury lamp light source was used to apply light over the reel-shaped resin mold G2 such that the accumulated light amount was 1200 mJ/cm$^2$. Thereafter, the reel-shaped resin mold G2 was separated.

Then, etching using oxygen gas was performed from the surface side of the material 2 of the obtained layered product (the layered product consisting of the material 2/the material 3/the substrate), the material 2 was regarded as a mask to perform nano-processing on the material 3 and the surface of the concave-convex structure L was partially exposed. The oxygen etching was performed under conditions in which the pressure was 1 Pa and the power was 300 W. Then, reactive ion etching using a mixture gas of $BCl_3$ gas and $Cl_2$ gas was performed from the surface side of the material 2, and thus nano-processing was performed on the sapphire substrate including the concave-convex structure L. The etching was performed under conditions in which the ICP was 150 W, the BIAS was 50 W and the pressure was 0.2 Pa, and a reactive ion etching device (RIE-101iPH, made by Samco Co., Ltd.) was used.

Finally, washing using a solution obtained by mixing sulfuric acid and hydrogen peroxide in a weight ratio of 2:1 was performed, and thus the sapphire optical substrate including the concave-convex structure surface of the concave-convex structure L and the concave-convex structure S was obtained. The shape of the concave-convex structure produced on the sapphire substrate was mainly controlled by the filling rate of the material 2 of the nano-processing film and the film thickness of the material 3.

The sapphire optical substrate including the concave-convex structure surface was observed with a scanning electron microscope. The concave-convex structures S were formed over the entire surface of the concave-convex structure L. It was found that the concave-convex structure S near the apex of the concave-convex structure L is higher in height and evenness than the concave-convex structure S near the convex bottom portion of the concave-convex structure L. The concave-convex structure S is a structure in which no corner is averagely present in the outline of the convex bottom portion, and the outline of the convex bottom portion is not circular but bent. The height of the convex portion in the concave-convex structure S, the convex bottom portion width Icvb and the coverage of the concave-convex structure S in the concave-convex structure L are shown in table 8. In table 8, the height of the convex portion in the concave-convex structure S, the convex bottom portion width Icvb and the value of the concave-convex structure S formed in the convex bottom portion of the concave-convex structure L for the concave-convex structure S are shown.

The meanings of terms used in table 8 are as follows.

PS: average interval in the concave-convex structure S $H_{ave}$: average convex portion height in the concave-convex structure S Icvb: convex portion bottom portion width of the concave-convex structure S PL/PS: ratio between the average interval (PL) in the concave-convex structure L and the average interval (PS) in the concave-convex structure S Coverage: coverage of the concave-convex structure S in the convex portion and the concave portion of the concave-convex structure L

TABLE 8

| | Concave-convex structure S | | | | |
|---|---|---|---|---|---|
| | PS[nm] | $H_{ave}$ (nm) | Icvb (nm) | PL/PS | Coverage [%] |
| Example 7 | 300 | 60 | 90 | 10 | 2.18 |
| Example 8 | 200 | 80 | 100 | 20 | 7.1 |

On the obtained sapphire optical substrate, the followings were continuously deposited by MOCVD: (1) AlGaN low-temperature buffer layer, (2) n-type GaN layer, (3) n-type AlGaN clad layer, (4) InGaN light-emitting layer (MQW), (5) p-type AlGaN clad layer, (6) p-type GaN layer and (7) ITO layer. The concave and convex portions on the sapphire substrate were under conditions of film formation in which they were embedded and flattened when the (2) n-type GaN layer was deposited. Furthermore, etching was performed, and an electrode pad was attached.

In this state, a prober was used to pass a current of 20 mA between a p-electrode pad and an n-electrode pad, and the light emission output was measured. The results were organized in tables 9 and 10.

In comparative examples 6 and 7 shown in table 9 and 10, the optical substrate including the concave-convex structure surface formed with only the concave-convex structure L was manufactured. The optical substrate including the concave-convex structure surface formed with the concave-convex structure corresponding to the concave-convex structure L of example 7 was used in comparative example 6. The optical substrate including the concave-convex structure surface formed with the concave-convex structure corresponding to the concave-convex structure L of example 8 was used in comparative example 7.

Table 9 shows the light emission output of an LED using the optical substrate in example 7 according to the present invention when the light emission output ratio of an LED using the optical substrate of comparative example 6 is assumed to be 1. Table 10 shows the light emission output of an LED using the optical substrate in example 8 according to the present invention when the light emission output ratio of the LED using the optical substrate of comparative example 7 is assumed to be 1.

The internal quantum efficiency IQE was determined by the PL strength. The internal quantum efficiency IQE was defined by (the number of photons emitted from the light-emitting semiconductor layer per unit time/the number of electrons injected into the semiconductor light-emitting element per unit time). In the present specification, as an index for evaluating the internal quantum efficiency IQE, (PL strength measured at 300K/PL strength measured at 10K) was adopted.

TABLE 9

| | Light emission output ratio | IQE[%] |
|---|---|---|
| Example 7 | 1.28 | 75 |
| comparative Example 6 | 1 | 60 |

TABLE 10

| | Light emission output ratio | IQE[%] |
|---|---|---|
| Example 8 | 1.39 | 82 |
| comparative Example 7 | 1 | 60 |

Tables 9 and 10 show that as compared with the optical substrate of comparative examples 6 and 7 including the concave-convex structure surface formed with only the concave-convex structure L, in comparative examples 7 and 8, the optical substrate including the concave-convex structure surface formed with the concave-convex structure S and the concave-convex structure L was used, and thus the light emission intensity was enhanced. It is found that one of the causes is that the internal quantum efficiency IQE is enhanced. It is estimated that the internal quantum efficiency IQE is improved because the effect of reducing dislocations in the semiconductor crystal layer grown from the concave portion in the concave-convex structure L is facilitated by the concave-convex structure S. Furthermore, it is found that the degree of the enhancement of the internal quantum efficiency IQE is greater than the degree of the enhancement of the light emission intensity. It is estimated that this is because since the concave-convex structure S has disturbance on the concave-convex structure L, light scattering is added, and thus the light extraction efficiency LEE is more enhanced.

Example 9

The concave-convex structure (L) of example 9 was produced as in example 7, and the concave-convex structure (S) was further produced on the concave-convex structure (L). Here, a method of manufacturing the concave-convex structure (S) was set the same as in example 7, and the nano-structure of the nano-processing film was changed. The nano-structure of the nano-processing film was set at a parameter, the optical substrate was obtained as in example 7 and the semiconductor light-emitting element was produced and evaluated. The concave-convex structure (S) was produced on the apex of the convex portion, the side surface of the convex portion and the bottom portion of the concave portion in the concave-convex structure (L).

The results of an observation of the manufactured optical substrate with a scanning electron microscope and the light emission output ratio are shown in table 11. The concave-convex structure (L) is the same as in example 7 of table 7.

The meanings of terms used in table 11 are as follows.

PS: average interval in the concave-convex structure S $H_{ave}$: average convex portion height in the concave-convex structure S Icvb: convex portion bottom portion width of the concave-convex structure S PL/PS: ratio between the average interval (PL) in the concave-convex structure L and the average interval (PS) in the concave-convex structure S Coverage: coverage of the concave-convex structure S in the convex portion and the concave portion of the concave-convex structure L

TABLE 11

| | No. | Concave-convex structure S PS [nm] | $H_{ave}$ [nm] | Icvb [nm] | PL/PS | Coverage [%] | Light emission output ratio |
|---|---|---|---|---|---|---|---|
| Example 9 | 1 | 200 | 60 | 90 | 15.0 | 12.6 | 1.29 |
| | 2 | 300 | 120 | 140 | 10.0 | 14.7 | 1.31 |
| | 3 | 500 | 220 | 300 | 6.0 | 24.6 | 1.42 |
| | 4 | 700 | 300 | 360 | 4.3 | 17.4 | 1.44 |
| | 5 | 900 | 420 | 480 | 3.3 | 18.8 | 1.41 |
| | 6 | 1200 | 540 | 720 | 2.5 | 26.7 | 1.12 |
| | 7 | 2500 | 710 | 1450 | 1.2 | 21.2 | 1.02 |

In table 11, in particular, approximately when PL/PS exceeds 2.5 (No. 6 in table 6), the distortion of the shape of the concave-convex structure (S) is increased, and accordingly the concave-convex structure (L) is also distorted. From this point of view, it was found that when the concave-convex structure (S) is arranged on the surface of the concave-convex structure (L) formed with a plurality of convex portions, PL/PS preferably exceeds 2.5. In particular, when PL/PS was equal to or more than 3.3, the accuracy of the shape of the concave-convex structure (S) was more enhanced, and when PL/PS was equal to or more than 6.0, the stability of the shape was saturated.

The light emission output ratio is shown with the one in example 7 of table 7 assumed to be 1. First, it is found that the light emission output ratio in each optical substrate is increased. Although as PL/PS is decreased, the light emission output ratio is increased, the light emission output ratio is slightly decreased after PL/PS=6.0. First, the reason why the light emission output ratio is increased is because of optical scattering caused by the concave-convex structure (L) having wide variations in volume on the order of micrometers. Here, the concave-convex structure (S) is provided on the surface of the concave-convex structure (L). In particular, it can be considered that it is because since the concave-convex structure (S) was also provided on the convex portion bottom surface of the concave-convex structure (L), when the semiconductor crystal layer was grown, in the vicinity of the concave portion bottom portion of the concave-convex structure (L), the growth mode of the semiconductor crystal can be disturbed, and thus dislocations were effectively removed. It was found that as PL/PS was increased, the internal quantum efficiency IQE was enhanced, and PL/PS was substantially saturated when PL/PS=10. In other words, when PL/PS is increased, the internal quantum efficiency IQE is saturated after a certain time. However, since the increase in PL/PS means that the volume as seen from the light emitted light from the semiconductor light-emitting element is lowered, optical scattering is lowered. Hence, it can be considered that a desired range for the light emission output appears.

Example 10

An optical substrate including the concave-convex structure (S) on only the upper surface of the convex portion apex in the concave-convex structure (L) was produced.

First, the reel-shaped resin mold G2 was produced as in example 4. However, the thickness of the film of the photo-curable resin applied was set at 4 μm, and the accumulated light amount in the application of ultraviolet rays was set at 1800 mJ/cm$^2$. Then, the reel-shaped resin mold G1 was used as a template, and the reel-shaped resin mold G2 was obtained. The reel-shaped resin mold was also produced as in example 4 except that the thickness of the film of the photo-curable resin applied was set at 2 μm, and the accumulated light amount in the application of ultraviolet rays was set at 1300 mJ/cm$^2$.

(3) Production of the Nano-Processing Film

The reel-shaped resin mold G2 was processed into the nano-processing film. The same procedure as in example 4 was used. When the material 3 was applied, the distance between the interface between the material 2 arranged within the nano-structure and the material 3 applied and the surface of the material 3 was set at 350 nm, and After the coating of the material 3, the reel-shaped resin mold G2 was passed through a blast drying furnace at 95° C. for 5 minutes.

(4) Nano-Processing of the Optical Substrate

The produced nano-processing film was used, the optical substrate was processed and the concave-convex structure (S) was produced.

UV-O3 processing was performed on the mirror surface of the c-plane one side mirror surface sapphire substrate for 5 minutes, and thus particles on the surface were removed and the sapphire substrate was made hydrophilic. Then, the surface of the material 3 of the nano-processing film was laminated to the sapphire substrate. At this time, the laminating was performed while the sapphire substrate was heated to 110° C. Then, a high-pressure mercury lamp light source was used to apply light over the reel-shaped resin mold G2 such that the accumulated light amount was 1400 mJ/cm$^2$. Thereafter, the reel-shaped resin mold G2 was separated.

Then, etching using oxygen gas was performed from the surface side of the material 2 of the obtained layered product (the layered product consisting of the material 2/the material 3/the substrate), the material 2 was regarded as a mask to perform nano-processing on the material 3 and the surface of the sapphire substrate was partially exposed. The oxygen etching was performed under conditions in which the pressure was 1 Pa and the power was 300 W. Then, reactive ion etching using a mixture gas of $BCl_3$ gas and $Cl_2$ gas was performed from the surface side of the material 2, and thus nano-processing was performed on the sapphire substrate including the concave-convex structure S. The etching was performed under conditions in which the ICP was 150 W, the BIAS was 50 W and the pressure was 0.2 Pa, and a reactive ion etching device (RIE-101iPH, made by Samco Co., Ltd.) was used.

Finally, washing using a solution obtained by mixing sulfuric acid and hydrogen peroxide in a weight ratio of 2:1 was performed, and thus the sapphire optical substrate including the concave-convex structure surface of the concave-convex structure S was obtained. The shape of the concave-convex structure (S) produced on the sapphire substrate was mainly controlled by the filling rate of the material 2 of the nano-processing film and the film thickness of the material 3.

Then, the novolak resin for photoresist was formed into a film on the concave-convex structure (S) by a spin coat method, and was prebaked on a hot plate at 120° C. Then, lithography was performed, and thus the concave-convex structure (L) was produced. Here, the photoresist was negatively developed and used, and thus the concave-convex structure (L) was formed into a dot shape, and the photoresist was positively developed, and thus the concave-convex structure (L) was formed into a hole shape. In any case, a regular hexagonal arrangement having an average interval of 3.2 μm was made.

The obtained optical substrate was observed with a scanning electron microscope. The dot-shaped concave-convex structure (L) was in the following dot-shaped state.

The average interval $P_{ave}$ was 3.2 μm, and a regular hexagonal arrangement was made.

The diameter of the bottom portion of the dot was 2.4 μm, and the shape of the bottom portion was substantially circular.

The concave portion bottom portion between the dots was flat.

A truncated cone shape with a flat surface on the dot apex was formed. The flat surface on the dot apex was substantially circular, and its diameter was 1.6 μm.

The dot apex was a substantially circular table top, and the concave-convex structure (S) was arranged on only the dot apex.

On the other hand, the hole-shaped concave-convex structure (L) was in the following hole-shaped state.

The average interval $P_{ave}$ was 3.2 μm, and a regular hexagonal arrangement was made.

The diameter of the opening portion of the hole was 1.5 μm, and the shape of the opening portion was substantially circular.

The depth of the hole was 1.4 μm.

The convex portion apex between the holes was flat, and the concave-convex structure (S) was arranged on only the flat surface.

The shape of the hole was conical with the bottom surface substantially circular, and the apex of the cone was a corner portion whose radius of curvature exceeded 0.

The results of the concave-convex structure (S) when the concave-convex structure (L) was dot-shaped were shown in table 12 together with the light emission output ratio. The light emission output ratio is shown with the one in example 7 of table 7 assumed to be 1.

The meanings of terms used in table 12 are as follows.

PS: average interval in the concave-convex structure S $H_{ave}$: average convex portion height in the concave-convex structure S Icvb: convex portion bottom portion width of the concave-convex structure S PL/PS: ratio between the average interval (PL) in the concave-convex structure L and the average interval (PS) in the concave-convex structure S Coverage 1: coverage of the concave-convex structure S in the convex portion and the concave portion of the concave-convex structure L Coverage 2: coverage T of the concave-convex structure S in the upper surface of the convex portion apex of the concave-convex structure L

TABLE 12

| No. | Concave-convex structure S PS [nm] | $H_{ave}$ [nm] | Icvb [nm] | PL/PS | Coverage 1 [%] | Coverage 2 [%] | Light emission output ratio |
|---|---|---|---|---|---|---|---|
| 8 | 300 | 30 | 60 | 10.7 | 0.2 | 3.1 | 1.18 |
| 9 | 300 | 40 | 90 | 10.7 | 0.5 | 7.1 | 1.21 |
| 10 | 300 | 60 | 120 | 10.7 | 0.9 | 12.6 | 1.32 |
| 11 | 300 | 80 | 150 | 10.7 | 1.5 | 19.6 | 1.36 |
| 12 | 300 | 110 | 180 | 10.7 | 2.1 | 28.3 | 1.41 |
| 13 | 300 | 140 | 200 | 10.7 | 2.6 | 34.9 | 1.44 |
| 14 | 300 | 180 | 240 | 10.7 | 3.8 | 50.2 | 1.3 |
| 15 | 300 | 200 | 260 | 10.7 | 4.5 | 59.0 | 1.19 |

Coverage 1: coverage of concave-convex structure S in concave-convex structure L
Coverage 2: coverage T of upper surface of convex portion apex Table 12 shows that as the coverage is increased, the light emission output is increased. This is because as has already been described, it is possible to reduce dislocations in the semiconductor crystal layer by the concave-convex structure (S). In particular, since the concave-convex structure (L) is dot-shaped, a flat surface is present on the convex portion of the dot-shaped concave-convex structure (L) and the concave-convex structure (S) is provided on the flat surface, the growth of the semiconductor crystal layer from the top of the convex portion apex of the concave-convex structure (L) can be made satisfactory. It is estimated that this is because the effect of reducing the discharge of the energy of the core of the semiconductor crystal layer in the convex bottom portion in the concave-convex structure (S) functions. Hence, it is possible to slightly slow the growth rate of the semiconductor crystal layer from the top of the convex portion apex of the concave-convex structure (L) as compared with the growth rate of the semiconductor crystal layer grown from the convex bottom portion in the concave-convex structure (L). In this way, it can be considered that this makes it possible to satisfactorily connect the semiconductor crystal layer grown from the convex bottom portion in the concave-convex structure (L) and the high-quality semiconductor crystal layer grown from the top of the convex portion apex of the concave-convex structure (L), with the result that dislocations are reduced and the internal quantum efficiency is enhanced. It was actually found by a transmission electron microscope observation that as the coverage of the concave-convex structure (S) was increased, dislocations were reduced. However, the light emission output intensity was lowered after the coverage T of the upper surface of the convex portion apex was 50.2% (No. 14 in table 12). It can be considered that this is because when the coverage T of the upper surface of the convex portion apex, that is, the flat surface occupancy of the concave-convex structure (S) within the surface of the concave-convex structure (L) to which the concave-convex structure (S) is provided, is excessively high, the action of discharge of the energy of the semiconductor crystal layer in the convex bottom portion in the concave-convex structure (S) is significantly lowered. In other words, it is estimated that in a stage where the nucleation of the semiconductor crystal layer is changed to the growth, the rate of discharge of the energy of the core attached to the convex bottom portion in the concave-convex structure (S). The light emission output was lowered after the coverage T of the upper surface of the convex portion apex was 7.1% (No. 9 in table 12). It can be considered that this is because optical scattering was lowered, that is, the light extraction efficiency was decreased. It was found, by an indirect examination, from a haze measurement on the concave-convex structure (S) alone, that scattering was lowered.

It is found from what has been described above that especially when the coverage T of the upper surface of the convex portion apex is in a range of 12.6% to 50.2%, the light emission output is increased, and among them, when the coverage T of the upper surface of the convex portion apex is in a range of 19.6% to 34.9%, the light emission output is more increased.

The results of the concave-convex structure (S) when the concave-convex structure (L) was hole-shaped were shown in table 1 together with the light emission output ratio. The light emission output ratio is shown with the one in example 7 of table 7 assumed to be 1.

The meanings of terms used in table 13 are as follows.

PS: average interval in the concave-convex structure S $H_{ave}$: average convex portion height in the concave-convex structure S Icvb: convex portion bottom portion width of the concave-convex structure S PL/PS: ratio between the average interval (PL) in the concave-convex structure L and the average interval (PS) in the concave-convex structure S Coverage 1: coverage of the concave-convex structure S in the convex portion and the concave portion of the concave-convex structure L Coverage 2: coverage T of the concave-convex structure S in the upper surface of the convex portion apex of the concave-convex structure L

TABLE 13

| | Concave-convex structure S | | | | Coverage | Coverage | Light emission |
|---|---|---|---|---|---|---|---|
| No. | PS [nm] | $H_{ave}$ [nm] | Icvb [nm] | PL/PS | 1 [%] | 2 [%] | output ratio |
| 8 | 300 | 30 | 60 | 10.7 | 3.1 | 3.1 | 1.17 |
| 9 | 300 | 40 | 90 | 10.7 | 7.1 | 7.1 | 1.19 |
| 10 | 300 | 60 | 120 | 10.7 | 12.6 | 12.6 | 1.28 |
| 11 | 300 | 80 | 150 | 10.7 | 19.6 | 19.6 | 1.33 |
| 12 | 300 | 110 | 180 | 10.7 | 28.3 | 28.3 | 1.38 |
| 13 | 300 | 140 | 200 | 10.7 | 34.9 | 34.9 | 1.42 |
| 14 | 300 | 180 | 240 | 10.7 | 50.2 | 50.2 | 1.29 |
| 15 | 300 | 200 | 260 | 10.7 | 59.0 | 59.0 | 1.16 |

Coverage 1: coverage of concave-convex structure S in concave-convex structure L
Coverage 2: coverage T of upper surface of convex portion apex Table 13 shows that as the coverage is increased, the light emission output is increased. This is because as has already been described, it is possible to reduce dislocations in the semiconductor crystal layer by the concave-convex structure (S). It was actually found by a transmission electron microscope observation that as the coverage of the concave-convex structure (S) was increased, dislocations were reduced. However, the light emission output intensity was lowered after the coverage T of the upper surface of the convex portion apex was 50.2% (No. 14 in table 13). It can be considered that this is because when the coverage T of the upper surface of the convex portion apex is excessively high, the action of discharge of the energy of the semiconductor crystal layer in the convex bottom portion in the concave-convex structure (S) is significantly lowered. In other words, it is estimated that in a stage where the nucleation of the semiconductor crystal layer is changed to the growth, the rate of discharge of the energy of the core attached to the convex bottom portion in the concave-convex structure (S). The light emission output was lowered after the coverage T of the upper surface of the convex portion apex was 7.1% (No. 9 in table 13). It can be considered that this is because optical scattering was lowered, that is, the light extraction efficiency was decreased. It was found, by an indirect examination, from a haze measurement on the concave-convex structure (S) alone, that scattering was lowered.

It is found from what has been described above that especially when the coverage T of the upper surface of the convex portion apex is in a range of 12.6% to 50.2%, the light emission output is increased, and among them, when the coverage T of the upper surface of the convex portion apex is in a range of 19.6% to 34.9%, the light emission output is more increased.

When the semiconductor crystal layer was checked in more detail, in a state after the semiconductor crystal layer was formed into a film, a hollow space was observed within the concave portion in the concave-convex structure (L). Hence, it can be considered that the difference in refractive index with the semiconductor crystal layer is increased, and thus the light extraction efficiency is easily enhanced. It was found that after the semiconductor crystal layer was formed into a film, when a support base member was attached to the surface of the semiconductor crystal layer, laser light was applied form the side of the optical substrate and thus laser lift-off was performed on the optical substrate, the optical substrate was able to be easily separated. It can be considered that this is because the presence of the hollow space which has already been described reduced the intimate contact between the optical substrate and the semiconductor crystal layer.

Example 11

As the material of the layered product mask, chromium oxide was selected for a first mask layer, and silicon oxide was selected for a second mask layer. For an etching solution used for the wet etching of the first mask layer (chromium oxide layer) and the sapphire substrate, which will be described later, an etching selectivity, between chromium oxide and the sapphire substrate is 3, and an etching selectivity, between silicon oxide and the sapphire substrate is 20 or more.

First, s film of chromium oxide of 50 nm was formed by a sputtering method, and then two sapphire substrates where a film of silicon oxide of 50 nm was formed were prepared. On one of them, a UV resist (PAK-02; made by Toyo Gosei Co., Ltd.) was formed into a film by a spin coat method. On the other, a thermal reaction type resist CuO-8% Si was formed into a film by a sputtering method.

In the sapphire substrate on which the UV resist was formed into a film, a pattern was transferred to the UV resist by using a nano-imprint mold. The residual film of the UV resist was removed by dry etching using $O_2$ gas. Thereafter, the UV resist pattern was used as a mask, and the pattern was transferred to the second mask layer (silicon oxide layer) by dry etching using a fluorine-based gas.

On the other hand, in the sapphire substrate on which the thermal reaction type resist CuO-8% Si was formed into a film, a pattern was drawn by an exposure device, and thereafter development was performed using a 3 wt % mixture solution of ammonium oxalate and glycine to form the pattern. Thereafter, the thermal reaction type resist pattern was used as a mask, and the pattern was transferred to the second mask layer (silicon oxide layer) by dry etching using a fluorine-based gas.

Although as the pattern intervals this time, five intervals, 200 nm, 460 nm, 700 nm, 2 μm and 5 μm, were used to perform the operation, the pattern interval can be changed as necessary, and the present invention does not receive any restriction by the pattern shape.

Then, the second mask layer (silicon oxide layer) was used as a mask, and thus wet etching was performed on the first mask layer (chromium oxide layer) and the sapphire substrate. A wet etching solution obtained by mixing phosphoric acid and sulfuric acid in a ratio of 1:3 vol % was heated to 230° C. and was used, and thus the wet etching was performed for 4 minutes.

Consequently, in all the intervals, the sapphire substrate was etched in the form of a concave-convex shape, that is, a tent-shape whose apex is pointed.

Example 12

As the material of the mask, a mixture consisting of silicon oxide and tungsten oxide was selected for the first mask layer, and silicon oxide was selected for the second mask layer. As the composition ratio of the mask, the ratio between silicon and tungsten was set at 9 mol %:1 mol %. For an etching solution used for the wet etching of the first mask layer (silicon oxide layer) and the sapphire substrate, which will be described later, an etching selectivity, between the mixture consisting of silicon oxide and tungsten oxide and the sapphire substrate is 3, and an etching selectivity, between silicon oxide and the sapphire substrate is 20 or more.

FIGS. 48 and 49 are cross-sectional schematic diagrams showing the individual steps of a method of manufacturing the optical substrate performed in example 12.

Figure 48A:
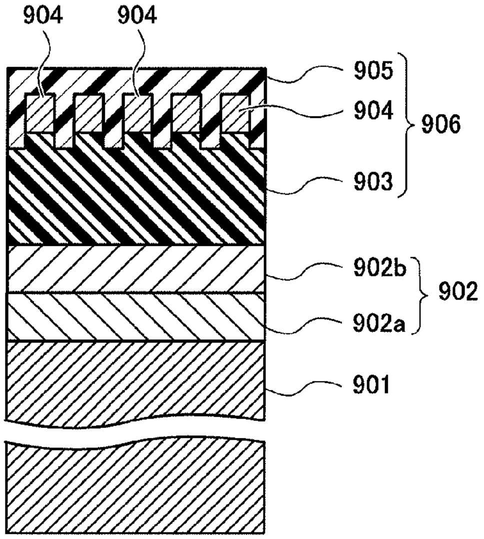
FIG. 48 A cross-sectional schematic view showing the individual steps of a method of manufacturing an optical substrate realized in example 12.

As shown in FIG. 48A, by a sputtering method, first, the first mask layer 902*a* of the mixture consisting of silicon oxide and tungsten oxide was formed into a film so as to have a film thickness of 50 nm, and the sapphire substrate 901 on which the second mask layer 902*b* of silicon oxide with a film thickness of 50 nm was prepared. The first mask layer 902*a* and the second mask layer 902*b* are collectively referred to as a layered product mask 902.

Then, a sheet 906 having a pattern shown in FIG. 48A was prepared. The sheet 906 is formed with a resin mold 905, a mask 903 and a mask 904. Here, the mask 904 can be arranged as necessary. As the material of the resin mold 905 and the mask 903, for example, a UV curable resin is preferable. As the material of the mask 904, for example, an inorganic material formed with a sol-gel material or the like is preferable. The mask 904 can be provided in order to enhance the dry etching resistance of the mask 903 when the residual film is removed and when the pattern is transferred to the second mask layer 902*b*, which will be described later. In the present example, as the resin mold 905, a material A which will be described later was used, as the mask 904, a material B which will be described later was used and as the mask 903, a material C which will be described later was used. The pattern of the sheet 906 was produced selecting an interval of 360 nm. Although the pattern interval this time was 360 nm, the pattern interval can be changed as necessary, and the present invention does not receive any restriction from the pattern shape.

In the present example, the following materials were used.

DACHP: OPTOOL DAC HP (made by Daikin Chemical Industry Company)

M350: trimethylol propane (EO-modified) triacrylate (made by Toagosei Co., Ltd., M350), I. 184: Irgacure 184 (made by BASF Corp.)

I. 369: Irgacure 369 (made by BASF Corp.)

TTB: titanium tetrabutoxide

3APTMS: KBM5103 (made by Shin-Etsu Silicone Co., Ltd.)

SH710: phenyl-modified silicone (made by Dow Corning Toray Co., Ltd.)

SR833: tricyclodecanedimethanol diacrylate (SR833 (made by SARTOMER Co., Ltd.))

SR368: tris (2-hydroxyethyl) isocyanurate triacrylate (SR368 (made by SARTOMER Co., Ltd.))

The sheet 906 described above was laminated onto the second mask layer 902*b* by heating the sapphire substrate 41 to 80° C. and UV application (500 mJ/$cm^2$).

Figure 48C:
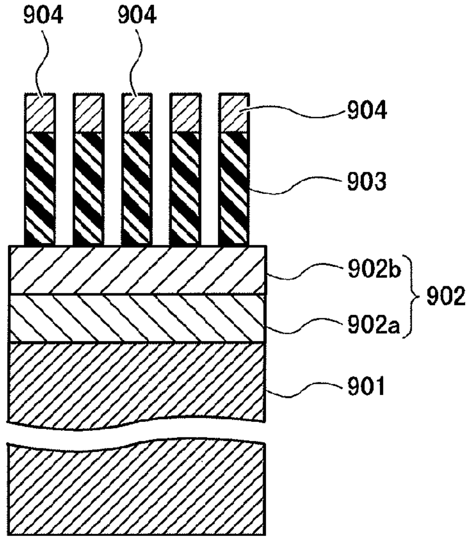
Figure 48B:
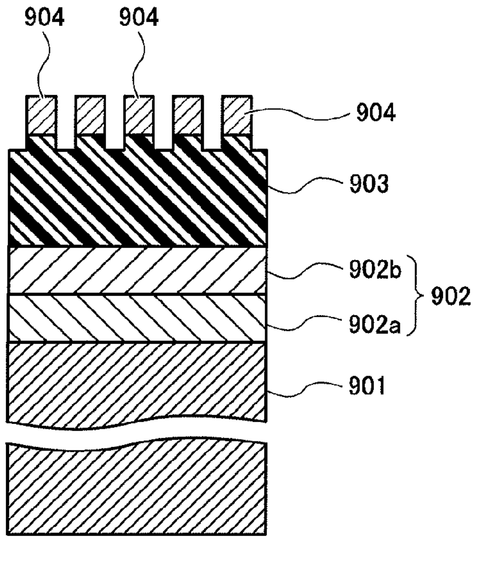

Then, as shown in FIG. 48B, the resin mold 905 was separated, and thereafter the residual film on the bottom of the concave portion in the mask 903 was removed by $O_2$ ashing, and as shown in FIG. 48C, the surface of the second mask layer 902*b* was partially exposed. The $O_2$ ashing was performed under conditions in which the pressure was 1 Pa and $O_2$ gas was used.

Figure 48D:
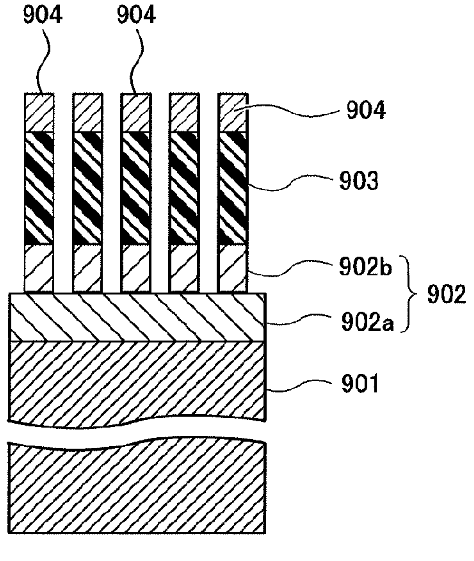

Then, by dry etching using the mask 903 and the mask 904 as masks and SF6 gas, as shown in FIG. 48D, the pattern was transferred to the second mask layer 902*b*. The dry etching was performed under conditions in which the pressure was 5 Pa and the time was 2 minutes.

Figure 49A:
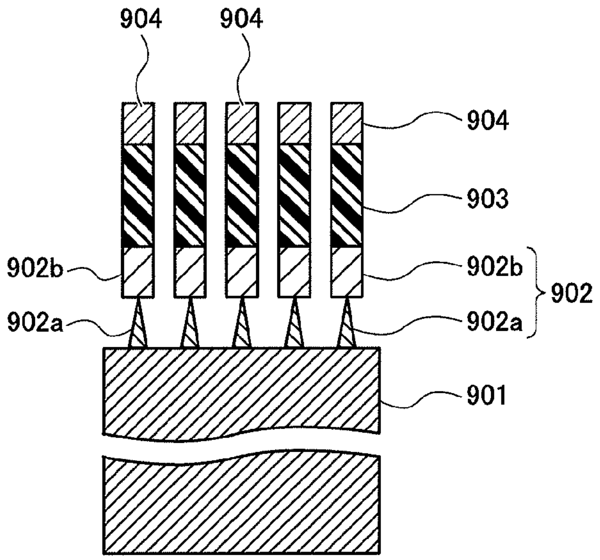
FIG. 49 A cross-sectional schematic view showing the individual steps of the method of manufacturing the optical substrate realized in example 12.
Figure 49B:
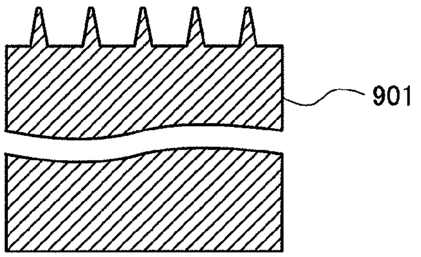

Then, as shown in FIGS. 49A and 49B, the second mask layer 902*b* was used as a mask, and wet etching was performed on the first mask layer 902*a* and the sapphire substrate 901. As a wet etching solution for the first mask layer 902*a* and the sapphire substrate 901, a solution obtained mixing phosphoric acid and sulfuric acid in a ratio of 1:1 vol % was heated to 230° C. and was used. The wet etching was performed for 3 minutes. Here, the first mask layer 902*a* was completely removed. The wet etching was performed in a state where the masks 903 and 904 were left on the first mask layer 902*a* and the second mask layer 902*b* (the layered product mask 902). However, even if the masks 903 and 904 are previously removed, the same results are obtained.

Consequently, the surface of the obtained sapphire substrate 901 was etched, with an interval of 360 nm, in the form of a concave-convex shape, that is, a tent-shape whose apex is pointed.

The sheet 906 may be produced one by one or may be produced in the shape of a reel. In particular, the sheet 906 is preferably produced in the shape of a reel because it is suitable for mass production. In the present example, the steps of producing the reel-shaped sheet 906 will be described below.

(1) The cylindrical master mold was produced, and (2) a light transfer method was applied to the cylindrical master mold to produce the reel-shaped resin mold. (3) Thereafter, the reel-shaped resin mold was processed into the nano-processing member (nano-processing film) of the optical substrate.

(1) Production of the Cylindrical Master Mold

By a direct drawing lithography method using a semiconductor laser, on the surface of a cylindrical quartz glass, the concave-convex structure was formed. First, on the surface of the cylindrical quartz glass, a resist layer was formed into a film by a sputtering method. In the sputtering method, as a target (resist layer), CuO (containing 8 atm % Si) of ϕ3 inches was used, a power of RF 100 W was used and the resist layer of 20 nm was formed into a film. Then, while the cylindrical quartz glass was being rotated, a semiconductor laser having a wavelength of 405 nm was used to perform exposure. Then, the resist layer after the exposure was developed. The development of the resist layer was performed using a 0.03 wt % glycine aqueous solution for 240 seconds. Then, the developed resist layer was used as a mask, and the etching layer (quarts glass) was etched by dry etching. The dry etching was performed under conditions in which SF6 was used as the etching gas, the processing gas pressure was 1 Pa, the processing power was 300 W and the processing time was 5 minutes. Finally, only the residual resist layer was separated, from the cylindrical quartz glass in which the concave-convex structure was provided to its surface, using sulfuric acid of pH 1. The separation time was set at 6 minutes.

Durasurf HD-1101Z (made by Daikin Chemical Industry Company), which is a fluorine-based release agent, was applied to the obtained cylindrical quartz glass, and they were heated at 60° C. for 1 hour, were left at room temperature for 24 hours and were immobilized. Thereafter, they were washed three times with Durasurf HD-ZV (made by Daikin Chemical Industry Company), and the cylindrical master mold was obtained.

(2) Production of the Reel-Shaped Resin Mold

The produced cylindrical master mold was used as a template, a photo-nano-imprint method was applied and thus the reel-shaped resin mold G1 was continuously produced. Then, the reel-shaped resin mold G1 was used as a template, a photo-nano-imprint method was performed and thus reel-shaped resin mold G2 was continuously obtained. The resin mold G2 was obtained, and thus the same pattern shape as the cylindrical master mold was obtained. A method of producing the resin molds G1 and G2 will be described below in detail.

The material A indicated below was applied to the easy-adhesion surface of a PET film A-3100 (made by Toyobo Co., Ltd.: 300 mm wide and 100 μm thick) with a micro gravure coating (made by Yasui Seiki Co., Ltd.) such that the thickness of the applied film was 5 μm. Then, the PET film to which the material A was applied was pressed with a nip roll to the cylindrical master mold, and a UV exposure device made by Fusion UV Systems Japan Inc., (H valve) was used to apply ultraviolet rays such that an accumulated exposure amount under a lamp in the center was 1500 $mJ/cm^2$ under the atmosphere, at a temperature of 25° C., at a humidity of 60%, and thus light curing was continuously performed, with the result that the reel-shaped resin mold G1 in which the concave-convex structure was transferred to the surface (200 m long and 300 mm wide) was obtained.

Then, the reel-shaped resin mold G1 was regarded as a template, a photo-nano-imprint method was continuously applied and thus reel-shaped resin mold G2 was produced.

The material A indicated below was applied to the easy-adhesion surface of the PET film A-3100 (made by Toyobo Co., Ltd.: 300 mm wide and 100 μm thick) with the micro gravure coating (made by Yasui Seiki Co., Ltd.) such that the thickness of the applied film was 3 μm. Then, the PET film to which the material A was applied was pressed with a nip roll (0.1 MPa) to the concave-convex structure surface of the reel-shaped resin mold G1, and the UV exposure device made by Fusion UV Systems Japan Inc., (H valve) was used to apply ultraviolet rays such that an accumulated exposure amount under a lamp in the center was 1200 $mJ/cm^2$ under the atmosphere, at a temperature of 25° C., at a humidity of 60%, and thus light curing was continuously performed, with the result that a plurality of reel-shaped resin molds G2 in which the concave-convex structure was transferred to the surface (200 m long and 300 mm wide) were obtained.

Material A—DACHP:M350:I. 184:I. 369=17.5 g:100 g:5.5 g:2.0 g (3) Production of the Nano-Processing Film A diluting solution of the material B below was applied to the concave-convex structure surface of the reel-shaped resin mold G2. Then, a diluting solution of the material C below was applied to the concave-convex structure surface of the reel-shaped resin mold G2 containing the material B within the concave-convex structure, and the nano-processing film was obtained.

Material B—TTB:3APTMS:SH710:I. 184:I. 369=65.2 g:34.8 g:5.0 g:1.9 g:0.7 g

Material C—Bindingpolymer:SR833:SR368:I. 184:I. 369=77.1 g:11.5 g:11.5 g:1.47 g:0.53 g Bindingpolymer: methyl ethyl ketone solution of a binary copolymer of 80 mass % of benzyl methacrylate and 20 mass % of methacrylic acid (a solid content of 50%, a weight average molecular weight of 56000, an acid equivalent of 330, a dispersion degree of 2.7)

The same device as in (2) the production of the reel-shaped resin mold described above was used, and thus the material B diluted with PGME was directly applied to the concave-convex structure surface of the reel-shaped resin mold G2 (resin mold 5). The dilute concentration here was set such that the solid content contained in the coating raw material (the material B diluted with PGME) per unit area was 20% lower than the volume of the concave-convex structure per unit area. After the coating, the reel-shaped resin mold G2 was passed through a blast drying furnace at 80° C. for 5 minutes, and the reel-shaped resin mold G2 containing the material B within the concave-convex structure was wound and collected.

Then, the reel-shaped resin mold G2 containing the material B within the concave-convex structure was unwound, and the same device as in (2) the production of the reel-shaped resin mold was used, and thus the material C diluted with PGME and MEK was directly applied to the concave-convex structure surface. The dilute concentration here was set such that the distance between the interface between the material B arranged within the concave-convex structure and the material C applied and the surface of the material C was 400 nm to 800 nm. After the coating, the reel-shaped resin mold was passed through the blast drying furnace at 80° C. for 5 minutes, and a polypropylene cover film was fitted to the surface of the material C and the reel-shaped resin mold was wound and collected.

In FIG. 48A, the mask 903 corresponds to the material C, the mask 904 corresponds to the material B and the resin mold 905 corresponds to the material A.

Example 13

As the material of the mask, silicon oxide, which is a material having resistance to the etching solution used for the wet etching of the sapphire substrate, was selected. For a wet etching solution for the sapphire substrate which will be described later, an etching selectivity, between silicon oxide and the sapphire substrate is 20 or more.

First, two sapphire substrates where a film of silicon oxide of 50 nm was formed were prepared. On one of them, a UV resist (PAK-02; made by Toyo Gosei Co., Ltd.) was formed into a film by a spin coat method. On the other, a thermal reaction type resist CuO-8% Si was formed into a film by a sputtering method.

In the sapphire substrate on which the UV resist was formed into a film, a pattern was transferred to the UV resist by using a nano-imprint mold. The residual film of the UV resist was removed by dry etching using $O_2$ gas. Thereafter, the UV resist pattern was used as a mask, and the pattern was transferred to the silicon oxide by dry etching using a fluorine-based gas.

On the other hand, in the sapphire substrate on which the thermal reaction type resist CuO-8% Si was formed into a film, a pattern was drawn by an exposure device, and thereafter development was performed using a 3 wt % mixture solution of ammonium oxalate and glycine to form the pattern. Thereafter, the thermal reaction type resist pattern was used as a mask, and the pattern was transferred to the silicon oxide by dry etching using a fluorine-based gas.

Although as the pattern intervals this time, five intervals, 200 nm, 460 nm, 700 nm, 2 μm and 5 μm, were used to perform the operation, the pattern interval can be changed as necessary, and the present invention does not receive any restriction by the pattern shape.

Then, the silicon oxide layer was used as a mask, and thus wet etching was performed on the sapphire substrate. A wet etching solution for the sapphire substrate obtained by mixing phosphoric acid and sulfuric acid in a ratio of 1:3 vol % was heated to 230° C. and was used, and the etching of the mask was performed by dry etching at 20 Pa, using $CF_4$ gas. The etching of the sapphire substrate was first performed for 30 seconds, and thereafter the etching of the mask was performed for 10 seconds. The step described above was repeated 6 times, and when the mask of silicon oxide was just removed, the etching of the sapphire substrate was completed.

Consequently, in all the intervals, the surface of the sapphire substrate was etched in the form of a concave-convex shape, that is, a tent-shape whose apex is pointed.

Example 14

As the material of the mask, chromium oxide, which is a material having no resistance to the etching solution used for the wet etching of the sapphire substrate, was selected. For a wet etching solution for the sapphire substrate which will be described later, an etching selectivity, between chromium oxide and the sapphire substrate is 3.

First, a sapphire substrate where a film of chromium oxide of 50 nm was formed by a sputtering method was prepared. On the sapphire substrate, a thermal reaction type resist CuO-8% Si was formed into a film by a sputtering method. The pattern formation using the thermal reaction type resist material was performed as in example 1.

Then, the thermal reaction type resist pattern was used as a mask, and the pattern was transferred to chromium oxide by wet etching using a cerium nitrate aqueous solution.

Thereafter, chromium oxide was used as a mask, and the wet etching of the sapphire substrate was performed. The wet etching of the sapphire substrate was performed under the same conditions as in example 1 for 3 minutes. At this time, chromium oxide was completely removed, and it was in an over-etched state.

Consequently, in all the intervals, the surface of the sapphire substrate was etched in the form of a concave-convex shape, that is, a tent-shape whose apex is pointed.

Example 15

As the material of the mask, a mixture consisting of silicon oxide and tungsten oxide having no resistance to the etching solution used for the wet etching of the sapphire substrate was selected. As the composition ratio of the mask, the ratio between silicon and tungsten was set at 9 mol %:1 mol %. For an etching solution for the sapphire substrate, which will be described later, an etching selectivity, between the mixture consisting of silicon oxide and tungsten oxide and the sapphire substrate is 3.

First, a sapphire substrate where the mixture consisting of silicon oxide and tungsten oxide was formed into a film so as to have a film thickness of 50 nm was prepared. On the sapphire substrate, a thermal reaction type resist CuO-8% Si was formed into a film by a sputtering method. The pattern formation using the thermal reaction type resist material was produced, selecting an interval of 460 nm in example 1. Although as the pattern interval this time, an interval of 460 nm was used to perform the operation, the pattern interval can be changed as necessary, and the present invention does not receive any restriction by the pattern shape.

Then, the thermal reaction type resist pattern was used as a mask, and by dry etching using $SF_6$ gas, the pattern was transferred to the mixture of silicon oxide and tungsten oxide. The dry etching was performed under conditions in which the pressure was 5 Pa and the time was 2 minutes.

Then, the mixture of silicon oxide and tungsten oxide was used as a mask, and wet etching was performed on the sapphire substrate. As a wet etching solution for the sapphire substrate, a solution obtained mixing phosphoric acid and sulfuric acid in a ratio of 1:1 vol % was heated to 230° C. and was used. The wet etching was performed for 3 minutes. Here, the mixture of silicon oxide and tungsten oxide was completely removed.

Consequently, when the surface of the obtained sapphire substrate was shot and observed with a scanning electron microscope (SEM), it was etched, with an interval of 460 nm, in the form of a concave-convex shape, that is, a tent-shape whose apex is pointed.

Example 16

As the material of the mask, the same mixture, as in example 3, consisting of silicon oxide and tungsten oxide having no resistance to the etching solution used for the wet etching of the sapphire substrate was selected. As the composition ratio of the mask, the ratio between silicon and tungsten was set at 9 mol %:1 mol %. For a wet etching solution for the sapphire substrate, which will be described later, an etching selectivity, between the mixture consisting of silicon oxide and tungsten oxide and the sapphire substrate is 3.

FIG. 50 is a cross-sectional schematic diagram showing the individual steps of a method of manufacturing the optical substrate according to example 16. As shown in FIG. 50A, a sapphire substrate 911 where a mask 912 of the mixture of silicon oxide and tungsten oxide was formed into a film so as to have a thickness of 50 nm by a sputtering method was prepared.

Figure 50A:
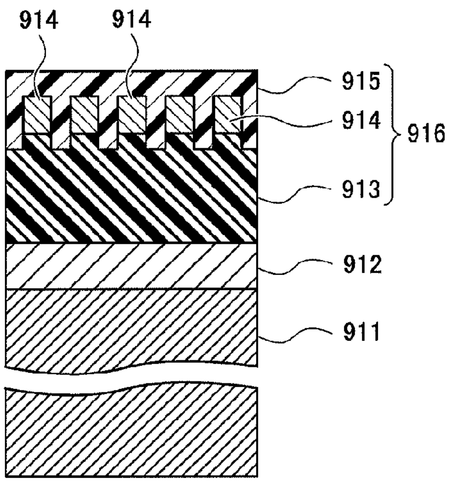
FIG. 50 A cross-sectional schematic view showing the individual steps of a method of manufacturing an optical substrate according to example 16.

Then, a sheet 916 having a pattern shown in FIG. 50A was prepared. The sheet 916 is formed with a resin mold 915, a mask 913 and a mask 914. Here, the mask 914 can be arranged as necessary. As the material of the resin mold 915 and the mask 913, for example, a UV curable resin is preferable. As the material of the mask 914, for example, an inorganic material formed with a sol-gel material or the like is preferable. The mask 914 can be provided in order to enhance the dry etching resistance of the mask 913 when the residual film is removed and when the pattern is transferred to the mask 912, which will be described later. In the present example, as the resin mold 915, a material A which will be described later was used, as the mask 914, a material B which will be described later was used and as the mask 913, a material C which will be described later was used. The pattern of the sheet 916 was produced selecting an interval of 460 nm. Although the pattern interval this time was 460 nm, the pattern interval can be changed as necessary, and the present invention does not receive any restriction from the pattern shape.

In the present example, the following materials were used.

DACHP: OPTOOL DAC HP (made by Daikin Chemical Industry Company)

M350: trimethylol propane (EO-modified) triacrylate (made by Toagosei Co., Ltd., M350), I. 184: Irgacure 184 (made by BASF Corp.)

I. 369: Irgacure 369 (made by BASF Corp.)

TTB: titanium tetrabutoxide

3APTMS: KBM5103 (made by Shin-Etsu Silicone Co., Ltd.)

SH710: phenyl-modified silicone (made by Dow Corning Toray Co., Ltd.)

SR833: tricyclodecanedimethanol diacrylate (SR833 (made by SARTOMER Co., Ltd.))

SR368: tris (2-hydroxyethyl) isocyanurate triacrylate (SR368 (made by SARTOMER Co., Ltd.))

The sheet 916 described above was laminated onto the mask 912 by heating the sapphire substrate 911 to 80° C. and UV application (500 mJ/cm$^2$).

Figure 50C:
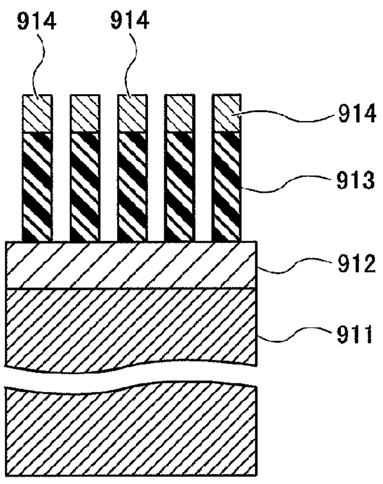
Figure 50B:
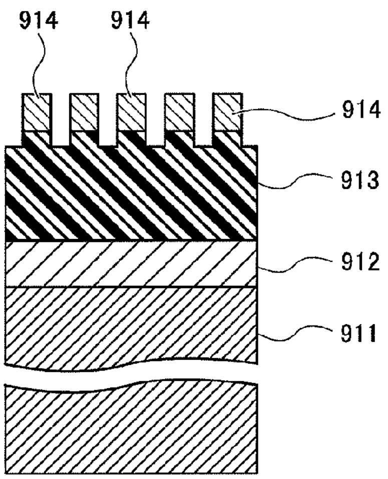

Then, as shown in FIG. 50B, the resin mold 915 was separated, and thereafter the residual film on the bottom of the concave portion in the mask 913 was removed by $O_2$ ashing, and as shown in FIG. 50C, the surface of the mask 912 was partially exposed. The $O_2$ ashing was performed under conditions in which the pressure was 1 Pa and $O_2$ gas was used.

Figure 50D:
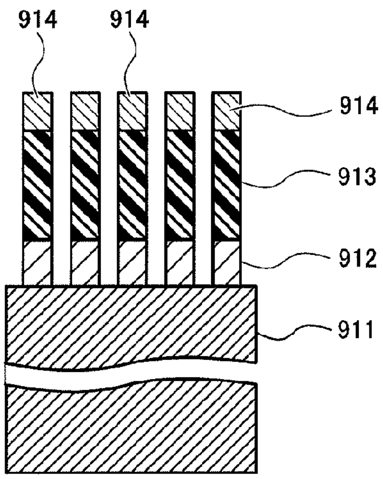

Then, by dry etching using the mask 913 and the mask 914 as masks and SF6 gas, as shown in FIG. 50D, the pattern was transferred to the mask 912. The dry etching was performed under conditions in which the pressure was 5 Pa and the time was 2 minutes.

Then, the mask 912 was used as a mask, and wet etching was performed on the sapphire substrate 911. As a wet etching solution for the sapphire substrate 911, a solution obtained mixing phosphoric acid and sulfuric acid in a ratio of 1:1 vol % was heated to 230° C. and was used. The wet etching was performed for 3 minutes. Here, the mask 912 was completely removed. The wet etching was performed in a state where the masks 913 and 914 were left on the mask 912. However, even if the masks 913 and 914 are previously removed, the same results are obtained.

Consequently, the surface of the obtained sapphire substrate 911 was etched, with an interval of 460 nm, in the form of a concave-convex shape, that is, a tent-shape whose apex is pointed.

The sheet 916 may be produced one by one or may be produced in the shape of a reel. In particular, the sheet 916 is preferably produced in the shape of a reel because it is suitable for mass production. In the present example, the steps of producing the reel-shaped sheet 916 will be described below.

(1) The cylindrical master mold was produced, and (2) a light transfer method was applied to the cylindrical master mold to produce the reel-shaped resin mold. (3) Thereafter, the reel-shaped resin mold was processed into the nano-processing member (nano-processing film) of the optical substrate.

(1) Production of the Cylindrical Master Mold

By a direct drawing lithography method using a semiconductor laser, on the surface of a cylindrical quartz glass, the concave-convex structure was formed. First, on the surface of the cylindrical quartz glass, a resist layer was formed into a film by a sputtering method. In the sputtering method, as a target (resist layer), CuO (containing 8 atm % Si) of ϕ3 inches was used, a power of RF 100 W was used and the resist layer of 20 nm was formed into a film. Then, while the cylindrical quartz glass was being rotated, a semiconductor laser having a wavelength of 405 nmn was used to perform exposure. Then, the resist layer after the exposure was developed. The development of the resist layer was performed using a 0.03 wt % glycine aqueous solution for 240 seconds. Then, the developed resist layer was used as a mask, and the etching layer (quarts glass) was etched by dry etching. The dry etching was performed under conditions in which SF6 was used as the etching gas, the processing gas pressure was 1 Pa, the processing power was 300 W and the processing time was 5 minutes. Finally, only the residual resist layer was separated, from the cylindrical quartz glass in which the concave-convex structure was provided to its surface, using sulfuric acid of pH 1. The separation time was set at 6 minutes.

Durasurf HD-1101Z (made by Daikin Chemical Industry Company), which is a fluorine-based release agent, was applied to the obtained cylindrical quartz glass, and they were heated at 60° C. for 1 hour, were left at room temperature for 24 hours and were immobilized. Thereafter, they were washed three times with Durasurf HD-ZV (made by Daikin Chemical Industry Company), and the cylindrical master mold was obtained.

(2) Production of the Reel-Shaped Resin Mold

The produced cylindrical master mold was used as a template, a photo-nano-imprint method was applied and thus the reel-shaped resin mold G1 was continuously produced. Then, the reel-shaped resin mold G1 was used as a template, a photo-nano-imprint method was performed and thus reel-shaped resin mold G2 was continuously obtained. The resin mold G2 was obtained, and thus the same pattern shape as the cylindrical master mold was obtained. A method of producing the resin molds G1 and G2 will be described below in detail.

The material A indicated below was applied to the easy-adhesion surface of a PET film A-4100 (made by Toyobo Co., Ltd.: 300 mm wide and 100 μm thick) with a micro gravure coating (made by Yasui Seiki Co., Ltd.) such that the thickness of the applied film was 5 μm. Then, the PET film to which the material A was applied was pressed with a nip roll to the cylindrical master mold, and a UV exposure device made by Fusion UV Systems Japan Inc., (H valve) was used to apply ultraviolet rays such that an accumulated exposure amount under a lamp in the center was 1500 mJ/cm$^2$ under the atmosphere, at a temperature of 25° C., at a humidity of 60%, and thus light curing was continuously performed, with the result that the reel-shaped resin mold G1 in which the concave-convex structure was transferred to the surface (200 m long and 300 mm wide) was obtained.

Then, the reel-shaped resin mold G1 was regarded as a template, a photo-nano-imprint method was continuously applied and thus reel-shaped resin mold G2 was produced.

The material A indicated below was applied to the easy-adhesion surface of the PET film A-4100 (made by Toyobo Co., Ltd.: 300 mm wide and 100 μm thick) with the micro gravure coating (made by Yasui Seiki Co., Ltd.) such that the thickness of the applied film was 3 μm. Then, the PET film to which the material A was applied was pressed with a nip roll (0.1 MPa) to the concave-convex structure surface of the reel-shaped resin mold G1, and the UV exposure device made by Fusion UV Systems Japan Inc., (H valve) was used to apply ultraviolet rays such that an accumulated exposure amount under a lamp in the center was 1200 mJ/cm$^2$ under the atmosphere, at a temperature of 25° C., at a humidity of 60%, and thus light curing was continuously performed, with the result that a plurality of reel-shaped resin molds G2 in which the concave-convex structure was transferred to the surface (200 m long and 300 mm wide) were obtained.

Material A—DACHP:M350:I. 184:I. 369=17.5 g:100 g:5.5 g:2.0 g (3) Production of the nano-processing film A diluting solution of the material B below was applied to the concave-convex structure surface of the reel-shaped resin mold G2. Then, a diluting solution of the material C below was applied to the concave-convex structure surface of the reel-shaped resin mold G2 containing the material B within the concave-convex structure, and the nano-processing film was obtained.

Material B—TTB:3APTMS:SH710:I. 184:I. 369=65.2 g:34.8 g:5.0 g:1.9 g:0.7 g

Material C—Bindingpolymer:SR833:SR368:I. 184:I. 369=77.1 g:11.5 g:11.5 g:1.47 g:0.53 g Bindingpolymer: methyl ethyl ketone solution of a binary copolymer of 80 mass % of benzyl methacrylate and 20 mass % of methacrylic acid (a solid content of 50%, a weight average molecular weight of 56000, an acid equivalent of 430, a dispersion degree of 2.7)

The same device as in (2) the production of the reel-shaped resin mold described above was used, and thus the material B diluted with PGME was directly applied to the concave-convex structure surface of the reel-shaped resin mold G2 (resin mold 5). The dilute concentration here was set such that the solid content contained in the coating raw material (the material B diluted with PGME) per unit area was 20% lower than the volume of the concave-convex structure per unit area. After the coating, the reel-shaped resin mold G2 was passed through a blast drying furnace at 80° C. for 5 minutes, and the reel-shaped resin mold G2 containing the material B within the concave-convex structure was wound and collected.

Then, the reel-shaped resin mold G2 containing the material B within the concave-convex structure was unwound, and the same device as in (2) the production of the reel-shaped resin mold was used, and thus the material C diluted with PGME and MEK was directly applied to the concave-convex structure surface. The dilute concentration here was set such that the distance between the interface between the material B arranged within the concave-convex structure and the material C applied and the surface of the material C was 400 nm to 800 nm. After the coating, the reel-shaped resin mold was passed through the blast drying furnace at 80° C. for 5 minutes, and a polypropylene cover film was fitted to the surface of the material C and the reel-shaped resin mold was wound and collected.

In FIG. 50A, the mask 913 corresponds to the material C, the mask 914 corresponds to the material B and the resin mold 915 corresponds to the material A.

The present invention is not limited to the embodiments described above, and various modifications are possible. In the embodiments described above, the sizes, the shapes and the like illustrated in the accompanying drawings are not limited, and modifications are possible as necessary within the range where the effects of the present invention are achieved. In the other configurations, modifications are possible as necessary without departing from the object of the present invention.

For example, although in the above embodiments, the case where the sapphire substrate is wet-etched has been described, the substrate for forming the concave-convex structure is not limit to this configuration, and modifications are possible as necessary. For example, even when a substrate having a spinel structure, a substrate having a perovskite structure (for example, yttrium aluminate), a GaN substrate, a SiC substrate and the like which are generally used in semiconductors and the like are wet-etched, the method in which as the wet etching proceeds, the volume of the mask is gradually reduced is utilized, and thus it is possible to avoid the formation of a pointed apex shaped concave-convex structure and to form a tent-shaped concave-convex structure.

INDUSTRIAL APPLICABILITY

The present invention has such an effect that dislocations in a semiconductor layer are dispersed, and thus the dislocation density is reduced to improve the internal quantum efficiency IQE, that the waveguide mode is removed by light scattering to enhance the light extraction efficiency LEE and that thus it is possible to enhance the efficiency of light emission of an LED, and in particular, can be suitably used for a GaN semiconductor light-emitting element applied to a blue LED, a purple LED and a white LED.

The present application is based on Japanese Patent Application No. 2012-084208 filed on Apr. 2, 2012, Japanese Patent Application No. 2012-103489 filed on Apr. 27, 2012, Japanese Patent Application No. 2012-103490 filed on Apr. 27, 2012, Japanese Patent Application No. 2012-227295 filed on Oct. 12, 2012, Japanese Patent Application No. 2012-267377 filed on Dec. 6, 2012, Japanese Patent Application No. 2012-267488 filed on Dec. 6, 2012 and Japanese Patent Application No. 2012-280241 filed on Dec. 21, 2012, the contents of which are incorporated herein by reference.

The invention claimed is:

1. An optical substrate that includes a substrate and a concave-convex structure which is formed in a part or a whole of a surface of the substrate, wherein at least one region of the concave-convex structure includes a plurality of convex portions arranged apart from each other, wherein the plurality convex portions are arranged in the form of a triangular lattice, a square lattice or a hexagonal lattice or an arrangement where their lattice number is regularly varied, wherein the plurality of convex portions include a plurality of first convex portions, each having a first height, and a plurality of second convex portions, each having a second height lower than the first height, wherein each of the first convex portions is adjacent to at least one other of the first convex portions without any of the second convex portions provided therebetween, wherein the following formulas (1), (2) and (3) are satisfied:

$$50\ \text{nm} \leq P_{ave} \leq 1500\ \text{nm} \quad (1),$$

$$0.6H_{ave} \geq hn \geq 0 \quad (2), \text{ and}$$

$$1/10000 \leq (N2/\{N1+N2\}) \leq 1/5 \quad (3), \text{ wherein}$$

$P_{ave}$ designates an average interval between adjacent first convex portions, $H_{ave}$ designates an average convex portion height of the concave-convex structure, hn designates the second height of each of the second convex portions, N1 designates the number of the first convex portions, and N2 designates the number of the second convex portions.

2. The optical substrate according to claim 1, wherein the at least one region is formed with only the plurality of convex portions, and the following formula is satisfied:

$$1/1000 \leq (N2/\{N1+N2\}) \leq 1/10.$$

3. The optical substrate according to claim 2, wherein an average distance Tcv−ave between the first convex portions adjacent through the second convex portion and the average interval $P_{ave}$ between the first convex portions adjacent satisfy a relationship of formula (4) below:

$$1.0P_{ave} < Tcv\text{−}ave \leq 11P_{ave}. \quad \text{Formula (4)}$$

4. An optical substrate that includes a substrate and a concave-convex structure which is formed in a part or a whole of a surface on one main surface of the substrate, wherein at least one region of the concave-convex structure includes a plurality of concave portions arranged apart from each other, wherein the plurality concave portions are arranged in the form of a triangular lattice, a square lattice or a hexagonal lattice or an arrangement where their lattice number is regularly varied, wherein the plurality of concave portions include a plurality of first concave portions, each having a first depth, and a plurality of second concave portions, each having a second depth smaller than the first depth, wherein each of the first concave portions is adjacent to at least one other of the first concave portions without any of the second concave portions provided therebetween, wherein the following formulas (5), (6) and (7) are satisfied:

$$50\ \text{nm} \le P_{ave} \le 1500\ \text{nm} \quad (5),$$

$$0.6D_{ave} \ge dn \ge 0 \quad (6), \text{ and}$$

$$1/10000 \le (N2/\{N1+N2\}) \le 1/5 \quad (7), \text{ wherein}$$

$P_{ave}$ designates an average interval between adjacent first concave portions, $D_{ave}$ designates an average concave portion depth of the concave-convex structure, dn designates the second depth of each of the second concave portions,

N1 designates the number of the first concave portions, and

N2 designates the number of the second concave portions.

5. The optical substrate according to claim 4, wherein the at least one region is formed with only the plurality of concave portions, and the following formula is satisfied:

$$1/1000 \le (N2/\{N1+N2\}) \le 1/10.$$

6. The optical substrate according to claim 5, wherein an average distance Tcc−ave between the first concave portions adjacent through the second concave portion and the average interval $P_{ave}$ between the first concave portions adjacent satisfy a relationship of formula (8) below:

$$1.0P_{ave} < Tcc\text{-}ave \le 11P_{ave}. \quad \text{Formula (8)}$$

7. A semiconductor light-emitting element comprising:

at least one or more of the optical substrates according to claim 1.

8. A semiconductor light-emitting element, wherein on a concave-convex structure surface of the optical substrate according to claim 1, at least a first semiconductor layer, a light-emitting semiconductor layer and a second semiconductor layer are deposited in this order.

9. The semiconductor light-emitting element according to claim 8, wherein the substrate, or a substrate main body including the substrate and another substrate of a hetero structure in which another base material is provided thereon, is formed of sapphire, SiC, Si, spinel or a nitride semiconductor.

10. The semiconductor light-emitting element according to claim 9, wherein the first semiconductor layer, the light-emitting semiconductor layer and the second semiconductor layer are formed of a III-V group semiconductor.

11. The semiconductor light-emitting element according to claim 10, wherein the first semiconductor layer, the light-emitting semiconductor layer and the second semiconductor layer are formed of a GaN semiconductor.

* * * * *